US008571135B2

(12) United States Patent
Sorrells et al.

(10) Patent No.: US 8,571,135 B2
(45) **Date of Patent: *Oct. 29, 2013**

(54) METHOD, SYSTEM AND APPARATUS FOR BALANCED FREQUENCY UP-CONVERSION OF A BASEBAND SIGNAL

(75) Inventors: David F. Sorrells, Middleburg, FL (US); Michael J. Bultman, Jacksonville, FL (US); Robert W. Cook, Switzerland, FL (US); Richard C Looke, Jacksonville, FL (US); Charley D. Moses, Jr., DeBary, FL (US); Gregory S. Rawlins, Chuluota, FL (US); Michael W. Rawlins, Lake Mary, FL (US)

(73) Assignee: ParkerVision, Inc., Jacksonville, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 13/323,550

(22) Filed: Dec. 12, 2011

(65) Prior Publication Data

US 2012/0114078 A1 May 10, 2012

Related U.S. Application Data

(63) Continuation of application No. 12/823,055, filed on Jun. 24, 2010, now Pat. No. 8,077,797, which is a continuation of application No. 11/015,653, filed on Dec. 20, 2004, now Pat. No. 7,773,688, which is a continuation of application No. 09/525,615, filed on Mar. 14, 2000, now Pat. No. 6,853,690.

(60) Provisional application No. 60/177,381, filed on Jan. 24, 2000, provisional application No. 60/171,502, filed on Dec. 22, 1999, provisional application No. 60/177,705, filed on Jan. 24, 2000, provisional application No. 60/129,839, filed on Apr. 16, 1999, provisional application No. 60/158,047, filed on Oct. 7, 1999, provisional application No. 60/171,349, filed on Dec. 21, 1999, provisional application No. 60/177,702, filed on Jan. 24, 2000, provisional application No. 60/180,667, filed on Feb. 7, 2000, provisional application No. 60/171,496, filed on Dec. 22, 1999.

(51) Int. Cl.
*H04L 27/04* (2006.01)
*H04L 27/12* (2006.01)
*H04L 27/20* (2006.01)

(52) U.S. Cl.
USPC ........... 375/295; 375/298; 375/259; 375/256; 455/76; 455/91

(58) Field of Classification Search
USPC ......... 375/295, 298, 259, 256, 296, 309–312, 375/268; 455/76, 91, 118, 323, 313
See application file for complete search history.

(56) References Cited

U.S. PATENT DOCUMENTS

| | | | | |
|---|---|---|---|---|
| 4,020,487 | A | 4/1977 | Winter | |
| 4,601,046 | A | 7/1986 | Halpern et al. | |
| 5,023,572 | A | 6/1991 | Caldwell et al. | |
| 5,222,079 | A | 6/1993 | Rasor | |
| 5,473,280 | A * | 12/1995 | Ohnishi et al. | 329/304 |
| 5,822,373 | A | 10/1998 | Addy | |
| 5,886,547 | A | 3/1999 | Durec et al. | |
| 5,949,471 | A | 9/1999 | Yuen et al. | |
| 6,009,317 | A | 12/1999 | Wynn | |
| 6,208,875 | B1 | 3/2001 | Damgaard et al. | |
| 6,240,100 | B1 | 5/2001 | Riordan et al. | |
| 6,324,379 | B1 | 11/2001 | Hadden et al. | |
| 6,459,889 | B1 | 10/2002 | Ruelke | |
| 6,512,798 | B1 * | 1/2003 | Akiyama et al. | 375/261 |
| 6,853,690 | B1 * | 2/2005 | Sorrells et al. | 375/295 |
| 7,522,900 | B2 | 4/2009 | Allott et al. | |
| 7,536,331 | B1 | 5/2009 | Pellegrino et al. | |
| 7,773,688 | B2 * | 8/2010 | Sorrells et al. | 375/295 |
| 7,991,815 | B2 | 8/2011 | Rawlins et al. | |
| 8,019,291 | B2 | 9/2011 | Sorrells et al. | |
| 8,036,304 | B2 | 10/2011 | Sorrells et al. | |
| 8,077,797 | B2 * | 12/2011 | Sorrells et al. | 375/295 |
| 8,160,196 | B2 | 4/2012 | Parker et al. | |
| 8,160,534 | B2 | 4/2012 | Sorrells et al. | |
| 8,190,108 | B2 | 5/2012 | Sorrells et al. | |
| 8,190,116 | B2 | 5/2012 | Sorrells et al. | |

| | | | |
|---|---|---|---|
| 8,223,898 | B2 | 7/2012 | Sorrells et al. |
| 8,224,281 | B2 | 7/2012 | Sorrells et al. |
| 8,229,023 | B2 | 7/2012 | Sorrells et al. |
| 8,233,855 | B2 | 7/2012 | Sorrells et al. |
| 8,295,406 | B1 | 10/2012 | Sorrells et al. |
| 8,295,800 | B2 | 10/2012 | Sorrells et al. |
| 8,340,618 | B2 | 12/2012 | Sorrells et al. |
| 8,406,724 | B2 | 3/2013 | Sorrells et al. |
| 8,407,061 | B2 | 3/2013 | Sorrells |
| 8,446,994 | B2 | 5/2013 | Rawlins et al. |
| 2012/0178398 | A1 | 7/2012 | Sorrells et al. |
| 2012/0220254 | A1 | 8/2012 | Sorrells et al. |
| 2012/0243643 | A1 | 9/2012 | Sorrells et al. |

OTHER PUBLICATIONS

Notice of Allowance dated Oct. 22, 2012 cited in U.S. Appl. No. 12/976,839, filed Dec. 22, 2010.
Office action dated Jan. 13, 2012 cited in U.S. Appl. No. 12/615,326, filed Nov. 10, 2009.
Office Action dated Dec. 14, 2011 cited in U.S. Appl. No. 12/634,233, filed Dec. 9, 2009.
Notice of Allowance dated Dec. 20, 2011 cited in U.S. Appl. No. 11/589,921, filed Oct. 31, 2006.
Office Action dated May 26, 2011 cited in U.S. Appl. No. 11/589,921, filed Oct. 31, 2006.
Office Action dated Oct. 6, 2011 cited in U.S. Appl. No. 12/118,111, filed May 9, 2008.
Notice of Allowance dated Jan. 20, 2012 cited in U.S. Appl. No. 12/881,912, filed Sep. 14, 2010.
Notice of Allowance dated Feb. 16, 2012 cited in U.S. Appl. No. 12/881,912, filed Sep. 14, 2010.
Notice of Allowance dated Feb. 29, 2012 cited in U.S. Appl. No. 11/589,921, filed Oct. 31, 2006.
Office Action dated Mar. 29, 2012 cited in U.S. Appl. No. 13/090,031, filed Apr. 19, 2011.
Notice of Allowanced dated Apr. 10, 2012 cited in U.S. Appl. No. 12/776,173, filed May 7, 2010.
Notice of Allowanced dated Apr. 20, 2012 cited in U.S. Appl. No. 09/569,045, filed May 10, 2000.
Notice of Allowanced dated Apr. 20, 2012 cited in U.S. Appl. No. 12/976,477, filed Dec. 22, 2010.
U.S. Appl. No. 13/090,031, filed Jun. 7, 2012, Notice of Allowance.
U.S. Appl. No. 12/615,326, filed Jun. 8, 2012, Notice of Allowance.
Notice of Allowanced dated Jul. 26, 2012 cited in U.S. Appl. No. 12/876,356, filed Sep. 7, 2010.
Office Action dated Jun. 11, 2012 cited in U.S. Appl. No. 13/421,635, filed Mar. 15, 2012.
Office Action dated Aug. 8, 2012 cited in U.S. Appl. No. 12/634,233, filed Dec. 9, 2009.
Office Action dated Aug. 15, 2012 cited in U.S. Appl. No. 12/118,111, filed May 9, 2008.
Notice of Allowanced dated Mar. 6, 2012 cited in U.S. Appl. No. 13/040,570, filed Mar. 4, 2011.
Notice of Allowanced dated Mar. 21, 2012 cited in U.S. Appl. No. 13/093,887, filed Apr. 26, 2011.
Notice of Allowance dated Feb. 22, 2013 cited in U.S. Appl. No. 12/634,233, filed Dec. 9, 2009.
U.S. Appl. No. 13/428,816, Dec. 17, 2012, Office Action.
U.S. Appl. No. 13/421,635, Jan. 4, 2013, Notice of Allowance.
U.S. Appl. No. 12/118,111, Jan. 7, 2013, Notice of Allowance.
Office Action dated May 29, 2013 cited in U.S. Appl. No. 13/550,492, filed Mar. 14, 2013 (Copy Attached).
Final Office Action dated Jun. 28, 2013 cited in U.S. Appl. No. 13/323,550, filed Dec. 12, 2011 (Copy Attached).
Notice of Allowance dated Aug. 2, 2013 cited in U.S. Appl. No. 13/618,621, filed Sep. 14, 2012 (Copy Attached).
Office Action dated Aug. 5, 2013 cited in U.S. Appl. No. 13/549,213, filed Mar. 23, 2012 (Copy Attached).
Notice of Allowance dated Aug. 14, 2013 cited in U.S. Appl. No. 13/323,550, filed Dec. 12, 2011 (Copy Attached).
Office Action dated Aug. 14, 2013 cited in U.S. Appl. No. 13/550,501, filed Jul. 16, 2012 (Copy Attached).

* cited by examiner

*Primary Examiner* — Phuong Phu
(74) *Attorney, Agent, or Firm* — Workman Nydegger

(57) ABSTRACT

A balanced transmitter up-converts a baseband signal directly from baseband-to-RF. The up-conversion process is sufficiently linear that no IF processing is required, even in communications applications that have stringent requirements on spectral growth. In operation, the balanced modulator sub-harmonically samples the baseband signal in a balanced and differential manner, resulting in harmonically rich signal. The harmonically rich signal contains multiple harmonic images that repeat at multiples of the sampling frequency, where each harmonic contains the necessary information to reconstruct the baseband signal. The differential sampling is performed according to a first and second control signals that are phase shifted with respect to each other. In embodiments of the invention, the control signals have pulse widths (or apertures) that operate to improve energy transfer to a desired harmonic in the harmonically rich signal. A bandpass filter can then be utilized to select the desired harmonic of interest from the harmonically rich signal. The sampling modules that perform the sampling can be configured in either a series or a shunt configuration. In embodiments of the invention, DC offset voltages are minimized between the sampling modules to minimize or prevent carrier insertion into the harmonic images.

24 Claims, 144 Drawing Sheets

1802

| TIME / NODE | t−1 (RISING EDGE OF $\phi_1$) | t−1 (RISING EDGE OF $\phi_2$) | t (RISING EDGE OF $\phi_1$) | t (RISING EDGE OF $\phi_2$) | t+1 (RISING EDGE OF $\phi_1$) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | — 1807 | — | $VO_{t-1}$ 1824 | $VO_{t-1}$ 1834 | $VO_t$ 1846 |
| 1912 | — | — 1815 | — | $VO_{t-1}$ 1836 | $VO_{t-1}$ 1848 |
| 1918 | — | — | — | — | $VI_t - 0.1*VO_t - 0.8*VO_{t-1}$ 1850 |

FIG. 18

CONVENTIONAL TRANSMITTER

CDMA TRANSMITTER

4002

BASE STATION

| | |
|---|---|
| RHO | 0.9970 |
| EVM | 5.51% |
| PHASE ERROR | 1.80° |
| MAGNITUDE ERROR | 4.53% |
| CARRIER INSERTION | -37.91 dB |
| PA POWER OUT | 28.06 dBm |

FIG.40

FREQUENCY (MHz) (MOBILE STATION)

4102

| | LOW | MIDDLE | HIGH |
|---|---|---|---|
| RHO | 0.9892 | 0.9969 | 0.9892 |
| EVM | 10.39% | 5.54% | 10.39% |
| PHASE ERROR | 4.47° | 2.24° | 4.08° |
| MAGNITUDE ERROR | 6.84% | 4.21% | 8.27% |
| CARRIER INSERTION | -40.15 dB | -44.58 dB | -35.27 dB |
| PA POWER OUT | 27.36 dBm | 28.11 dBm | 27.55 dBm |

FIG.41

BASE STATION CONSTELLATION FOR PILOT CHANNEL TEST

BASE STATION SAMPLED CONSTELLATION

MOBILE STATION CONSTELLATION FOR ACCESS CHANNEL TEST

MOBILE STATION SAMPLED CONSTELLATION

BASE STATION CONSTELLATION USING ONLY H/P TEST EQUIPMENT

MOBILE CONSTELLATION USING ONLY H/P TEST EQUIPMENT

BASE STATION SPECTRAL RESPONSE WITH MASK

MOBILE STATION SPECTRAL RESPONSE WITH MASK

CDMA CROSSTALK

| QUANTITY | DESCRIPTION | VOLTAGE | TOTAL CURRENT | POWER |
|---|---|---|---|---|
| 2 | CORES | 3.3 | 4mA | 13.2mW |
| 2 | BASEBAND INTERFACE CIRCUITS WITH/BW LIMIT | 3.3 | 6mA | 21.8mW |
| 1 | CLOCK CIRCUIT | 3.3 | 5mA | 20.0mW |
| | | | SUB TOTAL | 54.0mW |

FIG.52Z

| FIG.55 B-1 | FIG.55 B-2 | FIG.55 B-3 | FIG.55 B-4 |
|---|---|---|---|

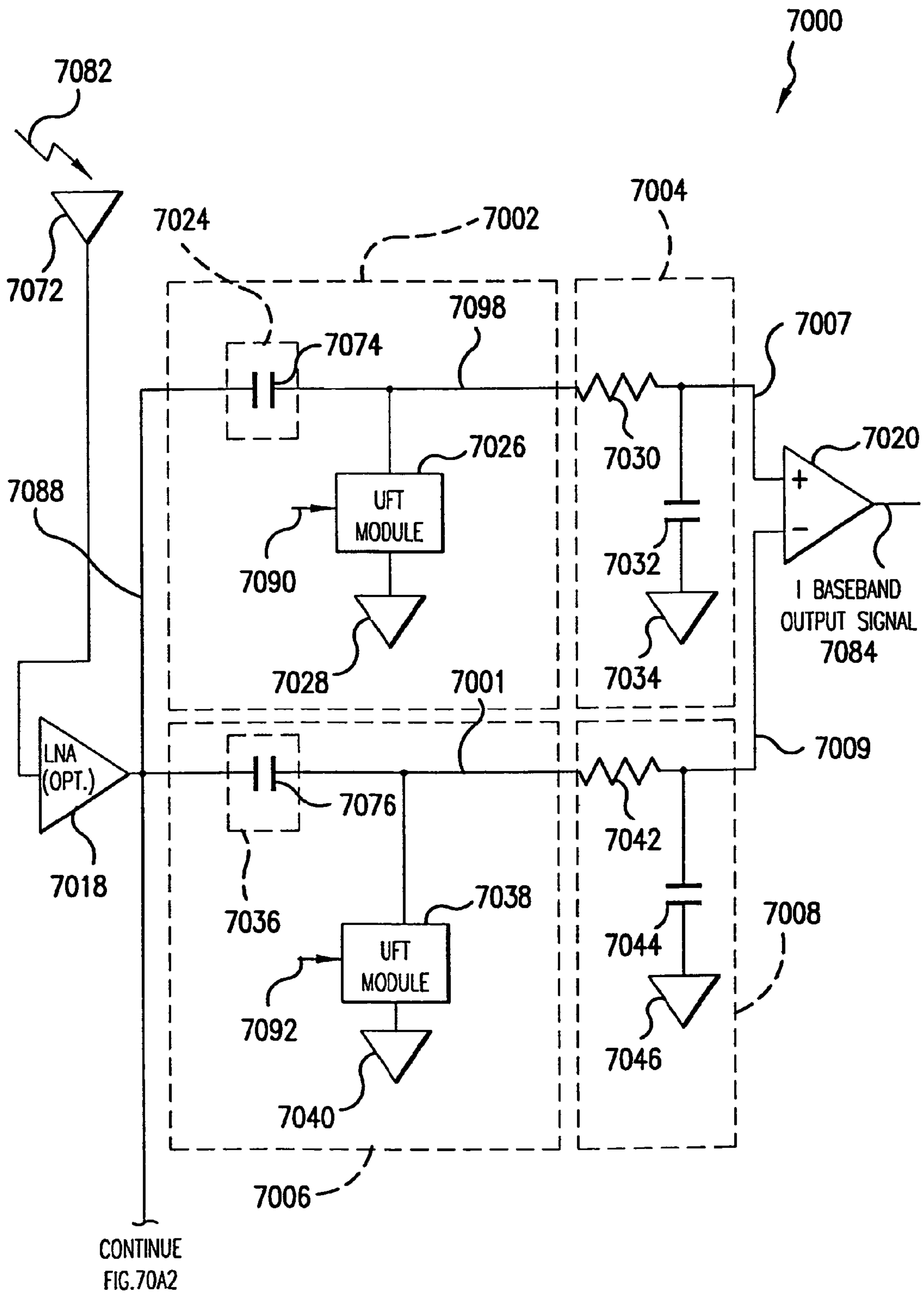
FIG.70A1

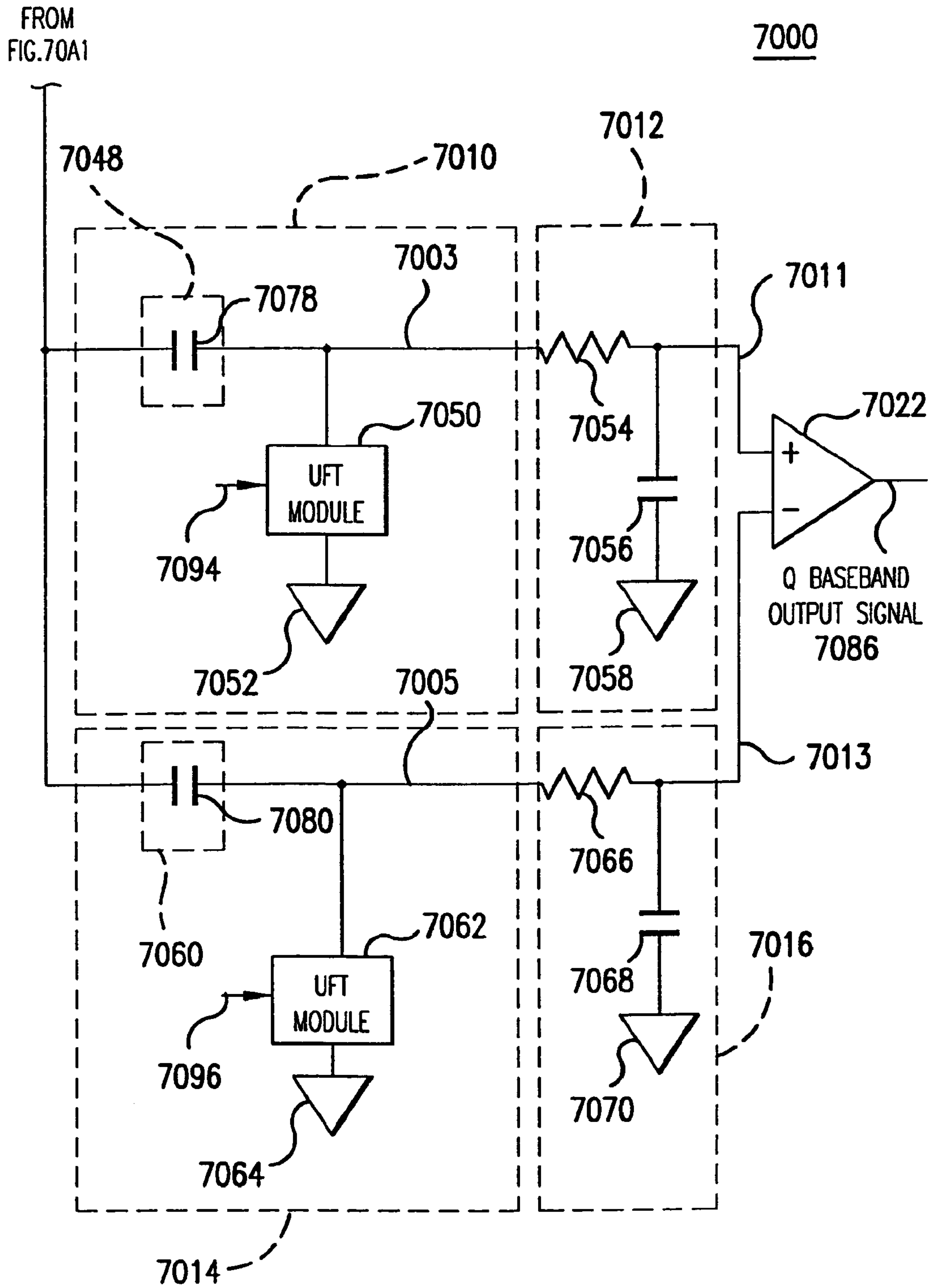
FIG.70A2

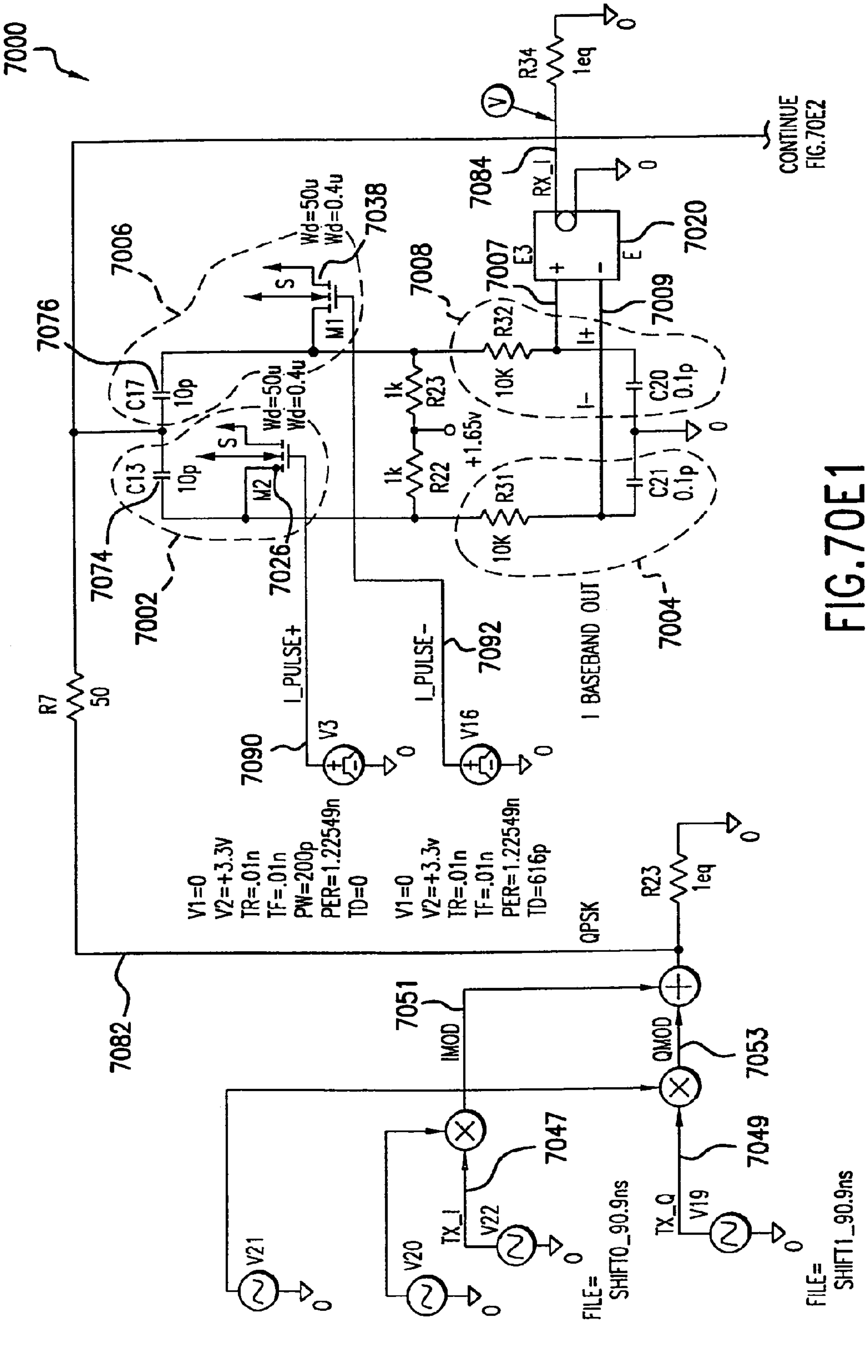
FIG.70E1

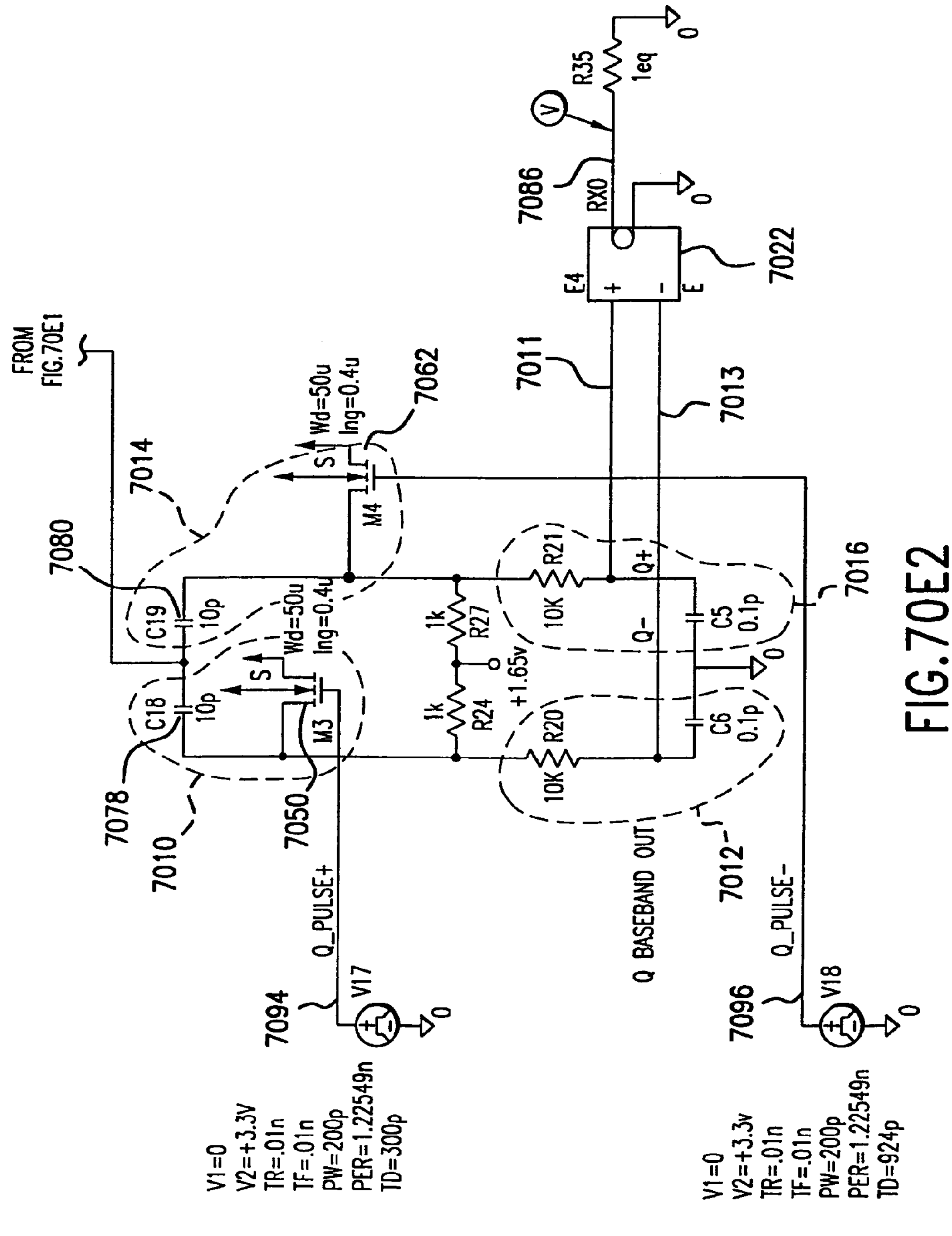
FIG.70E2

RISING EDGE PULSE GENERATOR

FALLING EDGE PULSE GENERATOR

METHOD, SYSTEM AND APPARATUS FOR BALANCED FREQUENCY UP-CONVERSION OF A BASEBAND SIGNAL

This application is a continuation to U.S. application Ser. No. 12/823,055, filed Jun. 24, 2010 now U.S. Pat. No. 8,077,797, entitled "Method, System and Apparatus for Balanced Frequency Up-Conversion of a Baseband Signal" which is a continuation to U.S. patent application Ser. No. 11/015,653, filed Dec. 20, 2004 now U.S. Pat. No. 7,773,688, entitled "Method, System and Apparatus for Balanced Frequency Up-Conversion of a Baseband Signal." U.S. patent application Ser. No. 11/015,653 is a continuation of U.S. patent application Ser. No. 09/525,615 filed Mar. 14, 2000, which is now U.S. Pat. No. 6,853,690, which claims benefit of the following: U.S. Provisional Application No. 60/177,381, filed on Jan. 24, 2000; U.S. Provisional Application No. 60/171,502, filed Dec. 22, 1999; U.S. Provisional Application No. 60/177,705, filed on Jan. 24, 2000; U.S. Provisional Application No. 60/129,839, filed on Apr. 16, 1999; U.S. Provisional Application No. 60/158,047, filed on Oct. 7, 1999; U.S. Provisional Application No. 60/171,349, filed on Dec. 21, 1999; U.S. Provisional Application No. 60/177,702, filed on Jan. 24, 2000; U.S. Provisional Application No. 60/180,667, filed on Feb. 7, 2000; and U.S. Provisional Application No. 60/171,496, filed on Dec. 22, 1999. The subject matter of all of the above-referenced applications is incorporated herein by reference as if fully set forth herein.

CROSS-REFERENCE TO OTHER APPLICATIONS

The following applications of common assignee are related to the present application, and are herein incorporated by reference in their entireties:

"Method and System for Down-Converting Electromagnetic Signals," Ser. No. 09/176,022, filed Oct. 21, 1998;

"Method and System for Frequency Up-Conversion," Ser. No. 09/176,154, filed Oct. 21, 1998;

"Method and System for Ensuring Reception of a Communications Signal," Ser. No. 09/176,415, filed Oct. 21, 1998;

"Integrated Frequency Translation And Selectivity," Ser. No. 09/175,966, filed Oct. 21, 1998;

"Universal Frequency Translation, and Applications of Same," Ser. No. 09/176,027, filed Oct. 21, 1998;

"Applications of Universal Frequency Translation," filed Mar. 3, 1999, Ser. No. 09/261,129, filed Mar. 3, 1999;

"Matched Filter Characterization and Implementation of Universal Frequency Translation Method and Apparatus," Ser. No. 09/521,878, filed Mar. 9, 2000;

"Spread Spectrum Applications of Universal Frequency Translation," Ser. No. 09/525,185; and "DC Offset, Re-radiation, and I/Q Solutions Using Universal Frequency Translation Technology," Ser. No. 11/059,536.

BACKGROUND OF THE INVENTION

1. Field of the Invention

The present invention is generally related to frequency up-conversion of a baseband signal, and applications of same. The invention is also directed to embodiments for frequency down-conversion, and to transceivers.

2. Related Art

Various communication components and systems exist for performing frequency up-conversion and down-conversion of electromagnetic signals.

SUMMARY OF THE INVENTION

The present invention is related to up-converting a baseband signal, and applications of same. Such applications include, but are not limited to, up-converting a spread spectrum signal directly from baseband to radio frequency (RF) without utilizing any intermediate frequency (IF) processing. The invention is also related to frequency down-conversion.

In embodiments, the invention differentially samples a baseband signal according to first and second control signals, resulting in a harmonically rich signal. The harmonically rich signal contains multiple harmonic images that each contain the necessary amplitude, frequency, and/or phase information to reconstruct the baseband signal. The harmonic images in the harmonically rich signal repeat at the harmonics of the sampling frequency ($1/T_S$) that are associated with the first and second control signals. In other words, the sampling is performed sub-harmonically according to the control signals. Additionally, the control signals include pulses that have an associated pulse width $T_A$ that is established to improve energy transfer to a desired harmonic image in the harmonically rich signal. The desired harmonic image can optionally be selected using a bandpass filter for transmission over a communications medium.

In operation, the invention converts the input baseband signal from a (single-ended) input into a differential baseband signal having first and second components. The first differential component is substantially similar to the input baseband signal, and the second differential component is an inverted version of the input baseband signal. The first differential component is sampled according to the first control signal, resulting in a first harmonically rich signal. Likewise, the second differential component is sampled according to the second control signal, resulting in a second harmonically rich signal. The first and second harmonically rich signals are combined to generate the output harmonically rich signal.

The sampling modules that perform the differentially sampling can be configured in a series or shunt configuration. In the series configuration, the baseband input is received at one port of the sampling module, and is gated to a second port of the sampling module, to generate the harmonically rich signal at the second port of the sampling module. In the shunt configuration, the baseband input is received at one port of the sampling module and is periodically shunted to ground at the second port of the sampling module, according to the control signal. Therefore, in the shunt configuration, the harmonically rich signal is generated at the first port of the sampling module and coexists with the baseband input signal at the first port.

The first control signal and second control signals that control the sampling process are phase shifted relative to one another. In embodiments of the invention, the phase-shift is 180 degree in reference to a master clock signal, although the invention includes other phase shift values. Therefore, the sampling modules alternately sample the differential components of the baseband signal. Additionally as mentioned above, the first and second control signals include pulses having a pulse width $T_A$ that is established to improve energy transfer to a desired harmonic in the harmonically rich signal during the sampling process. More specifically, the pulse width $T_A$ is a non-negligible fraction of a period associated with a desired harmonic of interest. In an embodiment, the pulse width $T_A$ is one-half of a period of the harmonic of interest. Additionally, in an embodiment, the frequency of the pulses in both the first and second control signal are a sub-harmonic frequency of the output signal.

In further embodiments, the invention minimizes DC offset voltages between the sampling modules during the differential sampling. In the serial configuration, this is accomplished by distributing a reference voltage to the input and output of the sampling modules. The result of minimizing (or preventing) DC offset voltages is that carrier insertion is minimized in the harmonics of the harmonically rich signal. In many transmit applications, carrier insertion is undesirable because the information to be transmitted is carried in the sidebands, and any energy at the carrier frequency is wasted. Alternatively, some transmit applications require sufficient carrier insertion for coherent demodulation of the transmitted signal at the receiver. In these applications, the invention can be configured to generate offset voltages between sampling modules, thereby causing carrier insertion in the harmonics of the harmonically rich signal.

An advantage is that embodiments of the invention up-convert a baseband signal directly from baseband-to-RF without any IF processing, while still meeting the spectral growth requirements of the most demanding communications standards. (Other embodiments may employ if processing.) For example, in an I Q configuration, the invention can up-convert a CDMA spread spectrum signal directly from base-band-to-RF, and still meet the CDMA IS-95 figure-of-merit and spectral growth requirements. In other words, the invention is sufficiently linear and efficient during the up-conversion process that no IF filtering or amplification is required to meet the IS-95 figure-of-merit and spectral growth requirements. As a result, the entire if chain in a conventional CDMA transmitter configuration can be eliminated, including the expensive and hard to integrate SAW filter. Since the SAW filter is eliminated, substantial portions of a CDMA transmitter that incorporate the invention can be integrated onto a single CMOS chip that uses a standard CMOS process, although the invention is not limited to this example application.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE FIGURES

The present invention will be described with reference to the accompanying drawings, wherein:

FIG. 18 is a table of example values at nodes in the UDF module of FIG. 17;

FIG. 26B-C illustrate example waveforms that are associated with the balanced transmitter 2602 according to an embodiment of the present invention;

FIGS. 40-52Z illustrate various example test results from testing the modulator 2910 in the test set 3900;

FIG. 70A illustrates an IQ receiver having shunt UFT modules according to embodiments of the invention;

FIG. 70E illustrates an example IQ modulation receiver embodiment according to embodiments of the invention;

FIGS. 70E-P illustrate example waveforms that are representative of the IQ receiver in FIG. 70E;

DETAILED DESCRIPTION OF THE PREFERRED EMBODIMENTS

Table of Contents

1. Universal Frequency Translation
2. Frequency Down-conversion
3. Frequency Up-conversion
4. Enhanced Signal Reception
5. Unified Down-conversion and Filtering
6. Other Example Application Embodiments of the Invention
7. Universal Transmitter
7.1 Universal Transmitter Having 2 UFT Modules
7.1.1 Balanced Modulator Detailed Description
7.1.2 Balanced Modulator Example Signal Diagrams and Mathematical Description
7.1.3 Balanced Modulator Having Shunt Configuration
7.1.4 Balanced Modulator FET Configuration
7.1.5 Universal Transmitter Configured for Carrier Insertion
7.2 Universal Transmitter in an IQ Configuration
7.2.1 IQ Transmitter Using Series-Type Balanced Modulator
7.2.2 IQ Transmitter Using Shunt-Type Balanced Modulator
7.2.3 IQ Transmitters Configured for Carrier Insertion
7.3 Universal Transmitter and CDMA
7.3.1 IS-95 CDMA Specifications
7.3.2 Conventional CDMA Transmitter
7.3.3. CDMA Transmitter Using the Present Invention
7.3.4 CDMA Transmitter Measured Test Results
8. Integrated Up-conversion and Spreading of a Baseband Signal
8.1 Integrated Up-Conversion and Spreading Using an Amplitude Shaper
8.2 Integrated Up-Conversion and Spreading Using a Smoothing Varying Clock Signal
9. Shunt Receiver Embodiments Utilizing UFT modules
9.1 Example I/Q Modulation Receiver Embodiments
9.1.1 Example I/Q Modulation Control Signal Generator Embodiments
9.1.2 Detailed Example I/Q Modulation Receiver Embodiment with Exemplary Waveforms
9.2 Example Single Channel Receiver Embodiment
9.3 Alternative Example I/Q Modulation Receiver Embodiment
10. Shunt Transceiver Embodiments Utilizing UFT Modules
11. Conclusion 1. Universal Frequency Translation The present invention is related to frequency translation, and applications of same.

Such applications include, but are not limited to, frequency down-conversion, frequency up-conversion, enhanced signal reception, unified down-conversion and filtering, and combinations and applications of same.

Figure 1A:
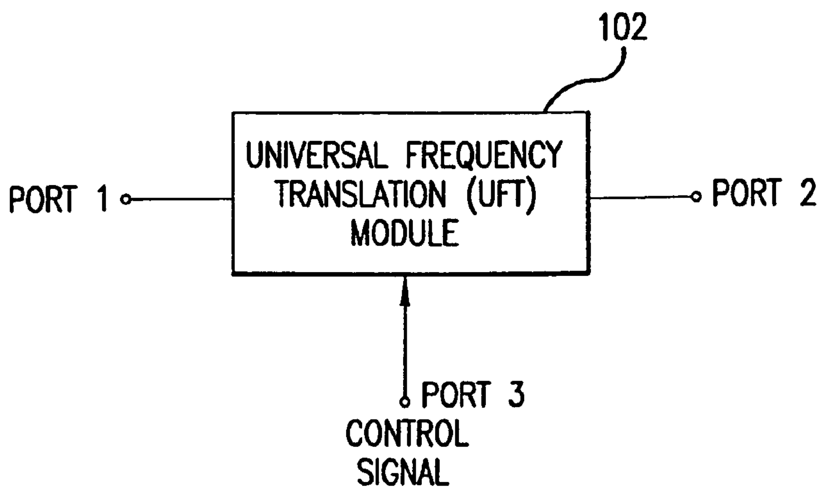
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
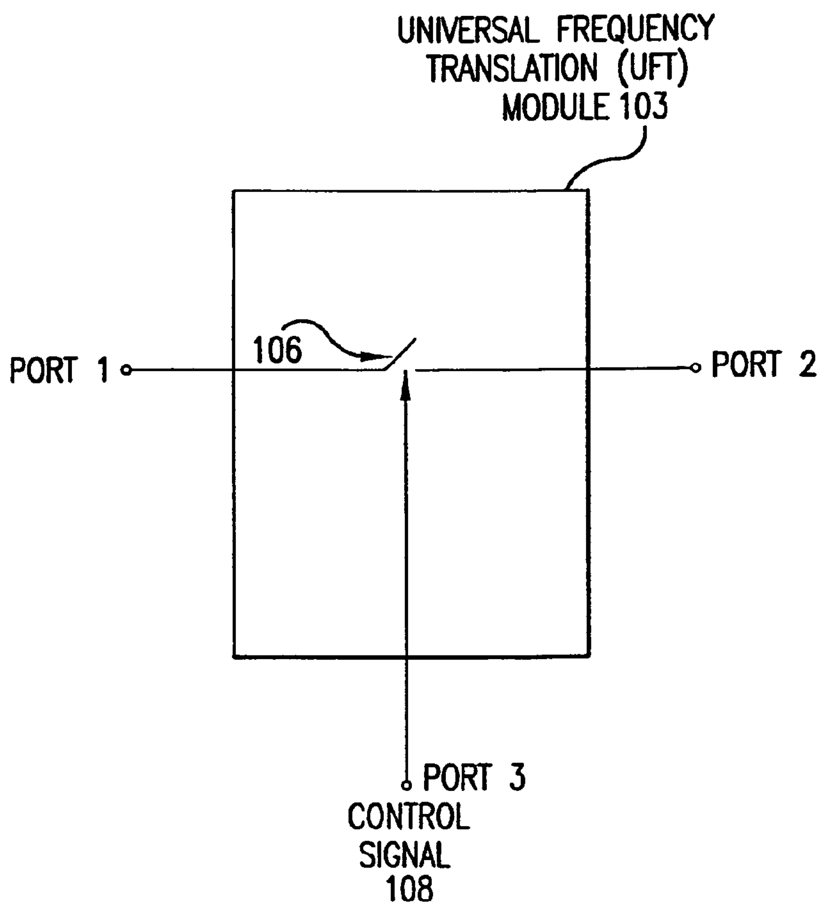
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2A:
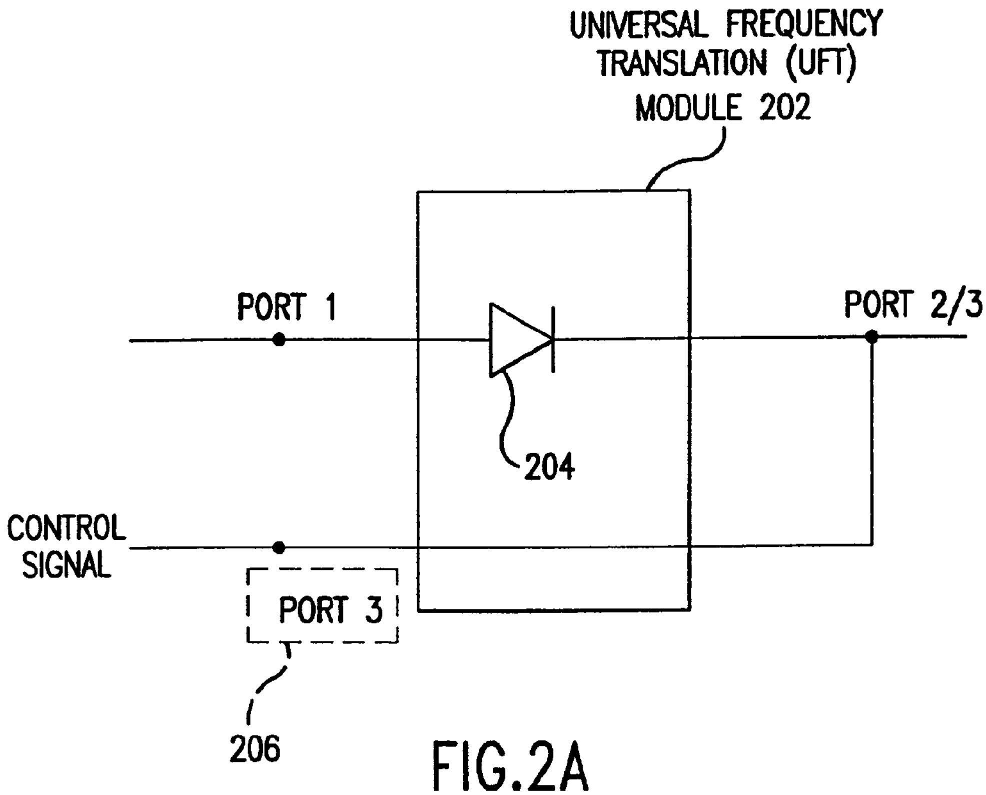
FIG. 2A is a block diagram of a universal frequency translation (UFT) module according to embodiments of the invention.
Figure 2B:
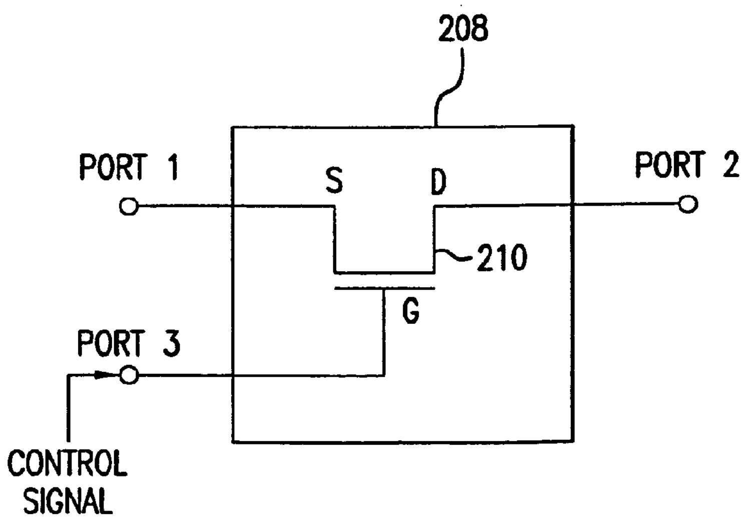
FIG. 2B is a block diagram of a universal frequency translation (UFT) module according to embodiments of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label. FIG. 2B illustrates a second example UFT module 208 having a FET 210 whose gate is controlled by the control signal.

The UFT module is a very powerful and flexible device. Its flexibility is illustrated, in part, by the wide range of applications in which it can be used. Its power is illustrated, in part, by the usefulness and performance of such applications.

Figure 1C:
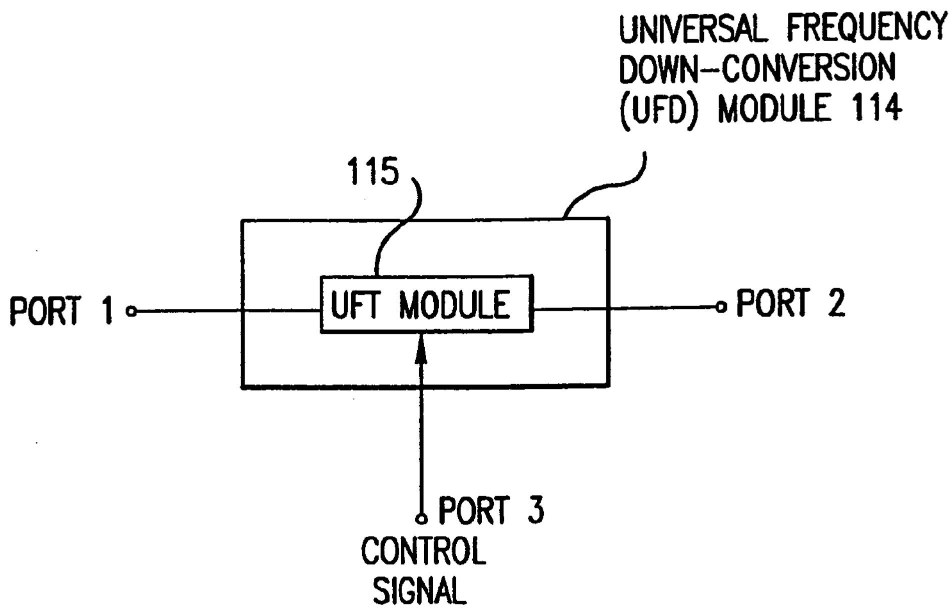
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
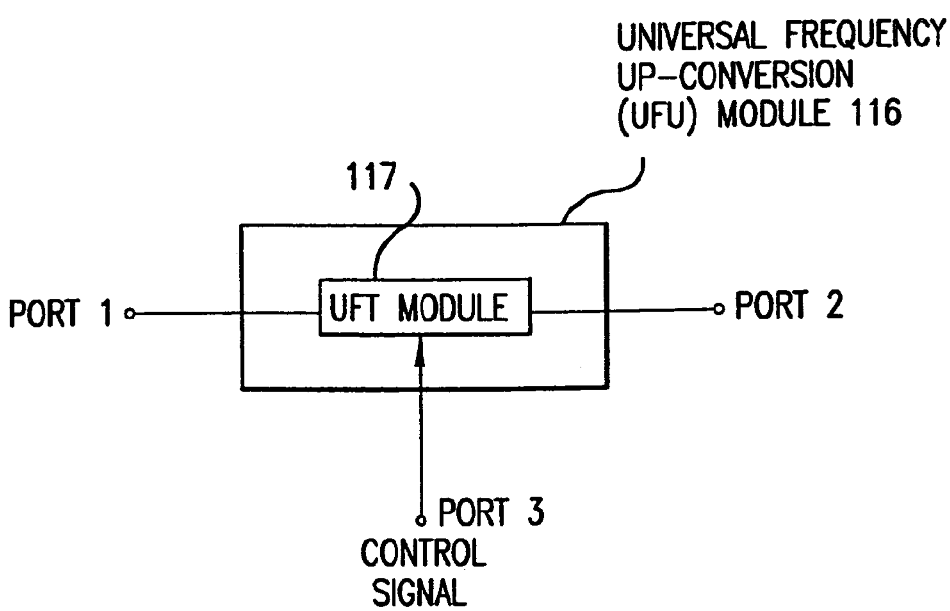
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2. Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. patent application entitled "Method and System for Down-Converting Electromagnetic Signals," Ser. No. 09/176,022, filed Oct. 21, 1998, the full disclosure of which is incorporated herein by reference. A relevant portion of the above mentioned patent application is summarized below to describe down-converting an input signal to produce a down-converted signal that exists at a lower frequency or a baseband signal.

Figure 20A:
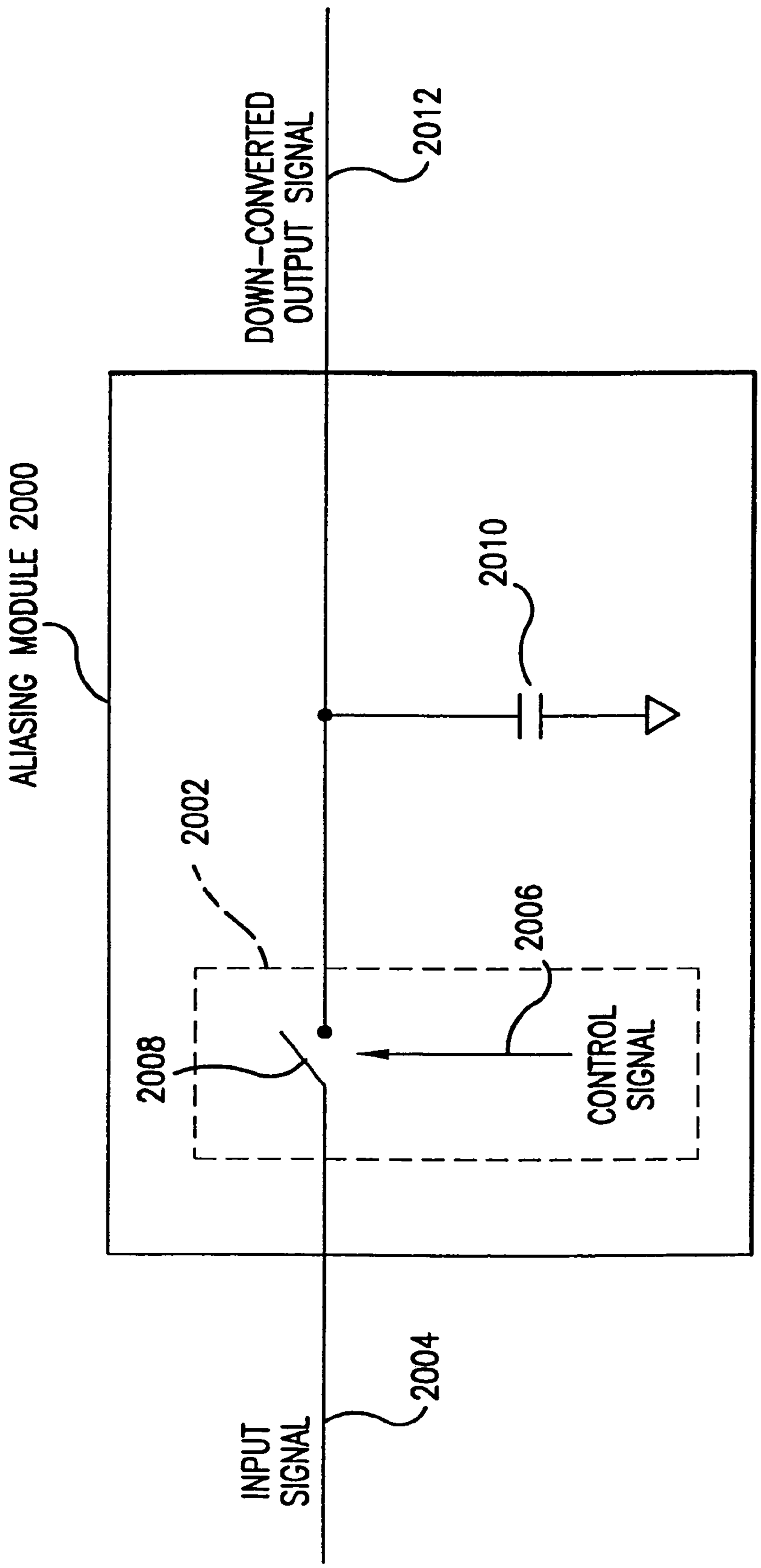
FIGS. 20A and 20A-1 are example aliasing modules according to embodiments of the invention.
Figures 1, 20A:
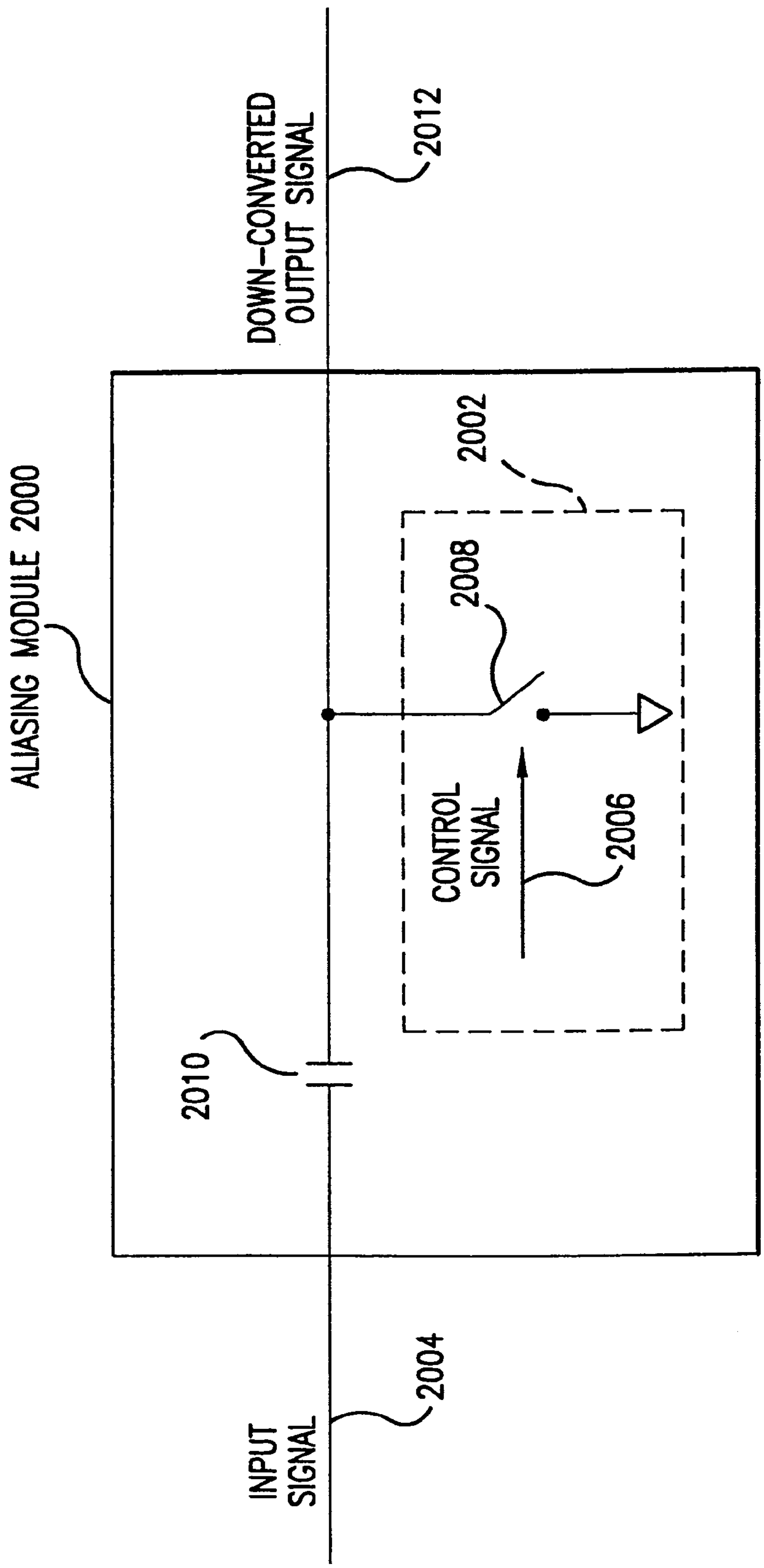

FIG. 20A illustrates an aliasing module 2000 (one embodiment of a UFD module) for down-conversion using a universal frequency translation (UFT) module 2002, which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIG. 20A-1), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20B:
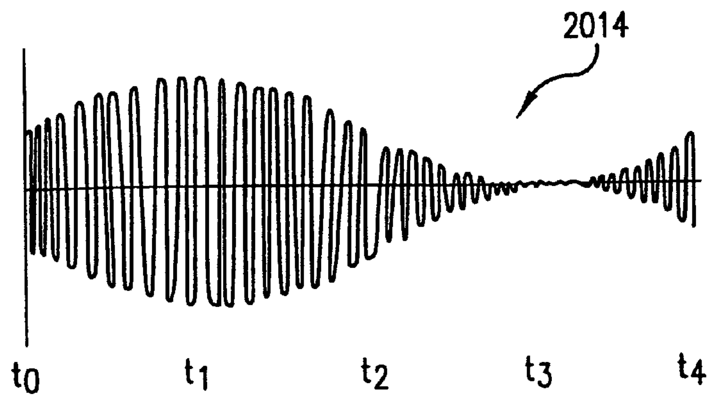
FIGS. 20B-20F are example waveforms used to describe the operation of the aliasing modules of FIGS. 20A and 20A-1.
Figure 20C:
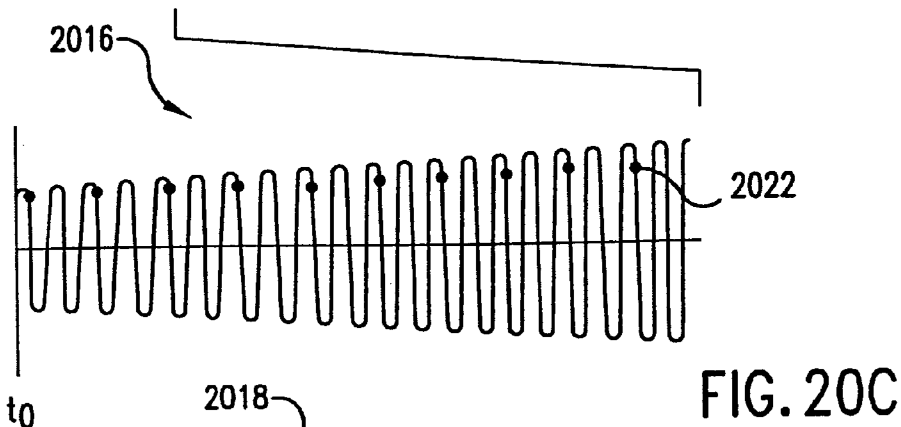
Figure 20D:
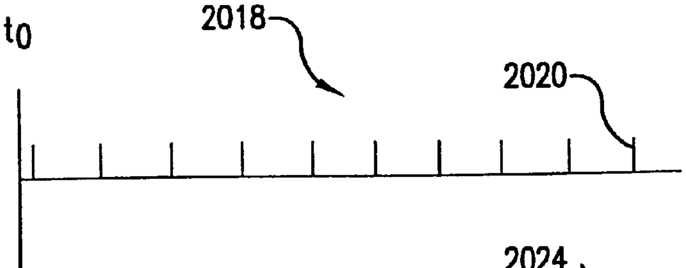
Figure 20E:
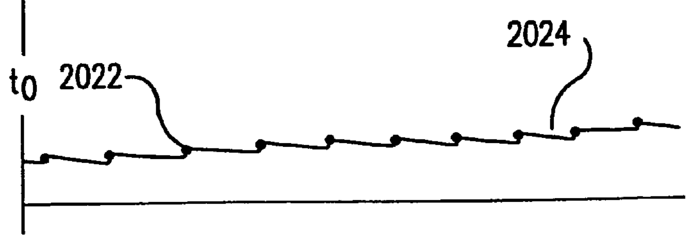

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses fauns down-converted output signal 2012.

Exemplary waveforms are shown in FIGS. 20B-20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of the analog AM carrier signal 2014 on an expanded time scale. The analog AM cattier signal portion 2016 illustrates the analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in co-pending U.S. patent application entitled "Method and System for Down-converting Electromagnetic Signals," application Ser. No. 09/176,022.

Figure 20F:

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample. Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B-20F illustrate down-conversion of AM carrier signal 2014.

The waveforms shown in FIGS. 20B-20F are discussed herein for illustrative purposes only, and are not limiting. Additional exemplary time domain and frequency domain drawings, and exemplary methods and systems of the invention relating thereto, are disclosed in co-pending U.S. patent application entitled "Method and System for Down-converting Electromagnetic Signals," application Ser. No. 09/176,022.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

$$(\text{Freq. of input signal 2004}) = n \cdot (\text{Freq. of control signal 2006}) \pm (\text{Freq. of Down-Converted Output Signal 2012})$$

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

$$(\text{Freq}_{input} - \text{Freq}_{IF})/n = \text{Freq}_{control}$$

$$(901\ \text{MHZ} - 1\ \text{MHZ})/n = 900/n$$

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in co-pending U.S. patent application entitled "Method and System for Down-converting Electromagnetic Signals," application Ser. No. 09/176,022.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

$$(Freq_{input}-Freq_{IF})/n=Freq_{control}$$

$$(900\ \text{MHZ}-0\ \text{MHZ})/n=900\ \text{MHZ}/n$$

For n=0.5, 1, 2, 3, 4, etc., the frequency of the control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. patent application entitled "Method and System for Down-converting Electromagnetic Signals," application Ser. No. 09/176,022.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 2006 would be calculated as follows:

$$\begin{aligned}\text{Frequency of the input} &= (F_1+F_2)\div 2\\ &= (899\ \text{MHZ}+901\ \text{MHZ})\div 2\\ &= 900\ \text{MHZ}\end{aligned}$$

Frequency of the down-converted signal=0 (i.e., baseband)

$$(Freq_{input}-Freq_{IF})/n=Freq_{control}$$

$$(900\ \text{MHZ}-0\ \text{MHZ})/n=900\ \text{MHZ}/n$$

For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 2006 should be substantially equal to:

$$(900\ \text{MHZ}-0\ \text{MHZ})/n=900\ \text{MHZ}/n,\ \text{or}$$

$$(901\ \text{MHZ}-0\ \text{MHZ})/n=901\ \text{MHZ}/n.$$

For the former case of 900 MHZ/n, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the co-pending U.S. patent application entitled "Method and System for Down-converting Electromagnetic Signals," application Ser. No. 09/176,022.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero. This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006, and for otherwise improving energy transfer and s/n ratio, are disclosed in the co-pending U.S. patent application entitled "Method and System for Down-converting Electromagnetic Signals," application Ser. No. 09/176,022.

3. Frequency Up-conversion Using Universal Frequency Translation

The present invention is directed to systems and methods of frequency up-conversion, and applications of same.

Figure 3:
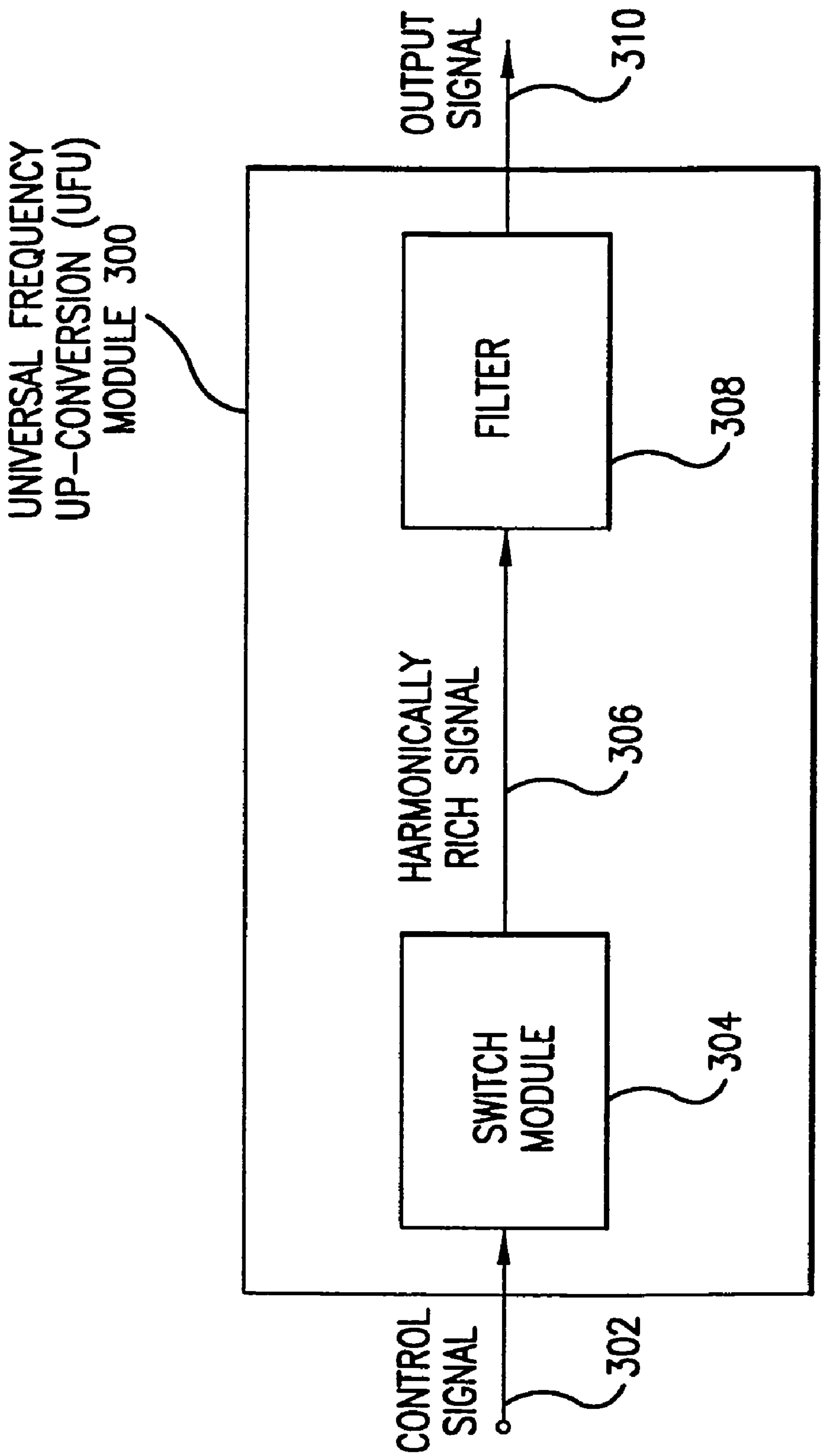
FIG. 3 is a block diagram of a universal frequency up-conversion (UFU) module according to an embodiment of the invention.

An example frequency up-conversion system 300 is illustrated in FIG. 3. The frequency up-conversion system 300 is now described.

Figures 6A, 6B, 6C, 6D:
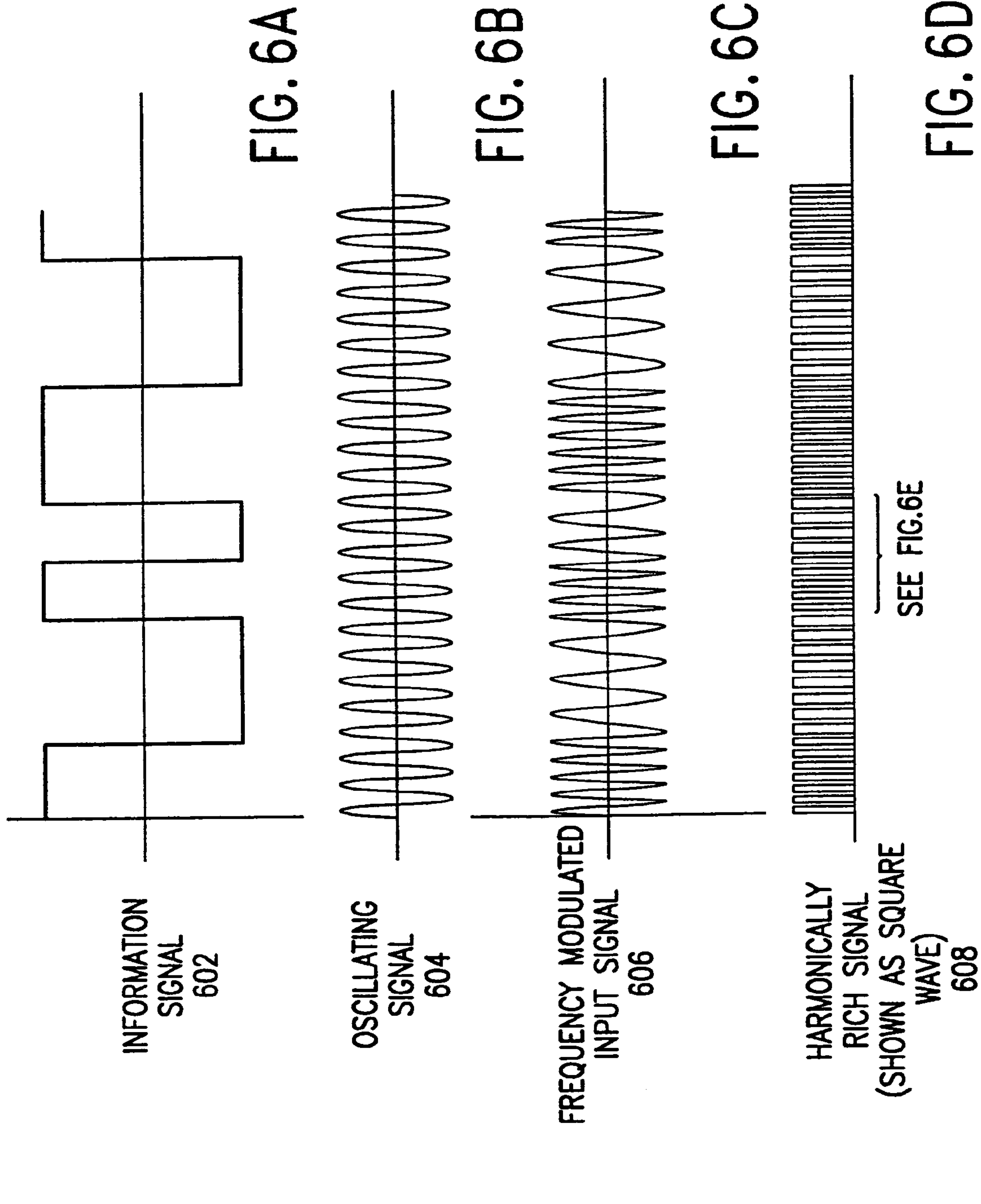
FIGS. 6A-6I illustrate example waveforms used to describe the operation of the UFU module.

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

The output of switch module 304 is a harmonically rich signal 306, shown for example in FIG. 6D as a harmonically rich signal 608. The harmonically rich signal 608 has a continuous and periodic waveform.

Figures 6E, 6F, 6G:
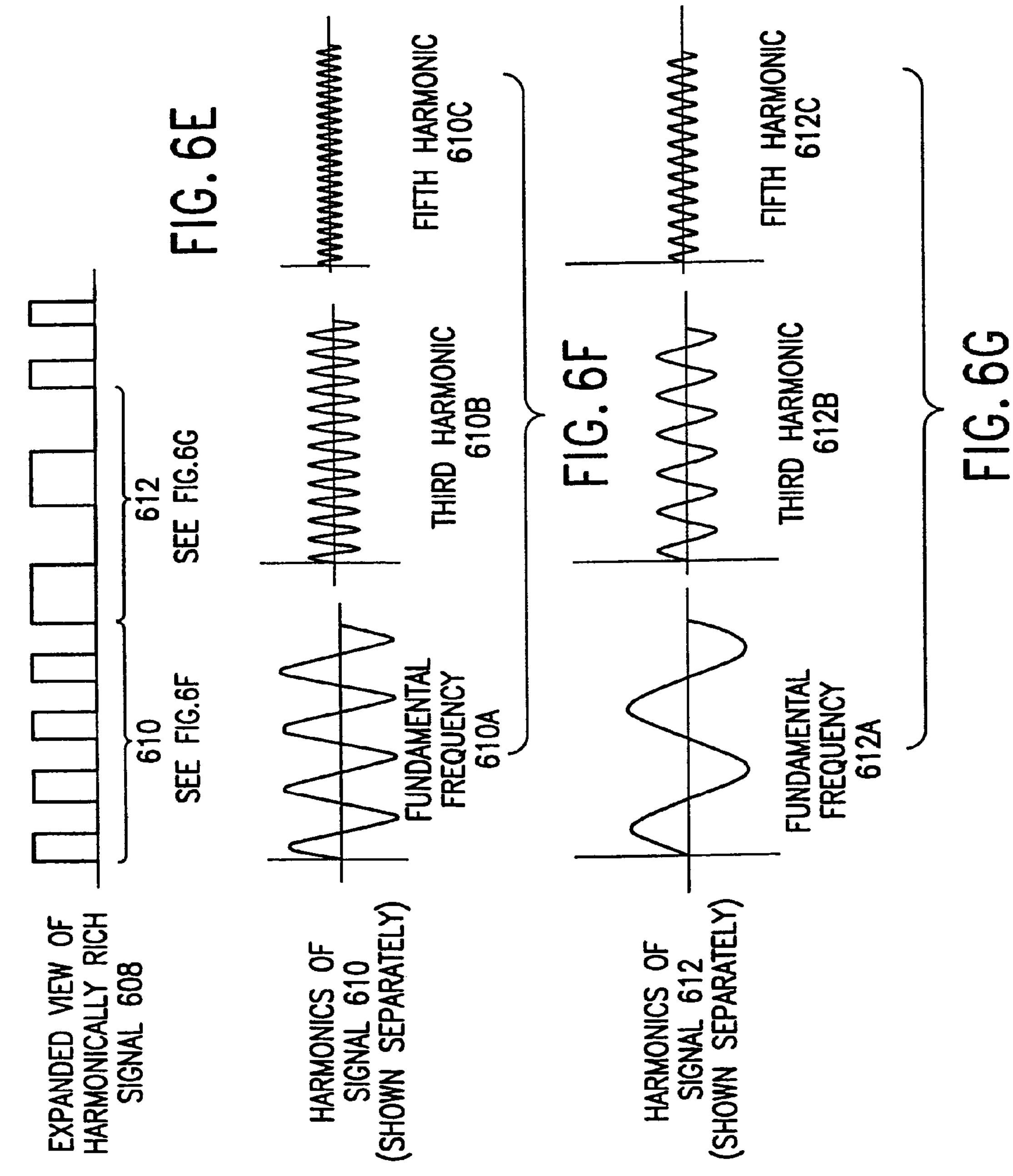

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6H:
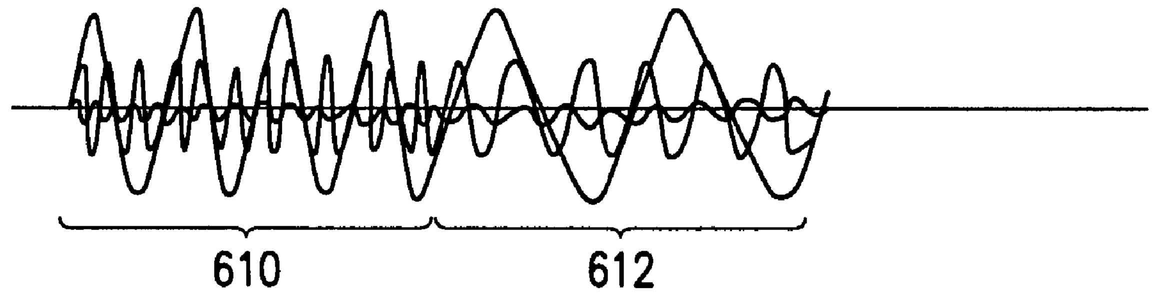
Figure 6I:
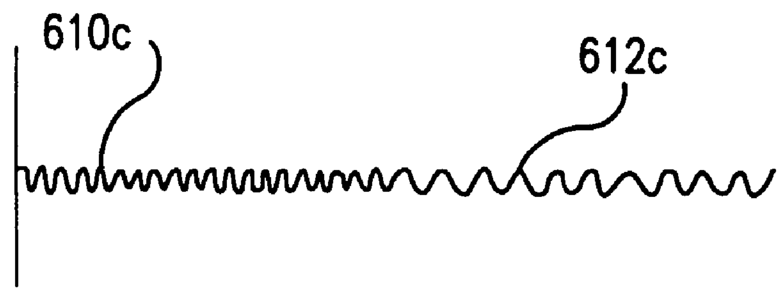

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

Figure 61:
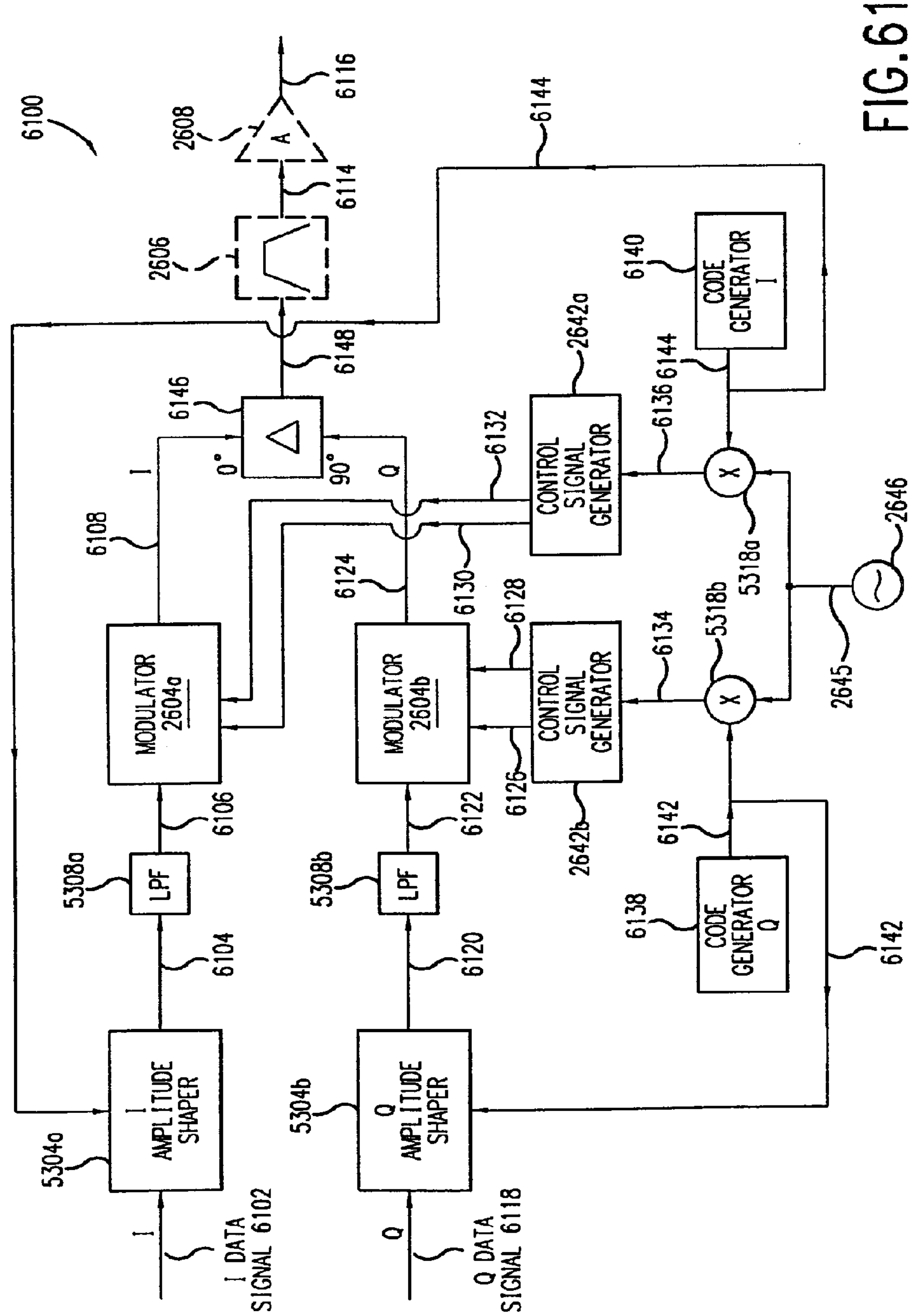
FIG. 61 illustrates an IQ transmitter 6100 according to embodiments of the invention.

A filter 308 filters out any undesired frequencies (harmonics), and outputs an electromagnetic (EM) signal at the desired harmonic frequency or frequencies as an output signal 310, shown for example as a filtered output signal 614 in FIG. 61.

Figure 4:
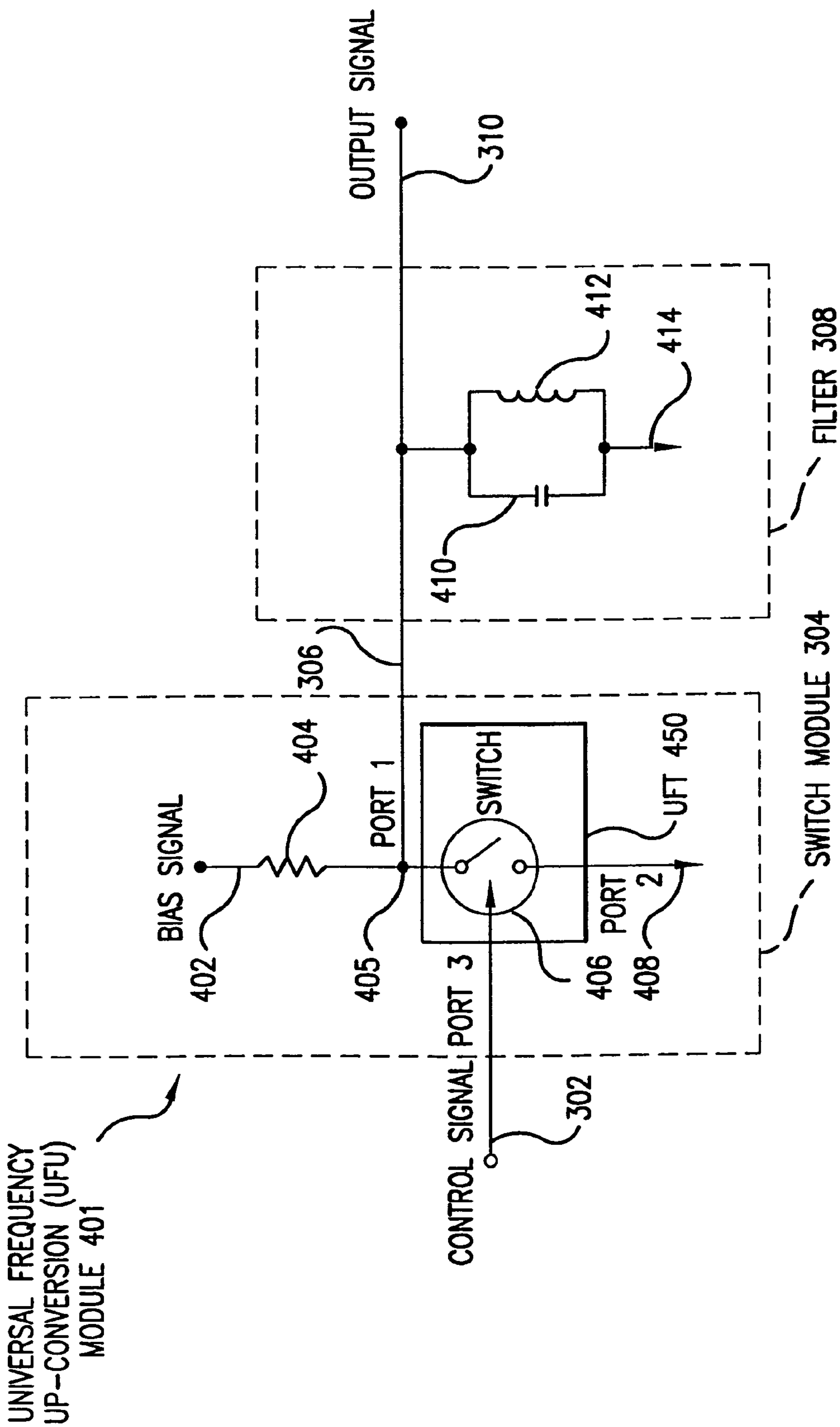
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
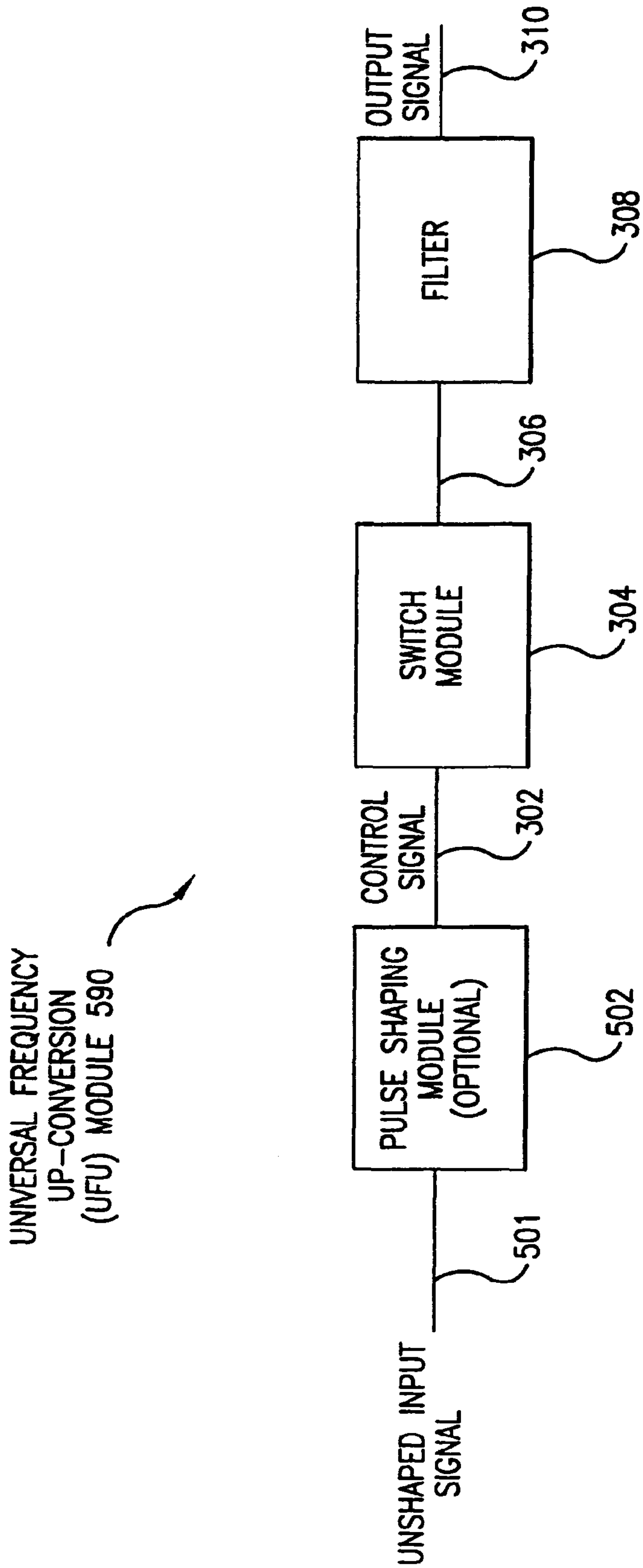
FIG. 5 is a block diagram of a universal frequency up-conversion (UFU) module according to an alternative embodiment of the invention.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

4. Enhanced Signal Reception

The present invention is directed to systems and methods of enhanced signal reception (ESR), and applications of same.

Figure 21:
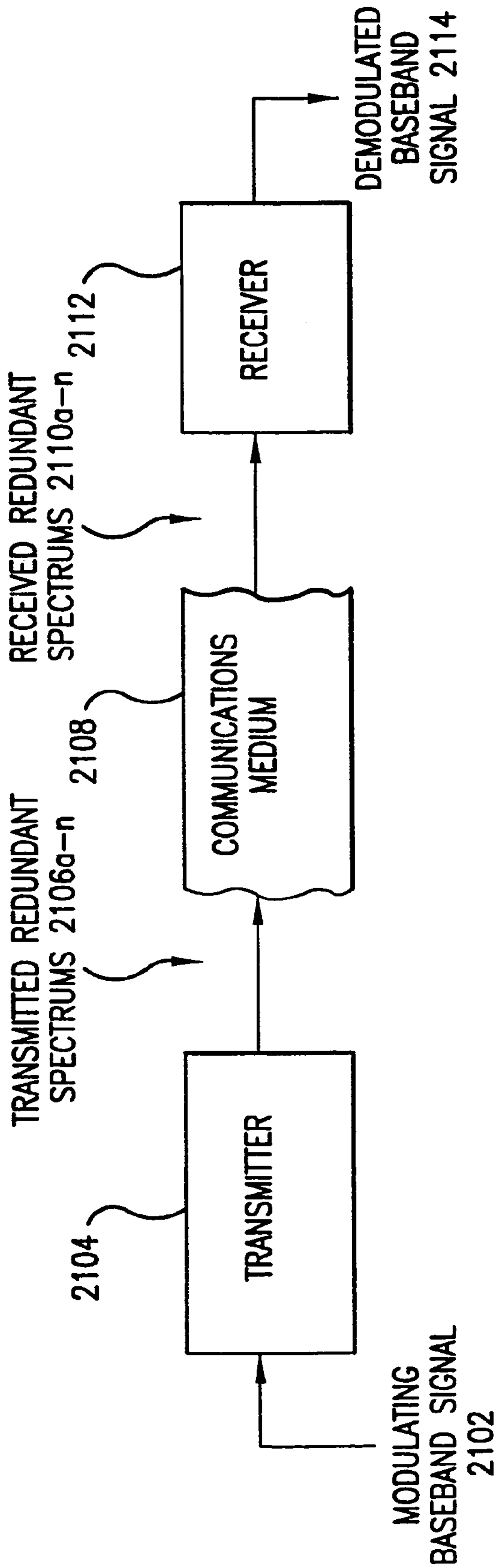
FIG. 21 illustrates an enhanced signal reception system according to an embodiment of the invention.

Referring to FIG. 21, transmitter 2104 accepts a modulating baseband signal 2102 and generates (transmitted) redundant spectrums 2106*a-n*, which are sent over communications medium 2108. Receiver 2112 recovers a demodulated baseband signal 2114 from (received) redundant spectrums 2110*a-n*. Demodulated baseband signal 2114 is representative of the modulating baseband signal 2102, where the level of similarity between the modulating baseband signal 2114 and the modulating baseband signal 2102 is application dependent.

Figures 22A, 22B, 22C, 22D:
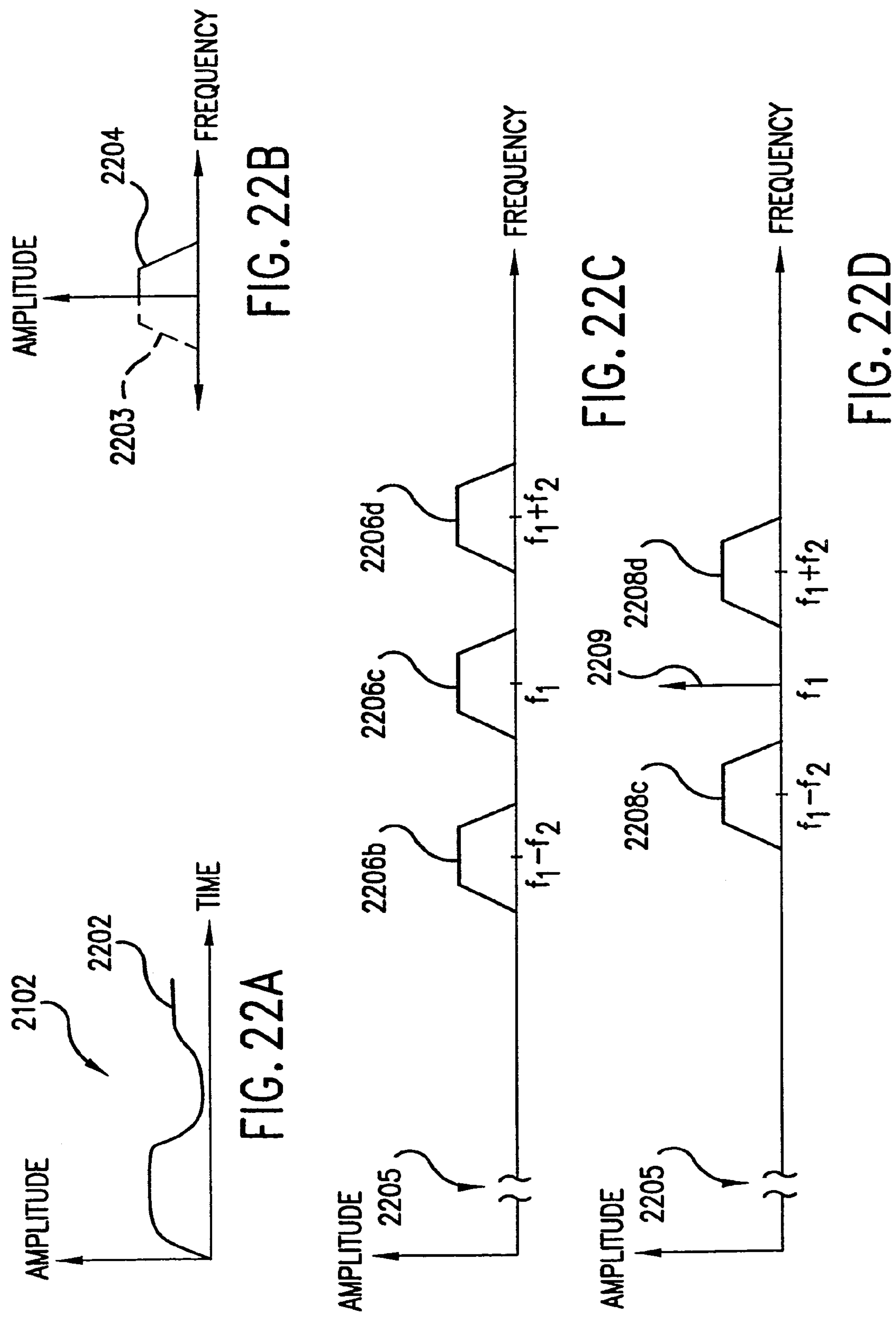
FIGS. 22A-22F are example waveforms used to describe the system of FIG. 21.

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22*a*, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106*a-n* contains the necessary information to substantially reconstruct the modulating baseband signal 2102. In other words, each redundant spectrum 2106*a-n* contains the necessary amplitude, phase, and frequency information to reconstruct the modulating baseband signal 2102.

FIG. 22C illustrates example transmitted redundant spectrums 2206*b-d*. Transmitted redundant spectrums 2206*b-d* are illustrated to contain three redundant spectrums for illustration purposes only. Any number of redundant spectrums could be generated and transmitted as will be explained in following discussions.

Transmitted redundant spectrums 2206*b-d* are centered at $f_1$, with a frequency spacing $f_2$ between adjacent spectrums. Frequencies $f_1$ and $f_2$ are dynamically adjustable in real-time as will be shown below. FIG. 22D illustrates an alternate embodiment, where redundant spectrums 2208*c,d* are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Figure 22E:
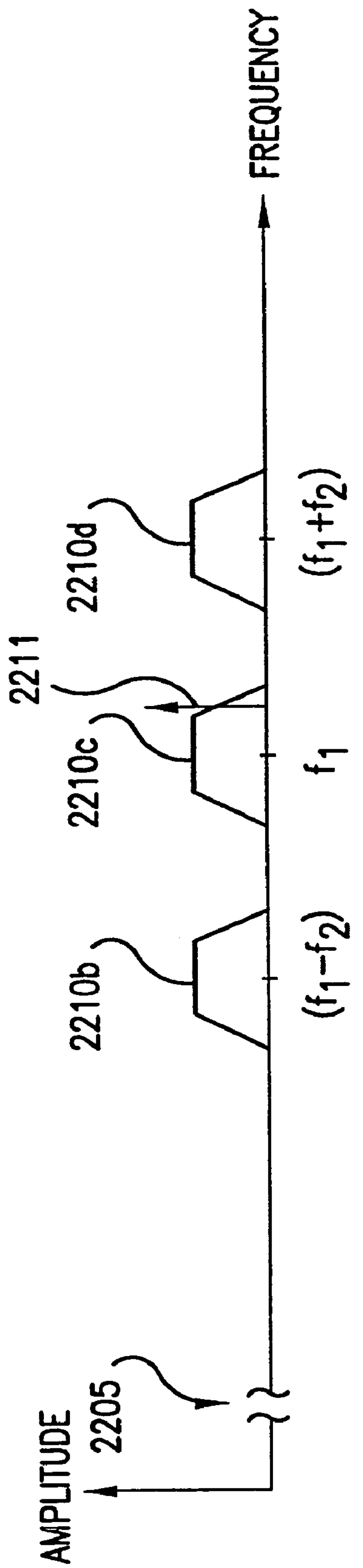

Received redundant spectrums 2110*a-n* are substantially similar to transmitted redundant spectrums 2106*a-n*, except for the changes introduced by the communications medium 2108. Such changes can include but are not limited to signal attenuation, and signal interference. FIG. 22E illustrates example received redundant spectrums 2210*b-d*. Received redundant spectrums 2210*b-d* are substantially similar to transmitted redundant spectrums 2206*b-d*, except that redundant spectrum 2210*c* includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

Figure 22F:
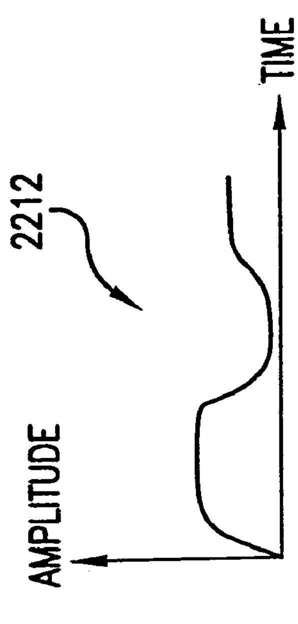

As stated above, demodulated baseband signal 2114 is extracted from one or more of received redundant spectrums 2210*b-d*. FIG. 22F illustrates example demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
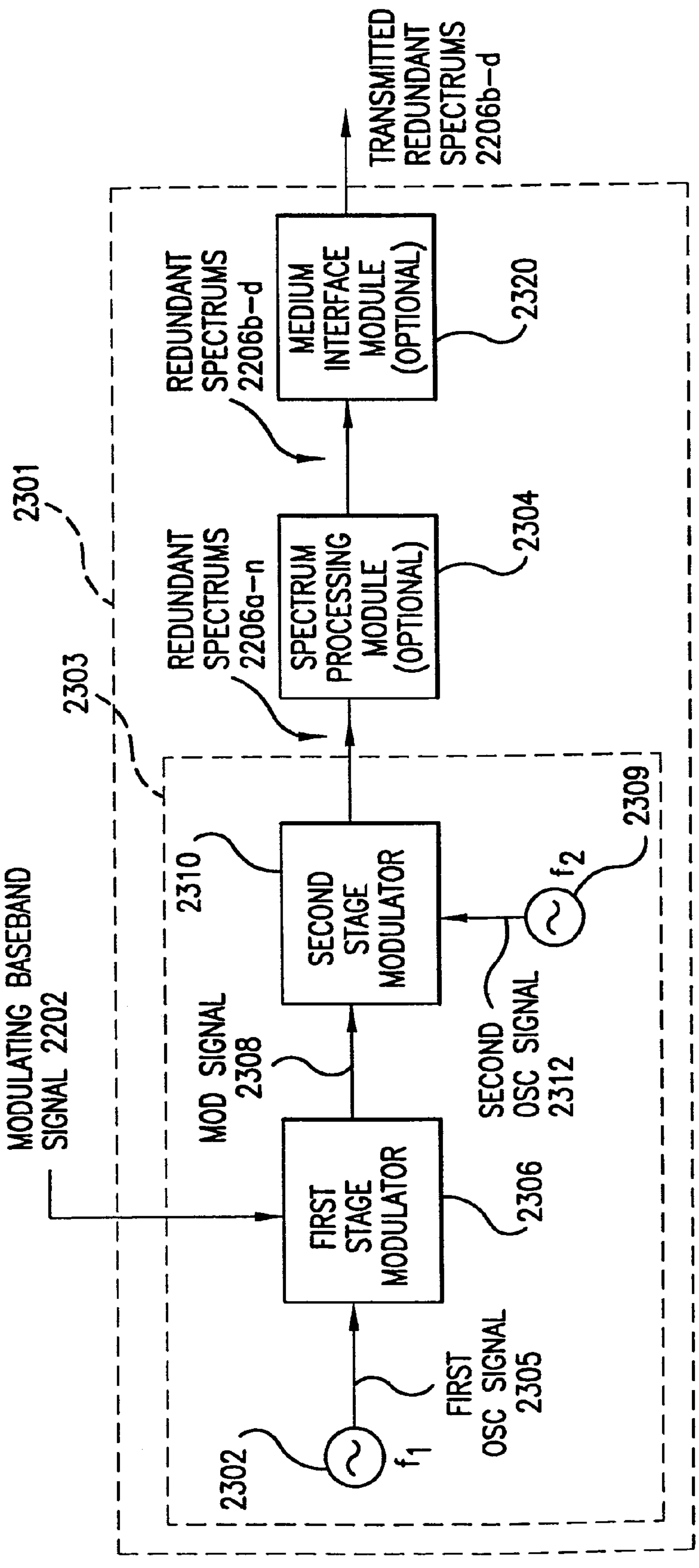
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206*b-d*. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Figure 23B:
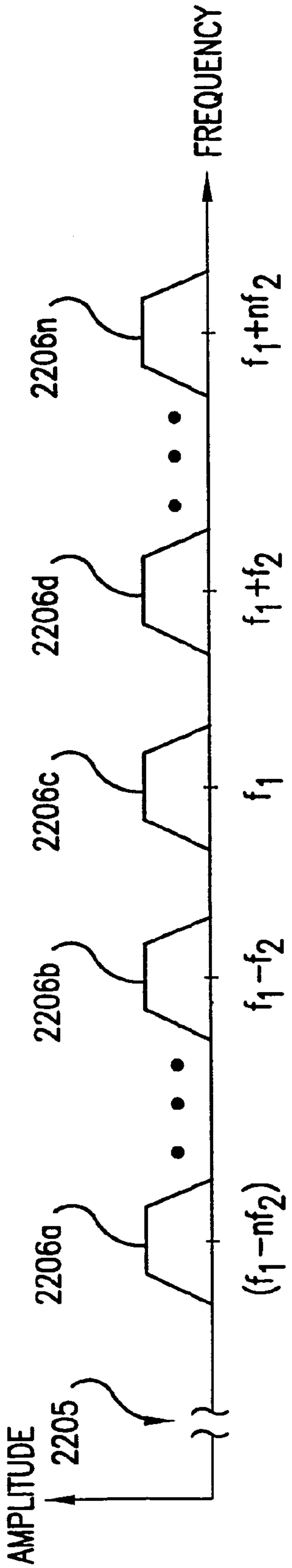
FIGS. 23B and 23C are example waveforms used to further describe the enhanced signal reception system according to an embodiment of the invention.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectrums 2206*a-n* shown in FIG. 23B. Second stage modulator 2310 is preferably a phase modulator, or a frequency modulator, although other types of modulation may be implemented including but not limited to amplitude modulation. Each redundant spectrum 2206*a-n* contains the necessary amplitude, phase, and frequency information to substantially reconstruct the modulating baseband signal 2202.

Redundant spectrums 2206*a-n* are substantially centered around $f_1$, which is the characteristic frequency of first oscillating signal 2305. Also, each redundant spectrum 2206*a-n* (except for 2206*c*) is offset from $f_1$ by approximately a multiple of $f_2$ (Hz), where $f_2$ is the frequency of the second oscillating signal 2312. Thus, each redundant spectrum 2206*a-n* is offset from an adjacent redundant spectrum by $f_2$ (Hz). This allows the spacing between adjacent redundant spectrums to be adjusted (or tuned) by changing $f_2$ that is associated with second oscillator 2309. Adjusting the spacing between adjacent redundant spectrums allows for dynamic real-time tuning of the bandwidth occupied by redundant spectrums 2206*a-n*.

In one embodiment, the number of redundant spectrums 2206*a-n* generated by transmitter 2301 is arbitrary and may be unlimited as indicated by the "a-n" designation for redundant spectrums 2206*a-n*. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206*a-n* prior to transmission over communications medium 2108.

Figure 23C:
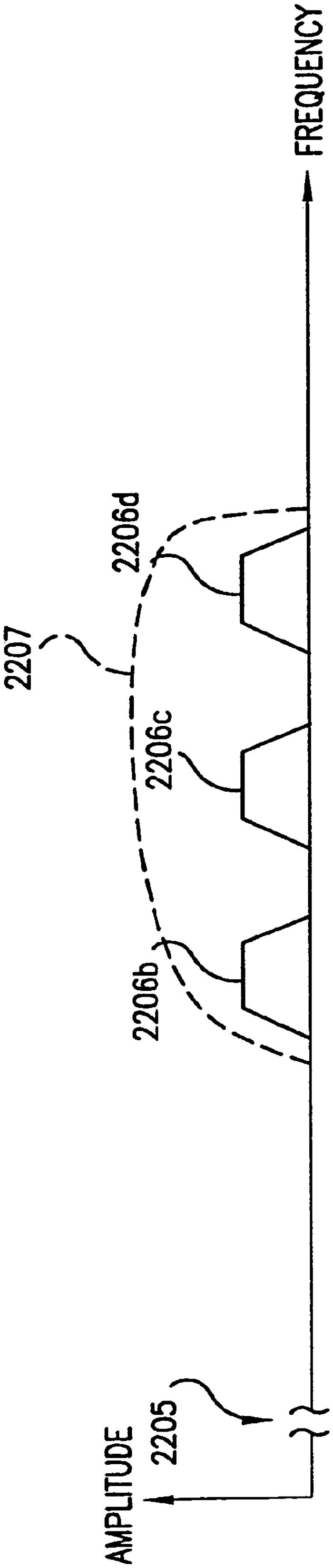

In one embodiment, spectrum processing module 2304 includes a filter with a passband 2207 (FIG. 23C) to select redundant spectrums 2206*b-d* for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
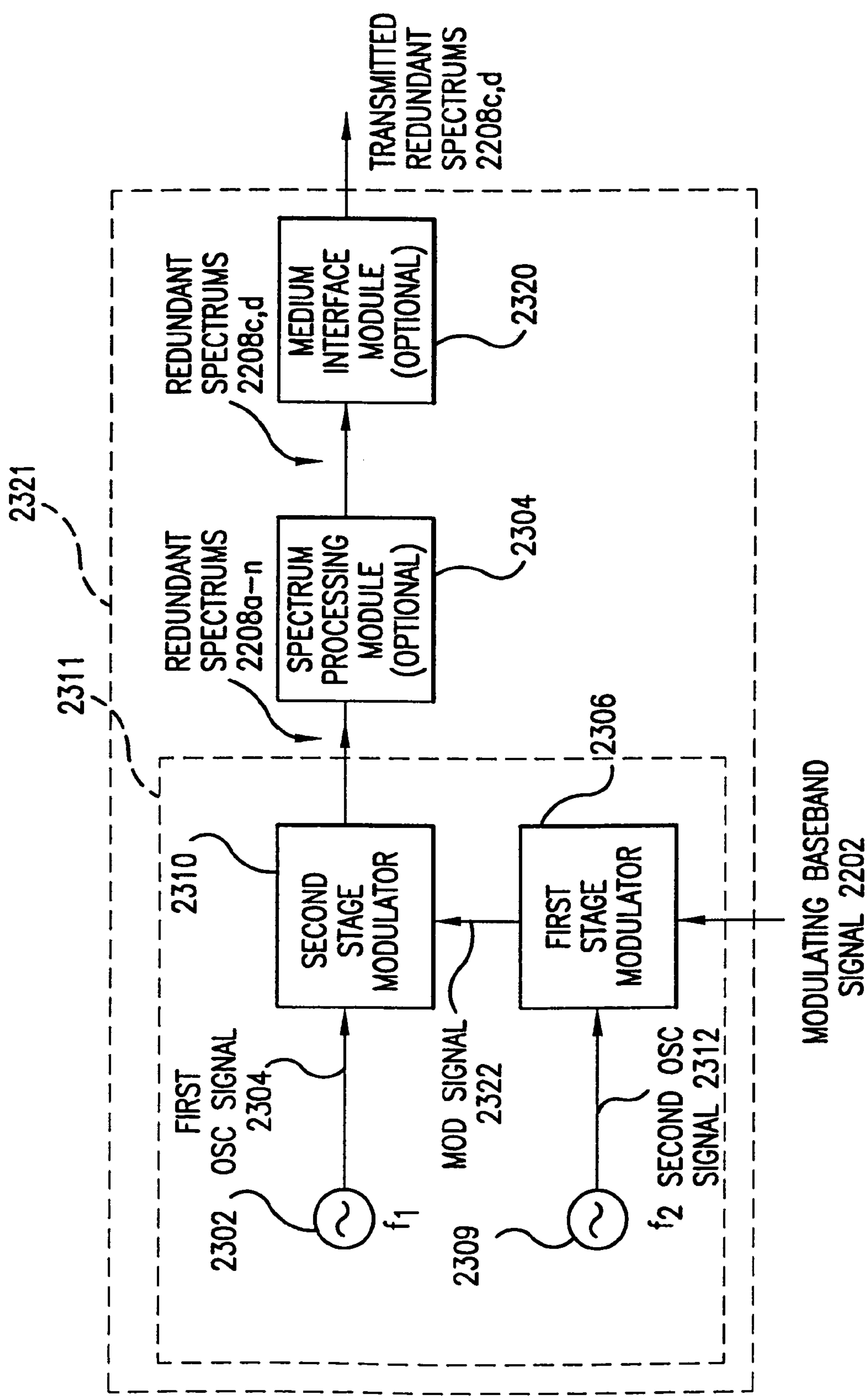
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208*c-d* and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

Figure 23E:
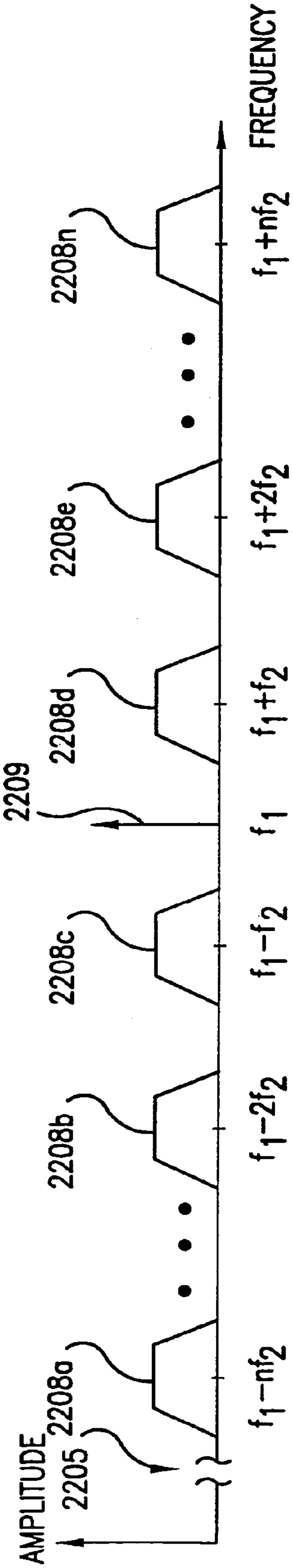
FIGS. 23E and 23F are example waveforms used to further describe the enhanced signal reception system according to an embodiment of the invention.
Figure 23F:
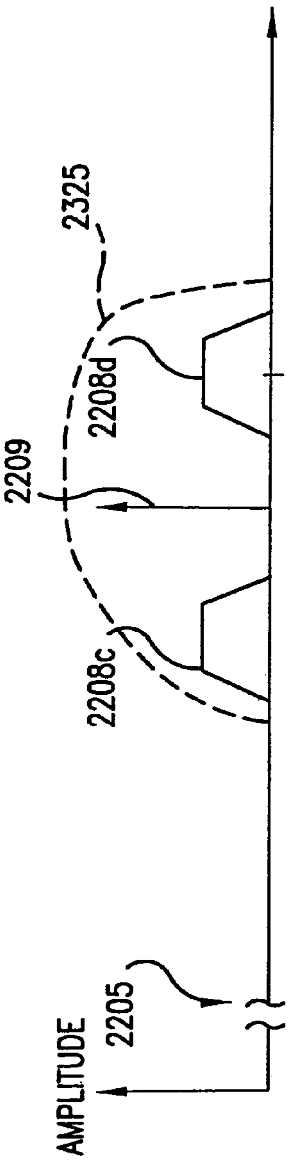

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectrums 2208*a-n*, as shown in FIG. 23E. Second stage modulator 2310 is preferably a phase or frequency modulator, although other modulators could used including but not limited to an amplitude modulator.

Redundant spectrums 2208*a-n* are centered on unmodulated spectrum 2209 (at $f_1$ Hz), and adjacent spectrums are separated by $f_2$ Hz. The number of redundant spectrums 2208*a-n* generated by generator 2311 is arbitrary and unlimited, similar to spectrums 2206*a-n* discussed above. Therefore, optional spectrum processing module 2304 may also include a filter with passband 2325 to select, for example, spectrums 2208*c,d* for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208*c,d* over communications medium 2108.

Figure 24A:
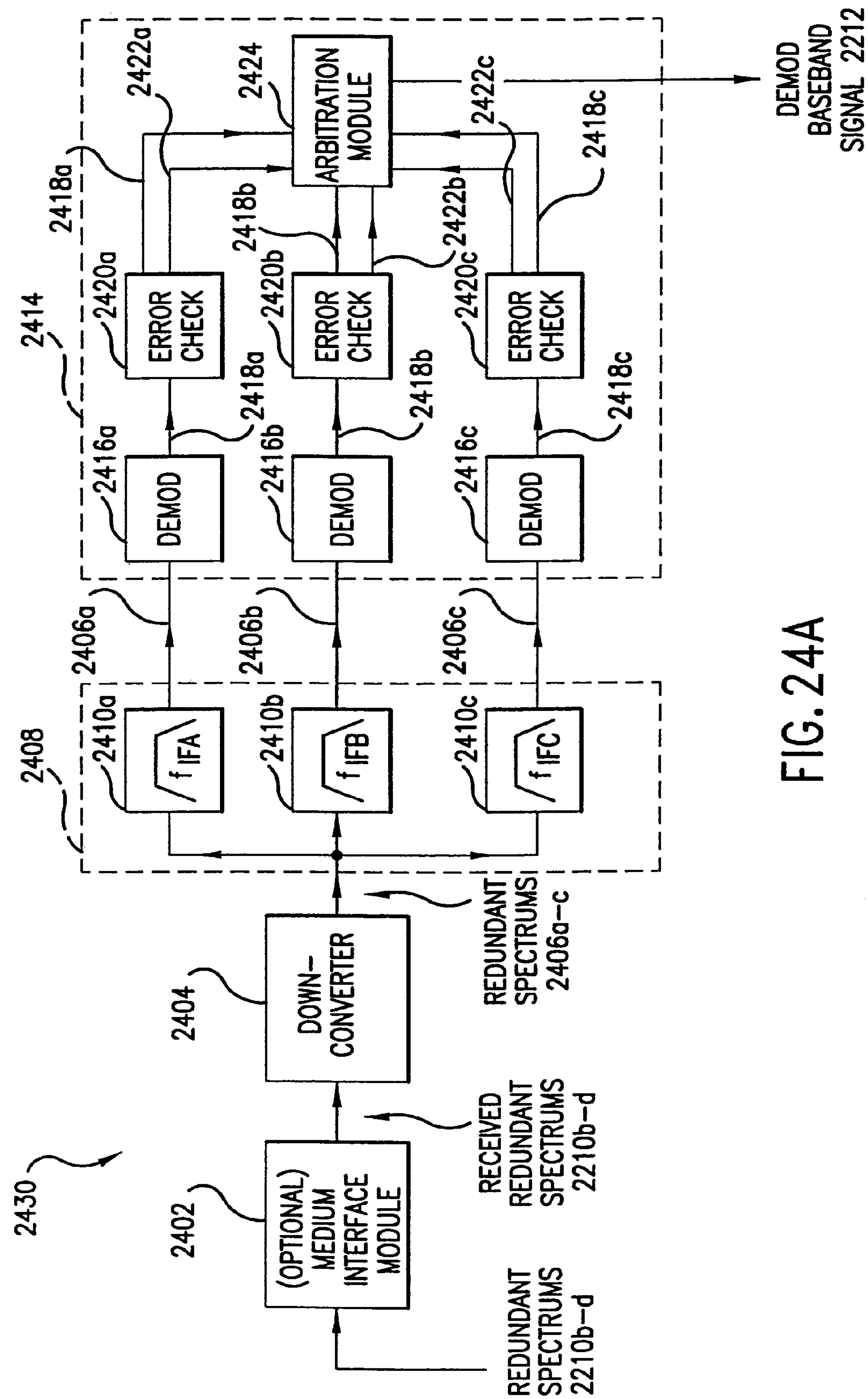
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410*a-c*. Data extraction module 2414 includes demodulators 2416*a-c*, error check modules 2420*a-c*, and arbitration module 2424. Receiver 2430 will be discussed in relation to the signal diagrams in FIGS. 24B-24J.

Figure 24B:
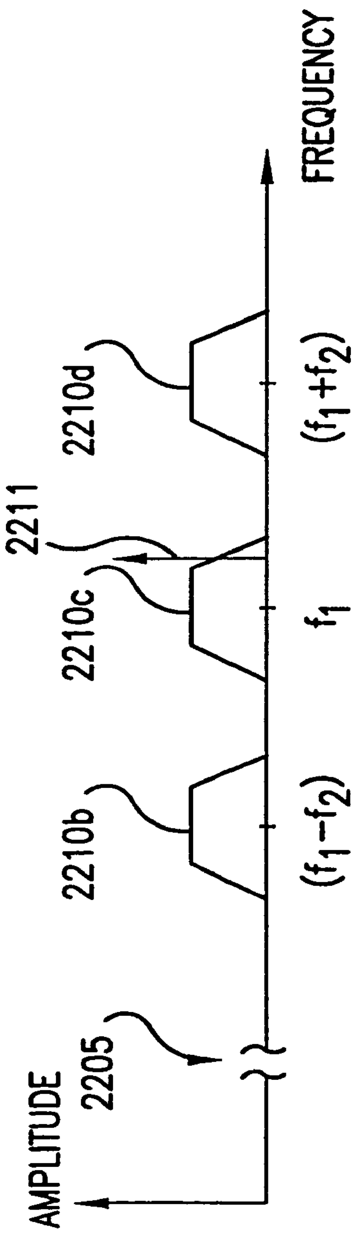
FIGS. 24B-24J are example waveforms used to further describe the enhanced signal reception system according to an embodiment of the invention.
Figure 24C:
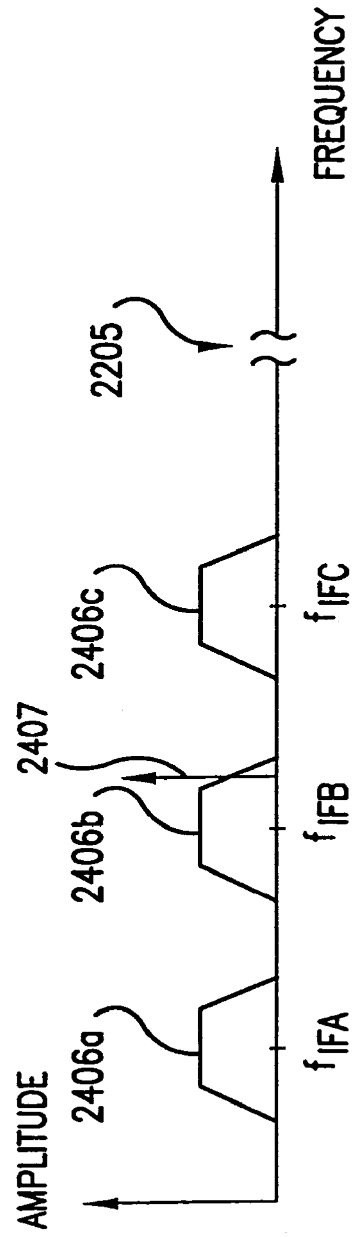
Figures 24D, 24E, 24F, 24G, 24H, 24I:
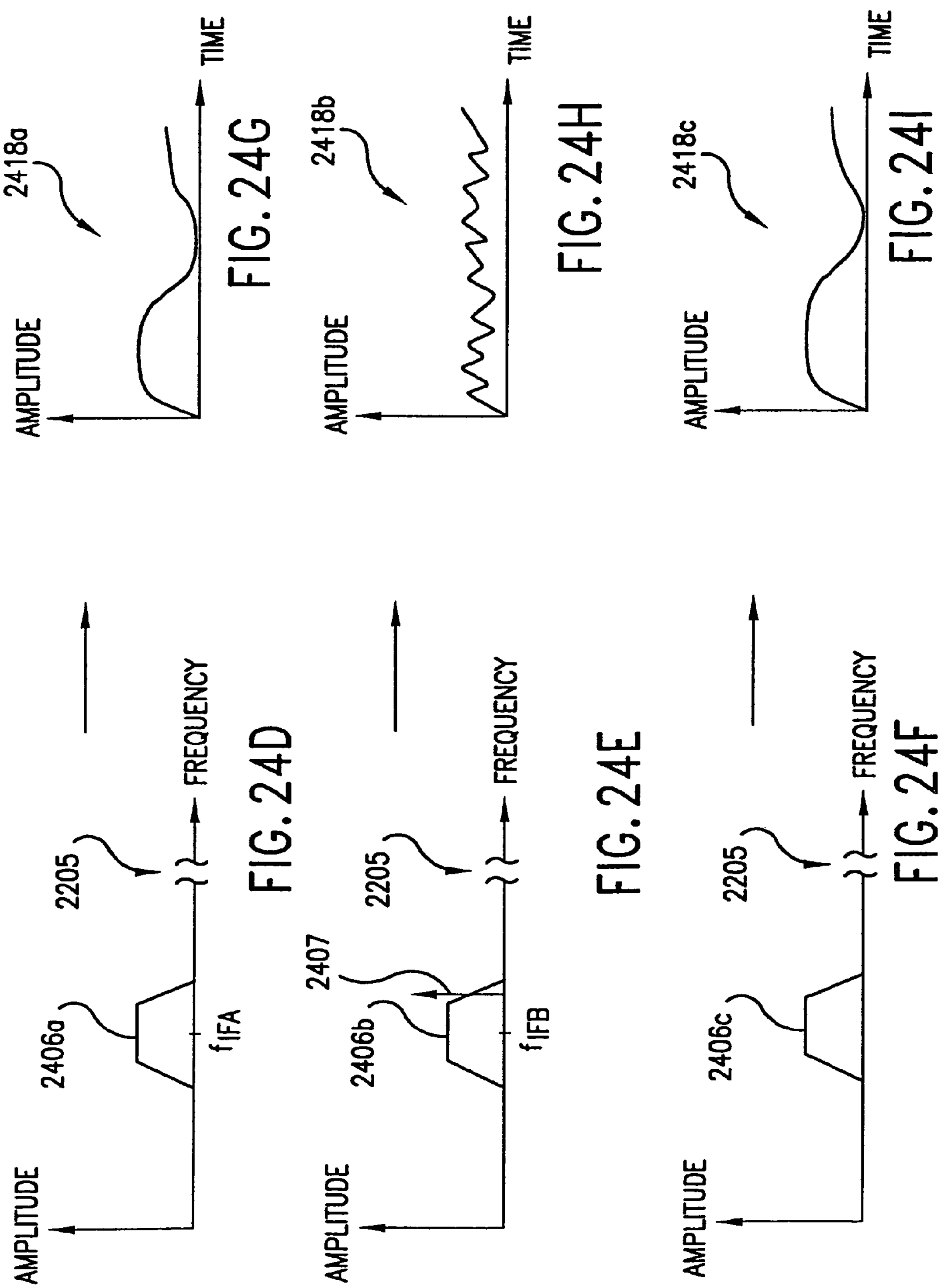
Figure 24J:
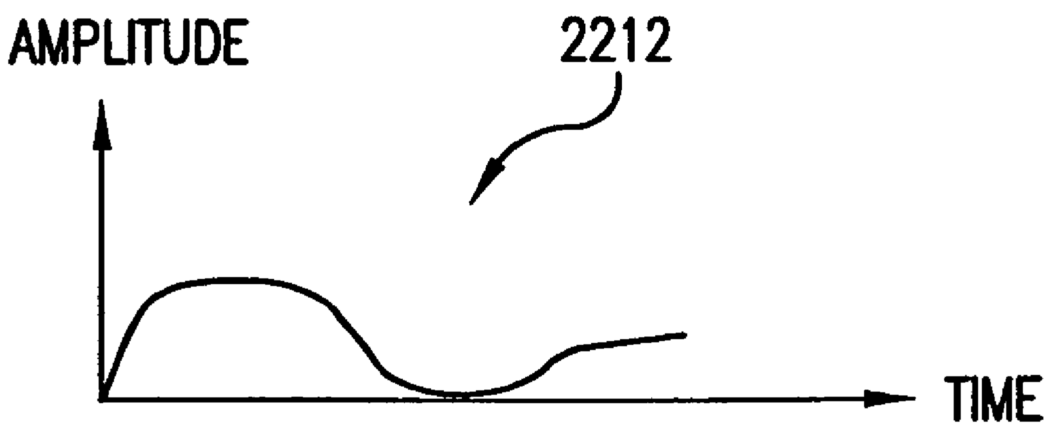

In one embodiment, optional medium interface module 2402 receives redundant spectrums 2210*b-d* (FIG. 22E, and FIG. 24B). Each redundant spectrum 2210*b-d* includes the necessary amplitude, phase, and frequency information to substantially reconstruct the modulating baseband signal used to generated the redundant spectrums. However, in the present example, spectrum 2210*c* also contains jamming signal 2211, which may interfere with the recovery of a baseband signal from spectrum 2210*c*. Down-converter 2404 down-converts received redundant spectrums 2210*b-d* to lower intermediate frequencies, resulting in redundant spectrums 2406*a-c* (FIG. 24C). Jamming signal 2211 is also down-converted to jamming signal 2407, as it is contained within redundant spectrum 2406*b*. Spectrum isolation module 2408 includes filters 2410*a-c* that isolate redundant spectrums 2406*a-c* from each other (FIGS. 24D-24F, respectively). Demodulators 2416*a-c* independently demodulate spectrums 2406*a-c*, resulting in demodulated baseband signals 2418*a-c*, respectively (FIGS. 24G-24I). Error check modules 2420*a-c* analyze demodulate baseband signal 2418*a-c* to detect any errors. In one embodiment, each error check module 2420*a-c* sets an error flag 2422*a-c* whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Referring to FIGS. 24G-I, arbitration module 2424 will select either demodulated baseband signal 2418*a* or 2418*c*, because error check module 2420*b* will set the error flag 2422*b* that is associated with demodulated baseband signal 2418*b*.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, incorporated herein by reference in its entirety.

5. Unified Down-conversion And Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
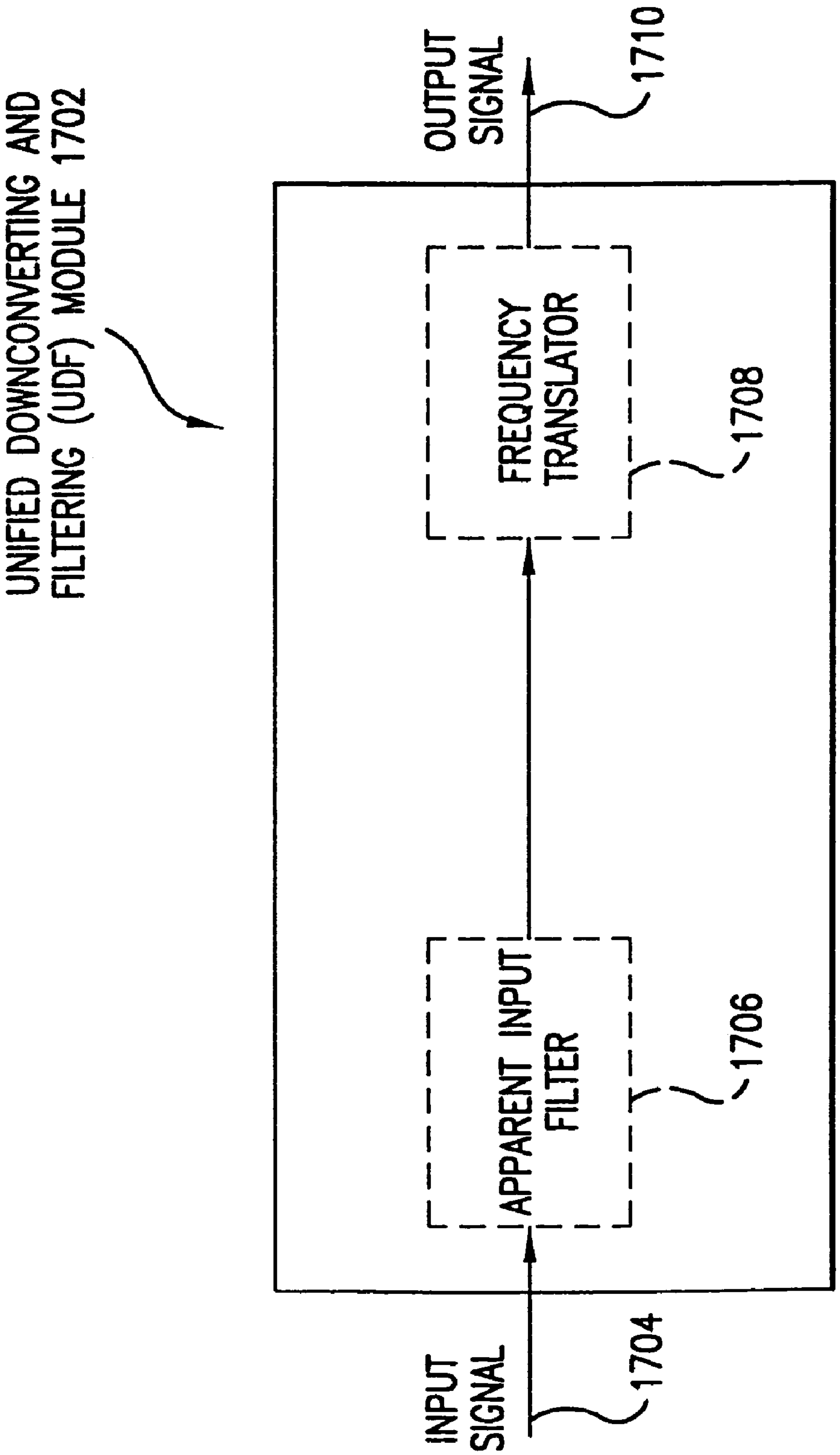
FIG. 17 illustrates a unified down-converting and filtering (UDF) module according to an embodiment of the invention.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
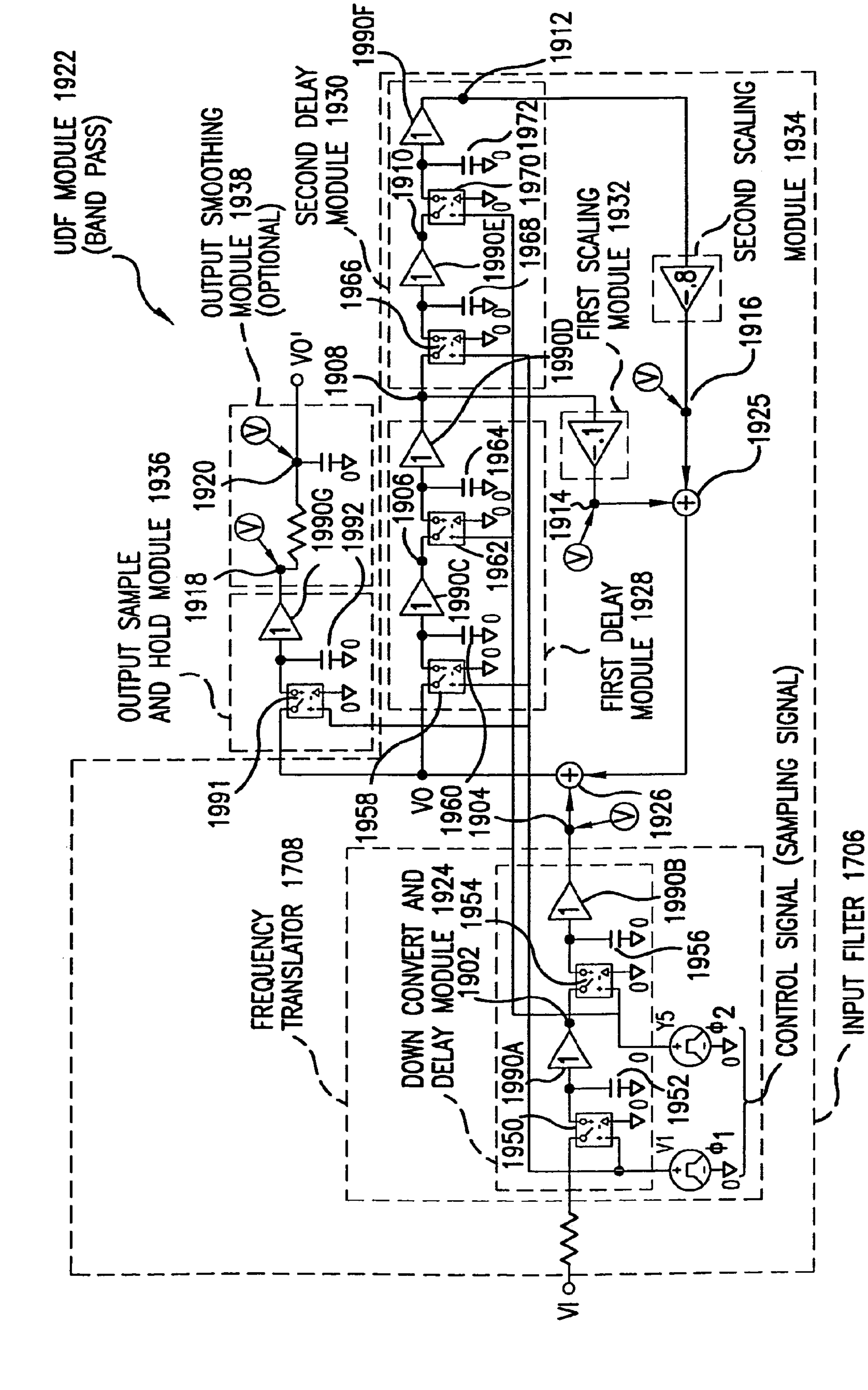
FIG. 19 is a detailed diagram of an example UDF module according to an embodiment of the invention.

FIG. 19 illustrates an example implementation of the unified down-converting and filtering (UDF) module 1922. The UDF module 1922 performs the frequency translation operation and the frequency selectivity operation in an integrated, unified manner as described above, and as further described below.

In the example of FIG. 19, the frequency selectivity operation performed by the UDF module 1922 comprises a band-pass filtering operation according to EQ. 1, below, which is an example representation of a band-pass filtering transfer function.

$$VO=\alpha_1 z^{-1} VI-\beta_1 z^{-1} VO-\beta_0 z^{-2} VO \quad \text{EQ. 1}$$

It should be noted, however, that the invention is not limited to band-pass filtering.

Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, the output smoothing module 1938 is optional.

As further described below, in the example of FIG. 19, the down-convert and delay module 1924 and the first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in the down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, which is herein incorporated by reference in its entirety.

Also at the rising edge of $\phi_1$ at time t−1, a switch 1958 in the first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 in the second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in the down-convert and delay module 1924 closes, allowing a capacitor 1956 to charge to the level of the capacitor 1952. Accordingly, the capacitor 1956 charges to $VI_{t-1}$, such that node 1904 is at $VI_{t-1}$. This is indicated by cell 1810 in Table 1802.

The UDF module 1922 may optionally include a unity gain module 1990A between capacitors 1952 and 1956. The unity gain module 1990A operates as a current source to enable capacitor 1956 to charge without draining the charge from capacitor 1952. For a similar reason, the UDF module 1922 may include other unity gain modules 1990B-1990G. It should be understood that, for many embodiments and applications of the invention, these unity gain modules 1990A-1990G are optional. The structure and operation of the unity gain modules 1990 will be apparent to persons skilled in the relevant art(s).

Also at the rising edge of $\phi_2$ at time t−1, a switch 1962 in the first delay module 1928 closes, allowing a capacitor 1964 to charge to the level of the capacitor 1960. Accordingly, the capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in the second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_1$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 is at $VO_{t-1}$. This is indicated by cell 1824 in Table 1802.

At the rising edge of $\phi_2$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated by cell 1828 in Table 1802.

Also at the rising edge of $\phi_2$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_2$ at time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t+1}$. Therefore, node 1902 is at $VI_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_1$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example of FIG. 19, the first scaling module 1932 scales the value at node 1908 (i.e., the output of the first delay module 1928) by a scaling factor of −0.1. Accordingly, the value present at node 1914 at time t+1 is $-0.1*VO_t$. Similarly, the second scaling module 1934 scales the value present at node 1912 (i.e., the output of the second scaling module 1930) by a scaling factor of −0.8. Accordingly, the value present at node 1916 is $-0.8*VO_{t-1}$ at time t+1.

At time t+1, the values at the inputs of the summer 1926 are: $VI_t$ at node 1904, $-0.1*VO_t$ at node 1914, and $-0.8*VO_{t-1}$ at node 1916 (in the example of FIG. 19, the values at nodes 1914 and 1916 are summed by a second summer 1925, and this sum is presented to the summer 1926). Accordingly, at time t+1, the summer generates a signal equal to $VI_t-0.1*VO_t-0.8*VO_{t-1}$.

At the rising edge of $\phi_1$ at time t+1, a switch 1991 in the output sample and hold module 1936 closes, thereby allowing a capacitor 1992 to charge to $VO_{t+1}$. Accordingly, the capacitor 1992 charges to $VO_{t+1}$, which is equal to the sum generated by the adder 1926. As just noted, this value is equal to: $VI_t-0.1*VO_t-0.8*VO_{t-1}$. This is indicated in cell 1850 of Table 1802. This value is presented to the optional output smoothing module 1938, which smooths the signal to thereby generate the instance of the output signal $VO_{t+1}$. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, incorporated herein by reference in its entirety.

6. Example Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
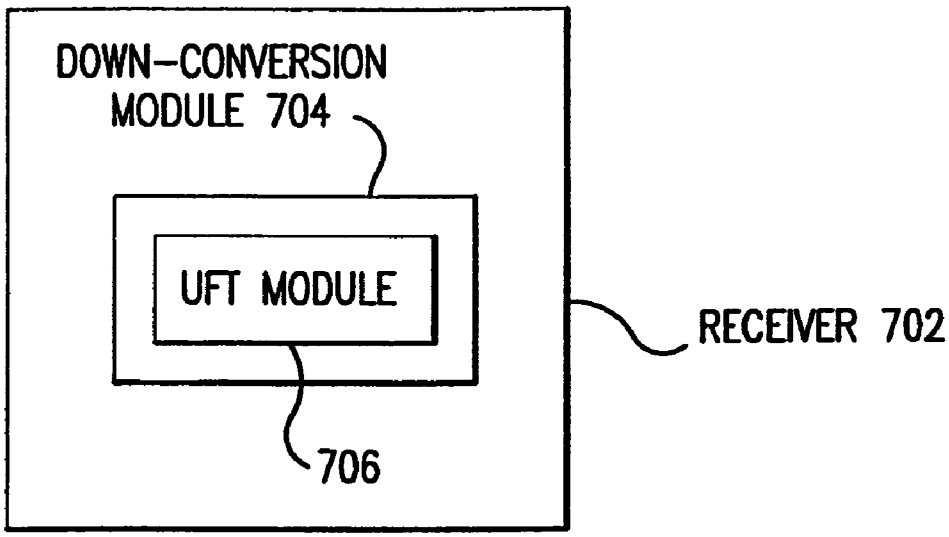
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
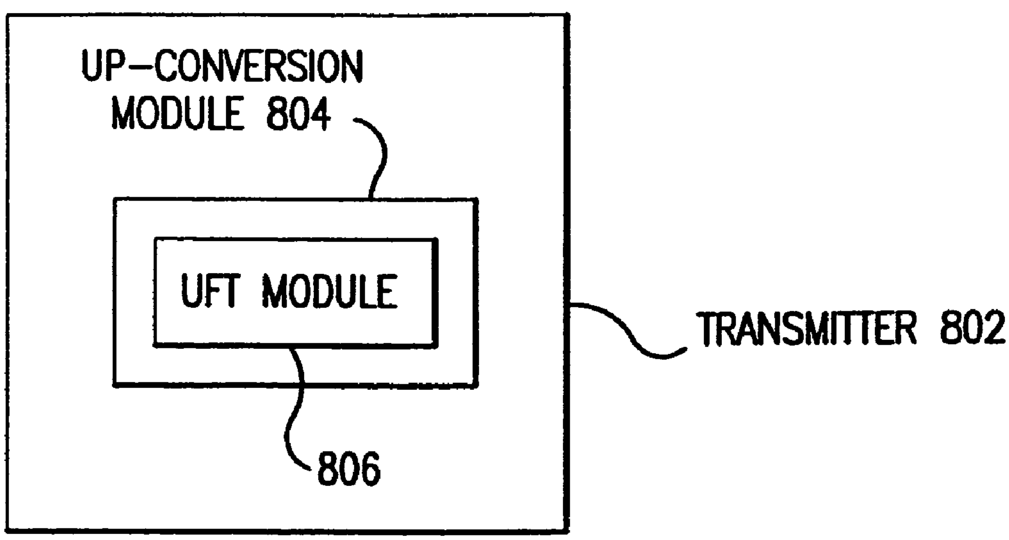
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
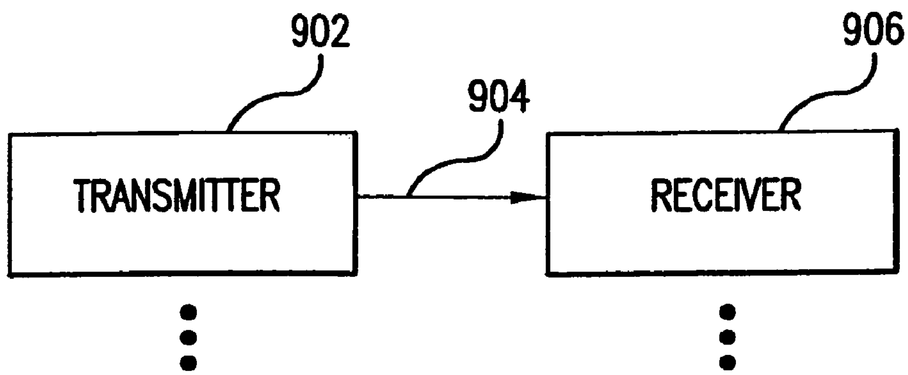
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
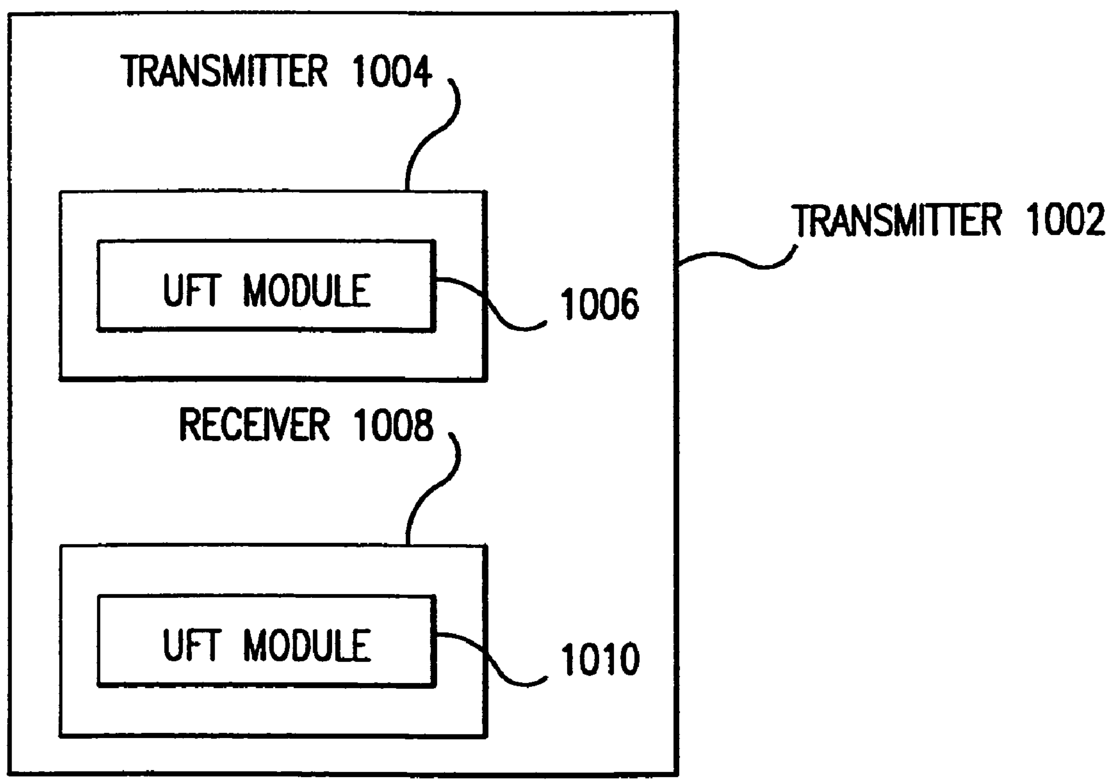
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
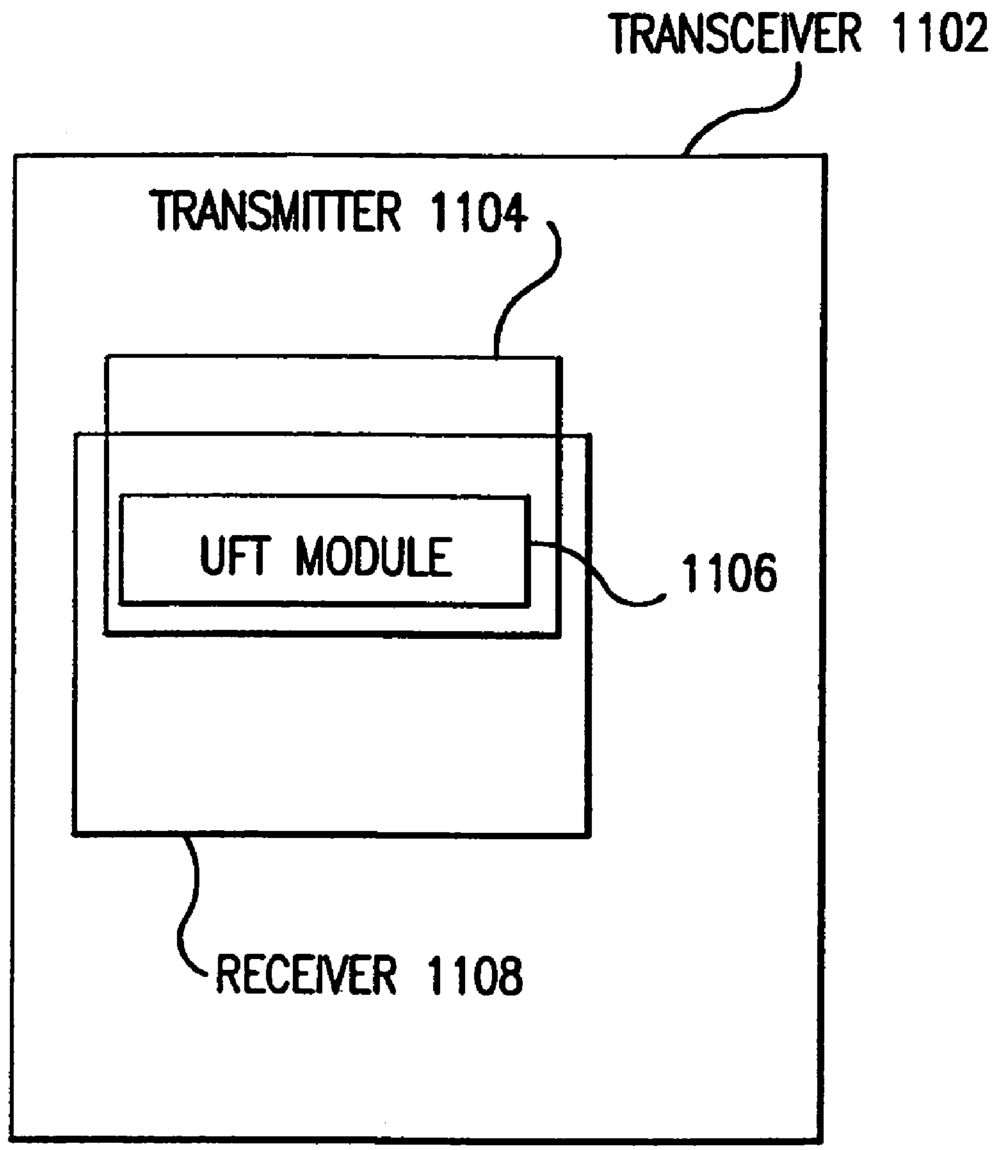
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a UFT module 1106.

Figure 12:
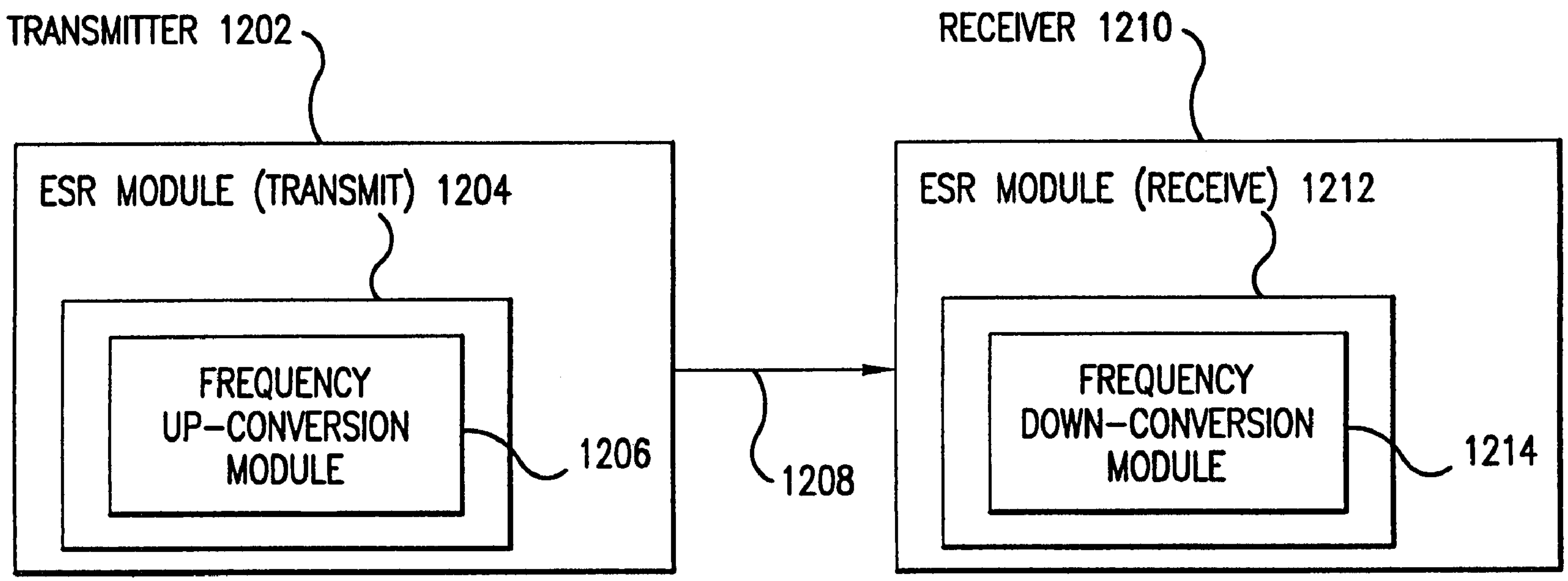
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
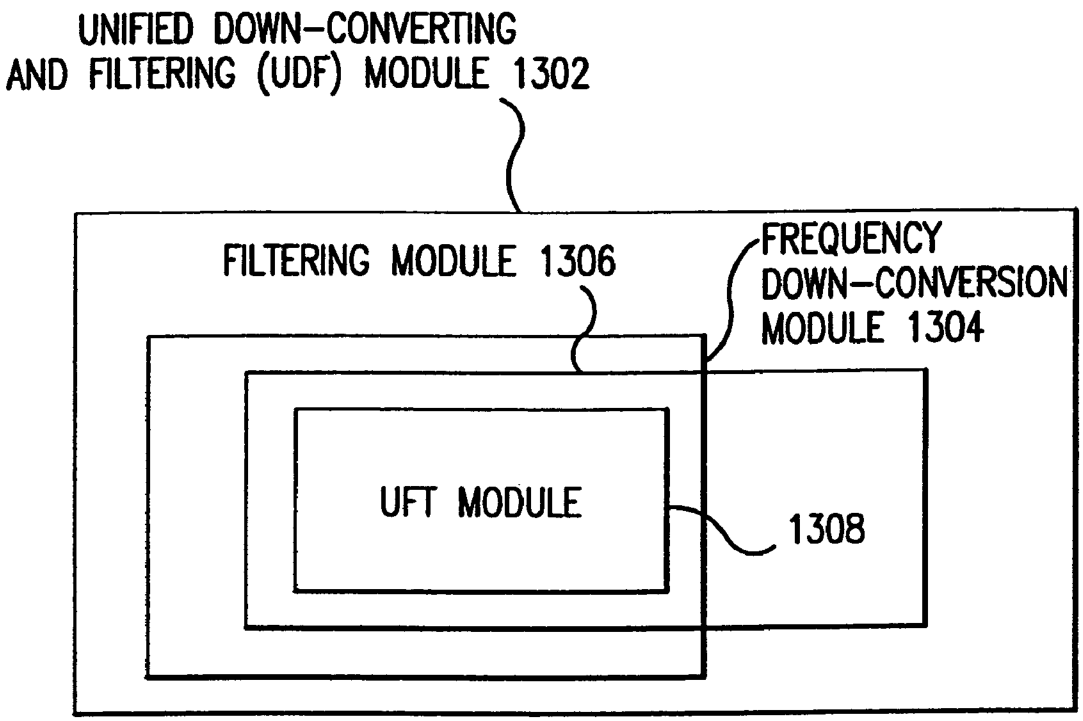
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
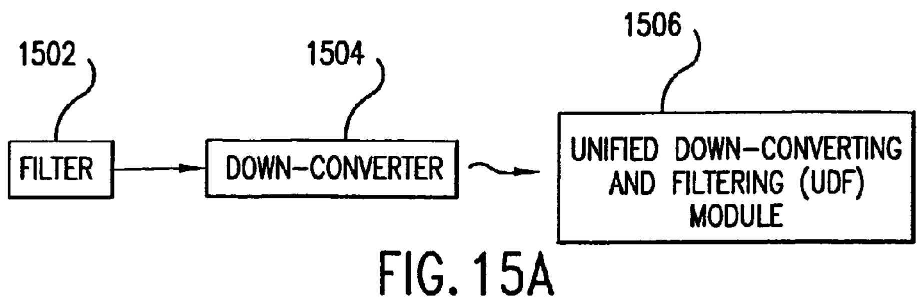
FIGS. 15A-15F illustrate example applications of the UDF module according to embodiments of the invention.
Figure 15B:
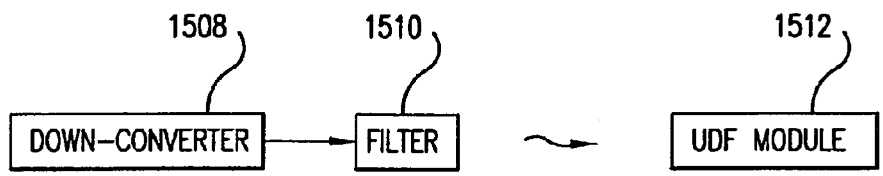
Figure 15C:
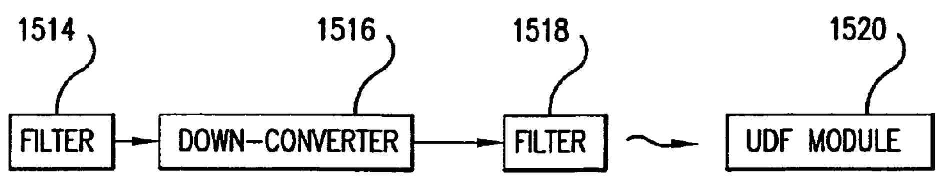
Figure 15D:
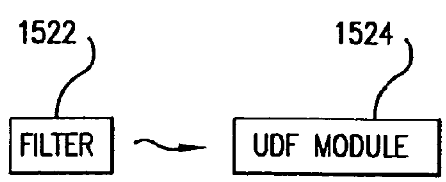
Figure 15E:
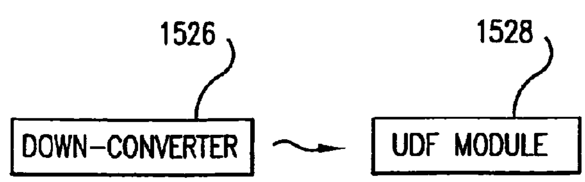
Figure 15F:
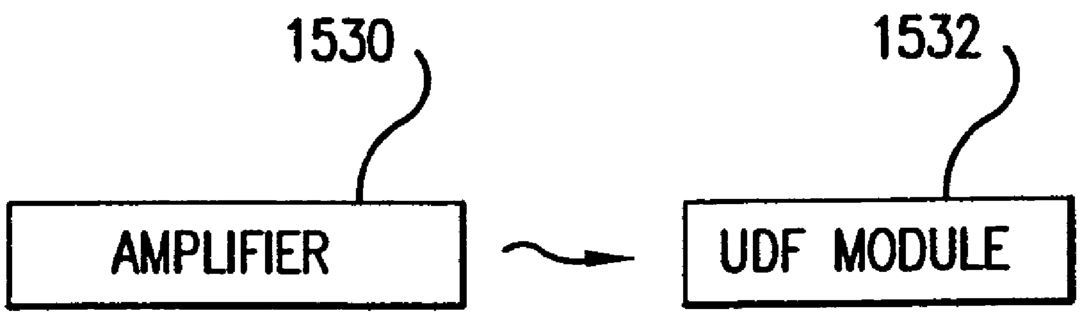

Unified down-conversion and filtering according to the invention is useful in applications involving filtering and/or frequency down-conversion. This is depicted, for example, in FIGS. 15A-15F. FIGS. 15A-15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
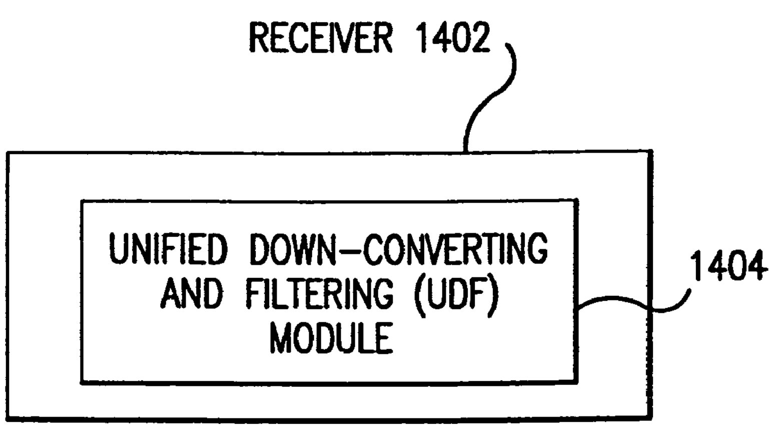
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
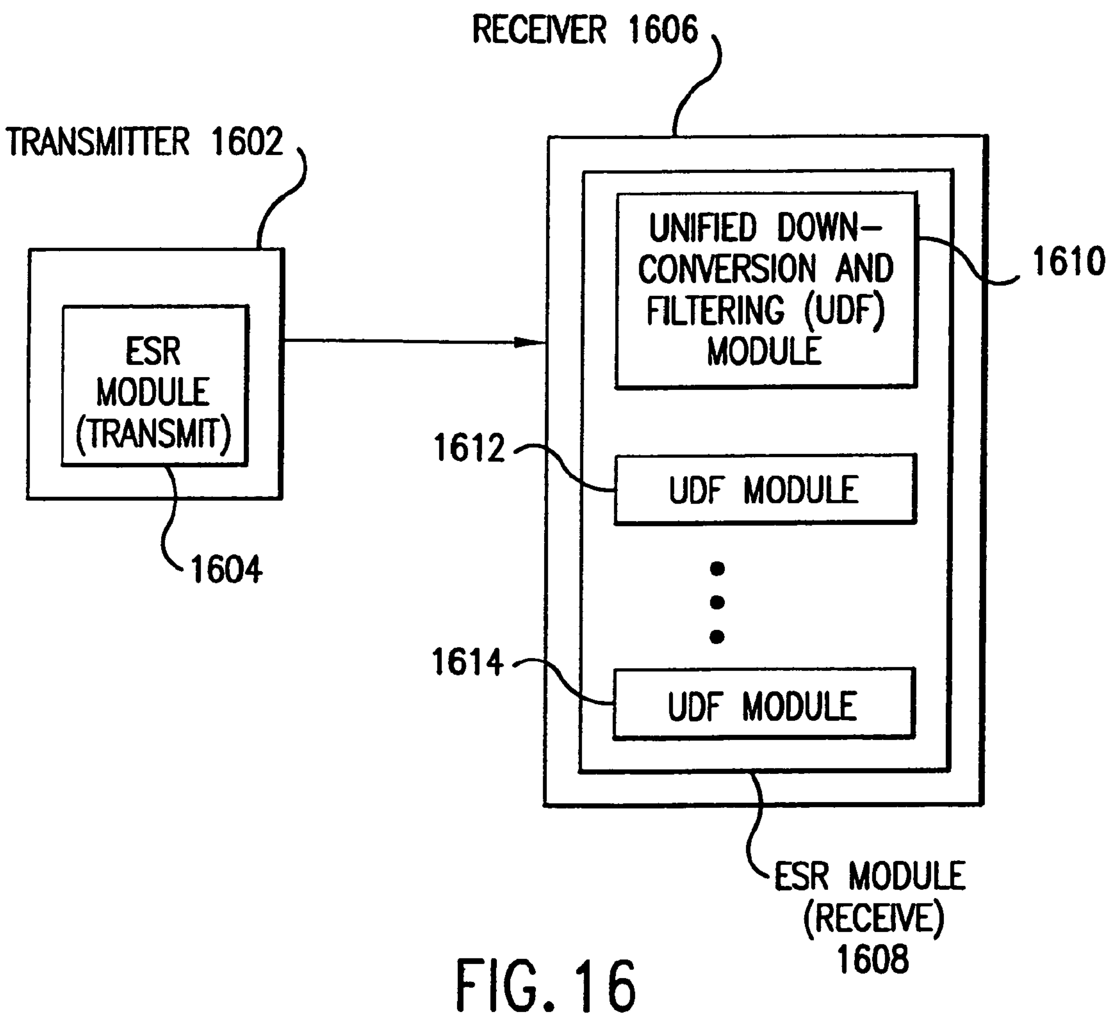
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules 1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to forth useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to forth a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional example applications are described below.

7. Universal Transmitter

The present invention is directed at a universal transmitter using, in embodiments, two or more UFT modules in a balanced vector modulator configuration. The universal transmitter can be used to create virtually every known and useful waveform used in analog and digital communications applications in wired and wireless markets. By appropriately selecting the inputs to the universal transmitter, a host of signals can be synthesized including but not limited to AM, FM, BPSK, QPSK, MSK, QAM, ODFM, multi-tone, and spread-spectrum signals (including CDMA and frequency hopping). As will be shown, the universal transmitter can up-convert these waveforms using less components than that seen with conventional super-hetrodyne approaches. In other words, the universal transmitter does not require multiple IF stages (having intermediate filtering) to up-convert complex waveforms that have demanding spectral growth requirements. The elimination of intermediate IF stages reduces part count in the transmitter and therefore leads to cost savings. As will be shown, the present invention achieves these savings without sacrificing performance.

Furthermore, the use of a balanced configuration means that carrier insertion can be attenuated or controlled during up-conversion of a baseband signal. Carrier insertion is caused by the variation of transmitter components (e.g. resistors, capacitors, etc.), which produces DC offset voltages throughout the transmitter. Any DC offset voltage gets up-converted, along with the baseband signal, and generates spectral energy (or carrier insertion) at the carrier frequency $f_C$. In many transmit applications, it is highly desirable to minimize the carrier insertion in an up-converted signal because the sideband(s) carry the baseband information and any carrier insertion is wasted energy that reduces efficiency.

Figure 25A:
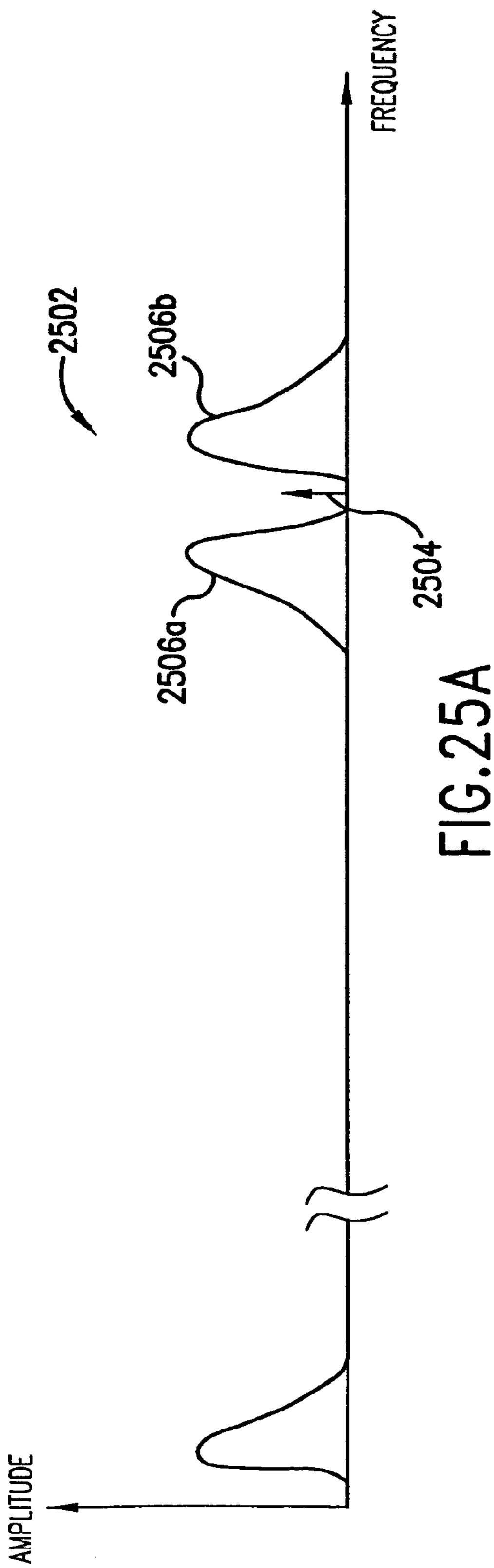
FIGS. 25A-B illustrate carrier insertion.
Figure 25B:
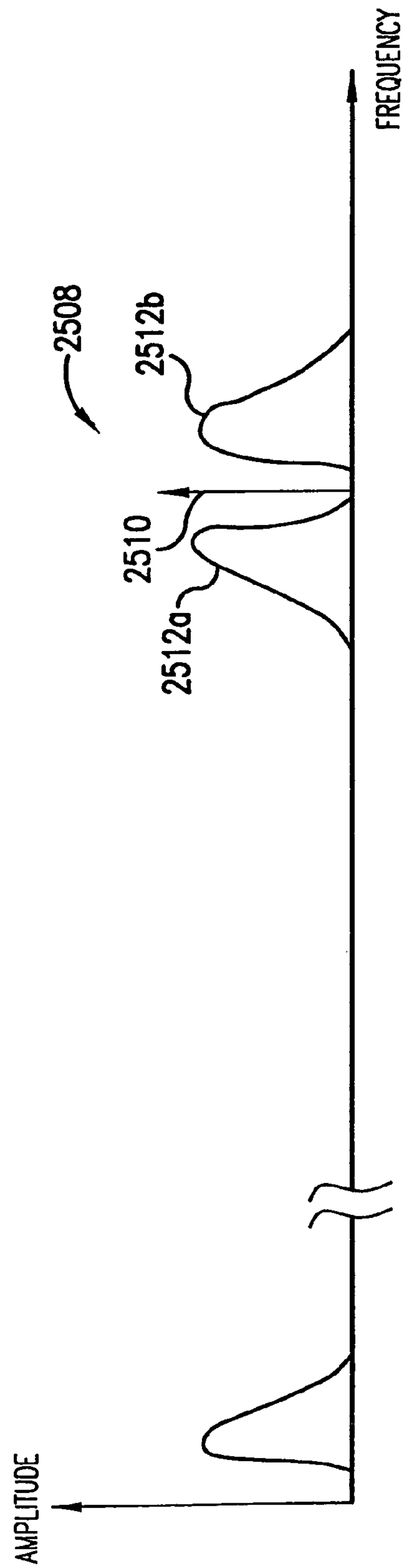

FIGS. 25A-B graphically illustrate carrier insertion in the context of up-converted signals that carry baseband information in the corresponding signal sidebands. FIG. 25A depicts an up-converted signal 2502 having minimal carrier energy 2504 when compared to sidebands 2506*a* and 2506*b*. In these transmitter applications, the present invention can be configured to minimize carrier insertion by limiting the relative DC offset voltage that is present in the transmitter. Alternatively, some transmit applications require sufficient carrier insertion for coherent demodulation of the transmitted signal at the receiver. This illustrated by FIG. 25B, which shows up-converted signal 2508 having carrier energy 2510 that is somewhat larger than sidebands 2512*a* and 2512*b*. In these applications, the present invention can be configured to introduce a DC offset voltage that generates the desired carrier insertion.

7.1 Universal Transmitter Having 2 UFT Modules

Figure 26A:
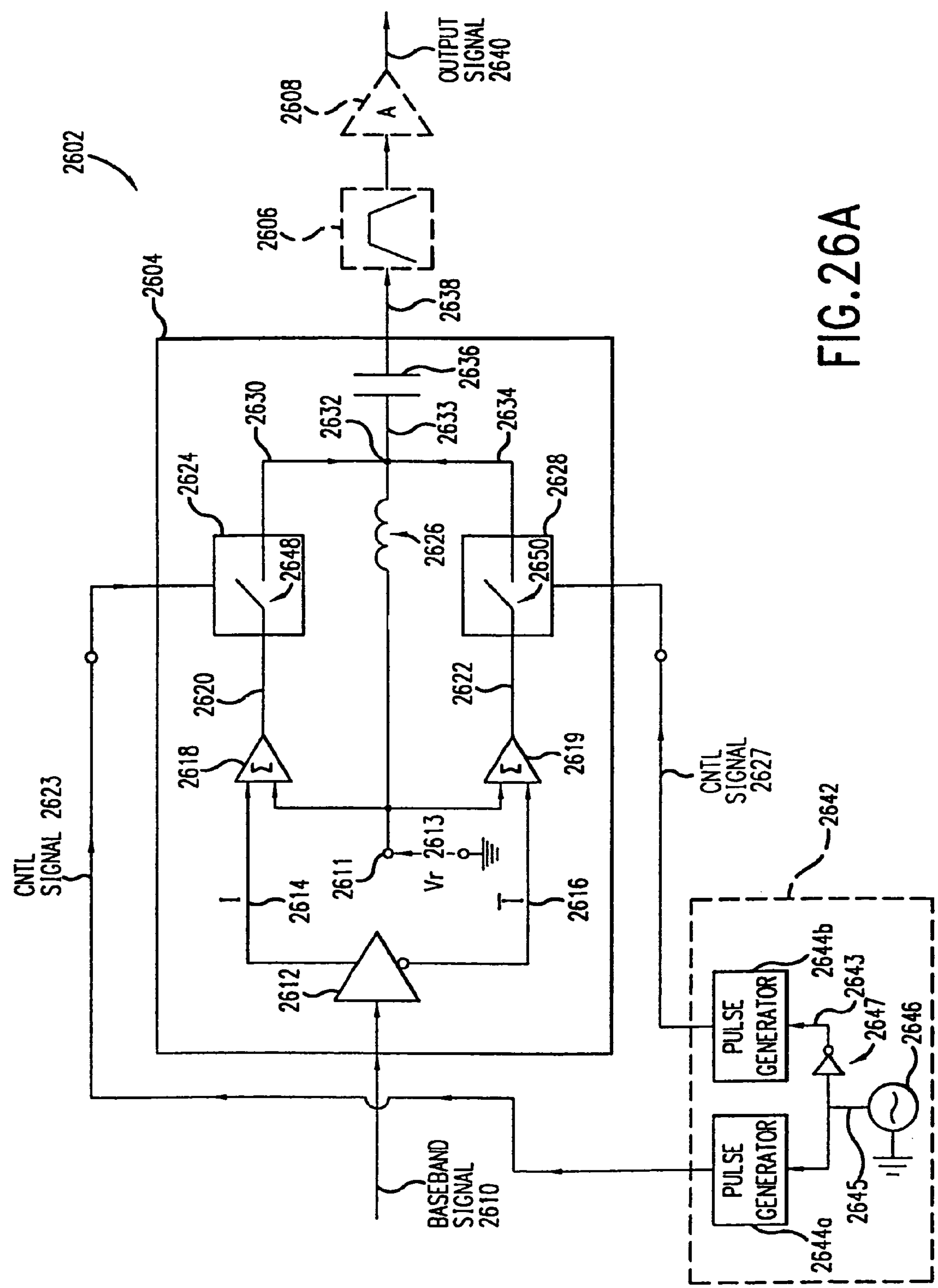
FIGS. 26A-C illustrate a balanced transmitter 2602 according to an embodiment of the present invention.
Figure 62:
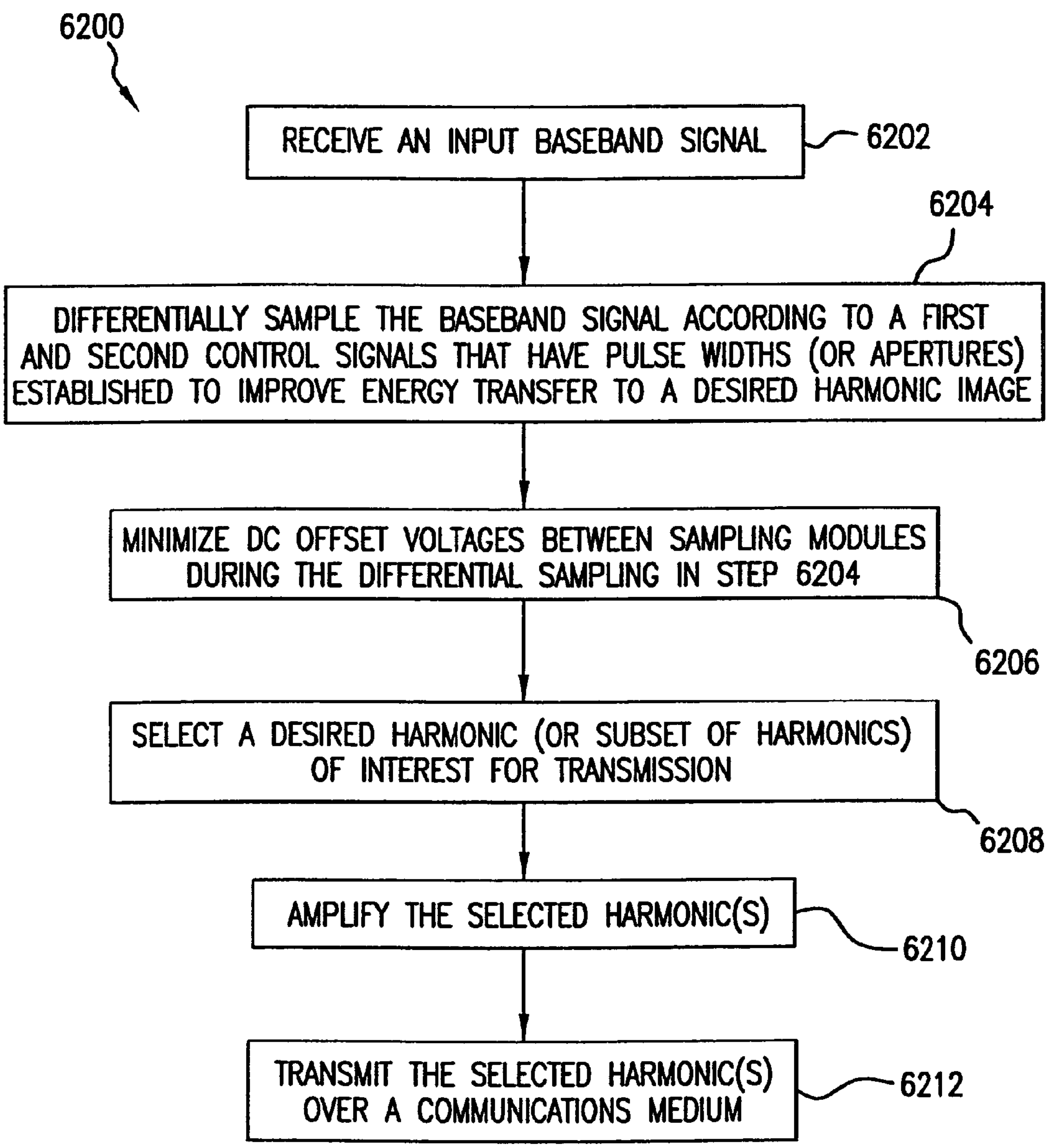
FIG. 62 illustrates a flowchart 6200 that is associated with the transmitter 2602 in the FIG. 26A according to an embodiment of the invention.

FIG. 26A illustrates a transmitter 2602 according to embodiments of the present invention. Transmitter 2602 includes a balanced modulator/up-converter 2604, a control signal generator 2642, an optional filter 2606, and an optional amplifier 2608. Transmitter 2602 up-converts a baseband signal 2610 to produce an output signal 2640 that is conditioned for wireless or wire line transmission. In doing so, the balanced modulator 2604 receives the baseband signal 2610 and samples the baseband signal in a differential and balanced fashion to generate a harmonically rich signal 2638. The harmonically rich signal 2638 includes multiple harmonic images, where each image contains the baseband information in the baseband signal 2610. The optional bandpass filter 2606 may be included to select a harmonic of interest (or a subset of harmonics) in the signal 2558 for transmission. The optional amplifier 2608 may be included to amplify the selected harmonic prior to transmission. The universal transmitter is further described at a high level by the flowchart 6200 that is shown in FIG. 62. A more detailed structural and operational description of the balanced modulator follows thereafter.

Referring to flowchart 6200, in step 6202, the balanced modulator 2604 receives the baseband signal 2610.

In step 6204, the balanced modulator 2604 samples the baseband signal in a differential and balanced fashion according to a first and second control signals that are phase shifted with respect to each other. The resulting harmonically rich signal 2638 includes multiple harmonic images that repeat at harmonics of the sampling frequency, where each image contains the necessary amplitude and frequency information to reconstruct the baseband signal 2610.

In embodiments of the invention, the control signals include pulses having pulse widths (or apertures) that are established to improve energy transfer to a desired harmonic of the harmonically rich signal. In further embodiments of the invention, DC offset voltages are minimized between sampling modules as indicated in step 6206, thereby minimizing carrier insertion in the harmonic images of the harmonically rich signal 2638.

In step 6208, the optional bandpass filter 2606 selects the desired harmonic of interest (or a subset of harmonics) in from the harmonically rich signal 2638 for transmission.

In step 6210, the optional amplifier 2608 amplifies the selected harmonic(s) prior to transmission.

In step 6212, the selected harmonic(s) is transmitted over a communications medium.

7.1.1 Balanced Modulator Detailed Description

Figure 63:
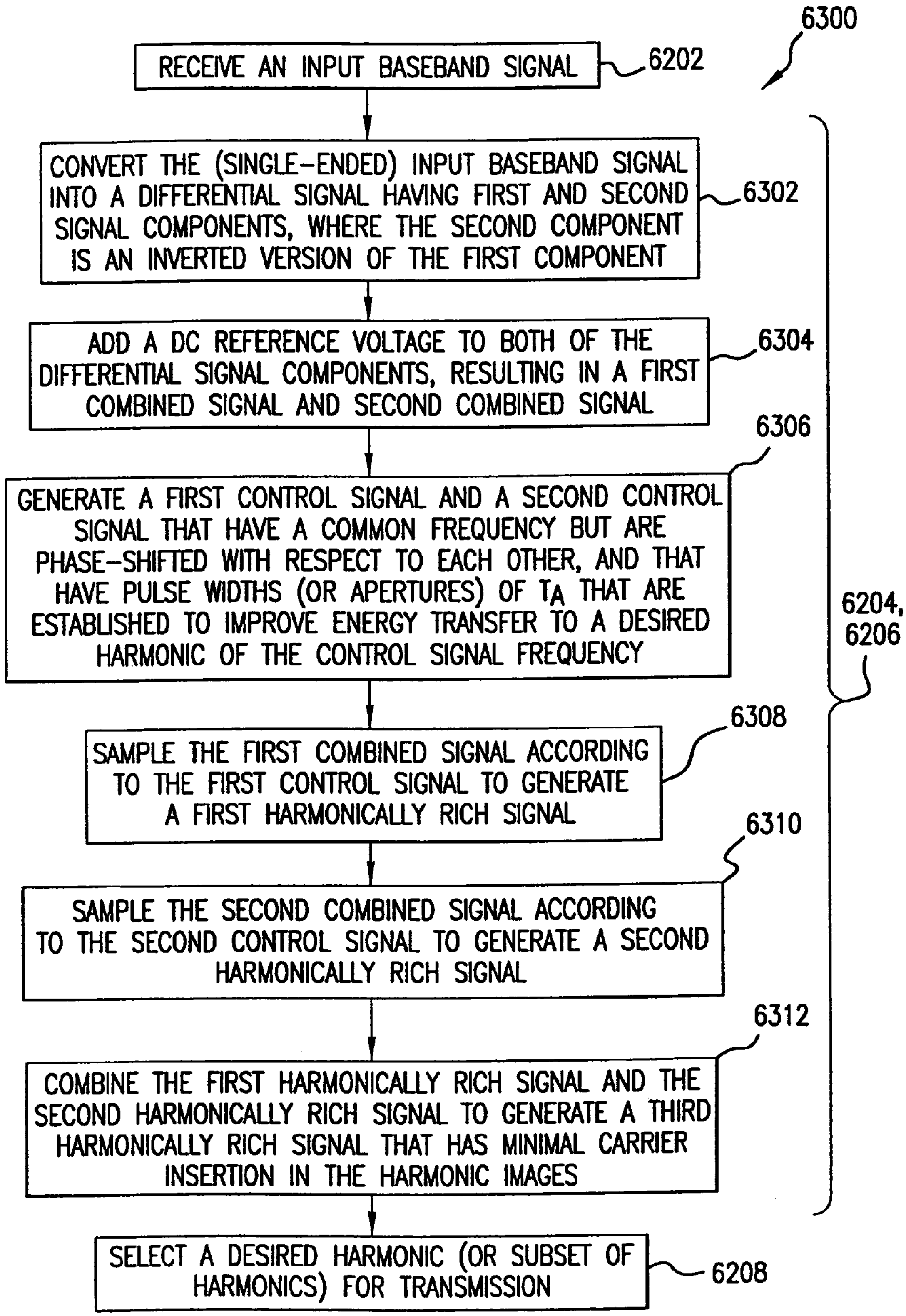
FIG. 63 illustrates a flowchart 6300 that further defines the flowchart 6200 in the FIG. 62, and is associated with the transmitter 2602 according to an embodiment of the invention.

Referring to the example embodiment shown in FIG. 26A, the balanced modulator 2604 includes the following components: a buffer/inverter 2612; summer amplifiers 2618, 2619; UFT modules 2624 and 2628 having controlled switches 2648 and 2650, respectively; an inductor 2626; a blocking capacitor 2636; and a DC terminal 2611. As stated above, the balanced modulator 2604 differentially samples the baseband signal 2610 to generate a harmonically rich signal 2638. More specifically, the UFT modules 2624 and 2628 sample the baseband signal in differential fashion according to control signals 2623 and 2627, respectively. A DC reference voltage 2613 is applied to terminal 2611 and is uniformly distributed to the UFT modules 2624 and 2628. The distributed DC voltage 2613 prevents any DC offset voltages from developing between the UFT modules, which can lead to carrier insertion in the harmonically rich signal 2638 as described above. The operation of the balanced modulator 2604 is discussed in greater detail with reference to flowchart 6300 (FIG. 63), as follows.

In step 6302, the buffer/inverter 2612 receives the input baseband signal 2610 and generates input signal 2614 and inverted input signal 2616. Input signal 2614 is substantially similar to signal 2610, and inverted signal 2616 is an inverted version of signal 2614. As such, the buffer/inverter 2612 converts the (single-ended) baseband signal 2610 into differential input signals 2614 and 2616 that will be sampled by the UFT modules. Buffer/inverter 2612 can be implemented using known operational amplifier (op amp) circuits, as will be understood by those skilled in the arts, although the invention is not limited to this example.

In step 6304, the summer amplifier 2618 sums the DC reference voltage 2613 applied to terminal 2611 with the input signal 2614, to generate a combined signal 2620. Likewise, the summer amplifier 2619 sums the DC reference voltage 2613 with the inverted input signal 2616 to generate a combined signal 2622. Summer amplifiers 2618 and 2619 can be implemented using known op amp summer circuits, and can be designed to have a specified gain or attenuation, including unity gain, although the invention is not limited to this example. The DC reference voltage 2613 is also distributed to the outputs of both UFT modules 2624 and 2628 through the inductor 2626 as is shown.

Figure 27A:
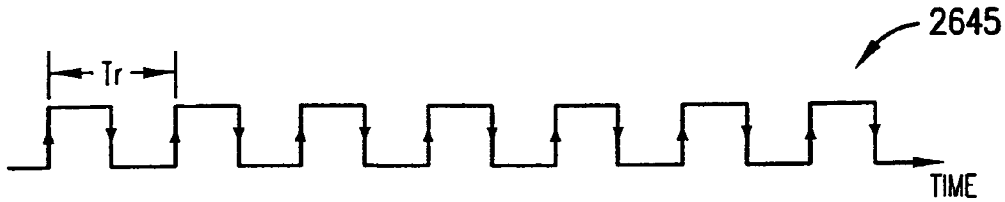
FIGS. 27A-I illustrate various example timing diagrams associated with the transmitter 2602.
Figure 27B:
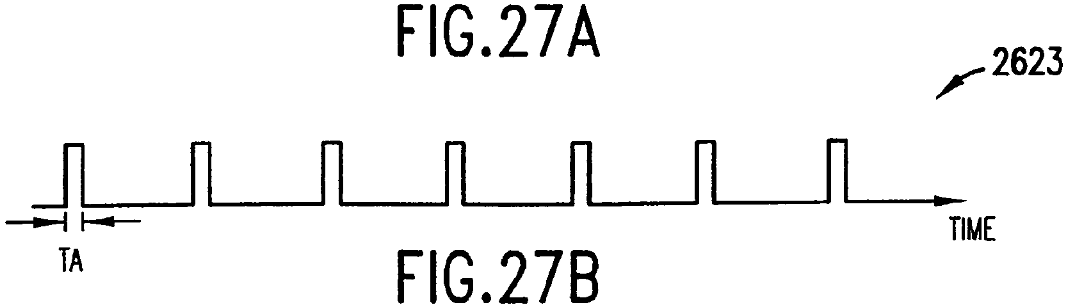
Figure 27C:
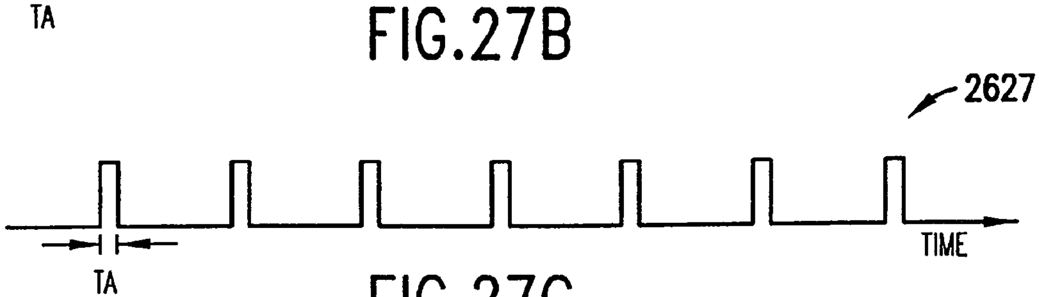

In step 6306, the control signal generator 2642 generates control signals 2623 and 2627 that are shown by way of example in FIG. 27B and FIG. 27C, respectively. As illustrated, both control signals 2623 and 2627 have the same period $T_S$ as a master clock signal 2645 (FIG. 27A), but have a pulse width (or aperture) of $T_A$. In the example, control signal 2623 triggers on the rising pulse edge of the master clock signal 2645, and control signal 2627 triggers on the falling pulse edge of the master clock signal 2645. Therefore, control signals 2623 and 2627 are shifted in time by 180 degrees relative to each other. In embodiments of invention, the master clock signal 2645 (and therefore the control signals 2623 and 2627) have a frequency that is a sub-harmonic of the desired output signal 2640. The invention is not limited to the example of FIGS. 27A-27C.

In one embodiment, the control signal generator 2642 includes an oscillator 2646, pulse generators 2644*a* and 2644*b*, and an inverter 2647 as shown. In operation, the oscillator 2646 generates the master clock signal 2645, which is illustrated in FIG. 27A as a periodic square wave having pulses with a period of $T_S$. Other clock signals could be used including but not limited to sinusoidal waves, as will be understood by those skilled in the arts. Pulse generator 2644*a* receives the master clock signal 2645 and triggers on the rising pulse edge, to generate the control signal 2623. Inverter 2647 inverts the clock signal 2645 to generate an inverted clock signal 2643. The pulse generator 2644*b* receives the inverted clock signal 2643 and triggers on the rising pulse edge (which is the falling edge of clock signal 2645), to generate the control signal 2627.

Figure 74A:
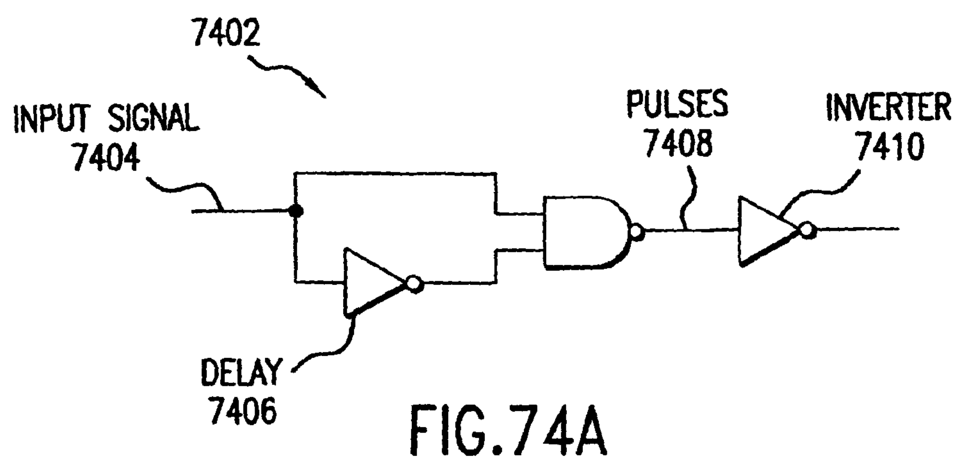
FIG. 74A illustrates various pulse generators according to embodiments of the invention.
Figure 74B:
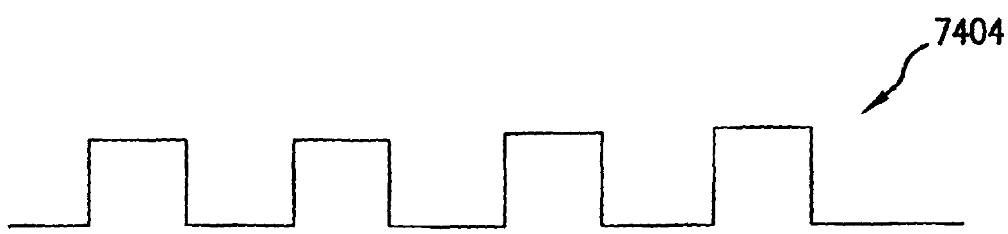
FIGS. 74B-C illustrate various example signal diagrams associated with the pulse generator in FIG. 74A, according to embodiments of the invention.
Figure 74C:
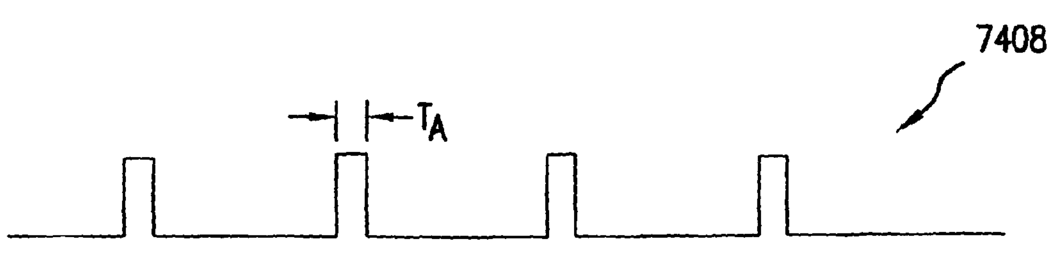
Figure 74D:
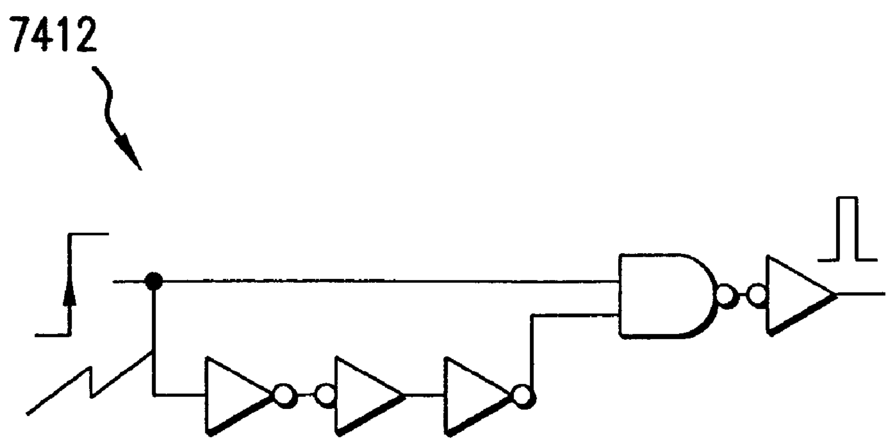
FIGS. 74D-E illustrate various additional pulse generators according to embodiments of the invention.
Figure 74E:
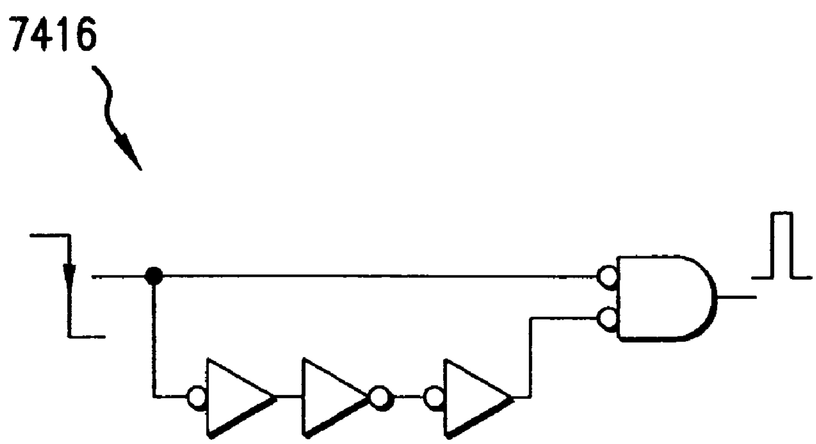

FIG. 74A-E illustrate example embodiments for the pulse generator 2644. FIG. 74A illustrates a pulse generator 7402. The pulse generator 7402 generates pulses 7408 having pulse width $T_A$ from an input signal 7404. Example input signals 7404 and pulses 7408 are depicted in FIGS. 74B and 74C, respectively. The input signal 7404 can be any type of periodic signal, including, but not limited to, a sinusoid, a square wave, a saw-tooth wave etc. The pulse width (or aperture) $T_A$ of the pulses 7408 is determined by delay 7406 of the pulse generator 7402. The pulse generator 7402 also includes an optional inverter 7410, which is optionally added for polarity considerations as understood by those skilled in the arts. The example logic and implementation shown for the pulse generator 7402 is provided for illustrative purposes only, and is not limiting. The actual logic employed can take many forms. Additional examples of pulse generation logic are shown in FIGS. 74D and 74E. FIG. 74D illustrates a rising edge pulse generator 7412 that triggers on the rising edge of input signal 7404. FIG. 74E illustrates a falling edge pulse generator 7416 that triggers on the falling edge of the input signal 7404.

Figure 26B:
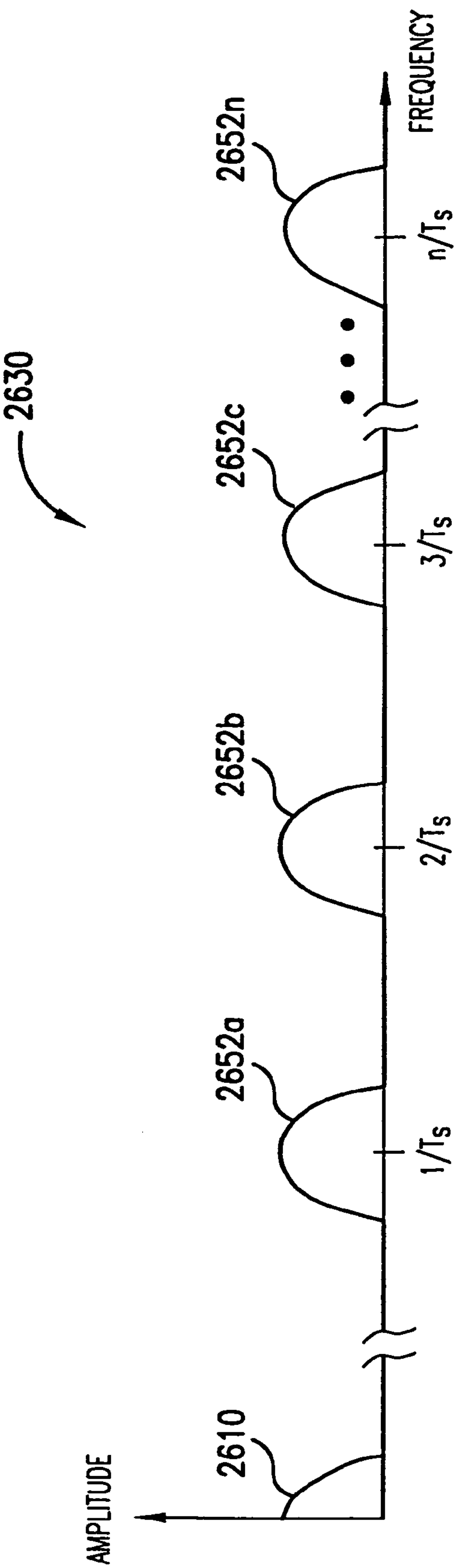

In step 6308, the UFT module 2624 samples the combined signal 2620 according to the control signal 2623 to generate harmonically rich signal 2630. More specifically, the switch 2648 closes during the pulse widths $T_A$ of the control signal 2623 to sample the combined signal 2620 resulting in the harmonically rich signal 2630. FIG. 26B illustrates an exemplary frequency spectrum for the harmonically rich signal 2630 having harmonic images 2652*a-n*. The images 2652 repeat at harmonics of the sampling frequency $1/T_S$, at infinitum, where each image 2652 contains the necessary amplitude, frequency, and phase information to reconstruct the baseband signal 2610. As discussed further below, the relative amplitude of the frequency images is generally a function of the harmonic number and the pulse width $T_A$. As such, the relative amplitude of a particular harmonic 2652 can be increased (or decreased) by adjusting the pulse width $T_A$ of the control signal 2623. In general, shorter pulse widths of $T_A$ shift more energy into the higher frequency harmonics, and longer pulse widths of $T_A$ shift energy into the lower frequency harmonics. The generation of harmonically rich signals by sampling an input signal according to a controlled aperture have been described earlier in this application in the section titled, "Frequency Up-conversion Using Universal Frequency Translation", and is illustrated by FIGS. 3-6. A more detailed discussion of frequency up-conversion using a switch with a controlled sampling aperture is discussed in the co-pending patent application titled, "Method and System for Frequency Up-Conversion," Ser. No. 09/176,154, field on Oct. 21, 1998, and incorporated herein by reference.

In step 6310, the UFT module 2628 samples the combined signal 2622 according to the control signal 2627 to generate harmonically rich signal 2634. More specifically, the switch 2650 closes during the pulse widths $T_A$ of the control signal 2627 to sample the combined signal 2622 resulting in the harmonically rich signal 2634. The harmonically rich signal 2634 includes multiple frequency images of baseband signal 2610 that repeat at harmonics of the sampling frequency ($1/T_S$), similar to that for the harmonically rich signal 2630. However, the images in the signal 2634 are phase-shifted compared to those in signal 2630 because of the inversion of signal 2616 compared to signal 2614, and because of the relative phase shift between the control signals 2623 and 2627.

Figure 26C:
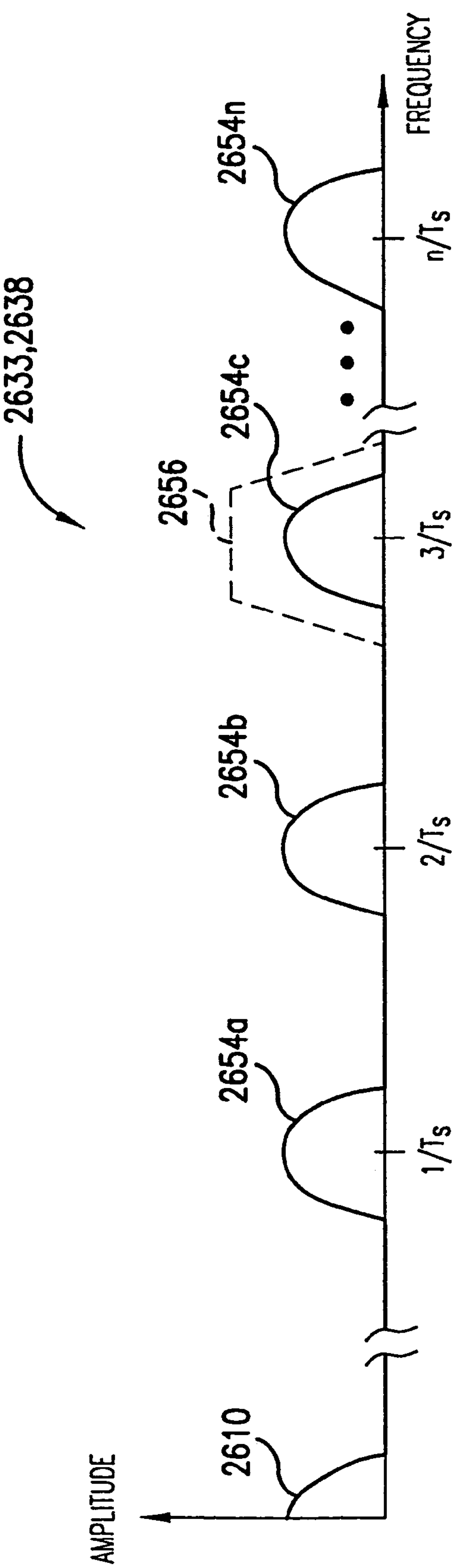

In step 6312, the node 2632 sums the harmonically rich signals 2632 and 2634 to generate harmonically rich signal 2633. FIG. 26C illustrates an exemplary frequency spectrum for the harmonically rich signal 2633 that has multiple images 2654*a-n* that repeat at harmonics of the sampling frequency $1/T_S$. Each image 2654 includes the necessary amplitude, frequency and phase information to reconstruct the baseband signal 2610. The capacitor 2636 operates as a DC blocking capacitor and substantially passes the harmonics in the harmonically rich signal 2633 to generate harmonically rich signal 2638 at the output of the modulator 2604.

In step 6208, the optional filter 2606 can be used to select a desired harmonic image for transmission. This is represented for example by a passband 2656 that selects the harmonic image 2654*c* for transmission in FIG. 26C.

An advantage of the modulator 2604 is that it is fully balanced, which substantially minimizes (or eliminates) any DC voltage offset between the two UFT modules 2624 and 2628. DC offset is minimized because the reference voltage 2613 contributes a consistent DC component to the input signals 2620 and 2622 through the summing amplifiers 2618 and 2619, respectively. Furthermore, the reference voltage 2613 is also directly coupled to the outputs of the UFT modules 2624 and 2628 through the inductor 2626 and the node 2632. The result of controlling the DC offset between the UFT modules is that carrier insertion is minimized in the harmonic images of the harmonically rich signal 2638. As discussed above, carrier insertion is substantially wasted energy because the information for a modulated signal is carried in the sidebands of the modulated signal and not in the carrier. Therefore, it is often desirable to minimize the energy at the carrier frequency by controlling the relative DC offset.

7.1.2 Balanced Modulator Example Signal Diagrams and Mathematical Description

Figure 27D:
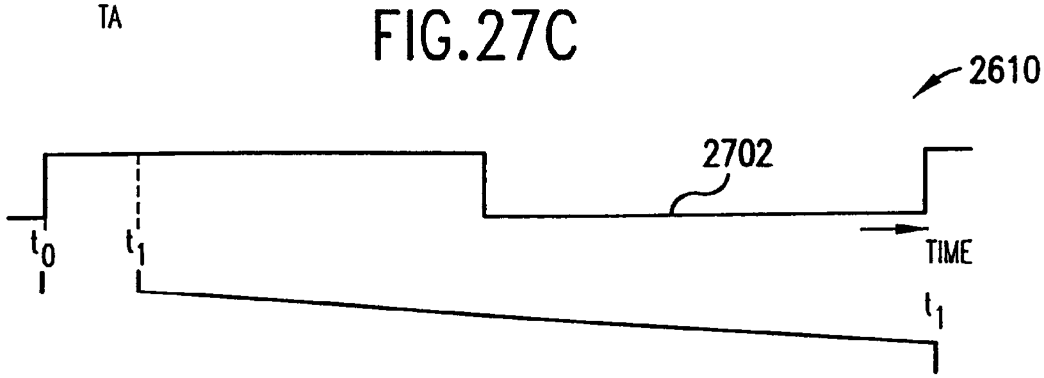
Figure 27E:
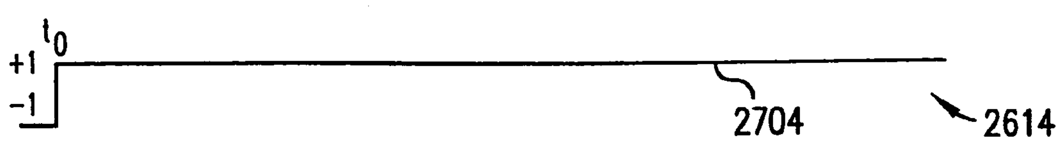
Figure 27F:
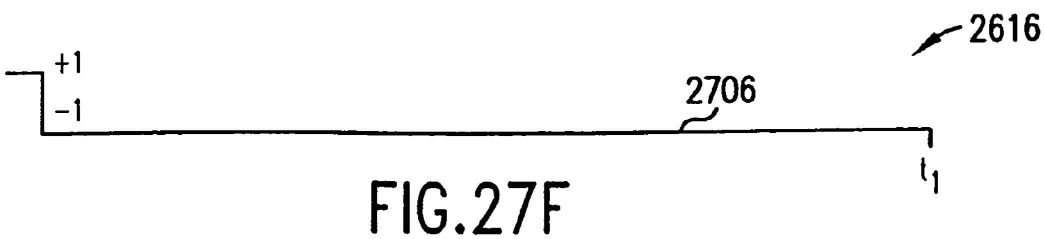
Figure 27G:
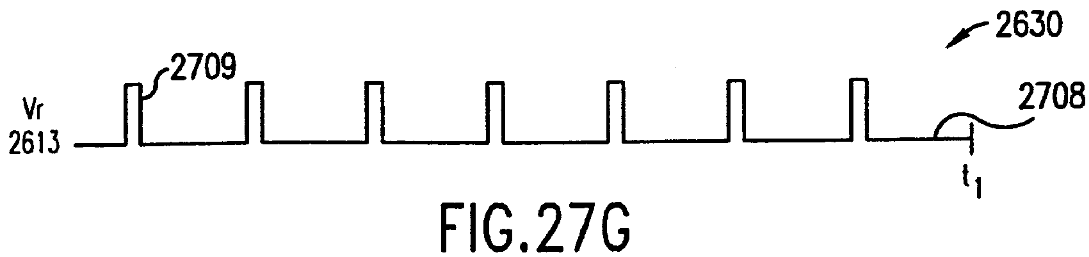

In order to further describe the invention, FIGS. 27D-271 illustrate various example signal diagrams (vs. time) that are representative of the invention. These signal diagrams are meant for example purposes only and are not meant to be limiting. FIG. 27D illustrates a signal 2702 that is representative of the input baseband signal 2610 (FIG. 26A). FIG. 27E illustrates a step function 2704 that is an expanded portion of the signal 2702 from time $t_0$ to $t_1$, and represents signal 2614 at the output of the buffer/inverter 2612. Similarly, FIG. 27F illustrates a signal 2706 that is an inverted version of the signal 2704, and represents the signal 2616 at the inverted output of buffer/inverter 2612. For analysis purposes, a step function is a good approximation for a portion of a single bit of data (for the baseband signal 2610) because the clock rates of the control signals 2623 and 2627 are significantly higher than the data rates of the baseband signal 2610. For example, if the data rate is in the KHz frequency range, then the clock rate will preferably be in MHZ frequency range in order to generate an output signal in the Ghz frequency range.

Figure 27H:
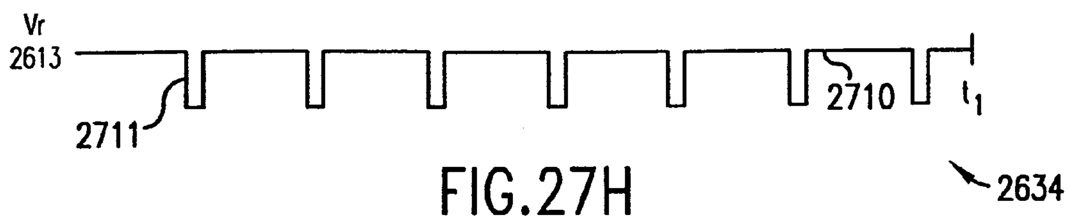

Still referring to FIGS. 27D-I, FIG. 27G illustrates a signal 2708 that an example of the harmonically rich signal 2630 when the step function 2704 is sampled according to the control signal 2623 in FIG. 27B. The signal 2708 includes positive pulses 2709 as referenced to the DC voltage 2613. Likewise, FIG. 27H illustrates a signal 2710 that is an example of the harmonically rich signal 2634 when the step function 2706 is sampled according to the control signal 2627. The signal 2710 includes negative pulses 2711 as referenced to the DC voltage 2613, which are time-shifted relative the positive pulses 2709 in signal 2708.

Figure 27I:
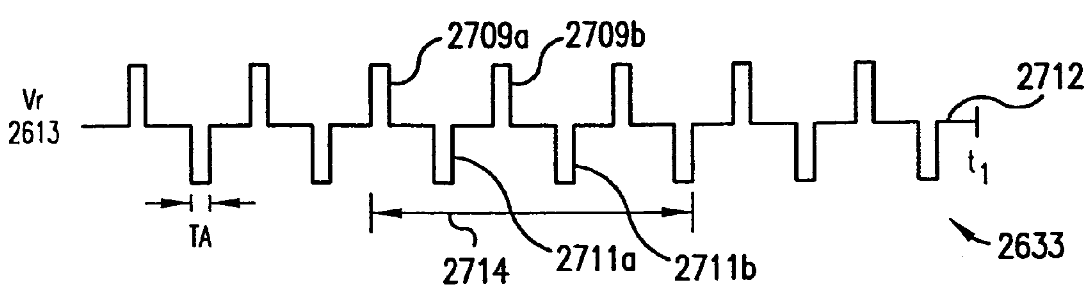

Still referring to FIGS. 27D-I, the FIG. 27I illustrates a signal 2712 that is the combination of signal 2708 (FIG. 27G) and the signal 2710 (FIG. 27H), and is an example of the harmonically rich signal 2633 at the output of the summing node 2632. As illustrated, the signal 2712 spends approximately as much time above the DC reference voltage 2613 as below the DC reference voltage 2613 over a limited time period. For example, over a time period 2714, the energy in the positive pulses 2709*a-b* is canceled out by the energy in the negative pulses 2711*a-b*. This is indicative of minimal (or zero) DC offset between the UFT modules 2624 and 2628, which results in minimal carrier insertion during the sampling process.

Still referring to FIG. 27I, the time axis of the signal 2712 can be phased in such a manner to represent the waveform as an odd function. For such an arrangement, the Fourier series is readily calculated to obtain:

$$I_C(t) = \sum_{n=1}^{\infty}\left(\frac{4\sin\left(\frac{n\pi T_A}{T_S}\right)\cdot\left(\frac{n\pi}{2}\right)}{n\pi}\right)\cdot\sin\left(\frac{2n\pi t}{T_S}\right). \qquad \text{Equation 1}$$

where:

$T_S$=period of the master clock 2645

$T_A$=pulse width of the control signals 2623 and 2627 n=harmonic number

As shown by Equation 1, the relative amplitude of the frequency images is generally a function of the harmonic number n, and the ratio of $T_A/T_S$. As indicated, the $T_A/T_S$ ratio represents the ratio of the pulse width of the control signals relative to the period of the sub-harmonic master clock. The $T_A/T_S$ ratio can be optimized in order to maximize the amplitude of the frequency image at a given harmonic. For example, if a passband waveform is desired to be created at 5× the frequency of the sub-harmonic clock, then a baseline power for that harmonic extraction may be calculated for the fifth harmonic (n=5) as:

$$I_C(t) = \left(\frac{4\sin\left(\frac{5\pi T_A}{T_S}\right)}{5\pi}\right)\cdot\sin(5\omega_S t). \qquad \text{Equation 2}$$

As shown by Equation 2, $I_C$ (t) for the fifth harmonic is a sinusoidal function having an amplitude that is proportional to the sin ($5\pi T_A/T_S$). The signal amplitude can be maximized by setting $T_A=(1/10\cdot T_S)$ so that sin ($5\pi T_A/T_S$)=sin ($\pi/2$)=1. Doing so results in the equation:

$$I_C(t)|_{n=5} = \frac{4}{5\pi}(\sin(5\omega_S t)). \qquad \text{Equation 3}$$

This component is a frequency at 5× of the sampling frequency of sub-harmonic clock, and can be extracted from the Fourier series via a bandpass filter (such as bandpass filter 2606) that is centered around $5f_S$. The extracted frequency component can then be optionally amplified by the amplifier 2608 prior to transmission on a wireless or wire-line communications channel or channels.

Equation 3 can be extended to reflect the inclusion of a message signal as illustrated by equation 4 below:

$$m(t)\cdot I_C(t)|_{\substack{n=5\\ \theta=\theta(t)}} = \frac{4\cdot m(t)}{5\pi}(\sin(5\omega_S t + 5\theta(t))). \qquad \text{Equation 4}$$

Equation 4 illustrates that a message signal can be carried in harmonically rich signals 2633 such that both amplitude and phase can be modulated. In other words, m(t) is modulated for amplitude and θ(t) is modulated for phase. In such cases, it should be noted that θ(t) is augmented modulo n while the amplitude modulation m(t) is simply scaled. Therefore, complex waveforms may be reconstructed from their Fourier series with multiple aperture UFT combinations.

As discussed above, the signal amplitude for the 5th harmonic was maximized by setting the sampling aperture width $T_A=1/10\ T_S$, where $T_S$ is the period of the master clock signal. This can be restated and generalized as setting $T_A=1/2$ the period (or π radians) at the harmonic of interest. In other words, the signal amplitude of any harmonic n can be maximized by sampling the input waveform with a sampling aperture of $T_A=1/2$ the period of the harmonic of interest (n). Based on this discussion, it is apparent that varying the aperture changes the harmonic and amplitude content of the output waveform. For example, if the sub-harmonic clock has a frequency of 200 MHZ, then the fifth harmonic is at 1 Ghz. The amplitude of the fifth harmonic is maximized by setting the aperture width $T_A$=500 picoseconds, which equates to ½ the period (or π radians) at 1 Ghz.

Figure 27J:
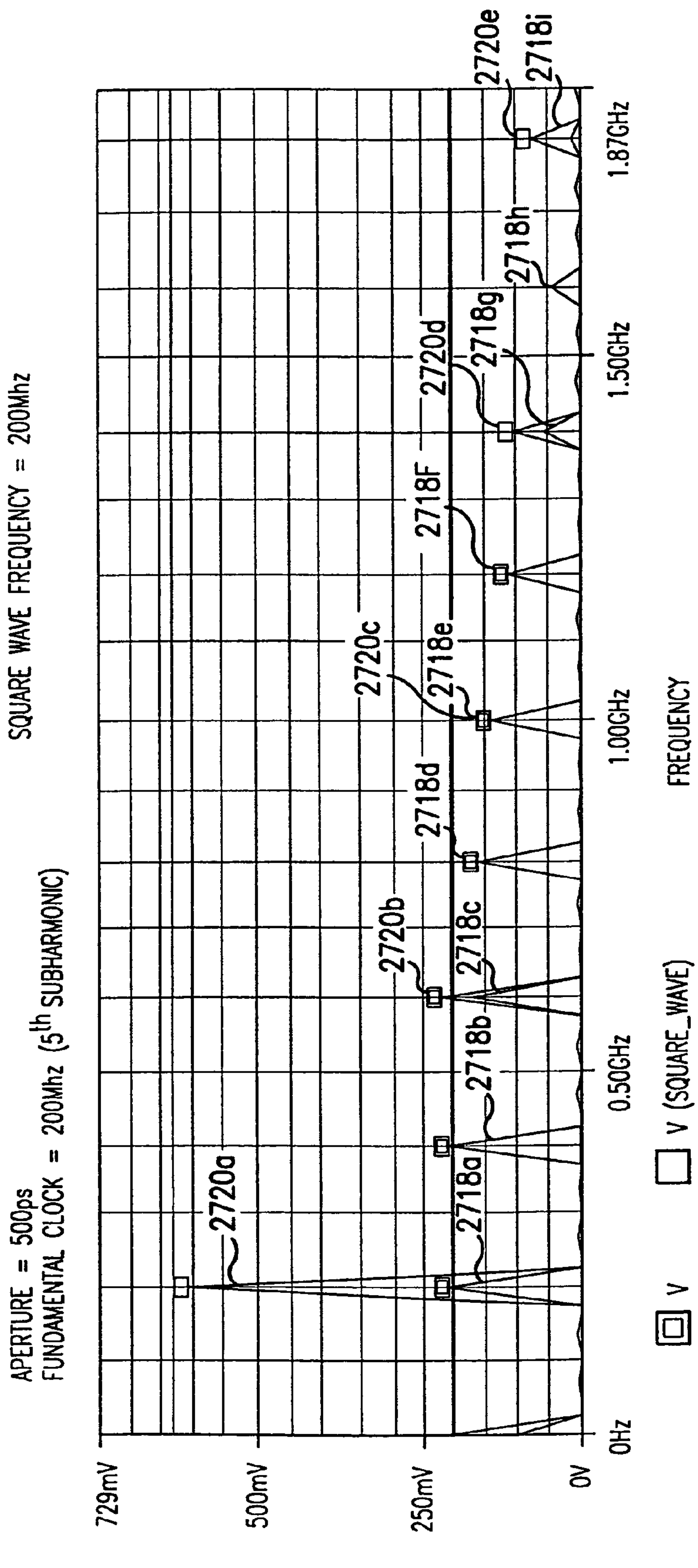
FIG. 27J illustrates an example frequency spectrum associated with the modulator 2604.

FIG. 27J depicts a frequency plot 2716 that graphically illustrates the effect of varying the sampling aperture of the control signals on the harmonically rich signal 2633 given a 200 MHZ harmonic clock. The frequency plot 2716 compares two frequency spectrums 2718 and 2720 for different control signal apertures given a 200 MHZ clock. More specifically, the frequency spectrum 2718 is an example spectrum for signal 2633 given the 200 MHZ clock with the aperture $T_A$=500 psec (where 500 psec is π radians at the 5th harmonic of 1 GHz). Similarly, the frequency spectrum 2720 is an example spectrum for signal 2633 given a 200 MHZ clock that is a square wave (so $T_A$=5000 psec). The spectrum 2718 includes multiple harmonics 2718*a-i*, and the frequency spectrum 2720 includes multiple harmonics 2720*a-e*. [It is noted that spectrum 2720 includes only the odd harmonics as predicted by Fourier analysis for a square wave.] At 1 Ghz (which is the 5th harmonic), the signal amplitude of the two frequency spectrums 2718*e* and 2720*c* are approximately equal. However, at 200 MHZ, the frequency spectrum 2718*a* has a much lower amplitude than the frequency spectrum 2720*a*, and therefore the frequency spectrum 2718 is more efficient than the frequency spectrum 2720, assuming the desired harmonic is the 5th harmonic. In other words, assuming 1 Ghz is the desired harmonic, the frequency spectrum 2718 wastes less energy at the 200 MHZ fundamental than does the frequency spectrum 2718.

7.1.3 Balanced Modulator Having a Shunt Configuration

Figure 56A:
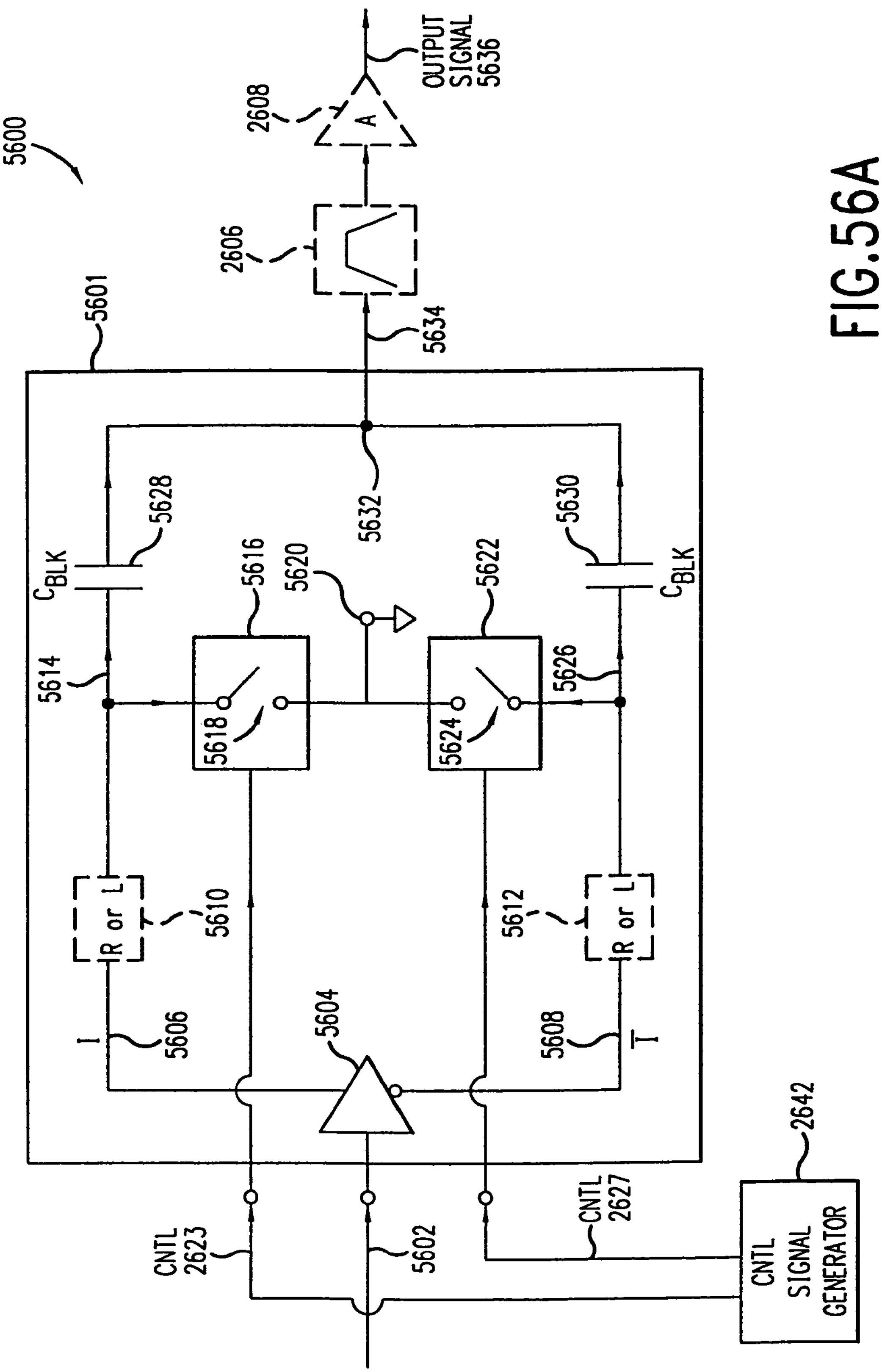
FIG. 56A illustrate a transmitter 5600 according to embodiments of the present invention.

FIG. 56A illustrates a universal transmitter 5600 that is a second embodiment of a universal transmitter having two balanced UFT modules in a shunt configuration. (In contrast, the balanced modulator 2604 can be described as having a series configuration based on the orientation of the UFT modules.) Transmitter 5600 includes a balanced modulator 5601, the control signal generator 2642, the optional bandpass filter 2606, and the optional amplifier 2608. The transmitter 5600 up-converts a baseband signal 5602 to produce an output signal 5636 that is conditioned for wireless or wire line transmission. In doing so, the balanced modulator 5601 receives the baseband signal 5602 and shunts the baseband signal to ground in a differential and balanced fashion to generate a harmonically rich signal 5634. The harmonically rich signal 5634 includes multiple harmonic images, where each image contains the baseband information in the baseband signal 5602. In other words, each harmonic image includes the necessary amplitude, frequency, and phase information to reconstruct the baseband signal 5602. The optional bandpass filter 2606 may be included to select a harmonic of interest (or a subset of harmonics) in the signal 5634 for transmission. The optional amplifier 2608 may be included to amplify the selected harmonic prior to transmission, resulting in the output signal 5636.

Figure 64:
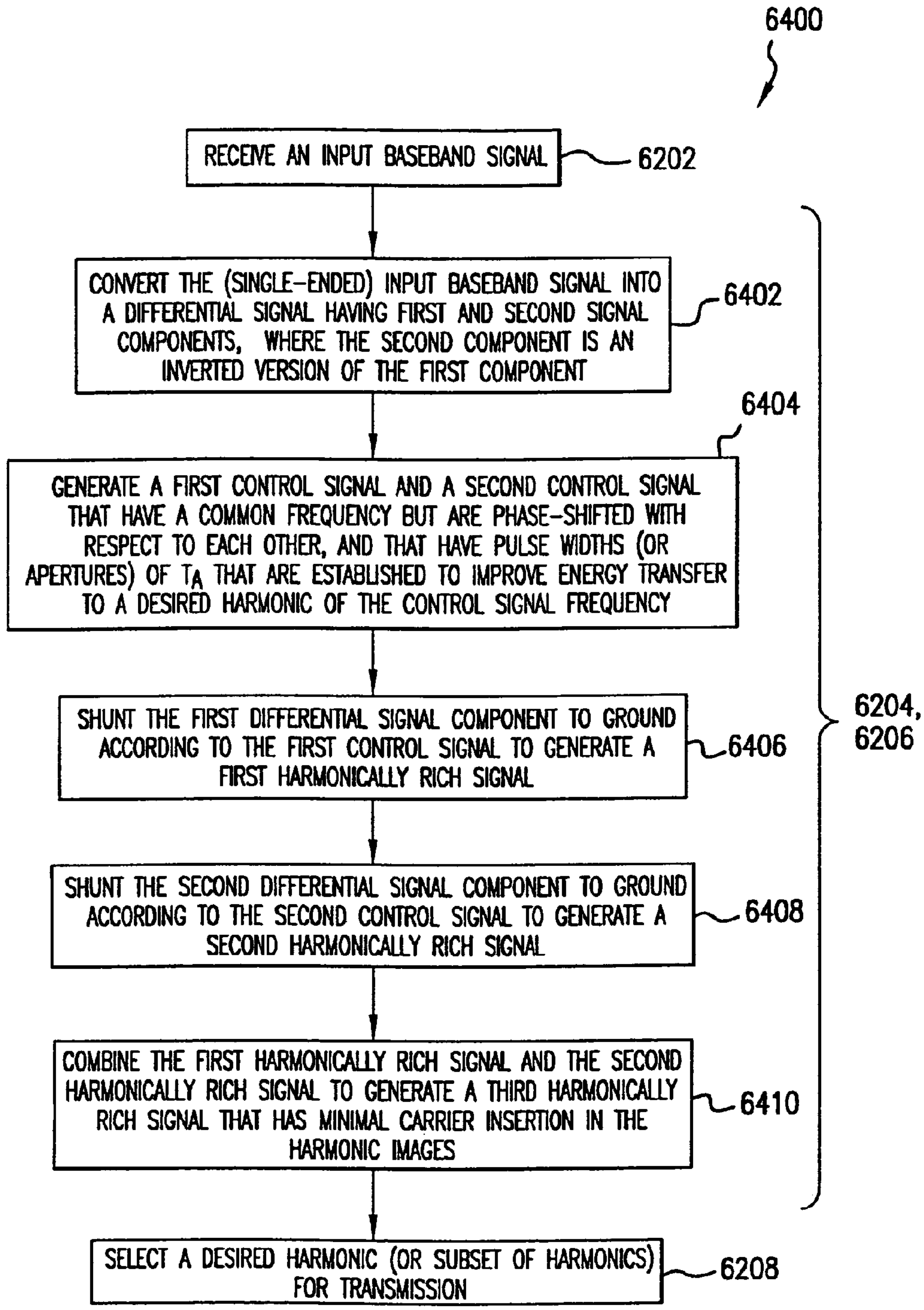
FIG. 64 illustrates a flowchart 6400 that further defines the flowchart 6200 in the FIG. 63 and is associated with the transmitter 6400 according to an embodiment of the invention.

The balanced modulator 5601 includes the following components: a buffer/inverter 5604; optional impedances 5610, 5612; UFT modules 5616 and 5622 having controlled switches 5618 and 5624, respectively; blocking capacitors 5628 and 5630; and a terminal 5620 that is tied to ground. As stated above, the balanced modulator 5601 differentially shunts the baseband signal 5602 to ground, resulting in a harmonically rich signal 5634. More specifically, the UFT modules 5616 and 5622 alternately shunts the baseband signal to terminal 5620 according to control signals 2623 and 2627, respectively. Terminal 5620 is tied to ground and prevents any DC offset voltages from developing between the UFT modules 5616 and 5622. As described above, a DC offset voltage can lead to undesired carrier insertion. The operation of the balanced modulator 5601 is described in greater detail according to the flowchart 6400 (FIG. 64) as follows.

In step 6402, the buffer/inverter 5604 receives the input baseband signal 5602 and generates I signal 5606 and inverted I signal 5608. I signal 5606 is substantially similar to the baseband signal 5602, and the inverted I signal 5608 is an inverted version of signal 5602. As such, the buffer/inverter 5604 converts the (single-ended) baseband signal 5602 into differential signals 5606 and 5608 that are sampled by the UFT modules. Buffer/inverter 5604 can be implemented using known operational amplifier (op amp) circuits, as will be understood by those skilled in the arts, although the invention is not limited to this example.

In step 6404, the control signal generator 2642 generates control signals 2623 and 2627 from the master clock signal 2645. Examples of the master clock signal 2645, control signal 2623, and control signal 2627 are shown in FIGS. 27A-C, respectively. As illustrated, both control signals 2623 and 2627 have the same period $T_S$ as a master clock signal 2645, but have a pulse width (or aperture) of $T_A$. Control signal 2623 triggers on the rising pulse edge of the master clock signal 2645, and control signal 2627 triggers on the falling pulse edge of the master clock signal 2645. Therefore, control signals 2623 and 2627 are shifted in time by 180 degrees relative to each other. A specific embodiment of the control signal generator 2642 is illustrated in FIG. 26A, and was discussed in detail above.

Figure 56B:
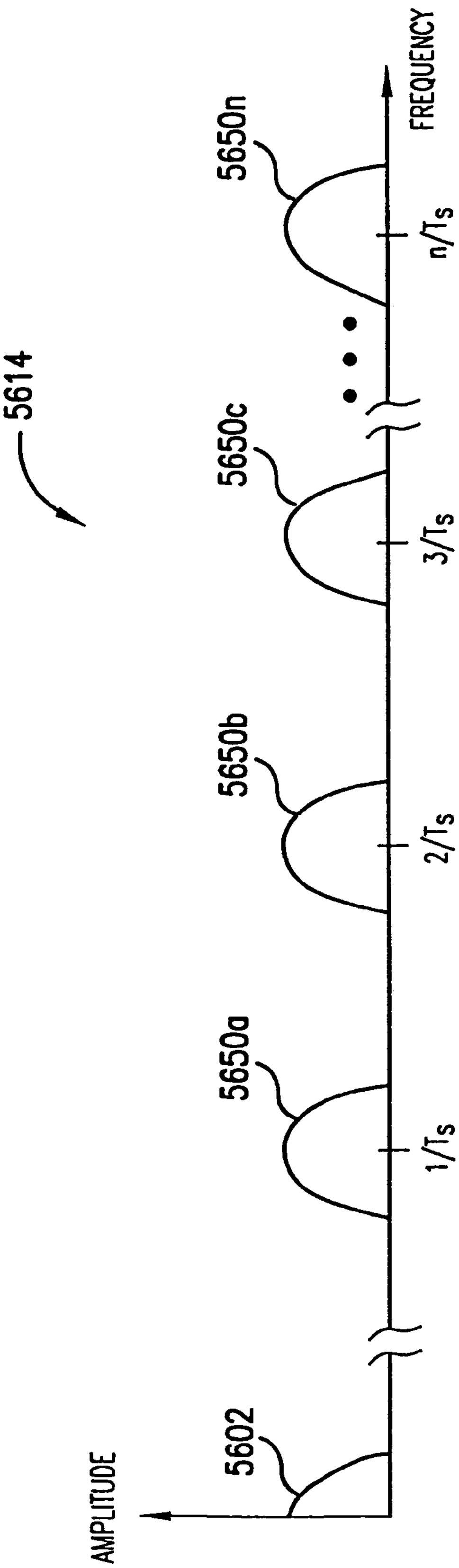
FIGS. 56B-C illustrate various frequency spectrums that are associated with the transmitter 5600.

In step 6406, the UFT module 5616 shunts the signal 5606 to ground according to the control signal 2623, to generate a harmonically rich signal 5614. More specifically, the switch 5618 closes and shorts the signal 5606 to ground (at terminal 5620) during the aperture width $T_A$ of the control signal 2623, to generate the harmonically rich signal 5614. FIG. 56B illustrates an exemplary frequency spectrum for the harmonically rich signal 5618 having harmonic images 5650*a-n*. The images 5650 repeat at harmonics of the sampling frequency $1/T_S$, at infinitum, where each image 5650 contains the necessary amplitude, frequency, and phase information to reconstruct the baseband signal 5602. The generation of harmonically rich signals by sampling an input signal according to a controlled aperture have been described earlier in this application in the section titled, "Frequency Up-conversion Using Universal Frequency Translation", and is illustrated by FIGS. 3-6. A more detailed discussion of frequency up-conversion using a switch with a controlled sampling aperture is discussed in the co-pending patent application titled, "Method and System for Frequency Up-Conversion," Ser. No. 09/176, 154, field on Oct. 21, 1998, and incorporated herein by reference.

The relative amplitude of the frequency images 5650 is generally a function of the harmonic number and the pulse width $T_A$. As such, the relative amplitude of a particular harmonic 5650 can be increased (or decreased) by adjusting the pulse width $T_A$ of the control signal 2623. In general, shorter pulse widths of $T_A$ shift more energy into the higher frequency harmonics, and longer pulse widths of $T_A$ shift energy into the lower frequency harmonics. Additionally, the relative amplitude of a particular harmonic 5650 can also be adjusted by adding/tuning an optional impedance 5610. Impedance 5610 operates as a filter that emphasizes a particular harmonic in the harmonically rich signal 5614.

In step 6408, the UFT module 5622 shunts the inverted signal 5608 to ground according to the control signal 2627, to generate a harmonically rich signal 5626. More specifically, the switch 5624 closes during the pulse widths $T_A$ and shorts the inverted I signal 5608 to ground (at terminal 5620), to generate the harmonically rich signal 5626. At any given time, only one of input signals 5606 or 5608 is shorted to ground because the pulses in the control signals 2623 and 2627 are phase shifted with respect to each other, as shown in FIGS. 27B and 27C.

The harmonically rich signal 5626 includes multiple frequency images of baseband signal 5602 that repeat at harmonics of the sampling frequency ($1/T_S$), similar to that for the harmonically rich signal 5614. However, the images in the signal 5626 are phase-shifted compared to those in signal 5614 because of the inversion of the signal 5608 compared to the signal 5606, and because of the relative phase shift between the control signals 2623 and 2627. The optional impedance 5612 can be included to emphasis a particular harmonic of interest, and is similar to the impedance 5610 above.

Figure 56C:
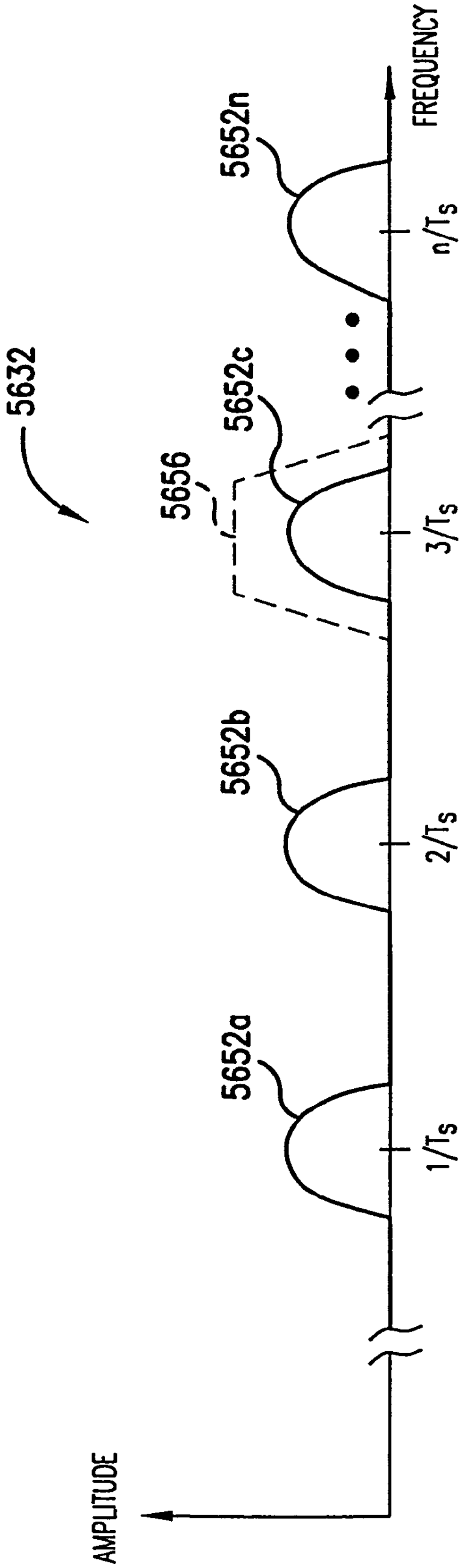

In step 6410, the node 5632 sums the harmonically rich signals 5614 and 5626 to generate the harmonically rich signal 5634. The capacitors 5628 and 5630 operate as blocking capacitors that substantially pass the respective harmonically rich signals 5614 and 5626 to the node 5632. (The capacitor values may be chosen to substantially block baseband frequency components as well.) FIG. 56C illustrates an exemplary frequency spectrum for the harmonically rich signal 5634 that has multiple images 5652*a-n* that repeat at harmonics of the sampling frequency $1/T_S$. Each image 5652 includes the necessary amplitude, frequency, and phase information to reconstruct the baseband signal 5602. The optional filter 2606 can be used to select the harmonic image of interest for transmission. This is represented by a passband 5656 that selects the harmonic image 5632*c* for transmission.

An advantage of the modulator 5601 is that it is fully balanced, which substantially minimizes (or eliminates) any DC voltage offset between the two UFT modules 5612 and 5614. DC offset is minimized because the UFT modules 5616 and 5622 are both connected to ground at terminal 5620. The result of controlling the DC offset between the UFT modules is that carrier insertion is minimized in the harmonic images of the harmonically rich signal 5634. As discussed above, carrier insertion is substantially wasted energy because the information for a modulated signal is carried in the sidebands of the modulated signal and not in the carrier. Therefore, it is often desirable to minimize the energy at the carrier frequency by controlling the relative DC offset.

7.1.4 Balanced Modulator FET Configuration

Figure 26D:
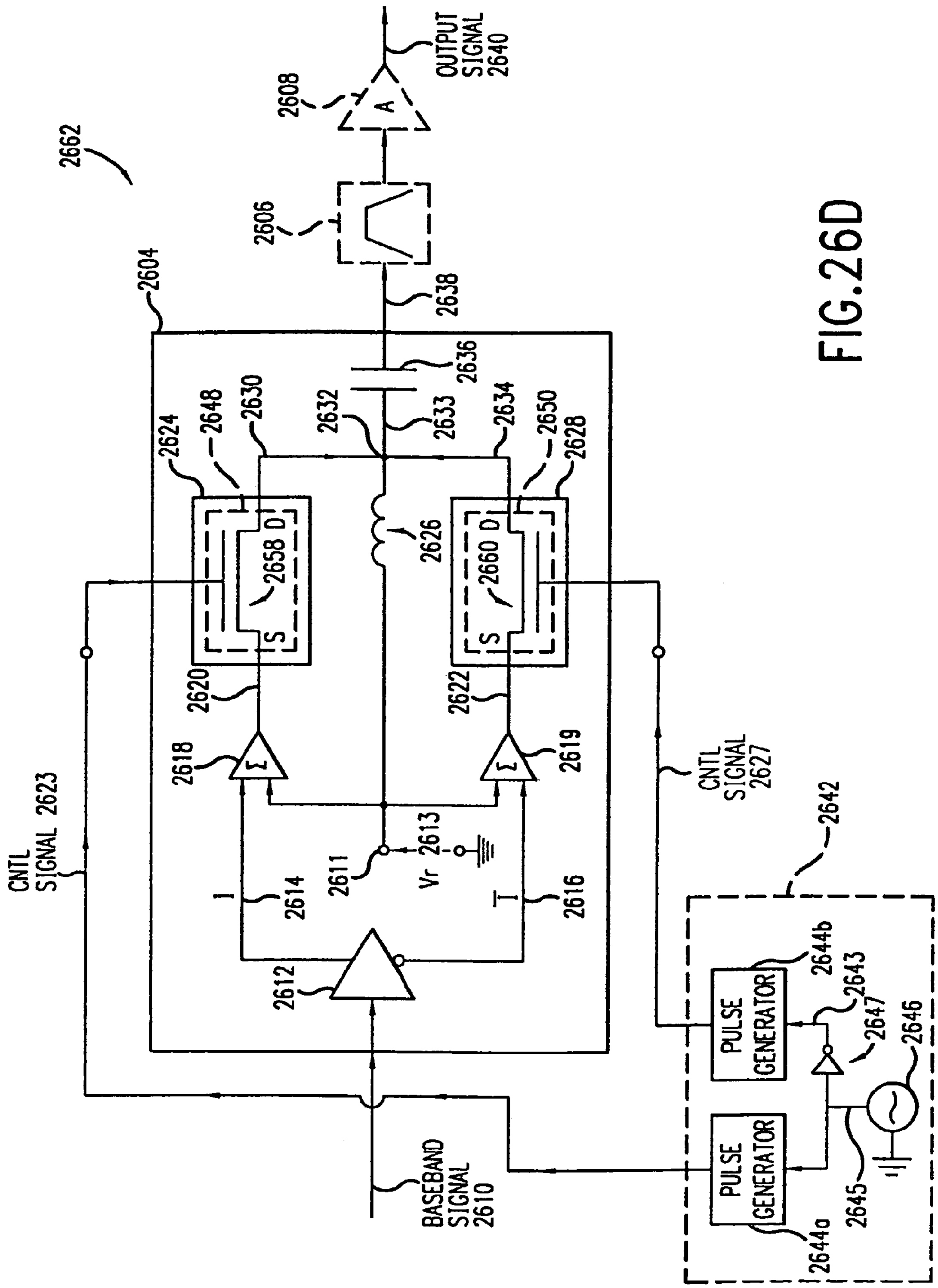
FIG. 26D illustrates example FET configurations of the balanced transmitter 2602.
Figure 56D:
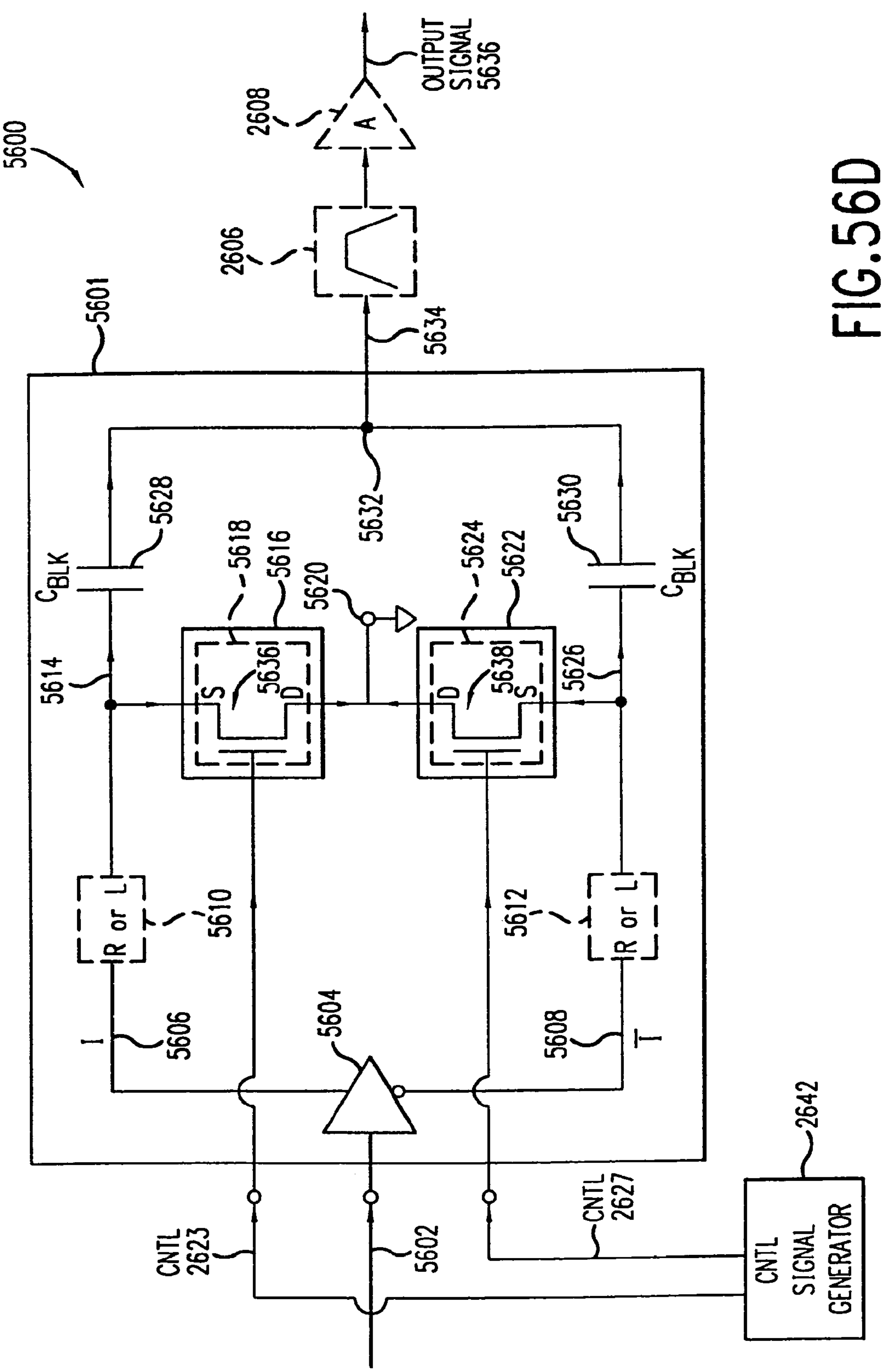
FIG. 56D illustrates a FET configuration for the modulator 5600.

As described above, the balanced modulators 2604 and 5601 utilize two balanced UFT modules to sample the input baseband signals to generate harmonically rich signals that contain the up-converted baseband information. More specifically, the UFT modules include controlled switches that sample the baseband signal in a balanced and differential fashion. FIGS. 26D and 56D illustrate embodiments of the controlled switch in the UFT module.

FIG. 26D illustrates an example embodiment of the modulator 2604 (FIG. 26B) where the controlled switches in the UFT modules are field effect transistors (FET). More specifically, the controlled switches 2648 and 2628 are embodied as FET 2658 and FET 2660, respectively. The FET 2658 and 2660 are oriented so that their gates are controlled by the control signals 2623 and 2627, so that the control signals control the FET conductance. For the FET 2658, the combined baseband signal 2620 is received at the source of the FET 2658 and is sampled according to the control signal 2623 to produce the harmonically rich signal 2630 at the drain of the FET 2658. Likewise, the combined baseband signal 2622 is received at the source of the FET 2660 and is sampled according to the control signal 2627 to produce the harmonically rich signal 2634 at the drain of FET 2660. The source and drain orientation that is illustrated is not limiting, as the source and drains can be switched for most FETs. In other words, the combined baseband signal can be received at the drain of the FETs, and the harmonically rich signals can be taken from the source of the FETs, as will be understood by those skilled in the relevant arts.

FIG. 56D illustrates an embodiment of the modulator 5600 (FIG. 56) where the controlled switches in the UFT modules are field effect transistors (FET). More specifically, the controlled switches 5618 and 5624 are embodied as FET 5636 and FET 5638, respectively. The FETs 5636 and 5638 are oriented so that their gates are controlled by the control signals 2623 and 2627, respectively, so that the control signals determine FET conductance. For the FET 5636, the baseband signal 5606 is received at the source of the FET 5636 and shunted to ground according to the control signal 2623, to produce the harmonically rich signal 5614. Likewise, the baseband signal 5608 is received at the source of the FET 5638 and is shunted to grounding according to the control signal 2627, to produce the harmonically rich signal 5626. The source and drain orientation that is illustrated is not limiting, as the source and drains can be switched for most FETs, as will be understood by those skilled in the relevant arts.

7.1.5 Universal Transmitter Configured for Carrier Insertion

As discussed above, the transmitters 2602 and 5600 have a balanced configuration that substantially eliminates any DC offset and results in minimal carrier insertion in the output signal 2640. Minimal carrier insertion is generally desired for most applications because the carrier signal carries no information and reduces the overall transmitter efficiency. However, some applications require the received signal to have sufficient carrier energy for the receiver to extract the carrier for coherent demodulation. In support thereof, the present invention can be configured to provide the necessary carrier insertion by implementing a DC offset between the two sampling UFT modules.

Figure 28A:
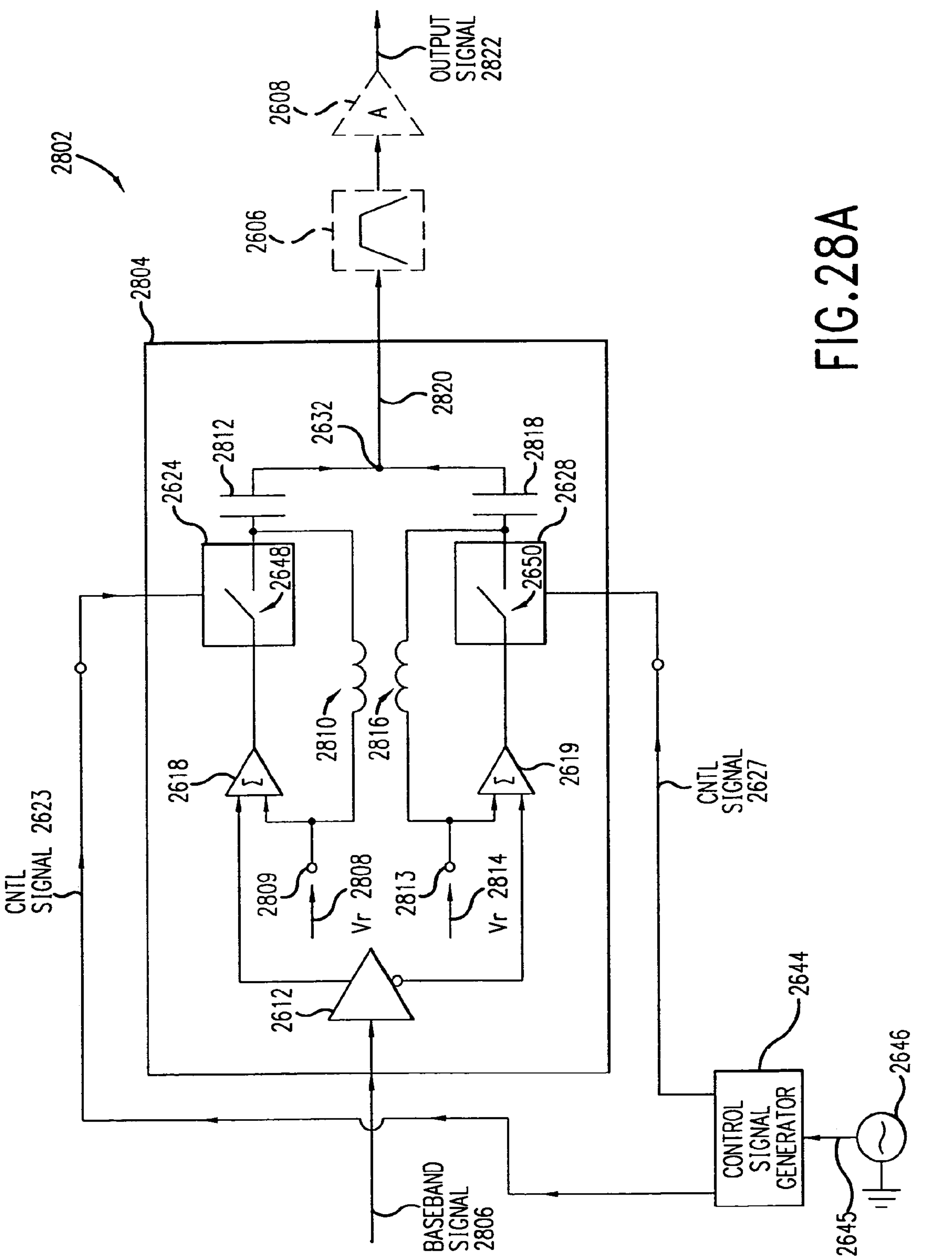
FIG. 28A illustrate a balanced modulator 2802 configured for carrier insertion according to embodiments of the present invention.

FIG. 28A illustrates a transmitter 2802 that up-converts a baseband signal 2806 to an output signal 2822 having carrier insertion. As is shown, the transmitter 2802 is similar to the transmitter 2602 (FIG. 26A) with the exception that the up-converter/modulator 2804 is configured to accept two DC references voltages. In contrast, modulator 2604 was configured to accept only one DC reference voltage. More specifically, the modulator 2804 includes a terminal 2809 to accept a DC reference voltage 2808, and a terminal 2813 to accept a DC reference voltage 2814. Vr 2808 appears at the UFT module 2624 though summer amplifier 2618 and the inductor 2810. Vr 2814 appears at UFT module 2628 through the summer amplifier 2619 and the inductor 2816. Capacitors 2812 and 2818 operate as blocking capacitors. If Vr 2808 is different from Vr 2814 then a DC offset voltage will be exist between UFT module 2624 and UFT module 2628, which will be up-converted at the carrier frequency in the harmonically rich signal 2820. More specifically, each harmonic image in the harmonically rich signal 2820 will include a carrier signal as depicted in FIG. 28B.

Figure 28B:
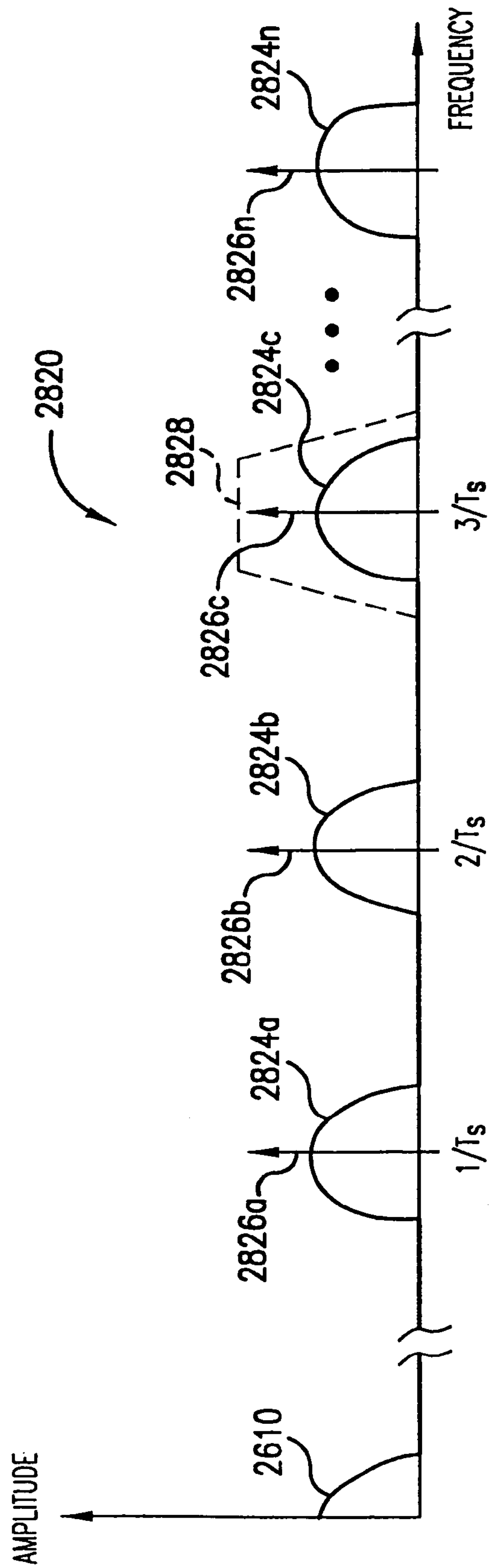
FIG. 28B illustrates example signal diagrams associated with the balanced transmitter 2802 according to embodiments of the invention.

FIG. 28B illustrates an exemplary frequency spectrum for the harmonically rich signal 2820 that has multiple harmonic images 2824*a-n*. In addition to carrying the baseband information in the sidebands, each harmonic image 2824 also includes a carrier signal 2826 that exists at respective harmonic of the sampling frequency $1/T_S$. The amplitude of the carrier signal increases with increasing DC offset voltage. Therefore, as the difference between Vr 2808 and Vr 2814 widens, the amplitude of each carrier signal 2826 increases. Likewise, as the difference between Vr 2808 and Vr 2814 shrinks, the amplitude of each carrier signal 2826 shrinks. As with transmitter 2802, the optional bandpass filter 2606 can be included to select a desired harmonic image for transmission. This is represented by passband 2828 in FIG. 28B.

7.2 Universal Transmitter in I Q Configuration:

As described above, the balanced modulators 2604 and 5601 up-convert a baseband signal to a harmonically rich signal having multiple harmonic images of the baseband information. By combining two balanced modulators, IQ configurations can be formed for up-converting I and Q baseband signals. In doing so, either the (series type) balanced modulator 2604 or the (shunt type) balanced modulator can be utilized. IQ modulators having both series and shunt configurations are described below.

7.2.1 IQ Transmitter Using Series-Type Balanced Modulator

Figure 29:
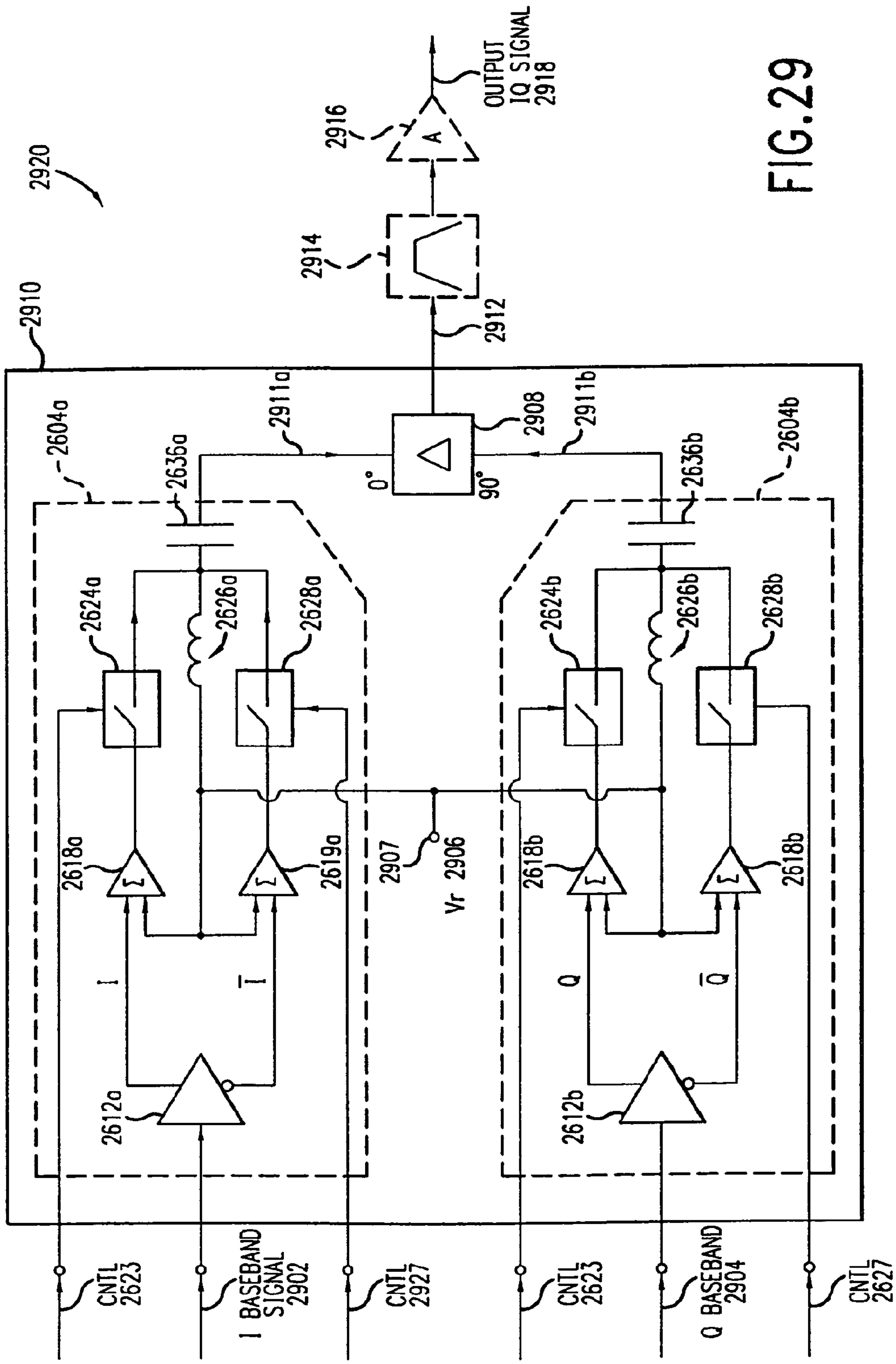
FIG. 29 illustrates an I Q balanced transmitter 2920 according to embodiments of the present invention.

FIG. 29 illustrates an IQ transmitter 2920 with an in-phase (I) and quadrature (Q) configuration according to embodiments of the invention. The transmitter 2920 includes an IQ balanced modulator 2910, an optional filter 2914, and an optional amplifier 2916. The transmitter 2920 is useful for transmitting complex I Q waveforms and does so in a balanced manner to control DC offset and carrier insertion. In doing so, the modulator 2910 receives an I baseband signal 2902 and a Q baseband signal 2904 and up-converts these signals to generate a combined harmonically rich signal 2912. The harmonically rich signal 2912 includes multiple harmonics images, where each image contains the baseband information in the I signal 2902 and the Q signal 2904. The optional bandpass filter 2914 may be included to select a harmonic of interest (or subset of harmonics) from the signal 2912 for transmission. The optional amplifier 2916 may be included to amplify the selected harmonic prior to transmission, to generate the IQ output signal 2918.

Figure 65:
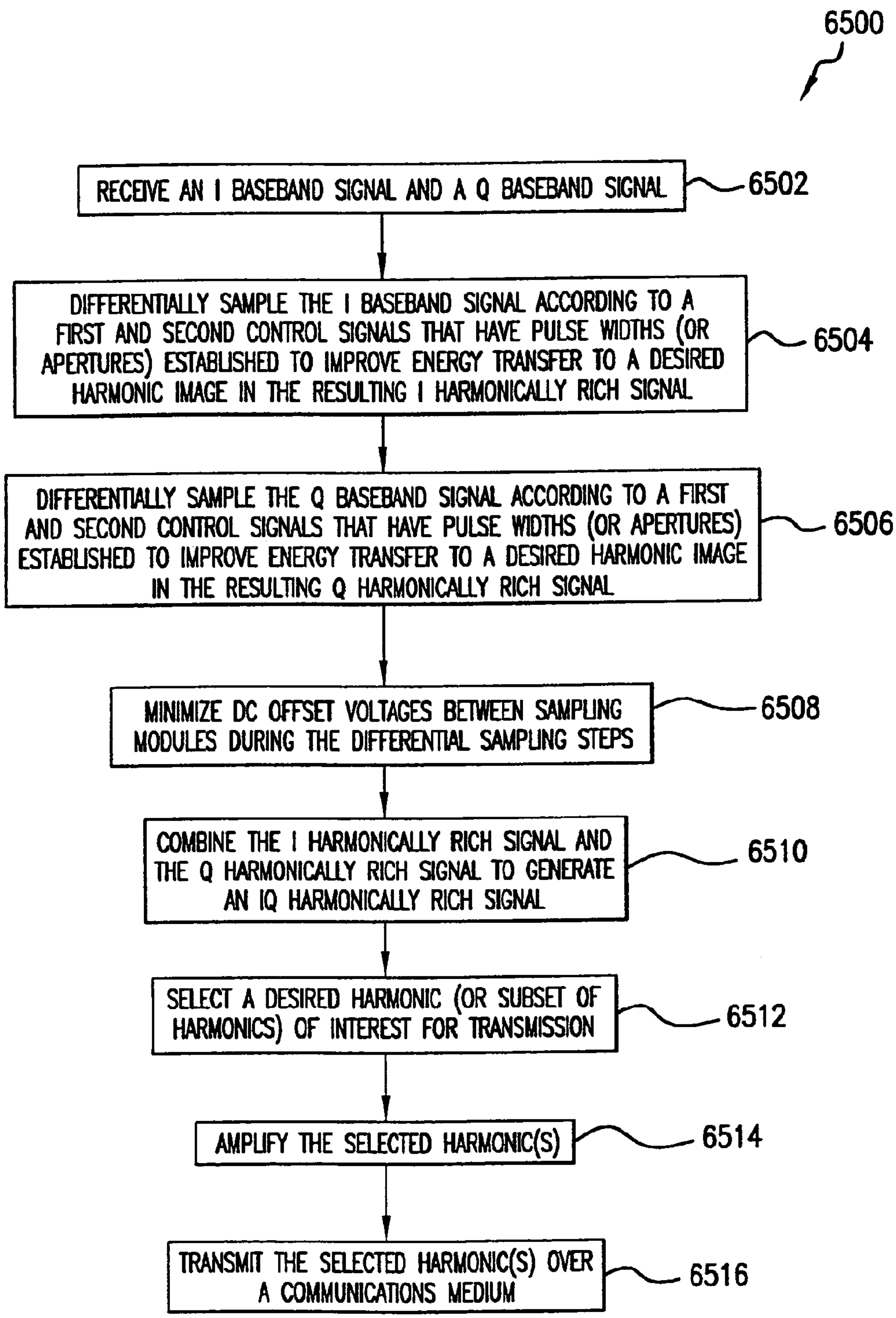
FIG. 65 illustrates the flowchart 6500 that is associated with the transmitter 2920 in the FIG. 29 according to an embodiment of the invention.

As stated above, the balanced IQ modulator 2910 up-converts the I baseband signal 2902 and the Q baseband signal 2904 in a balanced manner to generate the combined harmonically rich signal 2912 that carriers the I and Q baseband information. To do so, the modulator 2910 utilizes two balanced modulators 2604 from FIG. 26A, a signal combiner 2908, and a DC terminal 2907. The operation of the balanced modulator 2910 and other circuits in the transmitter is described according to the flowchart 6500 in FIG. 65, as follows.

In step 6502, the IQ modulator 2910 receives the I baseband signal 2902 and the Q baseband signal 2904.

In step 6504, the I balanced modulator 2604*a* samples the I baseband signal 2902 in a differential fashion using the control signals 2623 and 2627 to generate a harmonically rich signal 2911*a*. The harmonically rich signal 2911*a* contains multiple harmonic images of the I baseband information, similar to the harmonically rich signal 2630 in FIG. 26B.

In step 6506, the balanced modulator 2604*b* samples the Q baseband signal 2904 in a differential fashion using control signals 2623 and 2627 to generate harmonically rich signal 2911*b*, where the harmonically rich signal 2911*b* contains multiple harmonic images of the Q baseband signal 2904. The operation of the balanced modulator 2604 and the generation of harmonically rich signals was fully described above and illustrated in FIGS. 26A-C, to which the reader is referred for further details.

In step 6508, the DC terminal 2907 receives a DC voltage 2906 that is distributed to both modulators 2604*a* and 2604*b*. The DC voltage 2906 is distributed to both the input and output of both UFT modules 2624 and 2628 in each modulator 2604. This minimizes (or prevents) DC offset voltages from developing between the four UFT modules, and thereby minimizes or prevents any carrier insertion during the sampling steps 6504 and 6506.

Figure 30A:
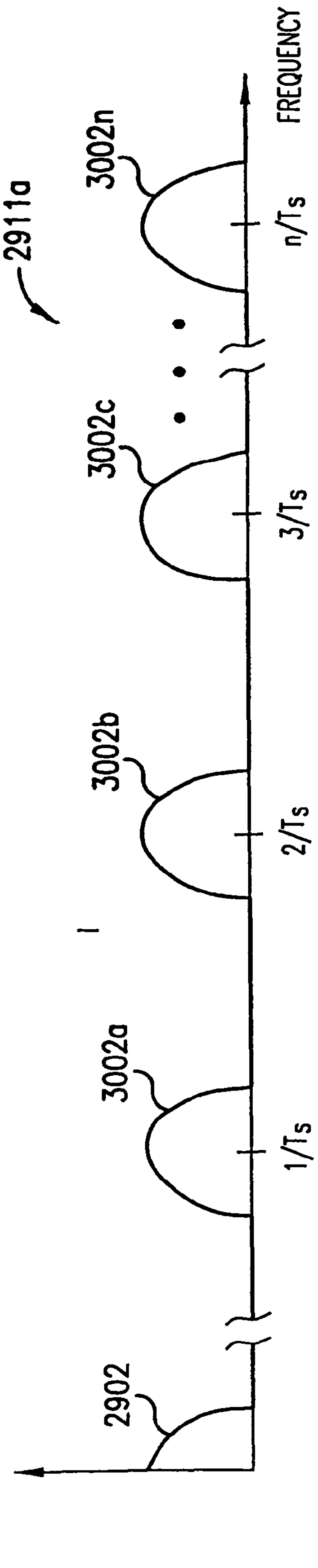
FIGS. 30A-C illustrate various example signal diagrams associated with the balanced transmitter 2920 in FIG. 29.
Figure 30B:
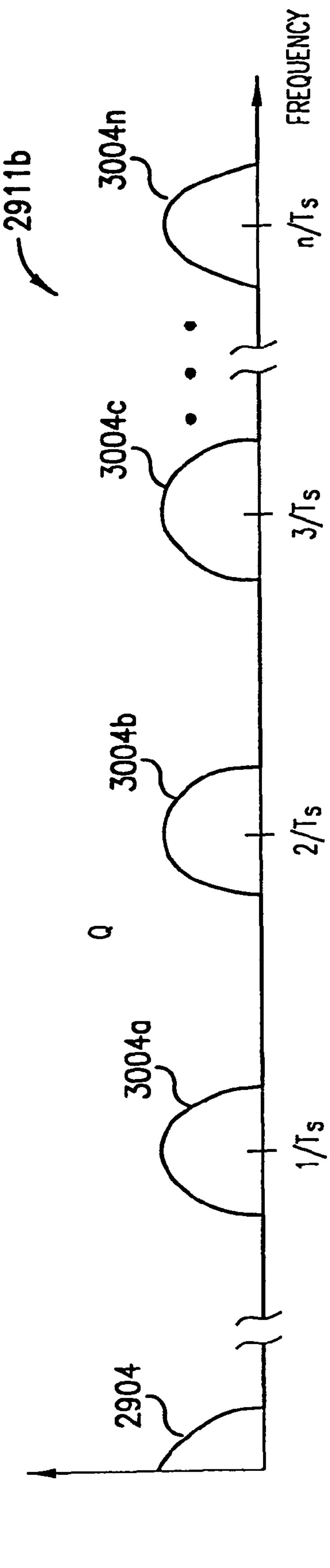
Figure 30C:
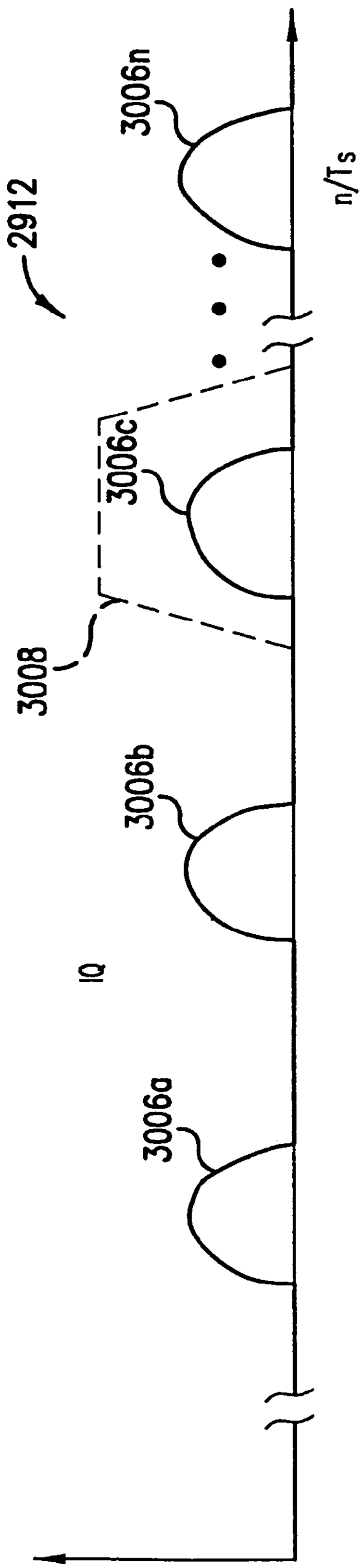

In step 6510, the 90 degree signal combiner 2908 combines the harmonically rich signals 2911*a* and 2911*b* to generate IQ harmonically rich signal 2912. This is further illustrated in FIGS. 30A-C. FIG. 30A depicts an exemplary frequency spectrum for the harmonically rich signal 2911*a* having harmonic images 3002*a-n*. The images 3002 repeat at harmonics of the sampling frequency $1/T_S$, where each image 3002 contains the necessary amplitude and frequency information to reconstruct the I baseband signal 2902. Likewise, FIG. 30B depicts an exemplary frequency spectrum for the harmonically rich signal 2911*b* having harmonic images 3004*a-n*. The harmonic images 3004*a-n* also repeat at harmonics of the sampling frequency $1/T_S$, where each image 3004 contains the necessary amplitude, frequency, and phase information to reconstruct the Q baseband signal 2904. FIG. 30C illustrates an exemplary frequency spectrum for the combined harmonically rich signal 2912 having images 3006. Each image 3006 carries the I baseband information and the Q baseband information from the corresponding images 3002 and 3004, respectively, without substantially increasing the frequency bandwidth occupied by each harmonic 3006. This can occur because the signal combiner 2908 phase shifts the Q signal 2911*b* by 90 degrees relative to the I signal 2911*a*. The result is that the images 3002*a-n* and 3004*a-n* effectively share the signal bandwidth do to their orthogonal relationship. For example, the images 3002*a* and 3004*a* effectively share the frequency spectrum that is represented by the image 3006*a*.

In step 6512, the optional filter 2914 can be included to select a harmonic of interest, as represented by the passband 3008 selecting the image 3006*c* in FIG. 30*c*.

In step 6514, the optional amplifier 2916 can be included to amplify the harmonic (or harmonics) of interest prior to transmission.

In step 6516, the selected harmonic (or harmonics) is transmitted over a communications medium.

Figure 31A:
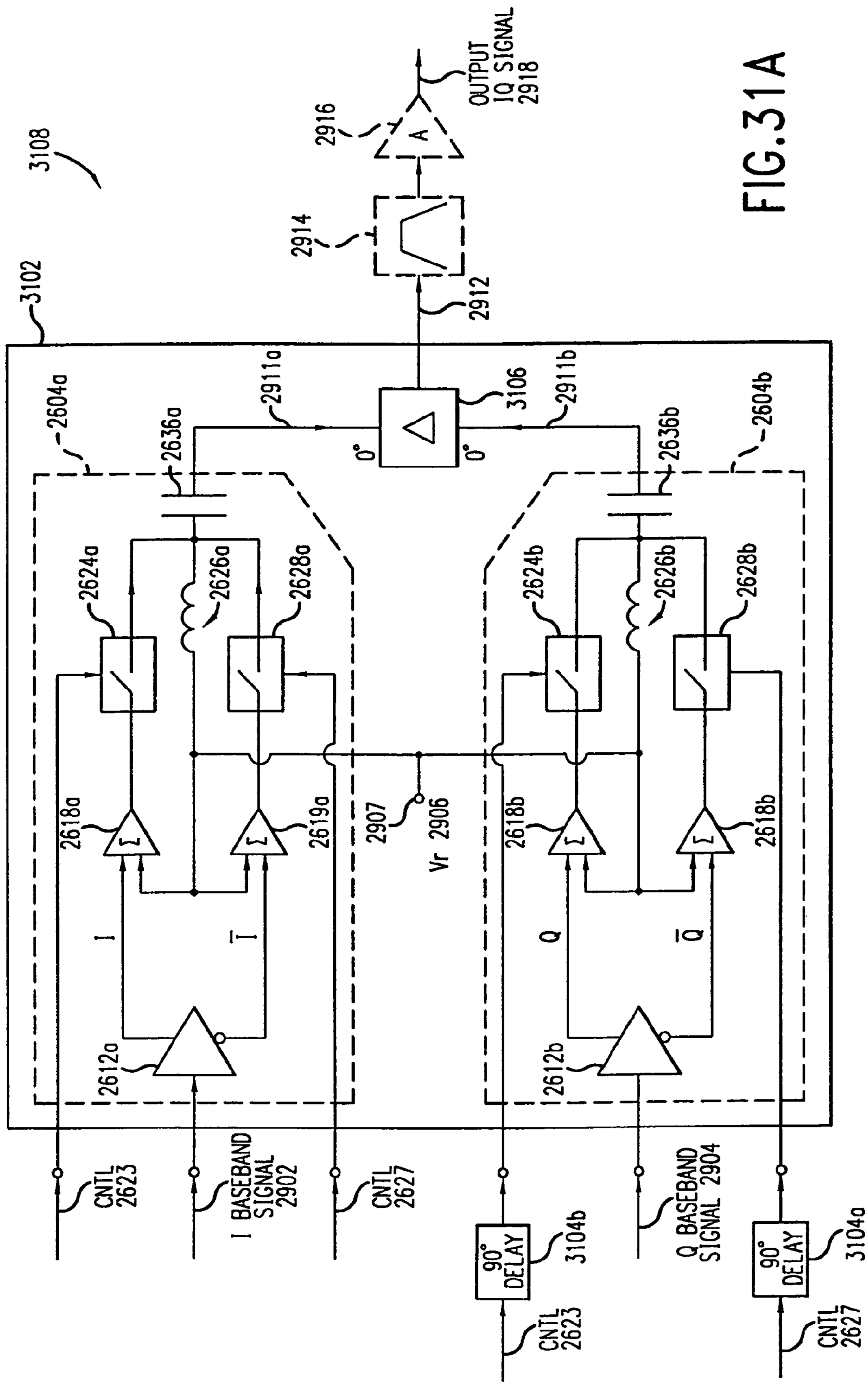
FIG. 31A illustrates an I Q balanced transmitter 3108 according to embodiments of the invention.

FIG. 31A illustrates a transmitter 3108 that is a second embodiment for an I Q transmitter having a balanced configuration. Transmitter 3108 is similar to the transmitter 2920 except that the 90 degree phase shift between the I and Q channels is achieved by phase shifting the control signals instead of using a 90 degree signal combiner to combine the harmonically rich signals. More specifically, delays 3104*a* and 3104*b* delay the control signals 2623 and 2627 for the Q channel modulator 2604*b* by 90 degrees relative the control signals for the I channel modulator 2604*a*. As a result, the Q modulator 2604*b* samples the Q baseband signal 2904 with 90 degree delay relative to the sampling of the I baseband signal 2902 by the I channel modulator 2604*a*. Therefore, the Q harmonically rich signal 2911*b* is phase shifted by 90 degrees relative to the I harmonically rich signal. Since the phase shift is achieved using the control signals, an in-phase signal combiner 3106 combines the harmonically rich signals 2911*a* and 2911*b*, to generate the harmonically rich signal 2912.

Figure 31B:
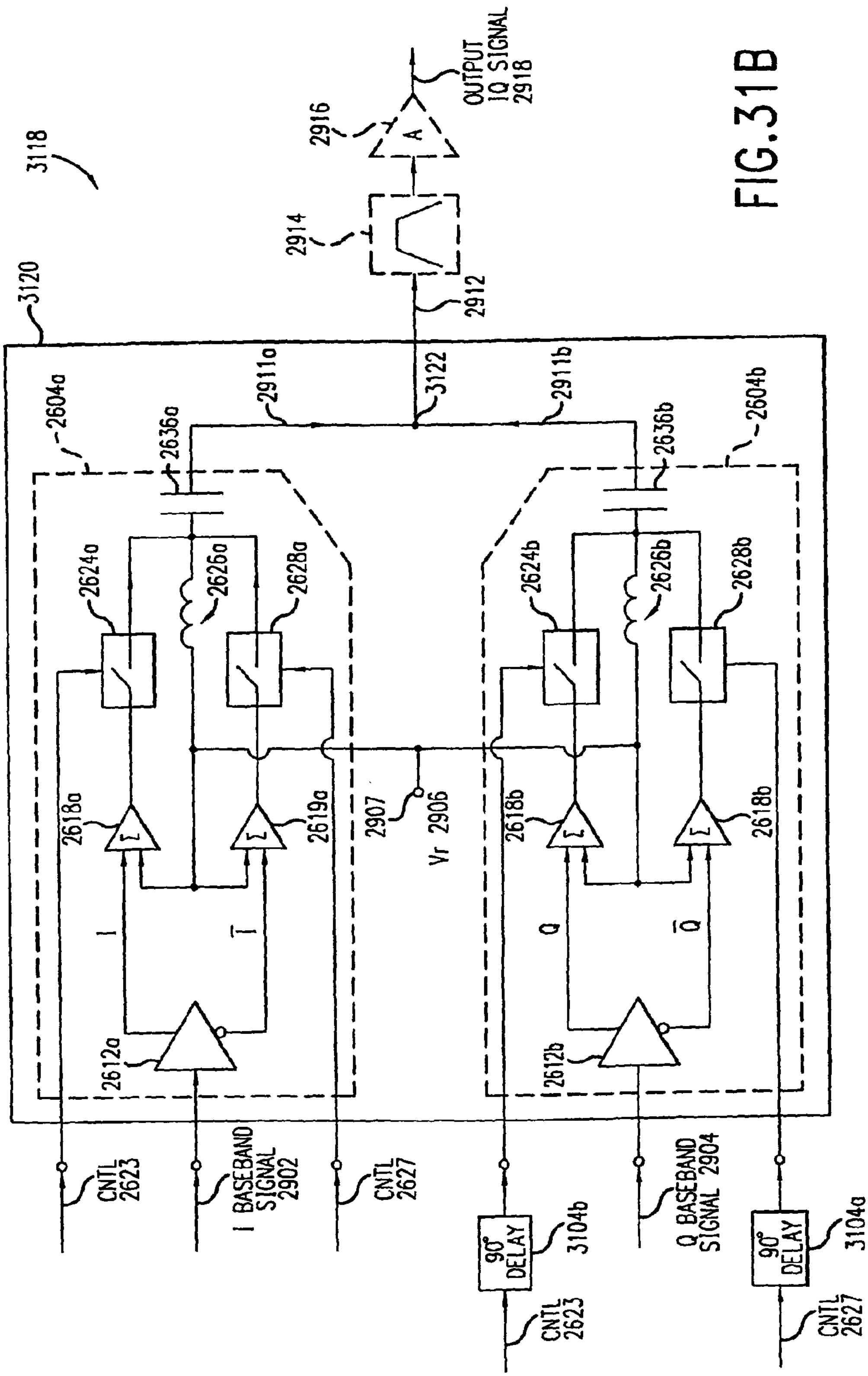
FIG. 31B illustrates an I Q balanced modulator 3118 according to embodiments of the invention.

FIG. 31B illustrates a transmitter 3118 that is similar to transmitter 3108 in FIG. 31A. The difference being that the transmitter 3118 has a modulator 3120 that utilizes a summing node 3122 to sum the signals 2911*a* and 2911*b* instead of the in-phase signal combiner 3106 that is used in modulator 3102 of transmitter 3108.

FIG. 55A-55D illustrate various detailed circuit implementations of the transmitter 2920 in FIG. 29. These circuit implementations are meant for example purposes only, and are not meant to be limiting.

Figure 55A:
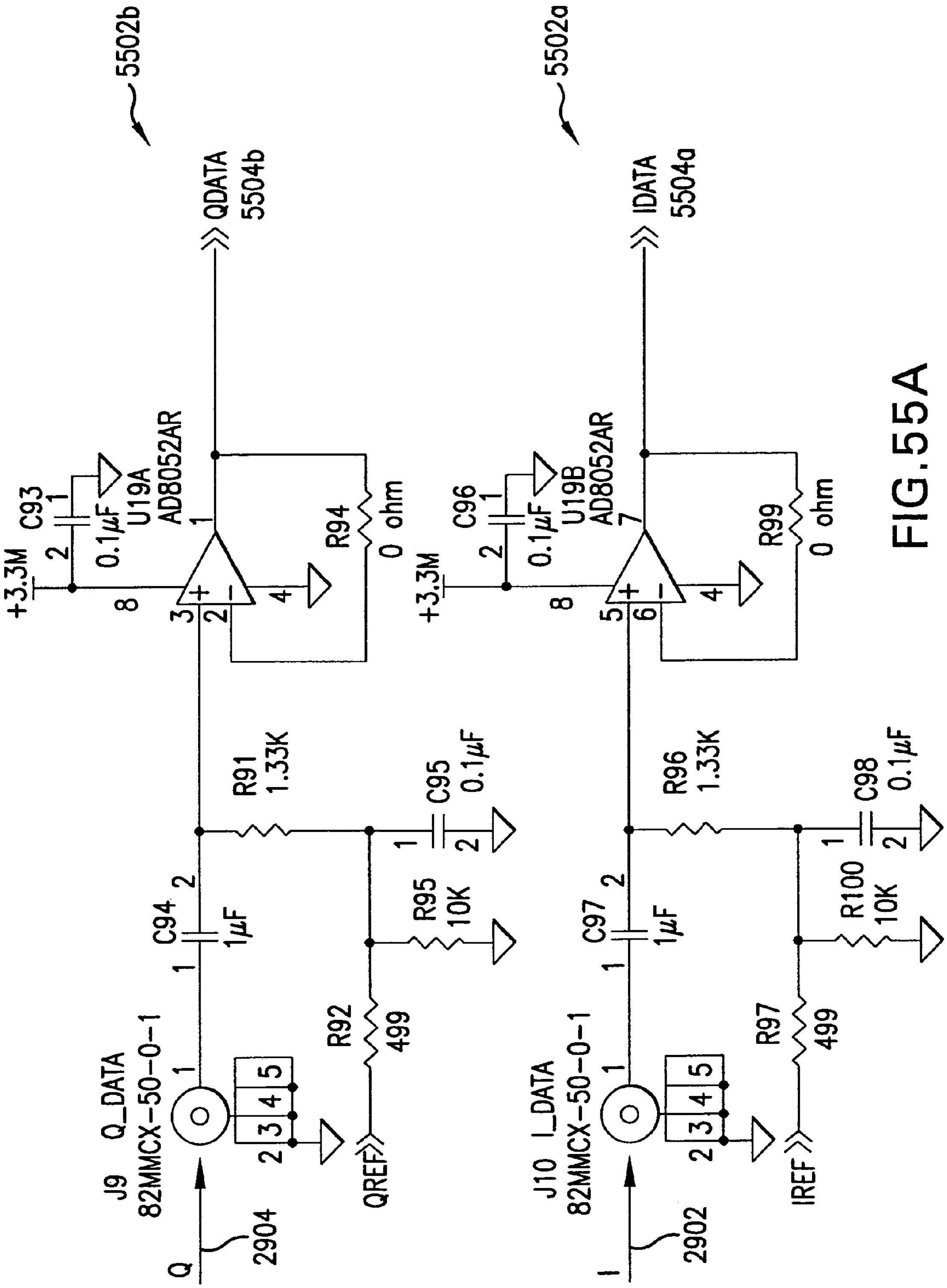
FIGS. 55A-D illustrates various implementation circuits for the modulator 2910 according to embodiments of the present invention.

FIG. 55A illustrates I input circuitry 5502*a* and Q input circuitry 5502*b* that receive the I and Q input signals 2902 and 2904, respectively.

Figures 1, 55B:
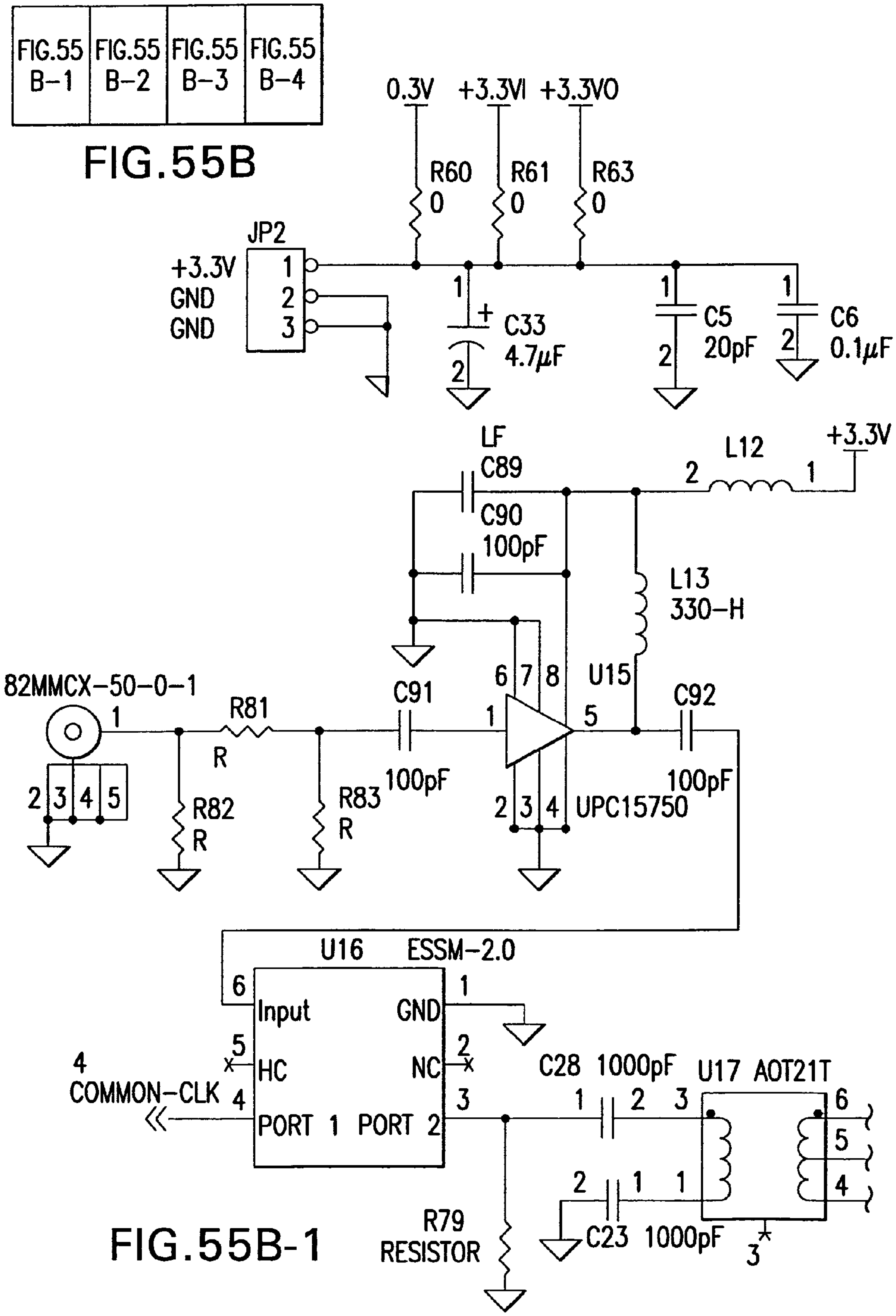
Figures 2, 55B:
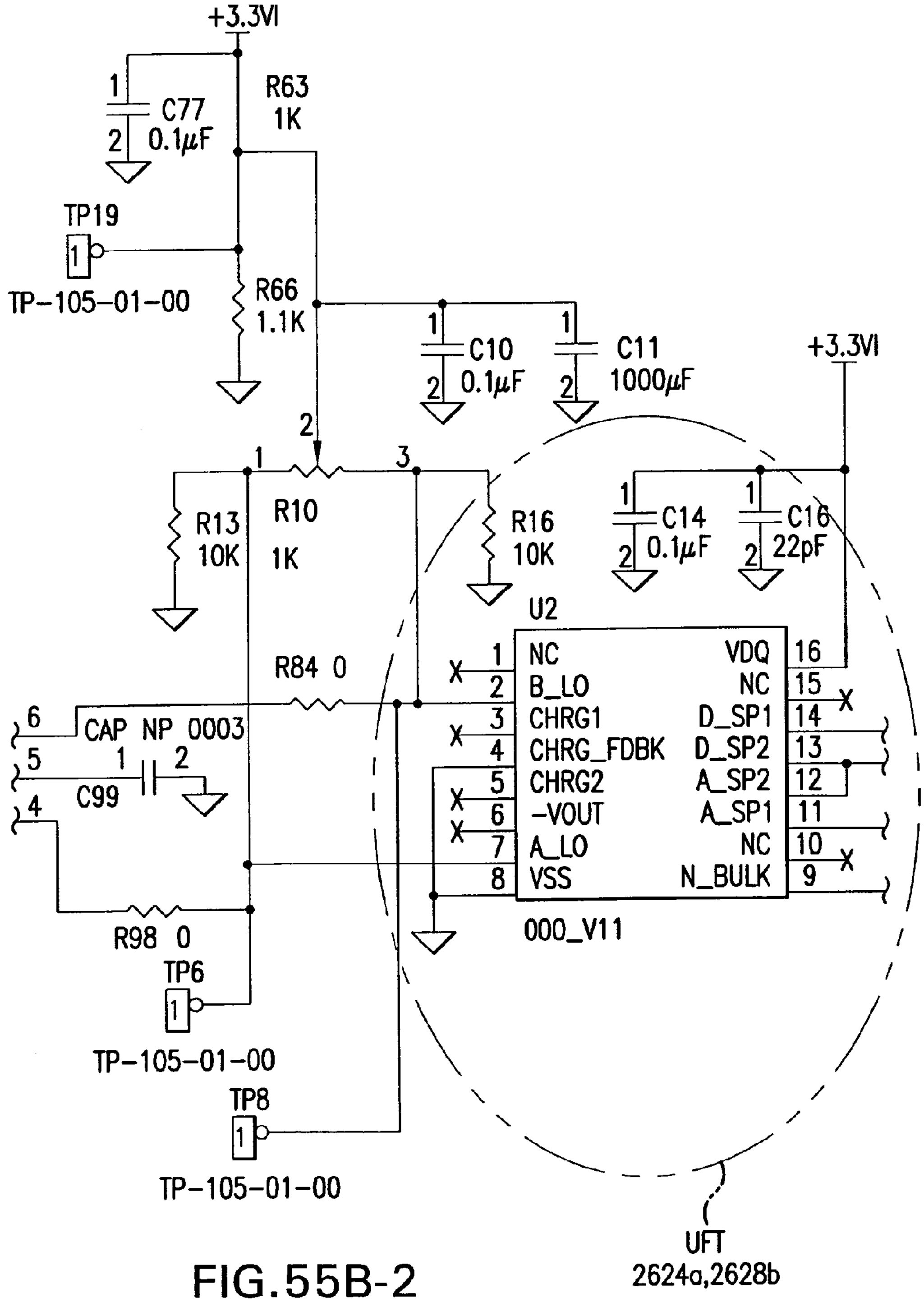
Figures 3, 55B:
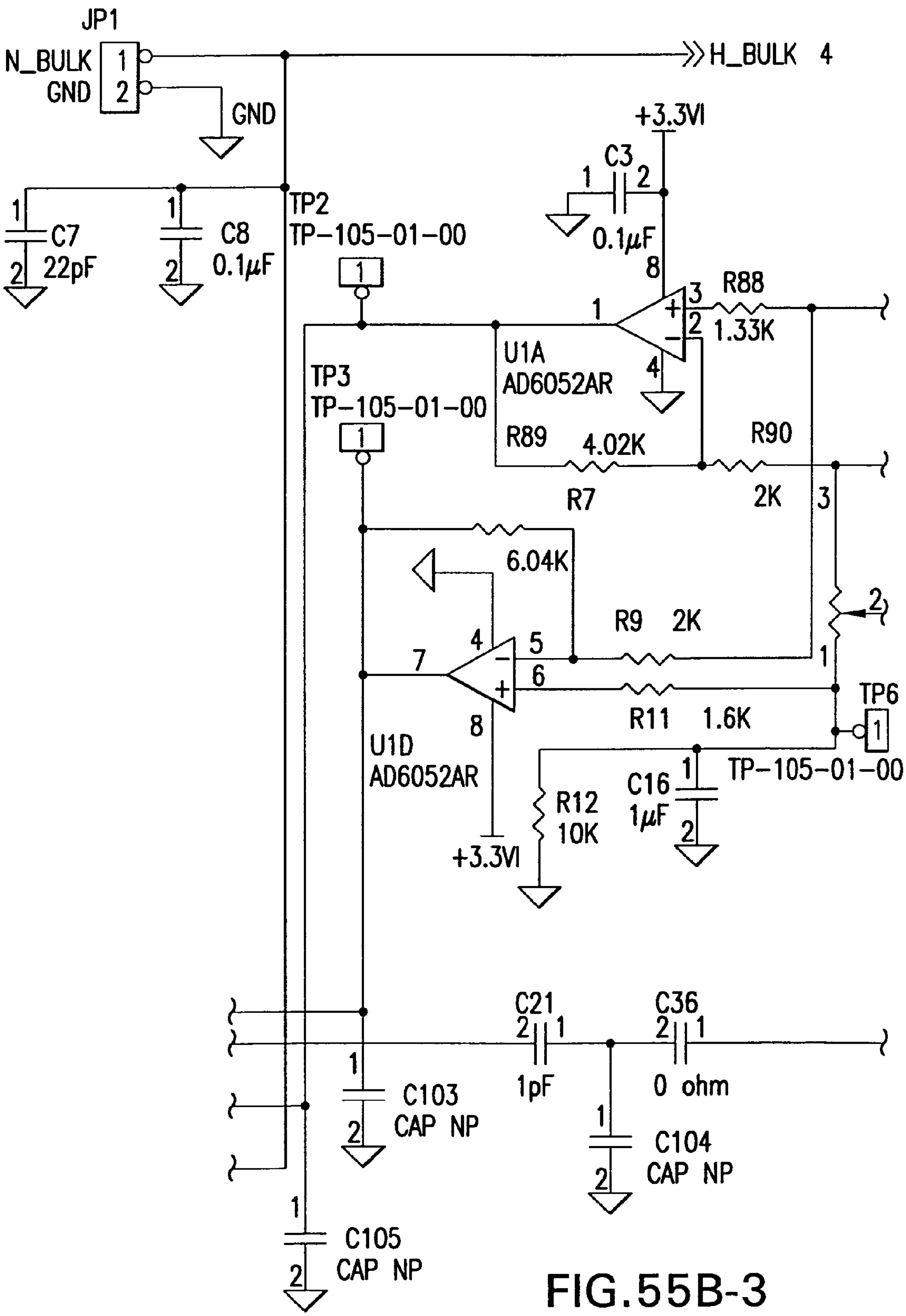
Figures 4, 55B:
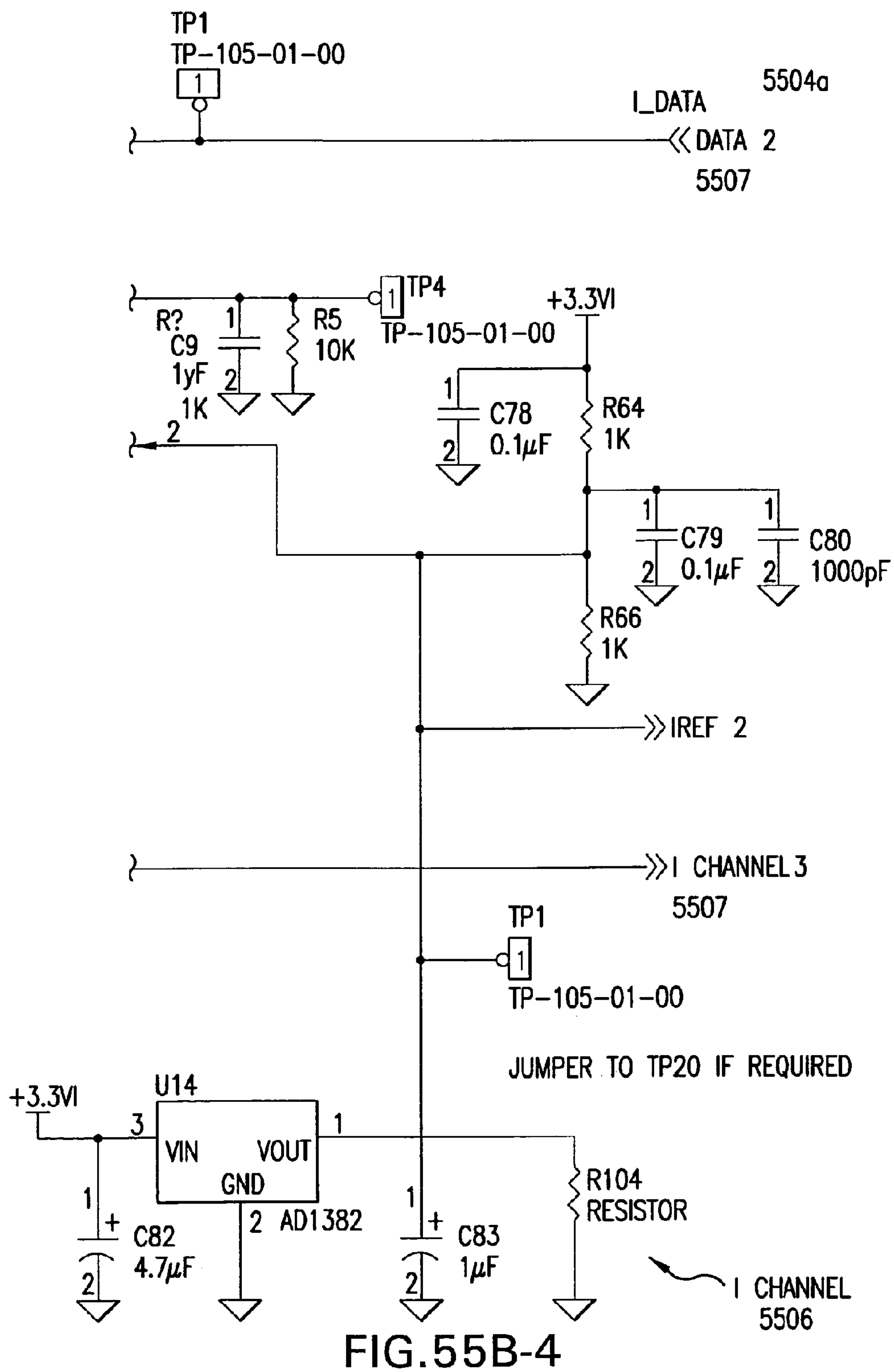

FIG. 55B illustrates the I channel circuitry 5506 that processes an I data 5504*a* from the I input circuit 5502*a*.

Figures 1, 55C:
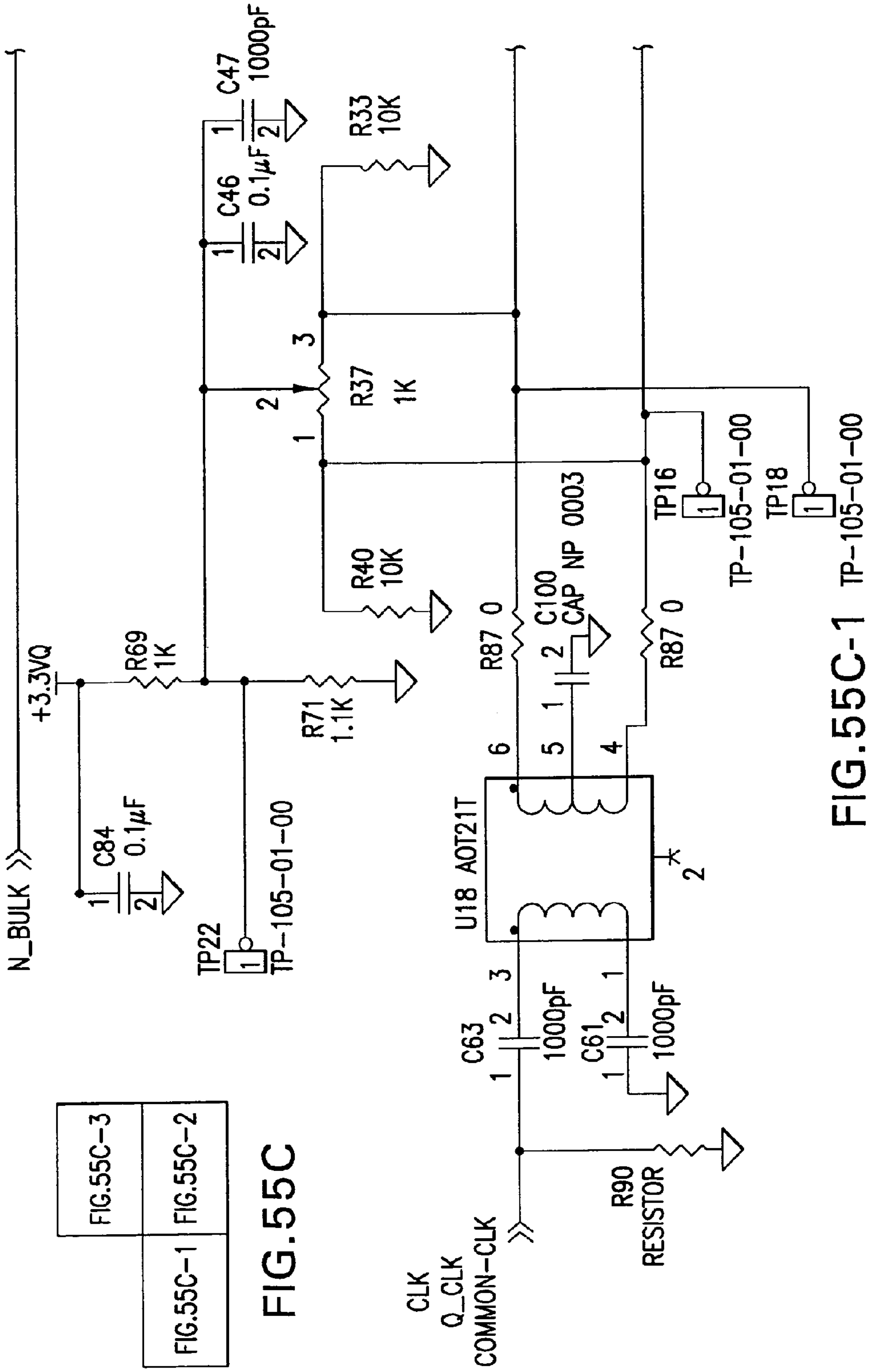
Figures 2, 55C:
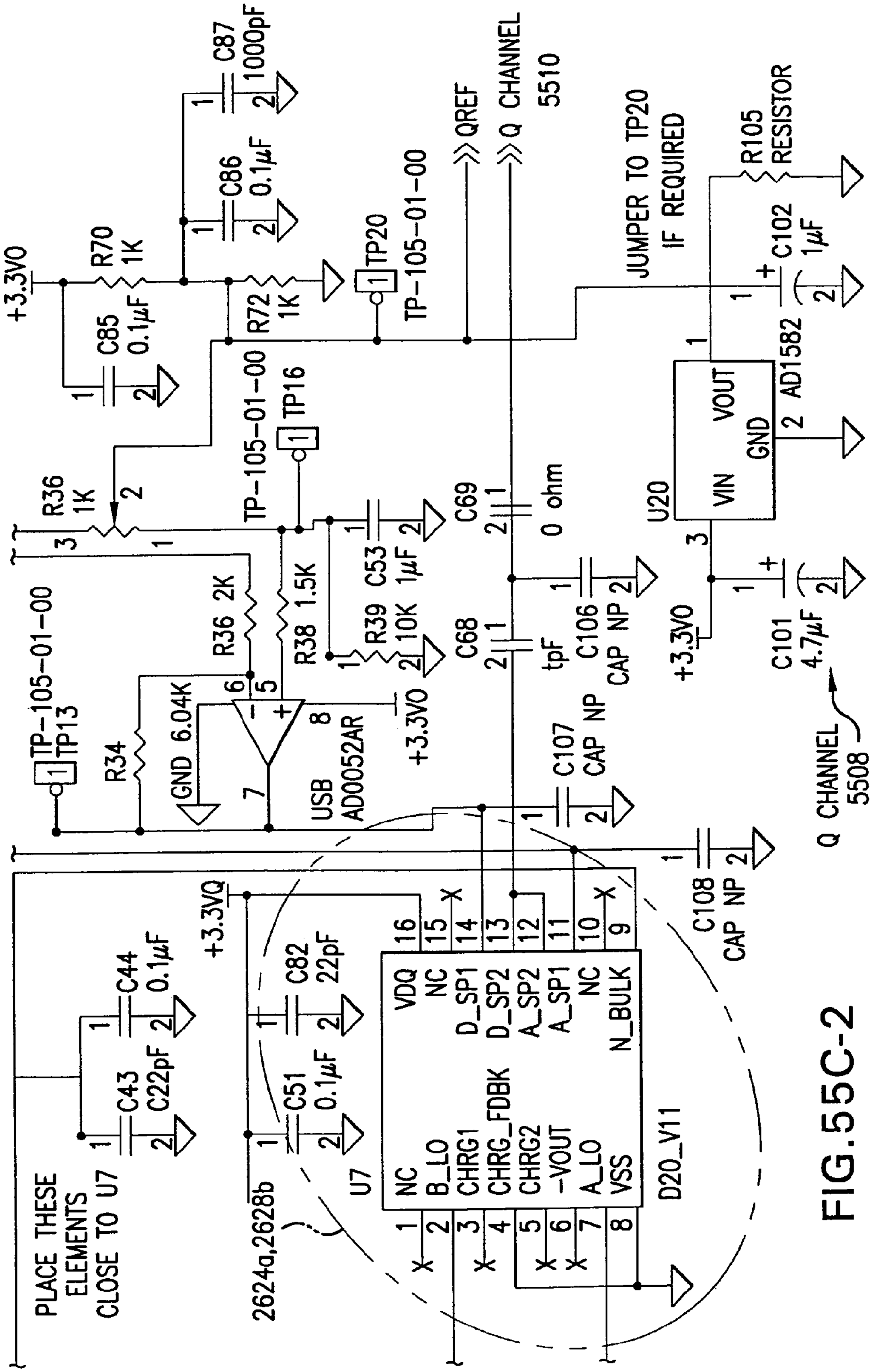
Figures 3, 55C:
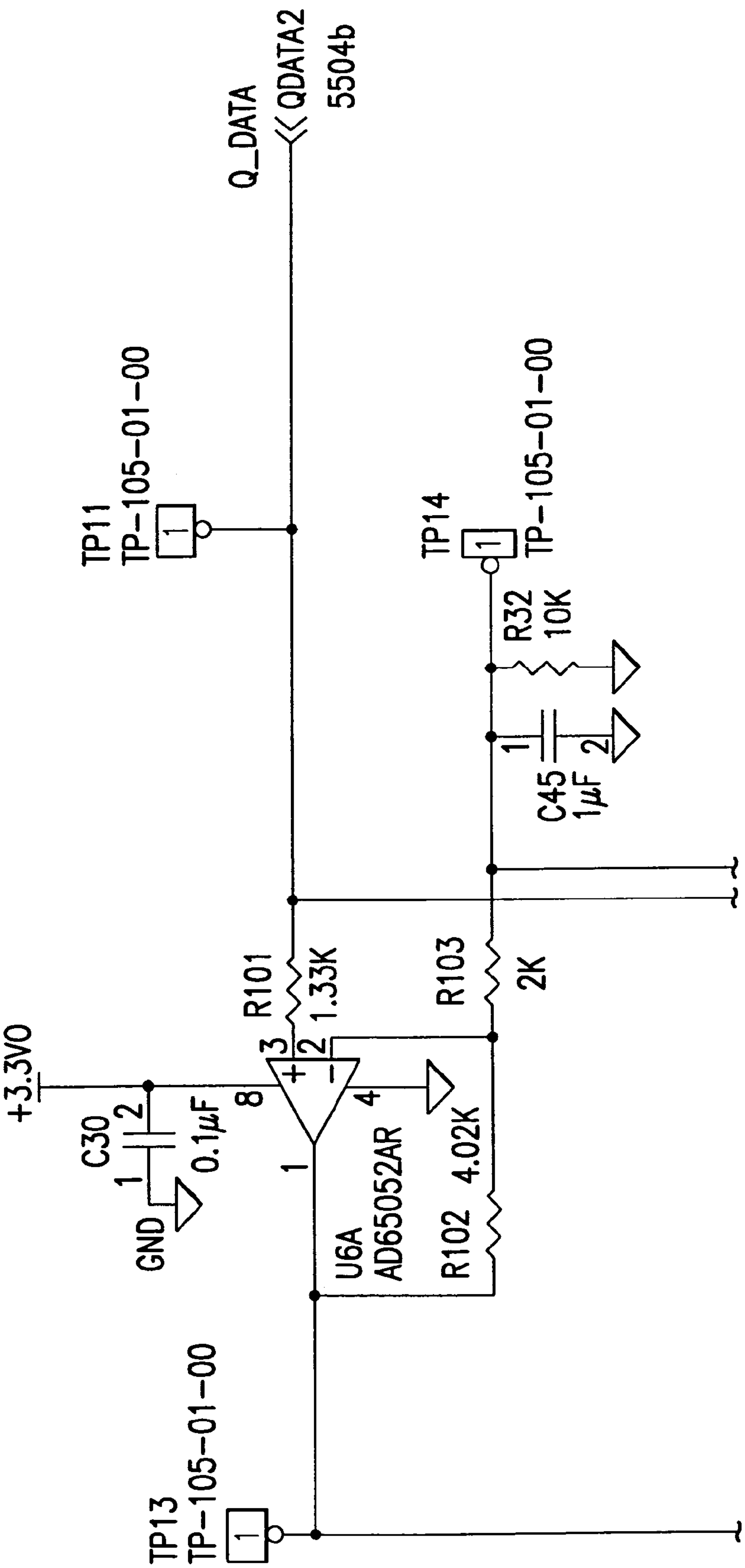

FIG. 55C illustrates the Q channel circuitry 5508 that processes the Q data 5504*b* from the Q input circuit 5502*b*.

Figure 55D:
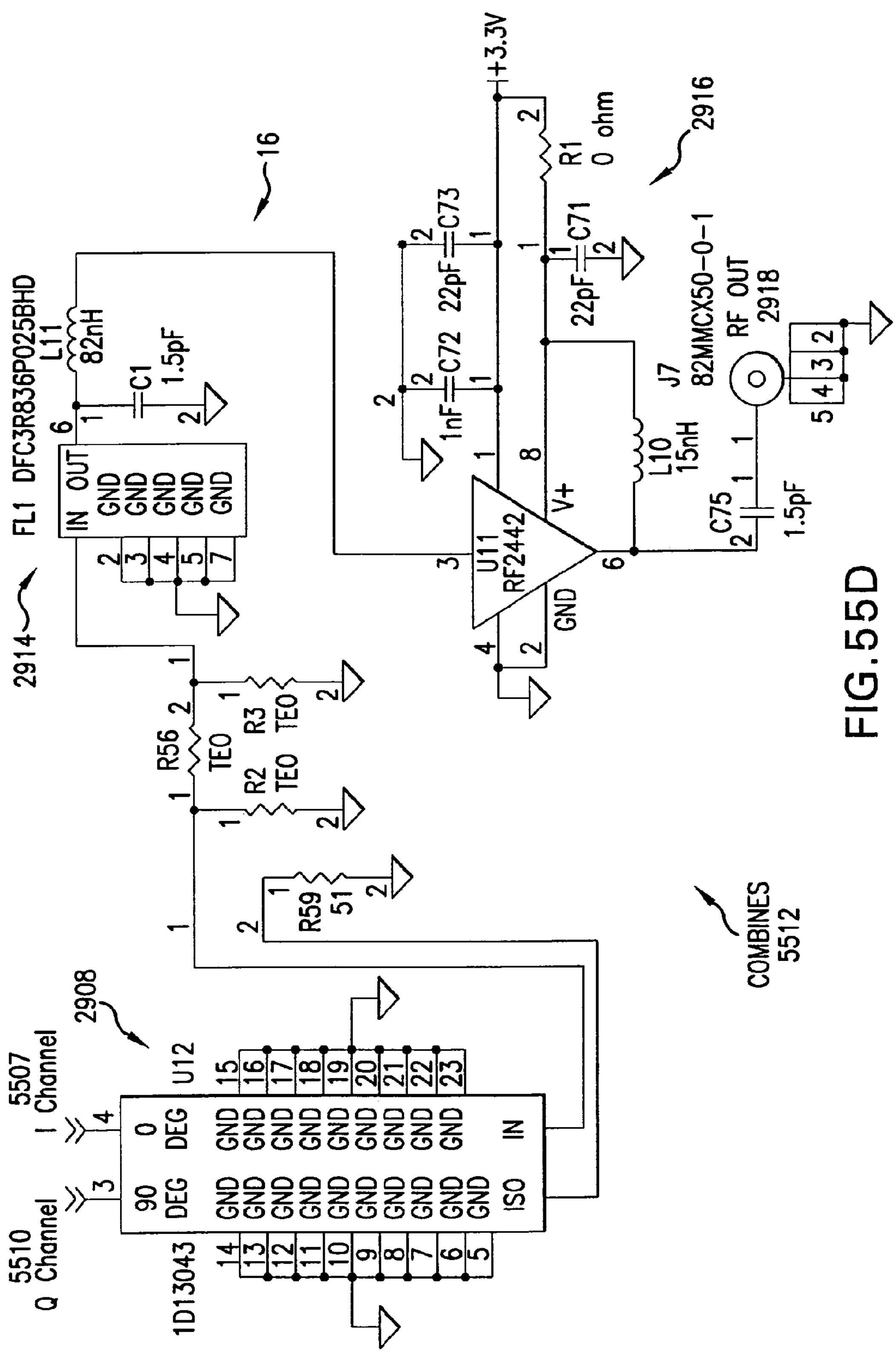

FIG. 55D illustrates the output combiner circuit 5512 that combines the I channel data 5507 and the Q channel data 5510 to generate the output signal 2918.

7.2.2. IQ Transmitter Using Shunt-Type Balanced Modulator

Figure 57:
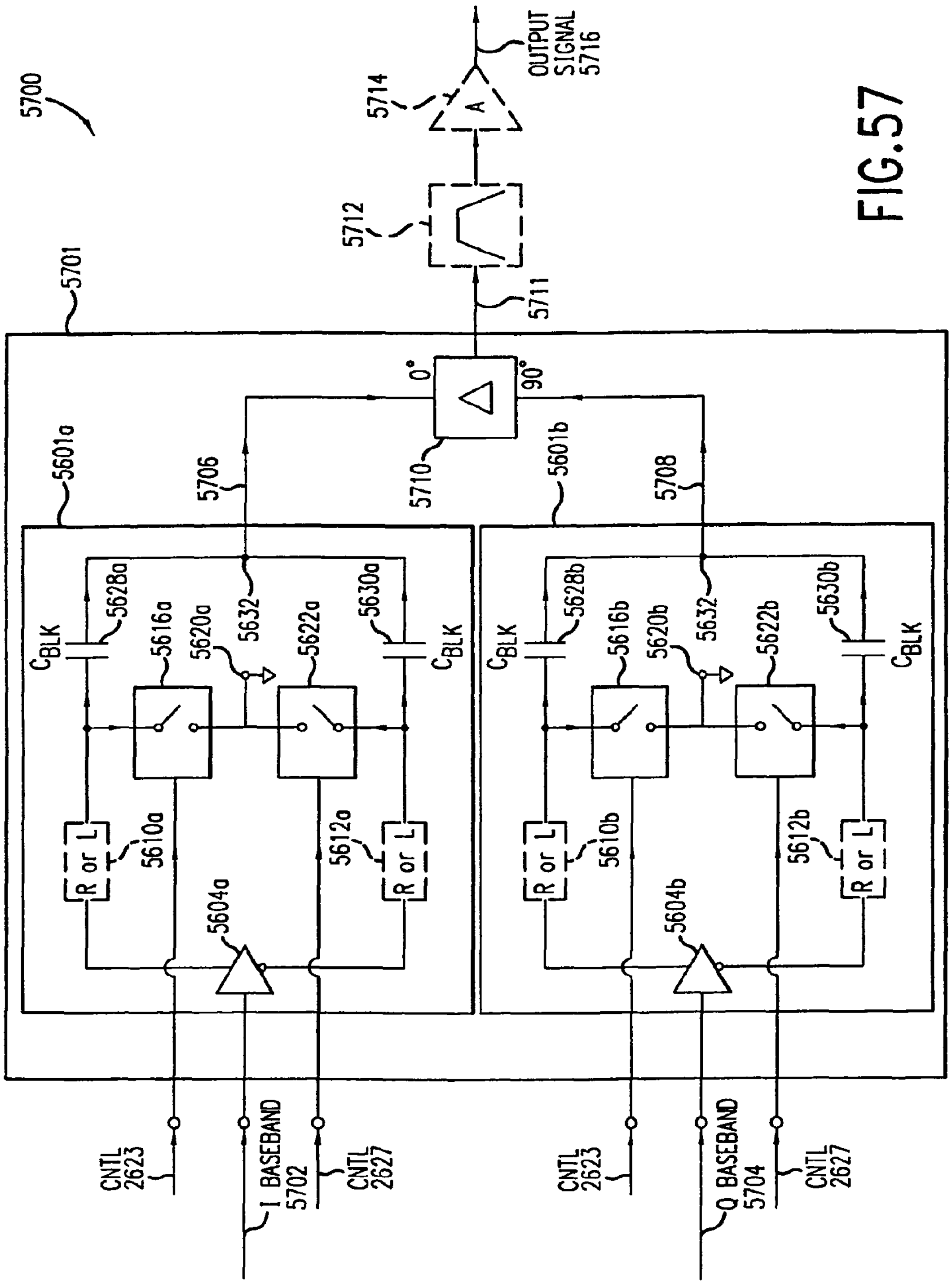
FIG. 57 illustrates a IQ transmitter 5700 according to embodiments of the present invention.

FIG. 57 illustrates an IQ transmitter 5700 that is another IQ transmitter embodiment according to the present invention. The transmitter 5700 includes an IQ balanced modulator 5701, an optional filter 5712, and an optional amplifier 5714. During operation, the modulator 5701 up-converts an I baseband signal 5702 and a Q baseband signal 5704 to generate a combined harmonically rich signal 5711. The harmonically rich signal 5711 includes multiple harmonics images, where each image contains the baseband information in the I signal 5702 and the Q signal 5704. The optional bandpass filter 5712 may be included to select a harmonic of interest (or subset of harmonics) from the harmonically rich signal 5711 for transmission. The optional amplifier 5714 may be included to amplify the selected harmonic prior to transmission, to generate the IQ output signal 5716.

Figure 66:
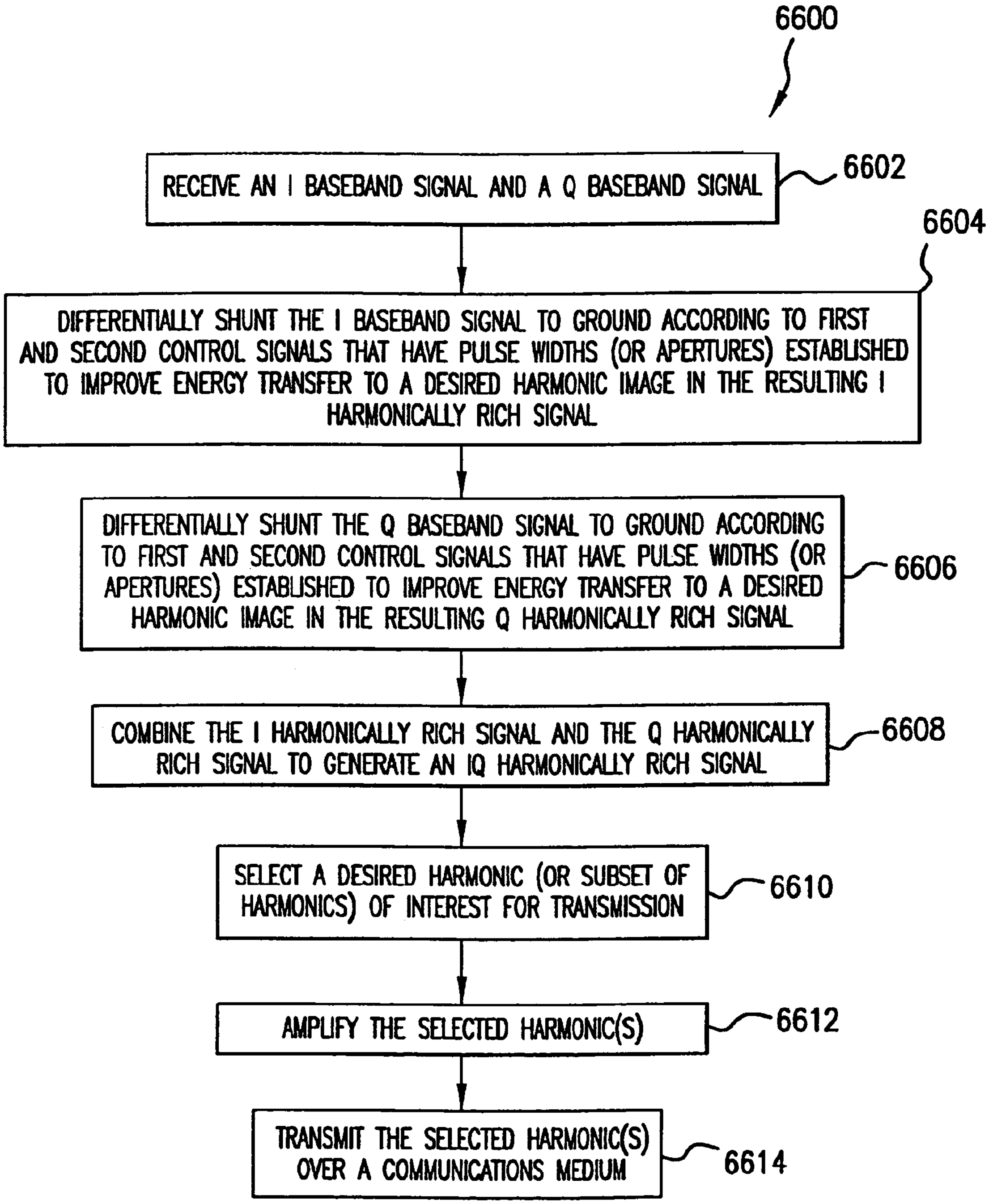
FIG. 66 illustrates a flowchart 6600 that is associated with the transmitter 5700 according to an embodiment of the invention.

The IQ modulator 5701 includes two balanced modulators 5601 from FIG. 56, and a 90 degree signal combiner 5710 as shown. The operation of the IQ modulator 5701 is described in reference to the flowchart 6600 (FIG. 66), as follows. The order of the steps in flowchart 6600 is not limiting.

In step 6602, the balanced modulator 5701 receives the I baseband signal 5702 and the Q baseband signal 5704.

In step 6604, the balanced modulator 5601*a* differentially shunts the I baseband signal 5702 to ground according the control signals 2623 and 2627, to generate a harmonically rich signal 5706. More specifically, the UFT modules 5616*a* and 5622*a* alternately shunt the I baseband signal and an inverted version of the I baseband signal to ground according to the control signals 2623 and 2627, respectively. The operation of the balanced modulator 5601 and the generation of harmonically rich signals was fully described above and is illustrated in FIGS. 56A-C, to which the reader is referred for further details. As such, the harmonically rich signal 5706 contains multiple harmonic images of the I baseband information as described above.

In step 6606, the balanced modulator 5601*b* differentially shunts the Q baseband signal 5704 to ground according to control signals 2623 and 2627, to generate harmonically rich signal 5708. More specifically, the UFT modules 5616*b* and 5622*b* alternately shunt the Q baseband signal and an inverted version of the Q baseband signal to ground, according to the control signals 2623 and 2627, respectively. As such, the harmonically rich signal 5708 contains multiple harmonic images that contain the Q baseband information.

Figure 58A:
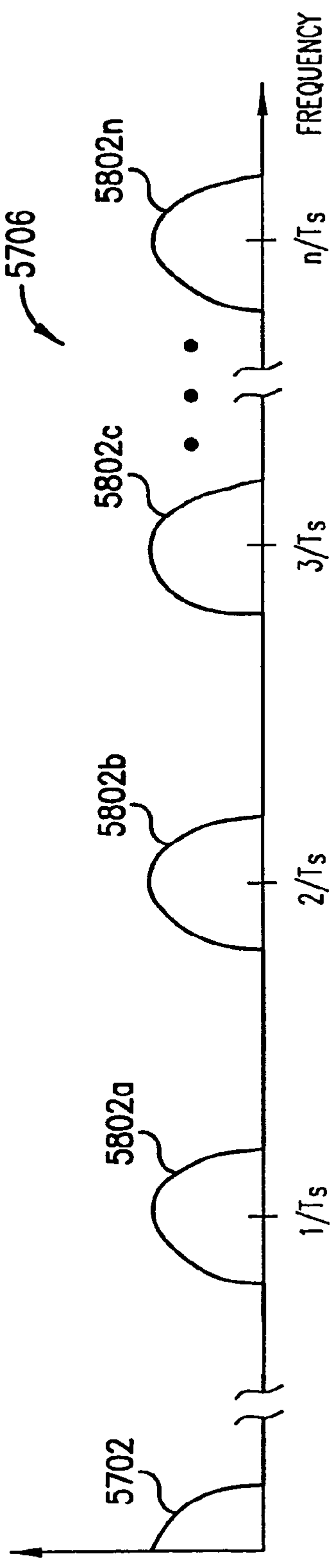
FIGS. 58A-C illustrate various frequency spectrums that are associated with the IQ transmitter 5700.
Figure 58B:
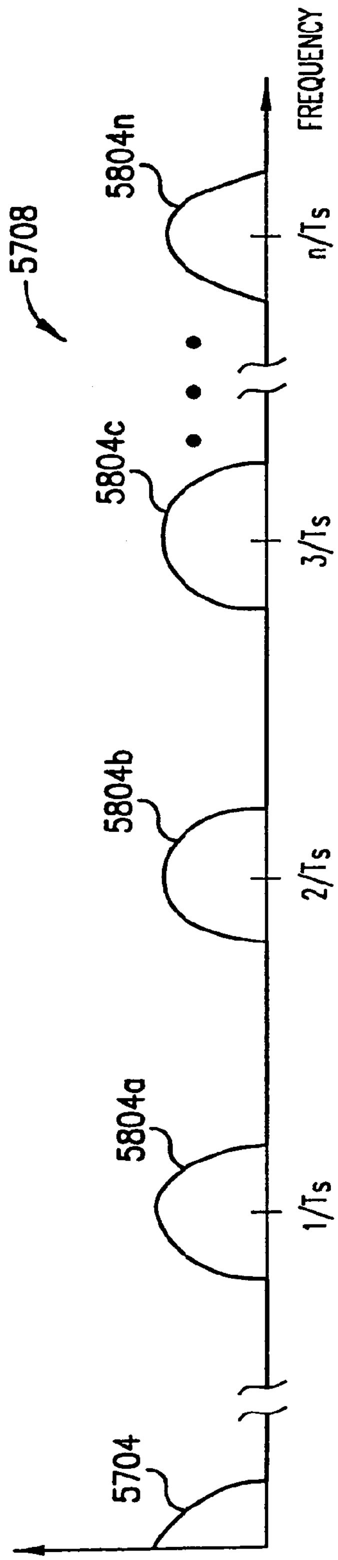

In step 6608, the 90 degree signal combiner 5710 combines the harmonically rich signals 5706 and 5708 to generate IQ harmonically rich signal 5711. This is further illustrated in FIGS. 58A-C. FIG. 58A depicts an exemplary frequency spectrum for the harmonically rich signal 5706 having harmonic images 5802*a-n*. The harmonic images 5802 repeat at harmonics of the sampling frequency $1/T_S$, where each image 5802 contains the necessary amplitude, frequency, and phase information to reconstruct the I baseband signal 5702. Likewise, FIG. 58B depicts an exemplary frequency spectrum for the harmonically rich signal 5708 having harmonic images 5804*a-n*. The harmonic images 5804*a-n* also repeat at harmonics of the sampling frequency $1/T_S$, where each image 5804 contains the necessary amplitude, frequency, and phase information to reconstruct the Q baseband signal 5704.

Figure 58C:
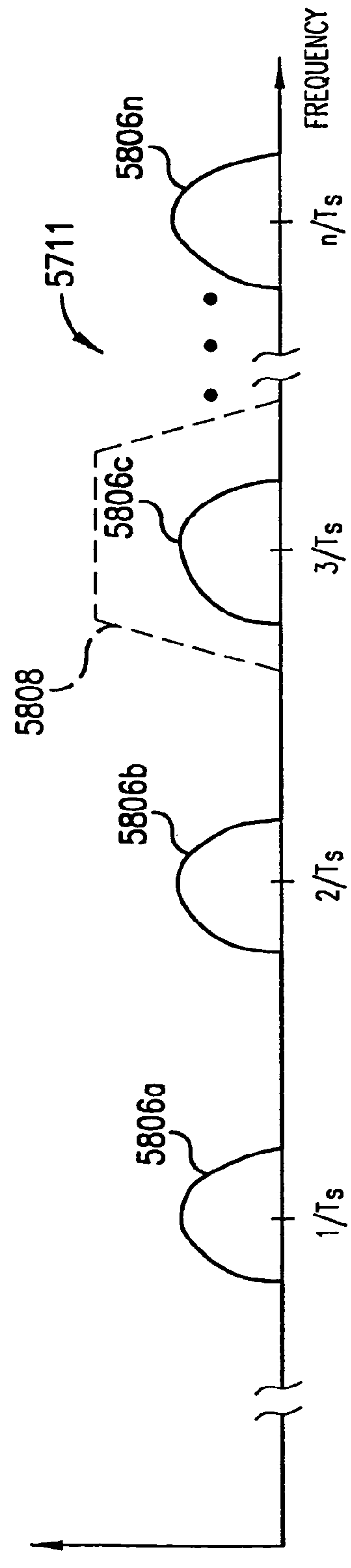

FIG. 58C illustrates an exemplary frequency spectrum for the IQ harmonically rich signal 5711 having images 5806*a-n*. Each image 5806 carries the I baseband information and the Q baseband information from the corresponding images 5802 and 5804, respectively, without substantially increasing the frequency bandwidth occupied by each image 5806. This can occur because the signal combiner 5710 phase shifts the Q signal 5708 by 90 degrees relative to the I signal 5706.

In step 6610, the optional filter 5712 may be included to select a harmonic of interest, as represented by the passband 5808 selecting the image 5806*c* in FIG. 58C.

In step 6612, the optional amplifier 5714 can be included to amplify the selected harmonic image 5806 prior to transmission.

In step 6614, the selected harmonic (or harmonics) is transmitted over a communications medium.

Figure 59:
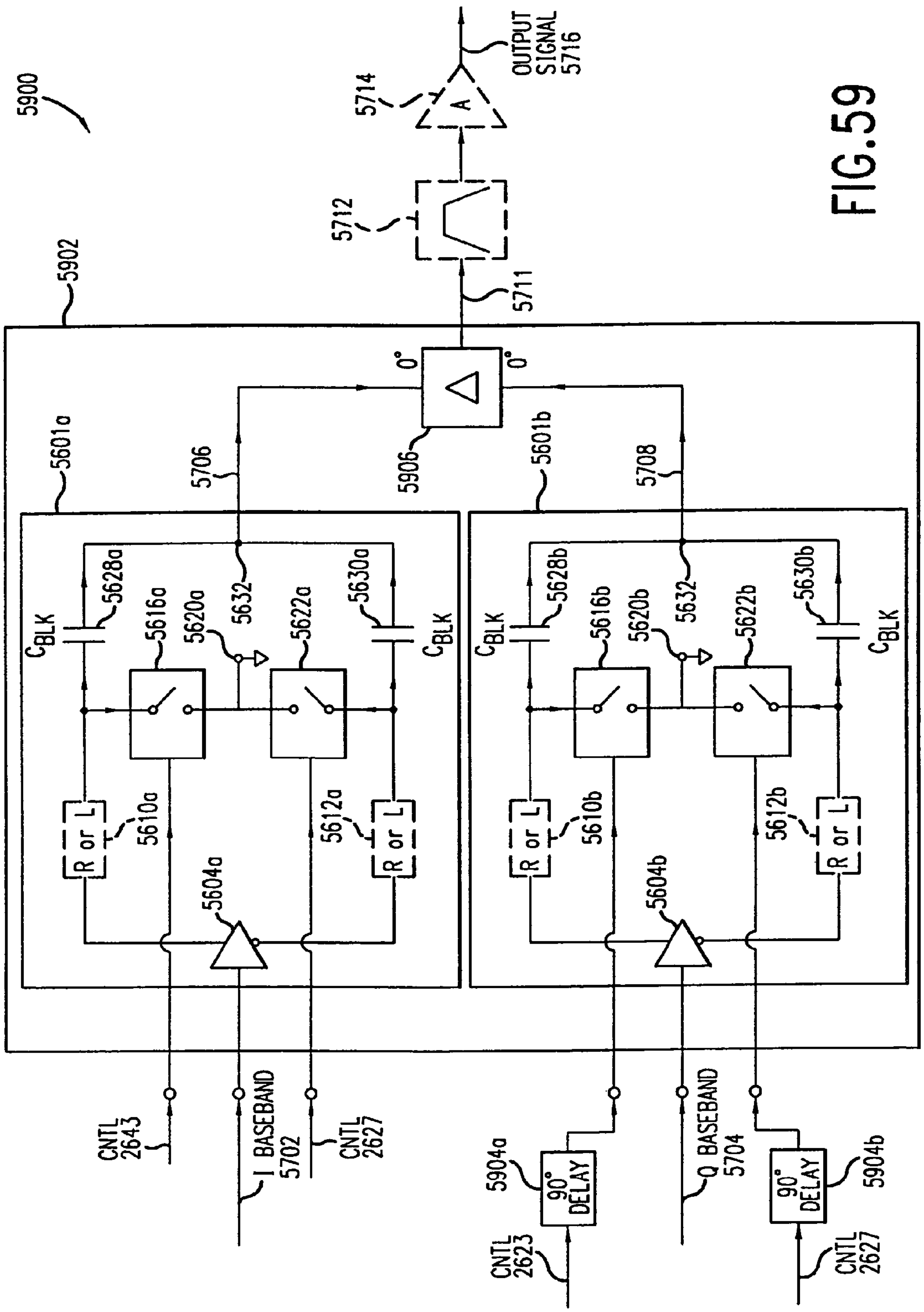
FIG. 59 illustrates an IQ transmitter 5900 according to embodiments of the present invention.

FIG. 59 illustrates a transmitter 5900 that is another embodiment for an I Q transmitter having a balanced configuration. Transmitter 5900 is similar to the transmitter 5700 except that the 90 degree phase shift between the I and Q channels is achieved by phase shifting the control signals instead of using a 90 degree signal combiner to combine the harmonically rich signals. More specifically, delays 5904*a* and 5904*b* delay the control signals 2623 and 2627 for the Q channel modulator 5601*b* by 90 degrees relative the control signals for the I channel modulator 5601*a*. As a result, the Q modulator 5601*b* samples the Q baseband signal 5704 with a 90 degree delay relative to the sampling of the I baseband signal 5702 by the I channel modulator 5601*a*. Therefore, the Q harmonically rich signal 5708 is phase shifted by 90 degrees relative to the I harmonically rich signal 5706. Since the phase shift is achieved using the control signals, an in-phase signal combiner 5906 combines the harmonically rich signals 5706 and 5708, to generate the harmonically rich signal 5711.

Figure 60:
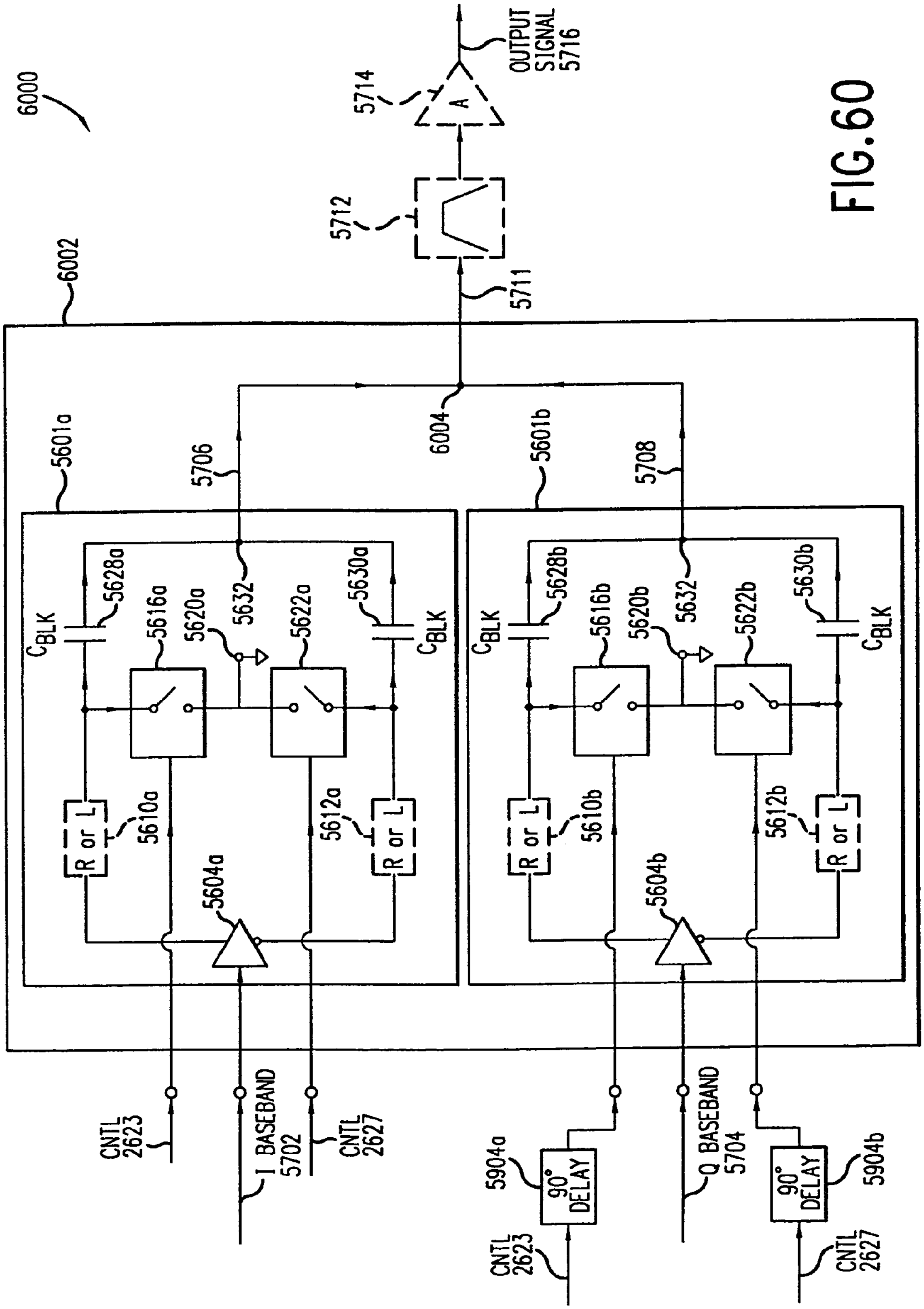
FIG. 60 illustrates an IQ transmitter 6000 according to embodiments of the present invention.

FIG. 60 illustrates a transmitter 6000 that is similar to transmitter 5900 in FIG. 59. The difference being that the transmitter 6000 has a balanced modulator 6002 that utilizes a summing node 6004 to sum the I harmonically rich signal 5706 and the Q harmonically rich signal 5708 instead of the in-phase signal combiner 5906 that is used in the modulator 5902 of transmitter 5900. The 90 degree phase shift between the I and Q channels is implemented by delaying the Q clock signals using 90 degree delays 5904, as shown.

7.2.3 IQ Transmitters Configured for Carrier Insertion

Figure 32:
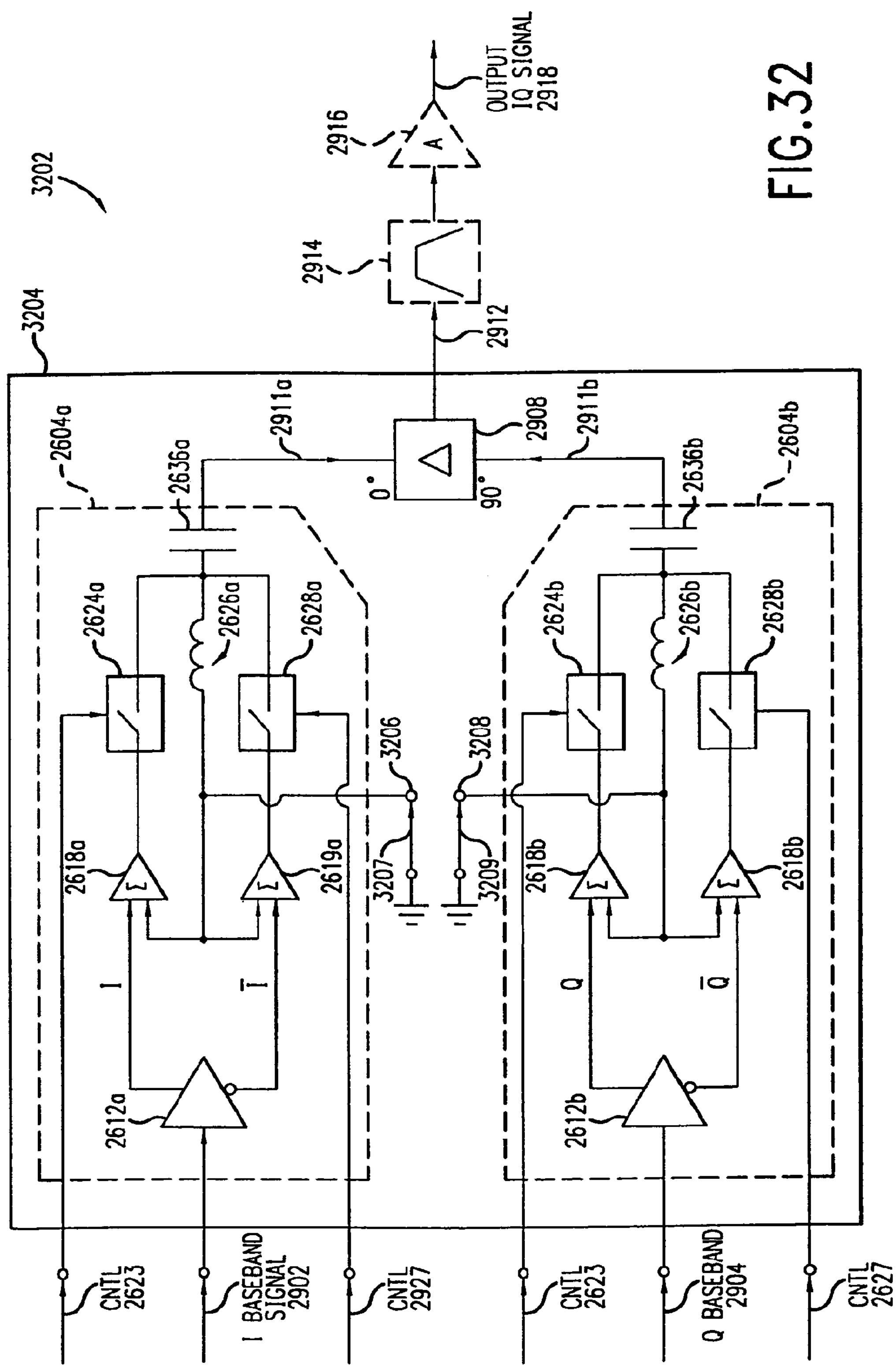
FIG. 32 illustrates an I Q balanced modulator 3202 configured for carrier insertion according to embodiments of the invention.

The transmitters 2920 (FIG. 29) and 3108 (FIG. 31A) have a balanced configuration that substantially eliminates any DC offset and results in minimal carrier insertion in the IQ output signal 2918. Minimal carrier insertion is generally desired for most applications because the carrier signal carries no information and reduces the overall transmitter efficiency. However, some applications require the received signal to have sufficient carrier energy for the receiver to extract the carrier for coherent demodulation. In support thereof, FIG. 32 illustrates a transmitter 3202 to provide any necessary carrier insertion by implementing a DC offset between the two sets of sampling UFT modules.

Transmitter 3202 is similar to the transmitter 2920 with the exception that a modulator 3204 in transmitter 3202 is configured to accept two DC reference voltages so that the I channel modulator 2604*a* can be biased separately from the Q channel modulator 2604*b*. More specifically, modulator 3204 includes a terminal 3206 to accept a DC voltage reference 3207, and a terminal 3208 to accept a DC voltage reference 3209. Voltage 3207 biases the UFT modules 2624*a* and 2628*a* in the I channel modulator 2604*a*. Likewise, voltage 3209 biases the UFT modules 2624*b* and 2628*b* in the Q channel modulator 2604*b*. When voltage 3207 is different from voltage 3209, then a DC offset will appear between the I channel modulator 2604*a* and the Q channel modulator 2604*b*, which results in carrier insertion in the IQ harmonically rich signal 2912. The relative amplitude of the carrier frequency energy increases in proportion to the amount of DC offset.

Figure 33:
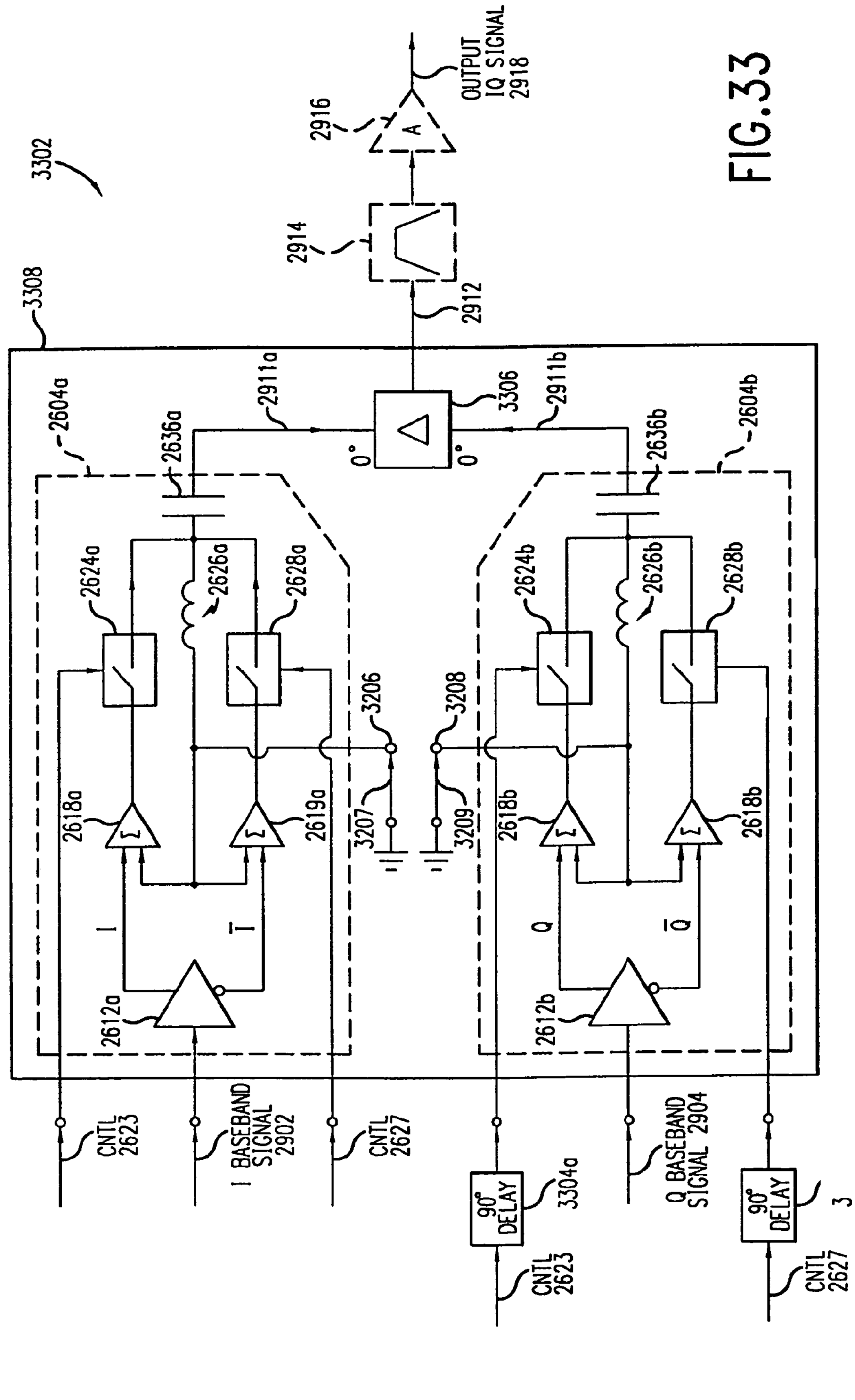
FIG. 33 illustrates an I Q balanced modulator 3302 configured for carrier insertion according to embodiments of the invention.

FIG. 33 illustrates a transmitter 3302 that is a second embodiment of an IQ transmitter having two DC terminals to cause DC offset, and therefore carrier insertion. Transmitter 3302 is similar to transmitter 3202 except that the 90 degree phase shift between the I and Q channels is achieved by phase shifting the control signals, similar to that done in transmitter 3108. More specifically, delays 3304*a* and 3304*b* phase shift the control signals 2623 and 2627 for the Q channel modulator 2604*b* relative to those of the I channel modulator 2604*a*. As a result, the Q modulator 2604*b* samples the Q baseband signal 2904 with 90 degree delay relative to the sampling of the I baseband signal 2902 by the I channel modulator 2604*a*. Therefore, the Q harmonically rich signal 2911*b* is phase shifted by 90 degrees relative to the I harmonically rich signal, which is then combined by the in-phase combiner 3306.

7.3 Universal Transmitter and CDMA

Figure 34A:
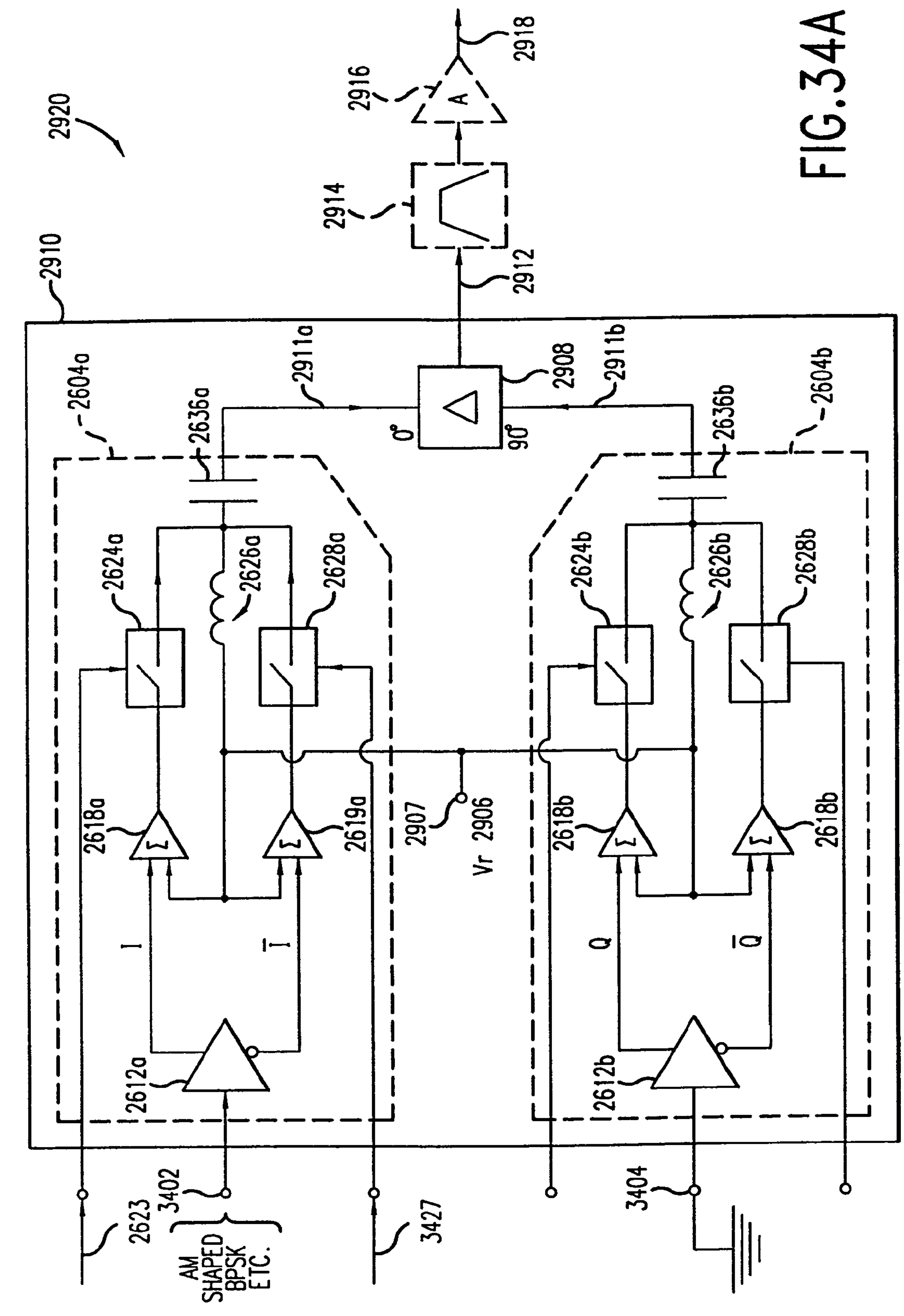
FIGS. 34A-B illustrate various input configurations for the balanced transmitter 2920 according to embodiments of the present invention.
Figure 34B:
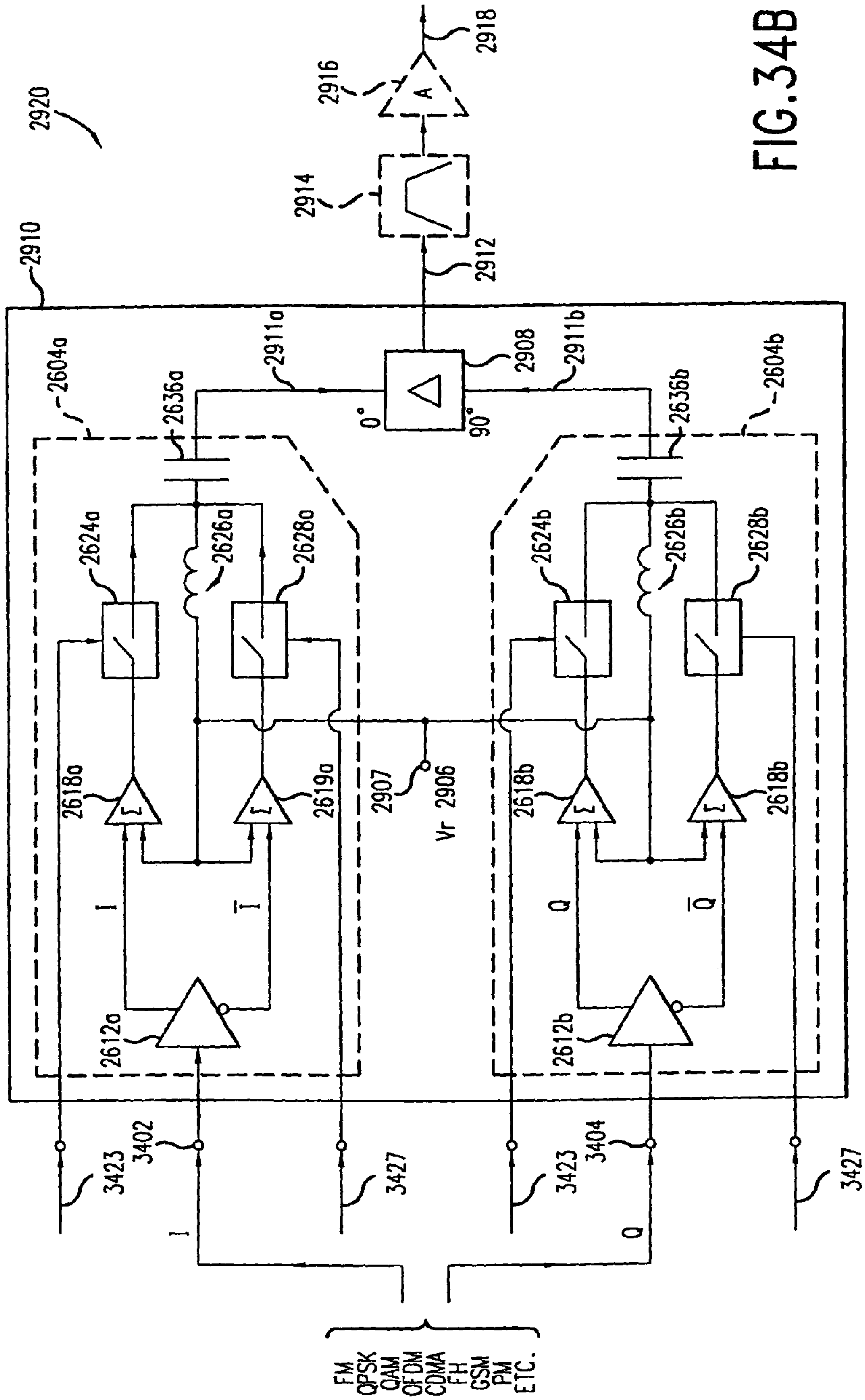

The universal transmitter 2920 (FIG. 29) and the universal transmitter 5700 (FIG. 57) can be used to up-convert every known useful analog and digital baseband waveform including but not limited to: AM, FM, PM, BPSK, QPSK, MSK, QAM, ODFM, multi-tone, and spread spectrum signals. For further illustration, FIG. 34A and FIG. 34B depict transmitter 2920 configured to up-convert the mentioned modulation waveforms. FIG. 34A illustrates transmitter 2920 configured to up-convert non-complex waveform including AM and shaped BPSK. In FIG. 34A, these non-complex (and non-IQ) waveforms are received on the I terminal 3402, and the Q input 3404 is grounded since only a single channel is needed. FIG. 34B illustrates a transmitter 2920 that is configured to receive both I and Q inputs for the up-conversion of complex waveforms including QPSK, QAM, OFDM, GSM, and spread spectrum waveforms (including CDMA and frequency hopping). The transmitters in FIGS. 34A and 34B are presented for illustrative purposes, and are not limiting. Other embodiments are possible, as will be appreciated in view of the teachings herein.

CDMA is an input waveform that is of particular interest for communications applications. CDMA is the fastest growing digital cellular communications standard in many regions, and now is widely accepted as the foundation for the competing third generation (3G) wireless standard. CDMA is considered to be the among the most demanding of the current digital cellular standards in terms of RF performance requirements.

7.3.1 IS-95 CDMA Specifications

Figure 35A:
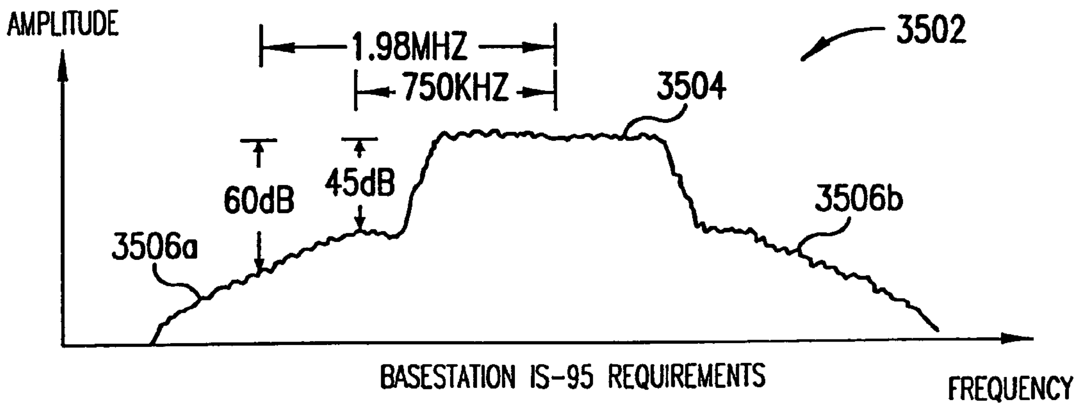
FIGS. 35A-B illustrate sidelobe requirements according to the IS-95 CDMA specification.
Figure 35B:
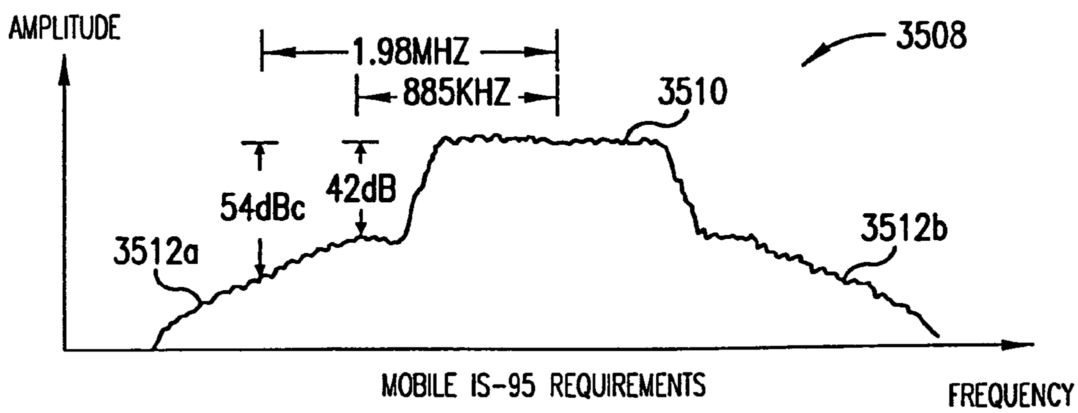

FIG. 35A and FIG. 35B illustrate the CDMA specifications for base station and mobile transmitters as required by the IS-95 standard. FIG. 35A illustrates a base station CDMA signal 3502 having a main lobe 3504 and sidelobes 3506*a* and 3506*b*. For base station transmissions, IS-95 requires that the sidelobes 3506*a,b* are at least 45 dB below the mainlobe 3504 (or 45 dbc) at an offset frequency of 750 kHz, and 60 dBc at an offset frequency of 1.98 MHZ. FIG. 35B illustrates similar requirements for a mobile CDMA signal 3508 having a main lobe 3510 and sidelobes 3512*a* and 3512*b*. For mobile transmissions, CDMA requires that the sidelobes 3512*a,b* are at least 42 dBc at a frequency offset of 885 kHz, and 54 dBc at a frequency offset 1.98 MHZ.

Rho is another well known performance parameter for CDMA. Rho is a figure-of-merit that measures the amplitude and phase distortion of a CDMA signal that has been processed in some manner (e.g. amplified, up-converted, filtered, etc.) The maximum theoretical value for Rho is 1.0, which indicates no distortion during the processing of the CDMA signal. The IS-95 requirement for the baseband-to-RF interface is Rho=0.9912. As will be shown by the test results below, the transmitter 2920 (in FIG. 29) can up-convert a CDMA baseband signal and achieve Rho values of approximately Rho=0.9967. Furthermore, the modulator 2910 in the transmitter 2920 achieves these results in standard CMOS (although the invention is not limited to this example implementation), without doing multiple up-conversions and IF filtering that is associated with conventional super-heterodyne configurations.

7.3.2 Conventional CDMA Transmitter

Figure 36:
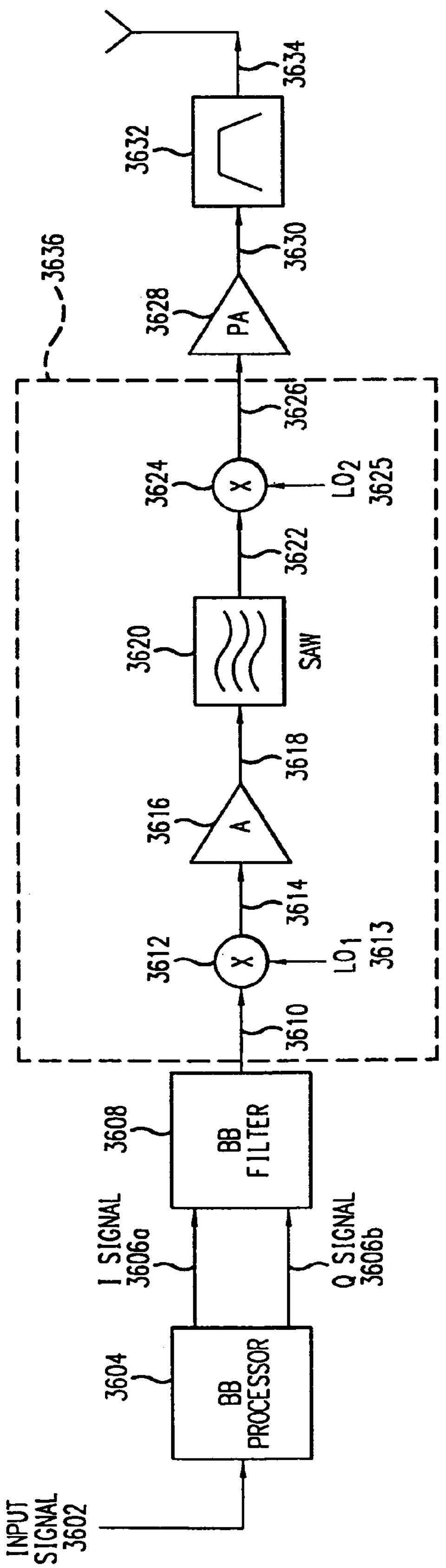
FIG. 36 illustrates a conventional CDMA transmitter 3600.

Before describing the CDMA implementation of transmitter 2920, it is useful to describe a conventional super-heterodyne approach that is used to meet the IS-95 specifications. FIG. 36 illustrates a conventional CDMA transmitter 3600 that up-converts an input signal 3602 to an output CDMA signal 3634. The conventional CDMA transmitter 3600 includes: a baseband processor 3604, a baseband filter 3608, a first mixer 3612, an amplifier 3616, a SAW filter 3620, a second mixer 3624, a power amplifier 3628, and a band-select filter 3632. The conventional CDMA transmitter operates as follows.

The baseband processor 3604 spreads the input signal 3602 with I and Q spreading codes to generate I signal 3606*a* and Q signal 3606*b*, which are consistent with CDMA IS-95 standards. The baseband filter 3608 filters the signals 3606 with the aim of reducing the sidelobes so as to meet the sidelobe specifications that were discussed in FIGS. 35A and 35B. Mixer 3612 up-converts the signal 3610 using a first LO signal 3613 to generate an IF signal 3614. IF amplifier 3616 amplifies the IF signal 3614 to generate IF signal 3618. SAW filter 3620 has a bandpass response that filters the IF signal 3618 to suppress any sidelobes caused by the non-linear operations of the mixer 3614. As is understood by those skilled in the arts, SAW filters provide significant signal suppression outside the passband, but are relatively expensive and large compared to other transmitter components. Furthermore, SAW filters are typically built on specialized materials that cannot be integrated onto a standard CMOS chip with other components. Mixer 3624 up-converts the signal 3622 using a second LO signal 3625 to generate RF signal 3626. Power amplifier 3628 amplifies RF signal 3626 to generate signal 3630. Band-select filter 3632 bandpass filters RF signal 3630 to suppress any unwanted harmonics in output signal 3634.

It is noted that transmitter 3602 up-converts the input signal 3602 using an IF chain 3636 that includes the first mixer 3612, the amplifier 3616, the SAW filter 3620, and the second mixer 3624. The IF chain 3636 up-converts the input signal to an IF frequency and does IF amplification and SAW filtering in order to meet the IS-95 sidelobe and figure-of-merit specifications. This is done because conventional wisdom teaches that a CDMA baseband signal cannot be up-converted directly from baseband to RF, and still meet the IS-95 linearity requirements.

7.3.3 CDMA Transmitter Using the Present Invention

Figure 37A:
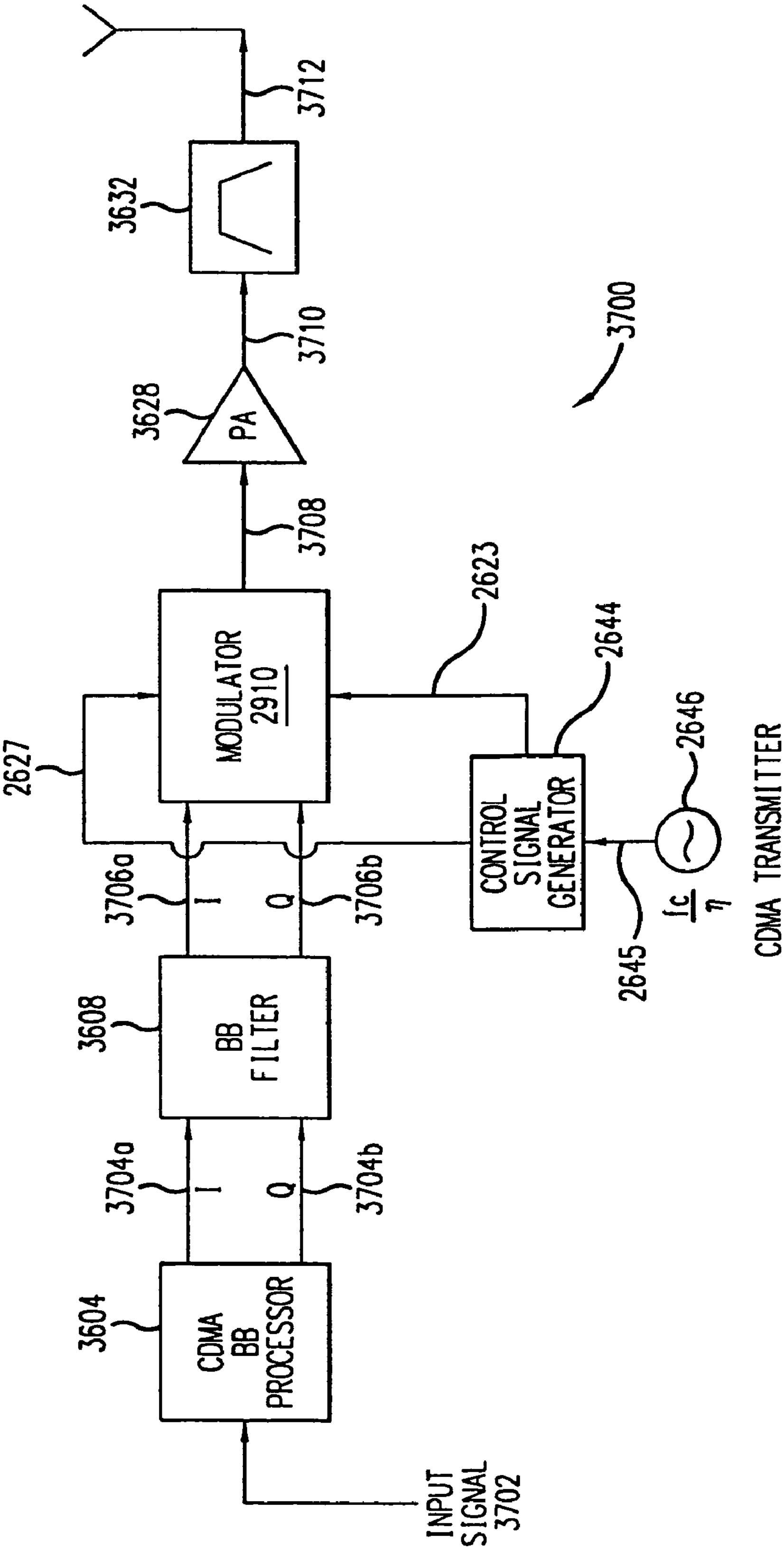
FIG. 37A illustrates a CDMA transmitter 3700 according to embodiments of the present invention.
Figure 73:
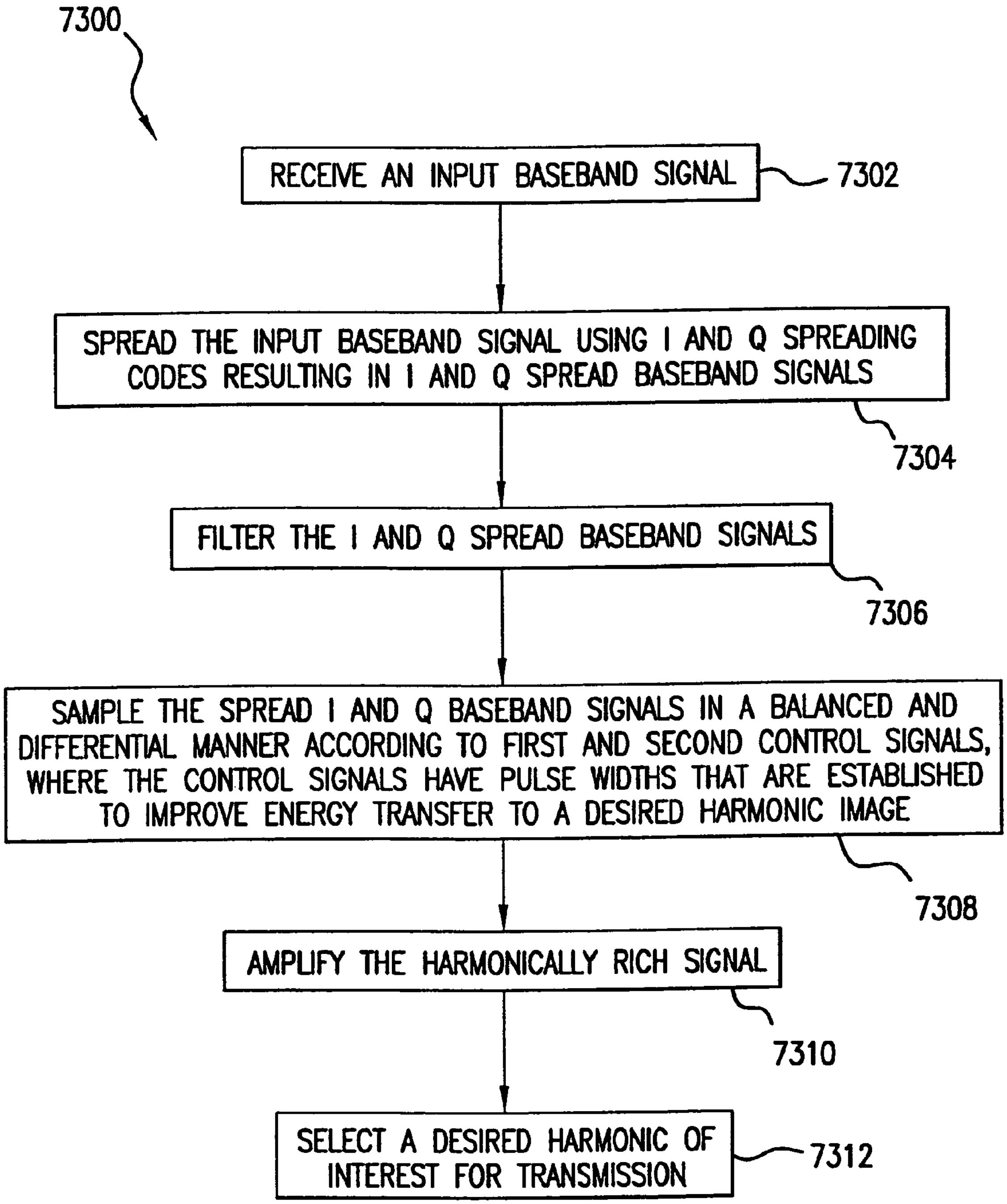
FIG. 73 illustrates a flowchart 7300 that is associated with the CDMA transmitter 3720 in FIG. 37 according to an embodiment of the invention.

For comparison, FIG. 37A illustrates an example CDMA transmitter 3700 according to embodiments of the present invention. The CDMA transmitter 3700 includes (it is noted that the invention is not limited to this example): the baseband processor 3604; the baseband filter 3608; the IQ modulator 2910 (from FIG. 29), the control signal generator 2642, the sub-harmonic oscillator 2646, the power amplifier 3628, and the filter 3632. In the example of FIG. 37A, the baseband processor 3604, baseband filter 3608, amplifier 3628, and the band-select filter 3632 are the same as that used in the conventional transmitter 3602 in FIG. 36. The difference is that the IQ modulator 2910 in transmitter 3700 completely replaces the IF chain 3636 in the conventional transmitter 3602. This is possible because the modulator 2910 up-converts a CDMA signal directly from baseband-to-RF without any IF processing. The detailed operation of the CDMA transmitter 3700 is described with reference to the flowchart 7300 (FIG. 73) as follows.

In step 7302, the input baseband signal 3702 is received.

In step 7304, the CDMA baseband processor 3604 receives the input signal 3702 and spreads the input signal 3702 using I and Q spreading codes, to generate an I signal 3704*a* and a Q signal 3704*b*. As will be understood, the I spreading code and Q spreading codes can be different to improve isolation between the I and Q channels.

In step 7306, the baseband filter 3608 bandpass filters the I signal 3704*a* and the Q signal 3704*b* to generate filtered I signal 3706*a* and filtered Q signal 3706*b*. As mentioned above, baseband filtering is done to improve sidelobe suppression in the CDMA output signal.

Figure 37B:
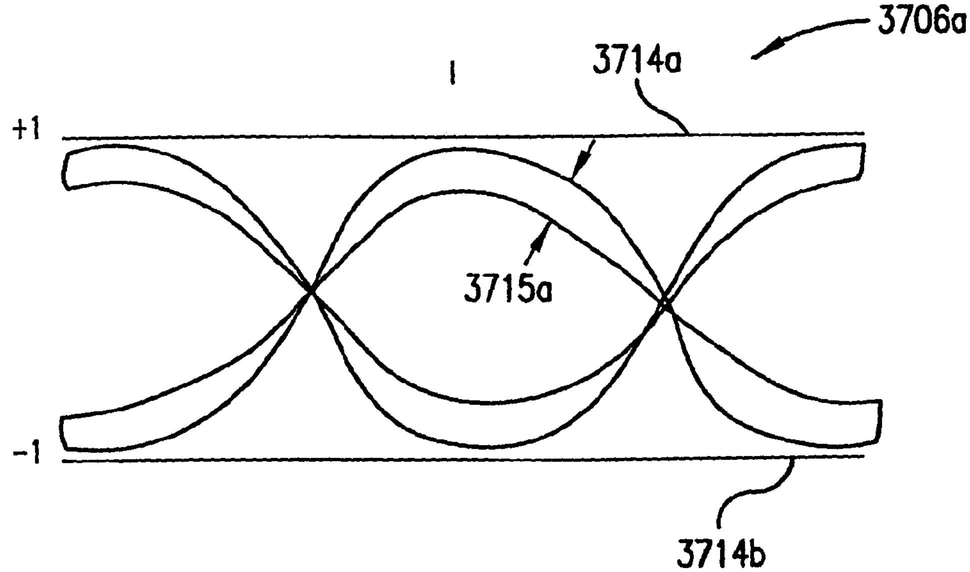
FIGS. 37B-E illustrate various example signal diagrams according to embodiments of the present invention.
Figure 37C:
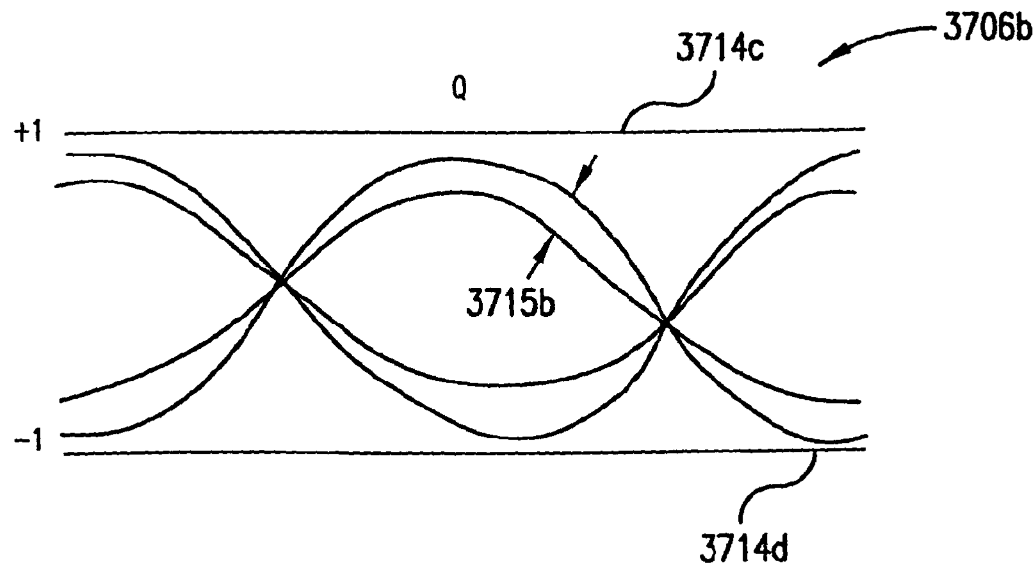
Figure 37D:
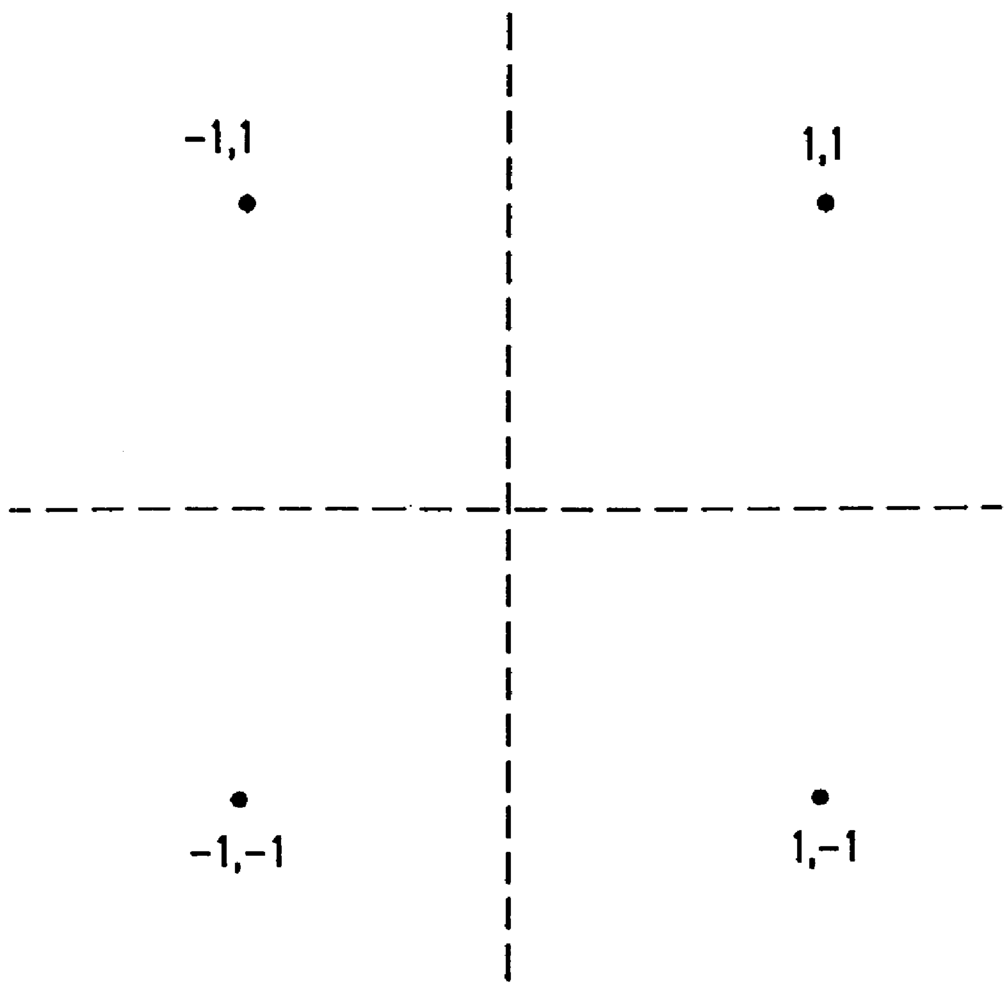

FIGS. 37B-37D illustrate the effect of the baseband filter 3608 on the I an Q inputs signals. FIG. 37B depicts multiple signal traces (over time) for the filtered I signal 3706*a*, and FIG. 37C depicts multiple signal traces for the filtered Q signal 3706*b*. As shown, the signals 3706*a,b* can be described as having an "eyelid" shape having a thickness 3715. The thickness 3715 reflects the steepness of passband roll off of the baseband filter 3608. In other words, a relatively thick eyelid in the time domain reflects a steep passband roll off in the frequency domain, and results in lower sidelobes for the output CDMA signal. However, there is a tradeoff, because as the eyelids become thicker, then there is a higher probability that channel noise will cause a logic error during decoding at the receiver. The voltage rails 3714 represent the +1/−1 logic states for the I and Q signals 3706, and correspond to the logic states in complex signal space that are shown in FIG. 37D.

Figure 37E:
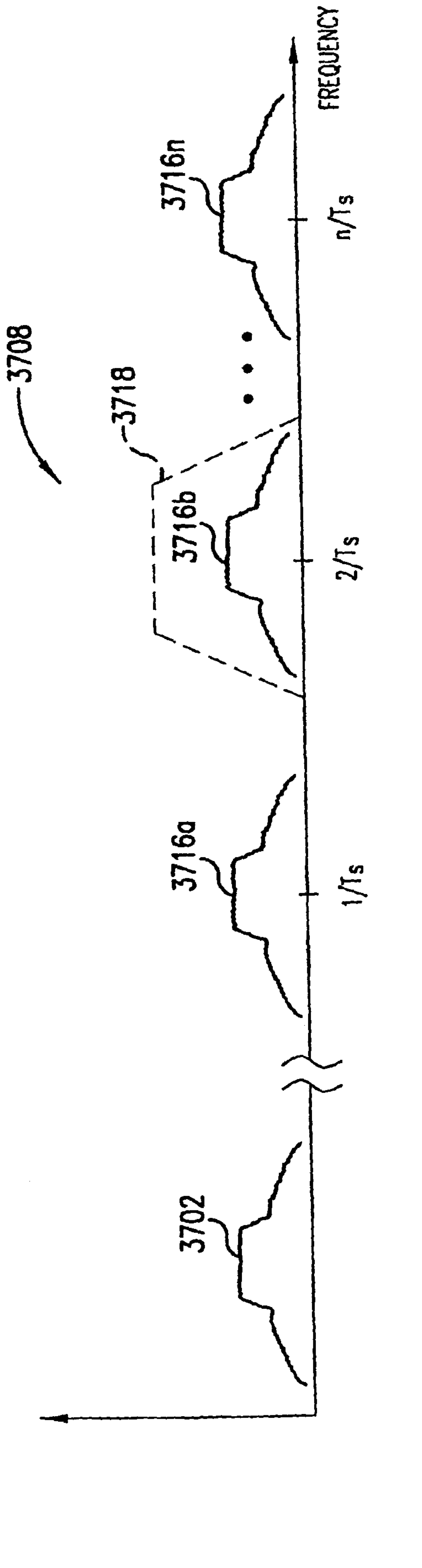

In step 7308, the IQ modulator 2910 samples I and Q input signals 3706A, 3706B in a differential and balanced fashion according to sub-harmonic clock signals 2623 and 2627, to generate a harmonically rich signal 3708. FIG. 37E illustrates the harmonically rich signal 3708 that includes multiple harmonic images 3716*a-n* that repeat at harmonics of the sampling frequency $1/T_S$. Each image 3716*a-n* is a spread spectrum signal that contains the necessary amplitude, frequency, and phase information to reconstruct the input baseband signal 3702.

In step 7310, the amplifier 3628 amplifies the harmonically rich signal 3708 to generate an amplified harmonically rich signal 3710.

Finally, the band-select filter 3632 selects the harmonic of interest from signal 3710, to generate an CDMA output signal 3712 that meets IS-95 CDMA specifications. This is represented by passband 3718 selecting harmonic image 3716*b* in FIG. 37E.

Figure 38:
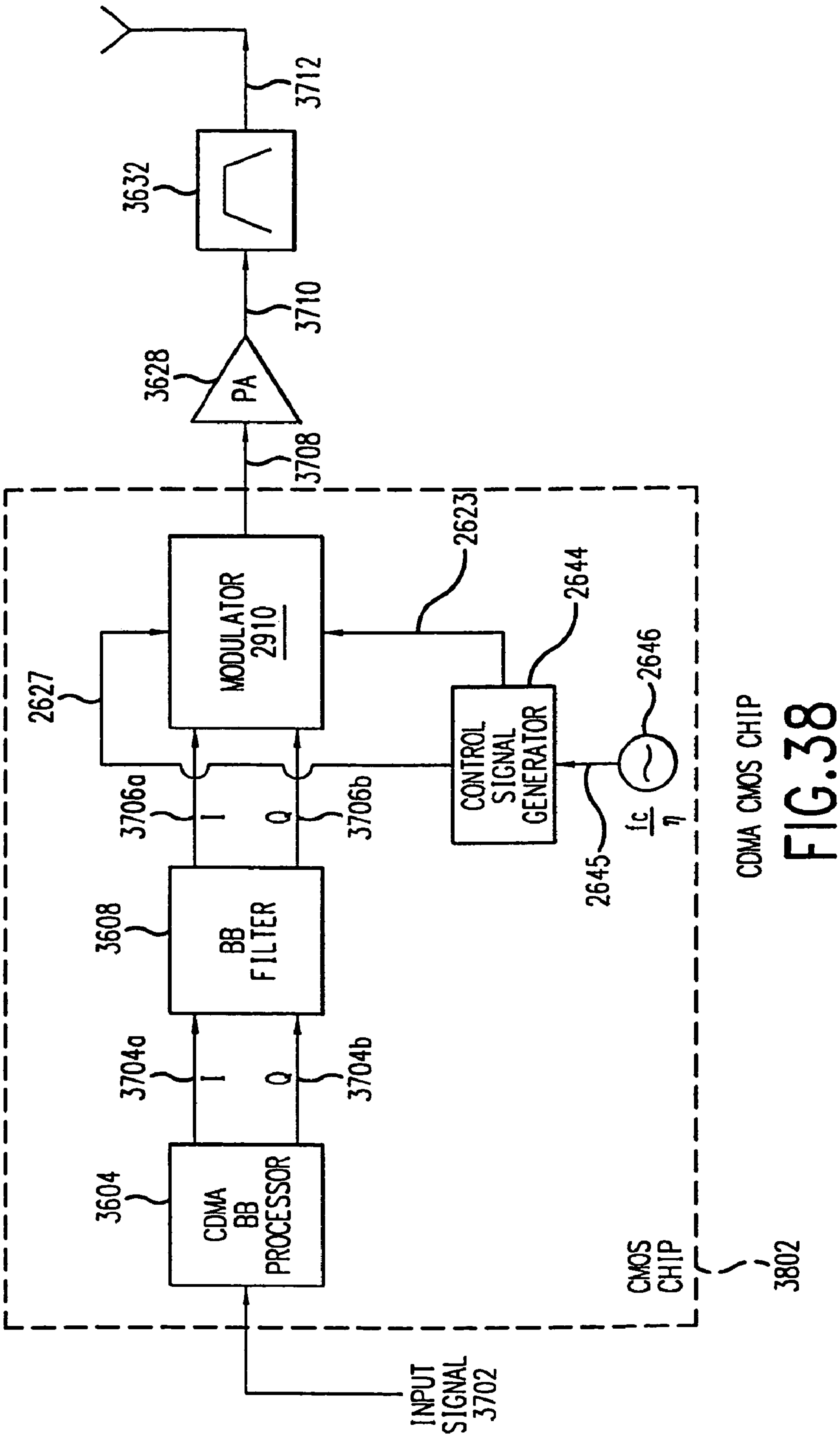
FIG. 38 illustrates a CDMA transmitter utilizing a CMOS chip according to embodiments of the present invention.

An advantage of the CDMA transmitter 3700 is in that the modulator 2910 up-converts a CDMA input signal directly from baseband to RF without any IF processing, and still meets the IS-95 sidelobe and figure-of-merit specifications. In other words, the modulator 2910 is sufficiently linear and efficient during the up-conversion process that no IF filtering or amplification is required to meet the IS-95 requirements. Therefore, the entire IF chain 3636 can be replaced by the modulator 2910, including the expensive SAW filter 3620. Since the SAW filter is eliminated, substantial portions of the transmitter 3702 can be integrated onto a single CMOS chip, for example, that uses standard CMOS process. More specifically, and for illustrative purposes only, the baseband processor 3604, the baseband filter 3608, the modulator 2910, the oscillator 2646, and the control signal generator 2642 can be integrated on a single CMOS chip, as illustrated by CMOS chip 3802 in FIG. 38, although the invention is not limited to this implementation example.

Figure 37F:
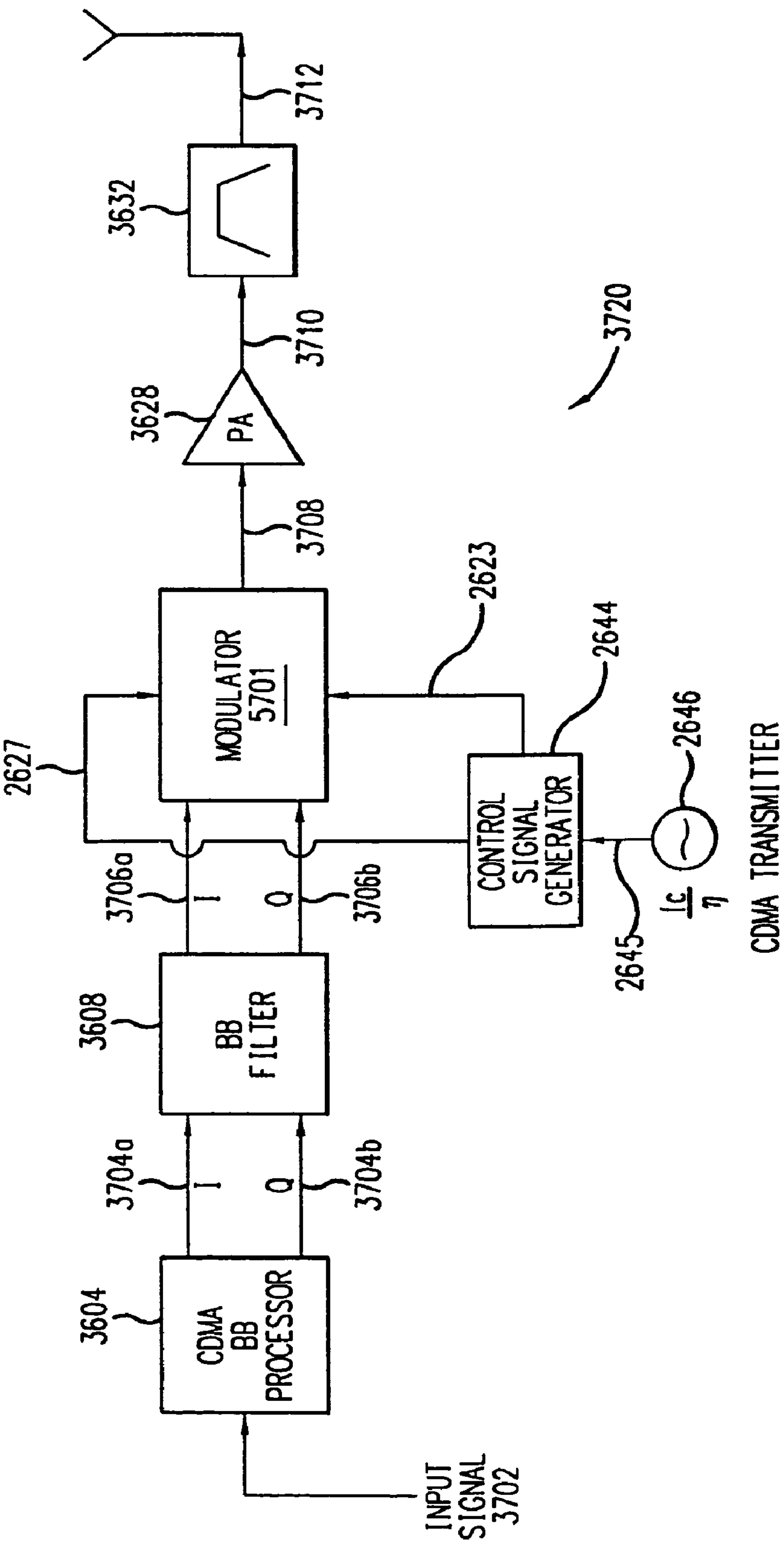
FIG. 37F illustrates a CDMA transmitter 3720 according to embodiments of the present invention.

FIG. 37F illustrates a transmitter 3720 that is similar to transmitter 3700 (FIG. 37A) except that modulator 5701 replaces the modulator 2910. Transmitter 3700 operates similar to the transmitter 3700 and has all the same advantages of the transmitter 3700.

Other embodiments discussed or suggested herein can be used to implement other CDMA transmitters according to the invention.

7.3.4 CDMA Transmitter Measured Test Results

As discussed above, the UFT-based modulator 2910 directly up-converts baseband CDMA signals to RF without any IF filtering, while maintaining the required figures-of-merit for IS-95. The modulator 2910 has been extensively tested in order to specifically determine the performance parameters when up-converting CDMA signals. The test system and measurement results are discussed as follows.

Figure 39:
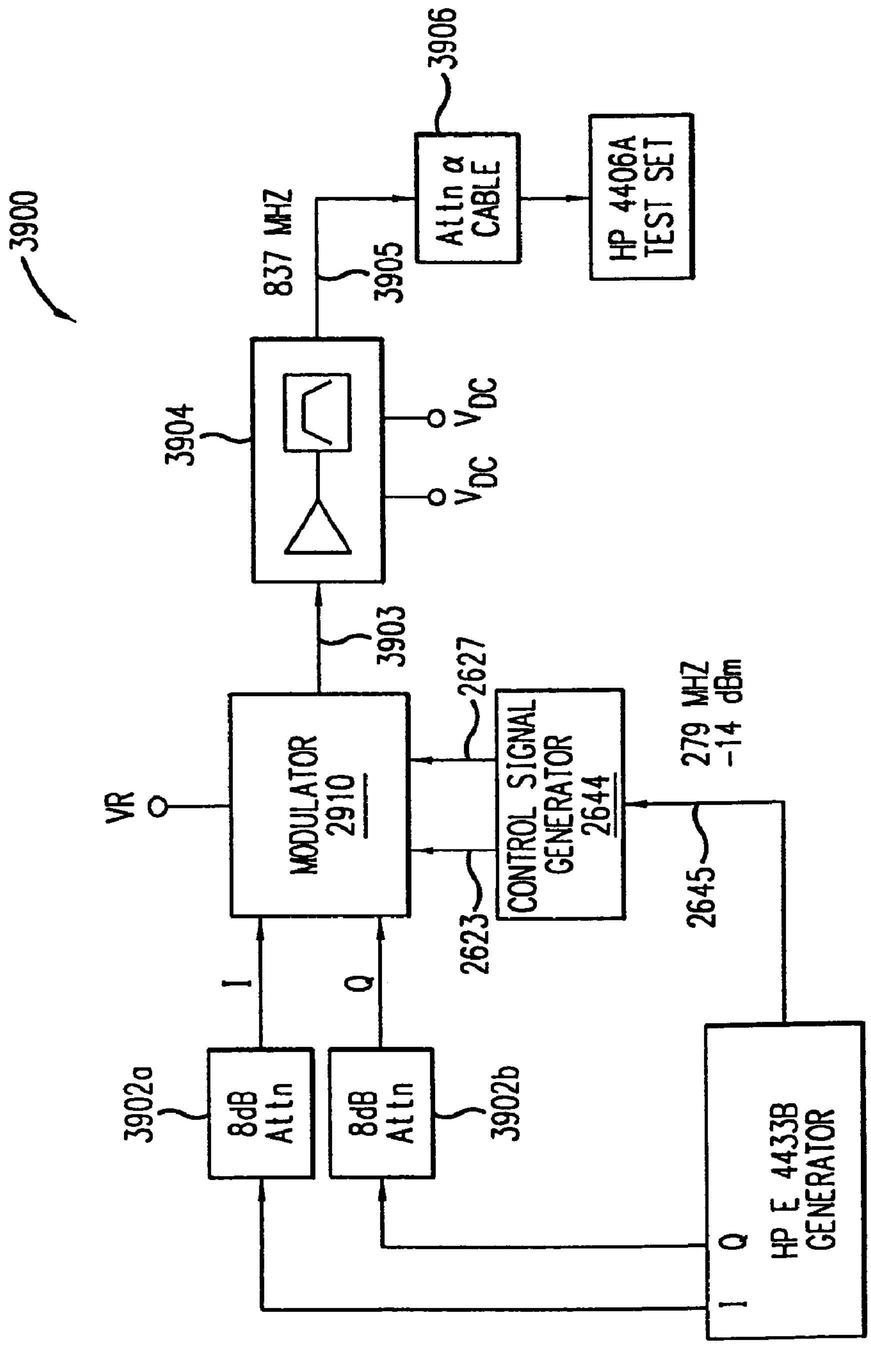
FIG. 39 illustrates an example test set 3900.

FIG. 39 illustrates a test system 3900 that measures the performance of the modulator 2910 when up-converting CDMA baseband signals. The test system 3900 includes: a Hewlett Packerd (HP) generator E4433B, attenuators 3902*a* and 3902*b*, control signal generator 2642, UFT-based modulator 2910, amplifier/filter module 3904, cable/attenuator 3906, and HP 4406A test set. The HP generator E4433B generates I and Q CDMA baseband waveforms that meet the IS-95 test specifications. The waveforms are routed to the UFT-based modulator 2910 through the 8-dB attenuators 3902*a* and 3902*b*. The HP generator E4433B also generates the sub-harmonic clock signal 2645 that triggers the control signal generator 2642, where the sub-harmonic clock 2645 has a frequency of 279 MHZ. The modulator 2910 up-converts the I and Q baseband signals to generate a harmonic rich signal 3903 having multiple harmonic images that represent the input baseband signal and repeat at the sampling frequency. The amplifier/filter module 3904 selects and amplifies the 3rd harmonic (of the 279 MHZ clock signal) in the signal 3903 to generate the signal 3905 at 837 MHZ. The HP 4406A test set accepts the signal 3905 for analysis through the cable/attenuator 3906. The HP 4406A measures CDMA modulation attributes including: Rho, EVM, phase error, amplitude error, output power, carrier insertion, and ACPR. In addition, the signal is demodulated and Walsh code correlation parameters are analyzed. Both forward and reverse links have been characterized using pilot, access, and traffic channels. For further illustration, FIGS. 40-60Z display the measurement results for the RF spectrum 3905 based on various base station and mobile waveforms that are generated by the HP E443B generator.

FIGS. 40 and 41 summarize the performance parameters of the modulator 2910 as measured by the test set 3900 for base station and mobile station input waveforms, respectively. For the base station, table 4002 includes lists performance parameters that were measured at a base station middle frequency and includes: Rho, EVM, phase error, magnitude error, carrier insertion, and output power. It is noted that Rho=0.997 for the base station middle frequency and exceeds the IS-95 requirement of Rho=0.912. For the mobile station, FIG. 41 illustrates a table 4102 that lists performance parameters that were measured at low, middle, and high frequencies. It is noted that the Rho exceeds the IS-95 requirement (0.912) for each of the low, middle, high frequencies of the measured waveform.

Figure 42:
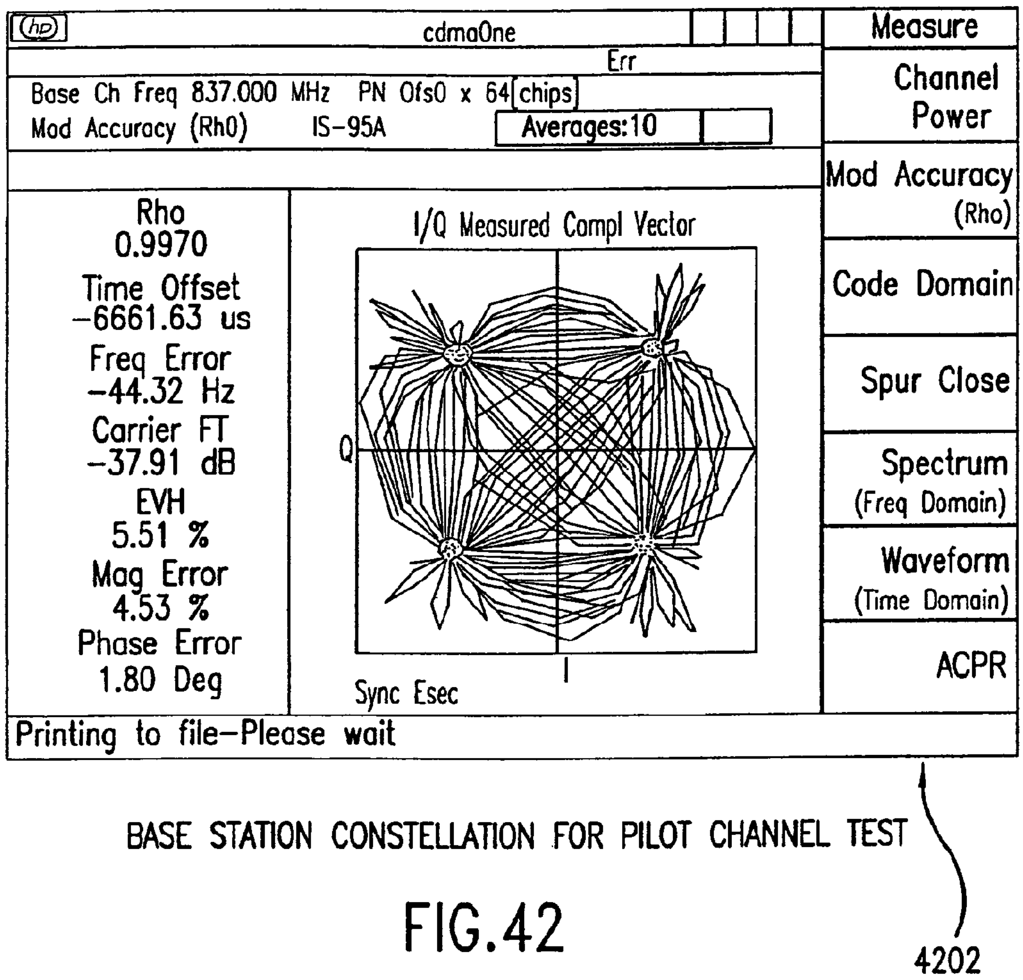

FIG. 42 illustrates a base station constellation 4202 measured during a pilot channel test. A signal constellation plots the various logic combinations for the I and Q signals in complex signal space, and is the raw data for determining the performance parameters (including Rho) that are listed in Table 40. The performance parameters (in table 40) are also indicated beside the constellation measurement 4202 for convenience. Again, it is noted that Rho=0.997 for this test. A value of 1 is perfect, and 0.912 is required by the IS-95 CDMA specification, although most manufactures strive for values greater than 0.94. This is a remarkable result since the modulator 2910 up-converts directly from baseband-to-RF without any IF filtering.

Figure 43:
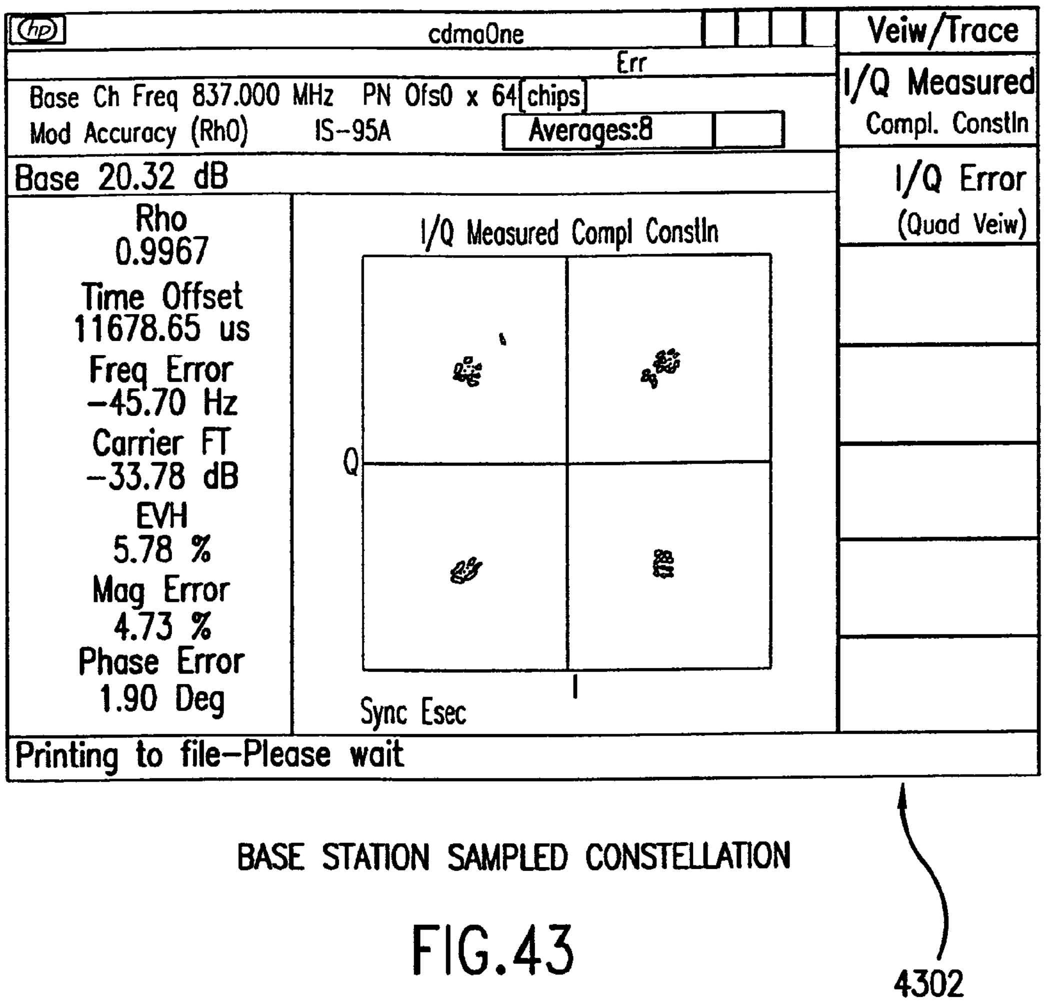

FIG. 43 illustrates a base station sampled constellation 4302, and depicts the tight constellation samples that are associated with FIG. 42. The symmetry and sample scatter compactness are illustrative of the superior performance of the modulator 2910.

Figure 44:
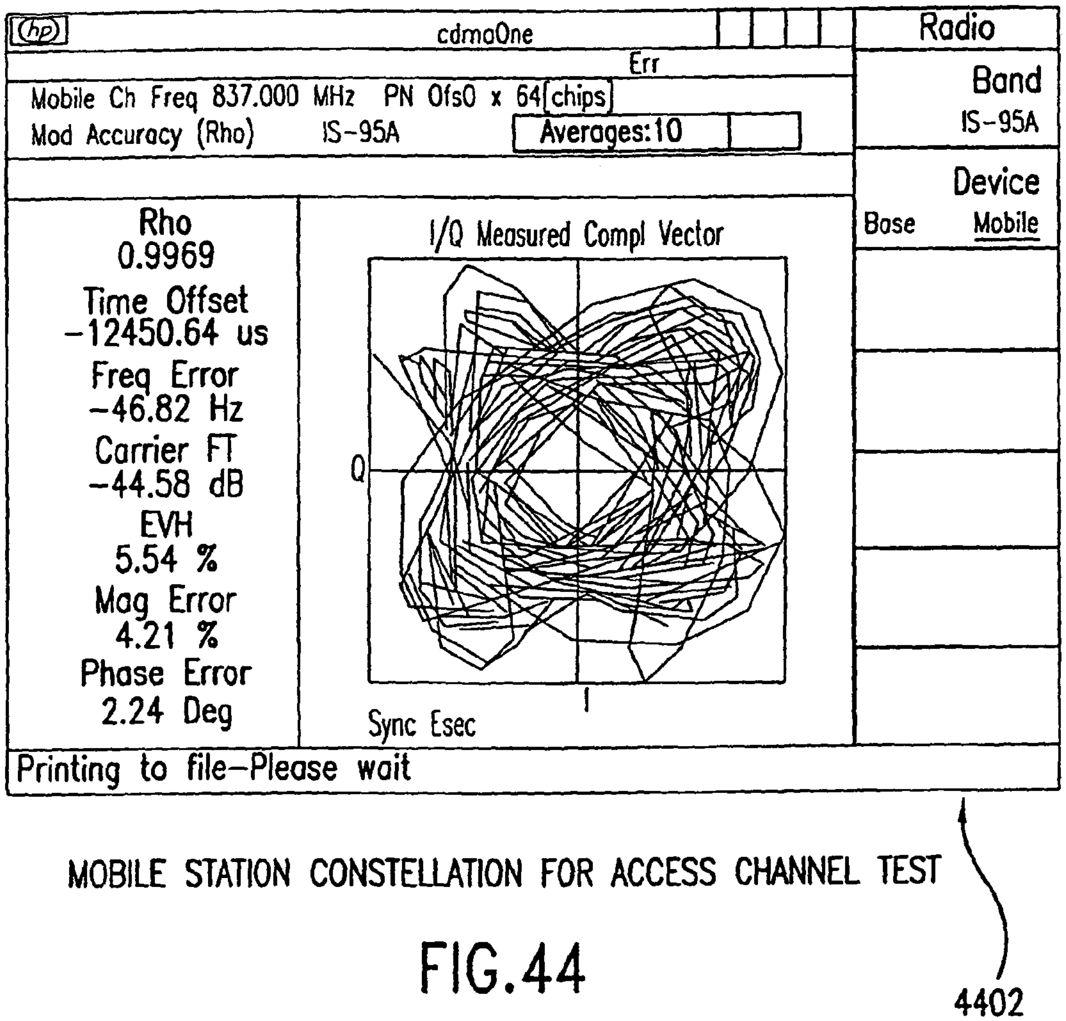

FIG. 44 illustrates a mobile station constellation 4402 measured during an access channel test. As shown, Rho=0.997 for the mobile station waveforms. Therefore, the modulator 2910 operates very well with conventional and offset shaped QPSK modulation schemes.

Figure 45:
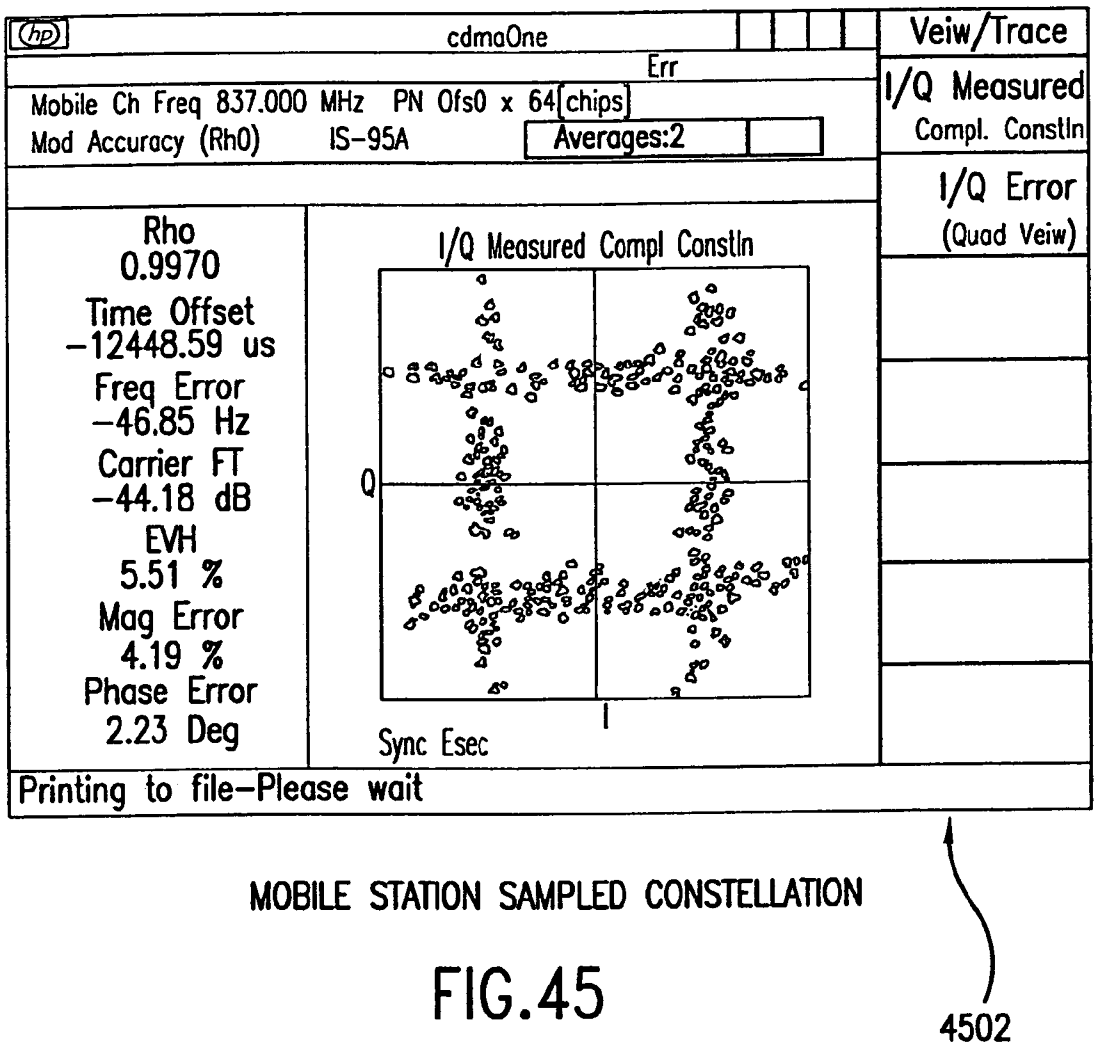

FIG. 45 illustrates a mobile station sampled constellation 4502. Constellation 4502 illustrates excellent symmetry for the constellation sample scatter diagram.

Figure 46:
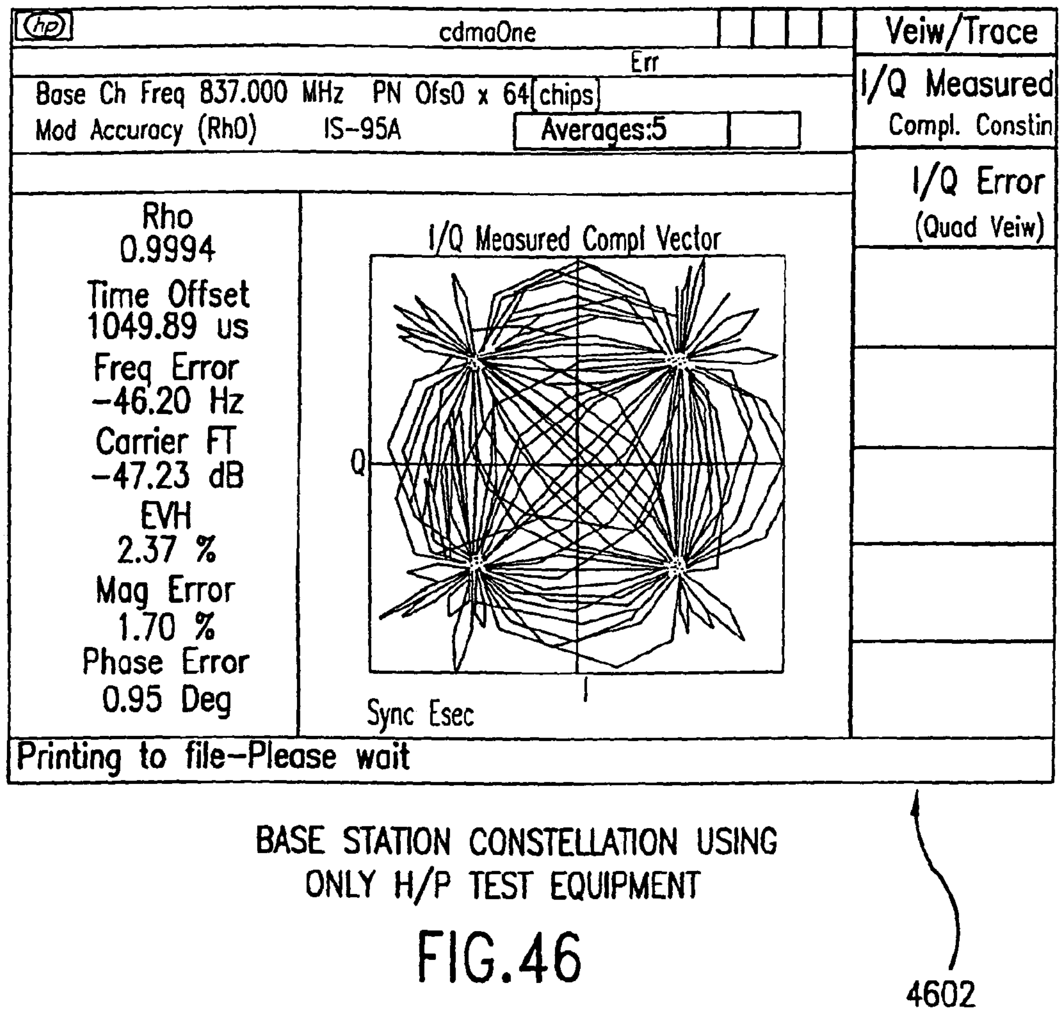

FIG. 46 illustrates a base station constellation 4602 using only the HP test equipment. The modulator 2910 has been removed so that the base station signal travels only through the cables that connect the HP signal generator E4433B to the HP 4406A test set. Therefore, constellation 4602 measures signal distortion caused by the test set components (including the cables and the attenuators). It is noted that Rho=0.9994 for this measurement using base station waveforms. Therefore, at least part of the minimal signal distortion that is indicated in FIGS. 42 and 43 is caused by the test set components, as would be expected by those skilled in the relevant arts.

Figure 47:
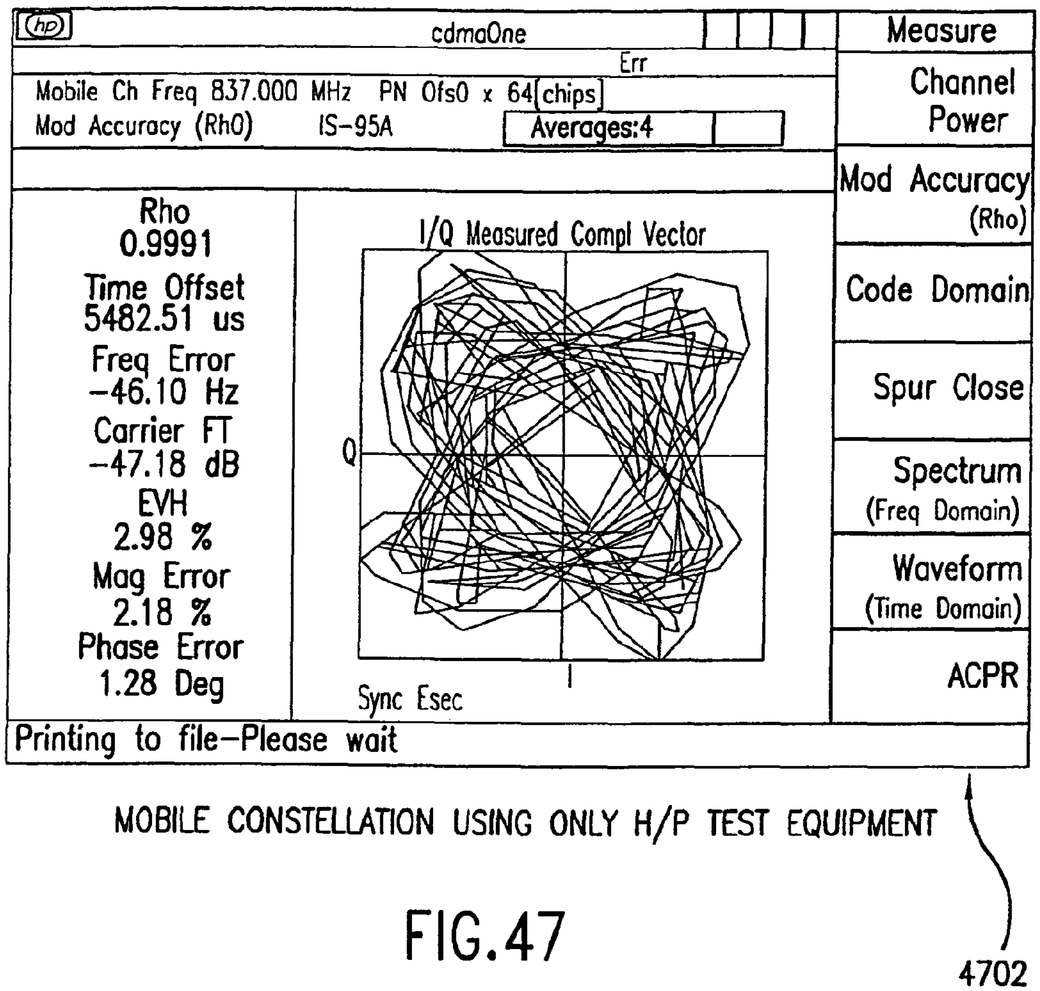

FIG. 47 illustrates a mobile station constellation 4702 using only the HP test equipment. As in FIG. 46, the modulator 2910 has been removed so that the mobile station signal travels only through the cables that connect the HP signal generator E4433B to the HP 4406A test set. Therefore, constellation 4602 measures signal distortion caused by the test set components (including the cables and the attenuators). It is noted that Rho=0.9991 for this measurement using mobile station waveforms. Therefore, at least part of the signal distortion indicated in FIGS. 44 and 45 is caused by the test set components, as would be expected.

Figure 48:
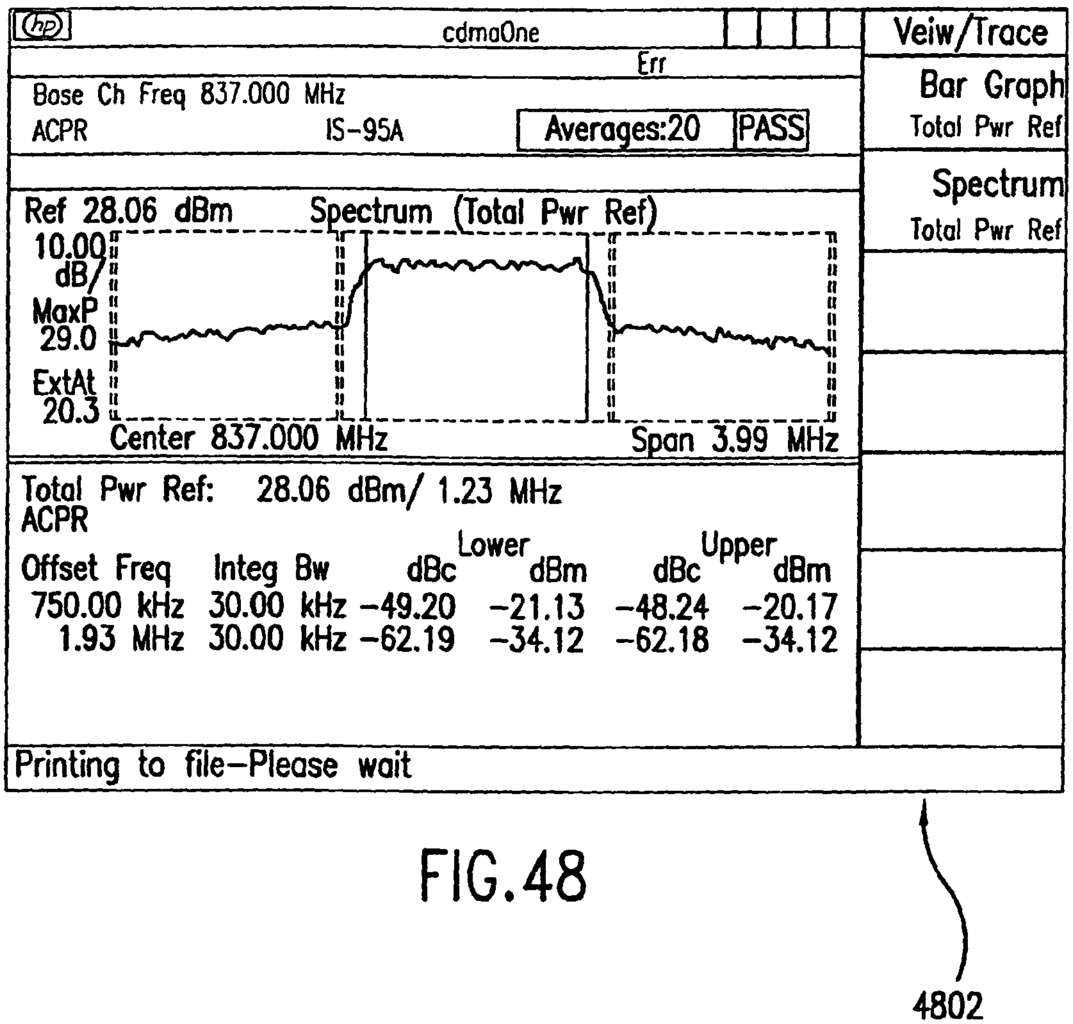

FIG. 48 illustrates a frequency spectrum 4802 of the signal 3905 with a base station input waveform. The frequency spectrum 4802 has a main lobe and two sidelobes, as expected for a CDMA spread spectrum signal. The adjacent channel power ratio (ACPR) measures the spectral energy at a particular frequency of the side lobes relative to the main lobe. As shown, the frequency spectrum 4802 has an ACPR=−48.34 dBc and −62.18 dBc at offset frequencies of 750 KHz and 1.98 MHZ, respectively. The IS-95 ACPR requirement for a base station waveform is −45 dBc and −60 dBc maximum, at the offset frequencies of 750 kHz and 1.98 MHZ, respectively. Therefore, the modulator 2910 has more than 3 dB and 2 dB of margin over the IS-95 requirements for the 750 kHz and 1.98 MHZ offsets, respectively.

Figure 49:
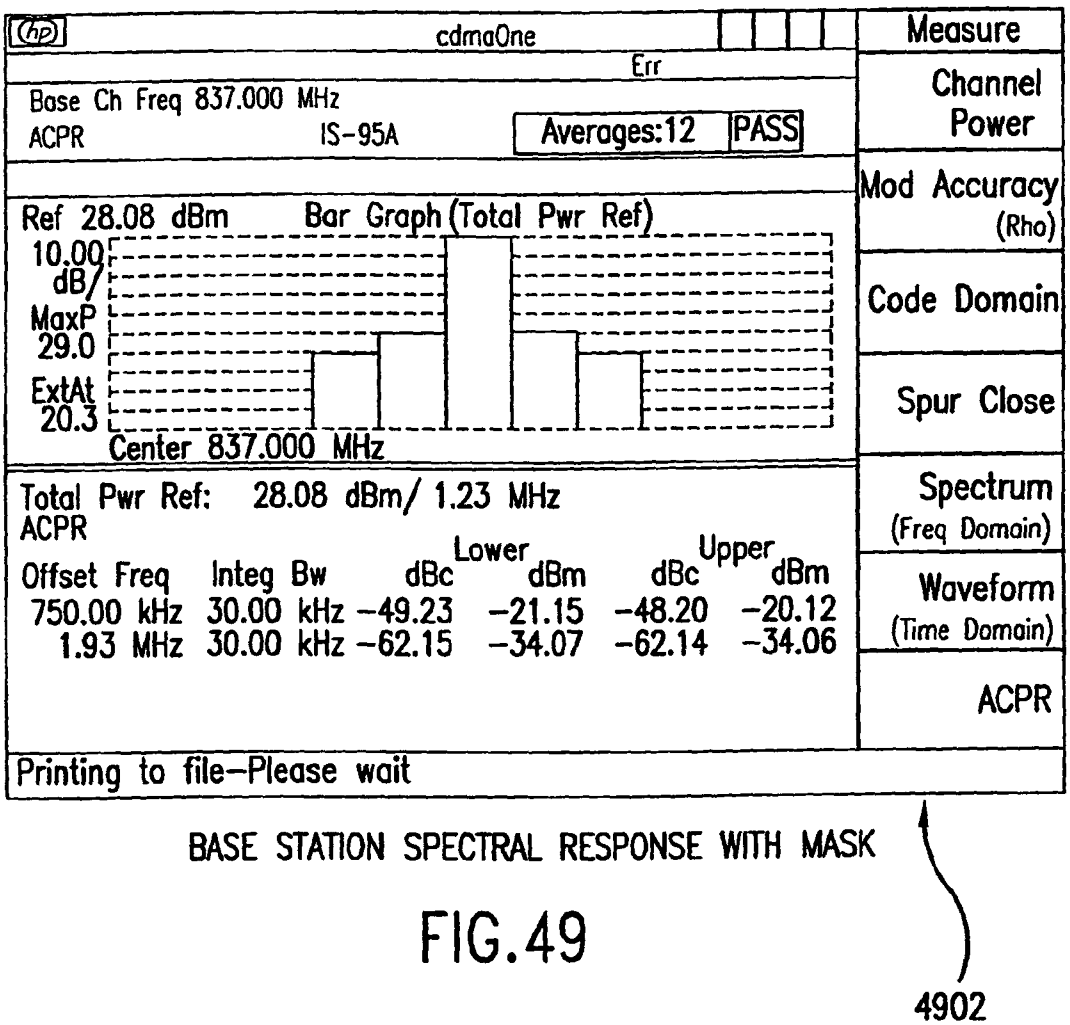

FIG. 49 illustrates a histogram 4902 that corresponds to the spectrum plot in FIG. 48. The histogram 4902 illustrates the distribution of the spectral energy in the signal 3905 for a base station waveform.

Figure 50:
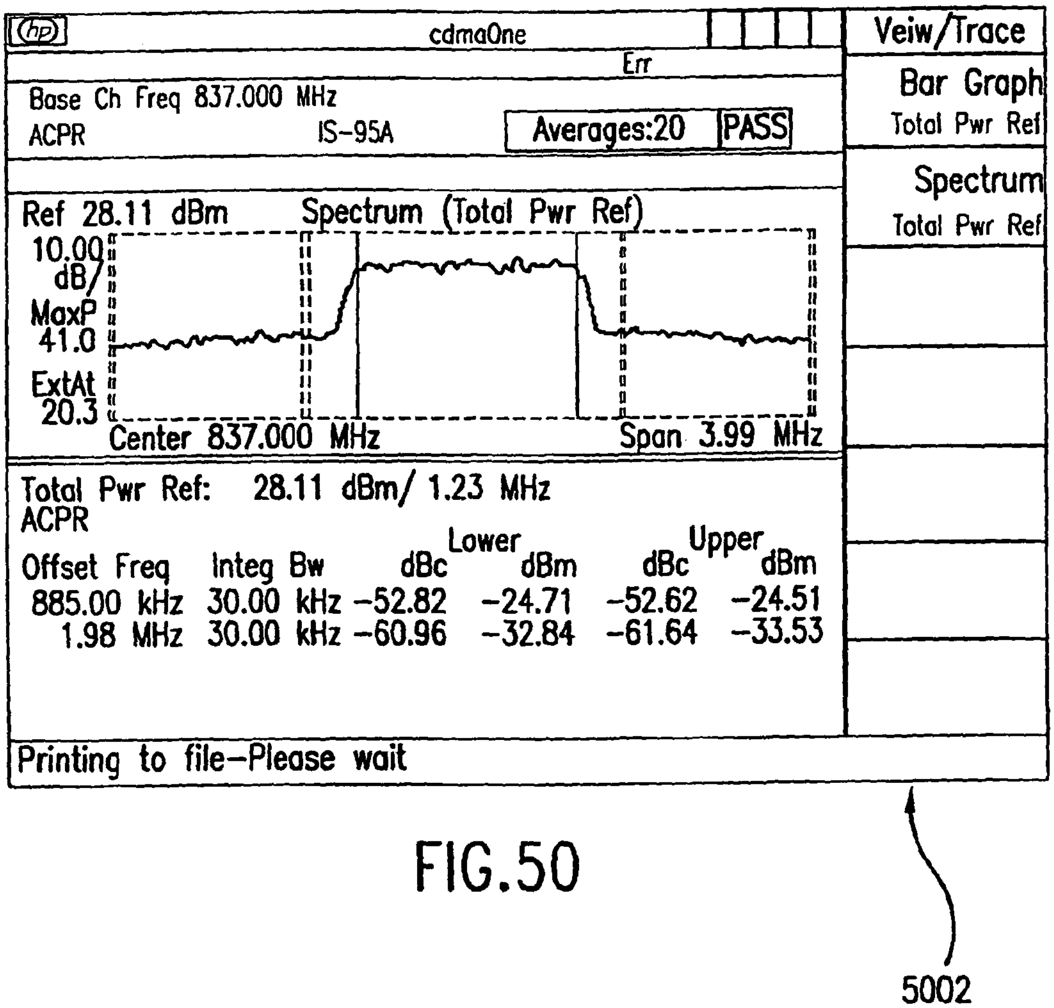

FIG. 50 illustrates a frequency spectrum 5002 of the signal 3905 with a mobile station input waveform. As shown, the ACPR measurement is −52.62 dBc and −60.96 dBc for frequency offsets of 885 kHz and 1.98 MHZ, respectively. The IS-95 ACPR requirement for a mobile station waveform is approximately −42 dBc and −54 dBc, respectively. Therefore, the modulator 2910 has over 10 dB and 6 dB of margin above the IS-95 requirements for the 885 kHz and 1.98 MHZ frequency offsets, respectively.

Figure 51:
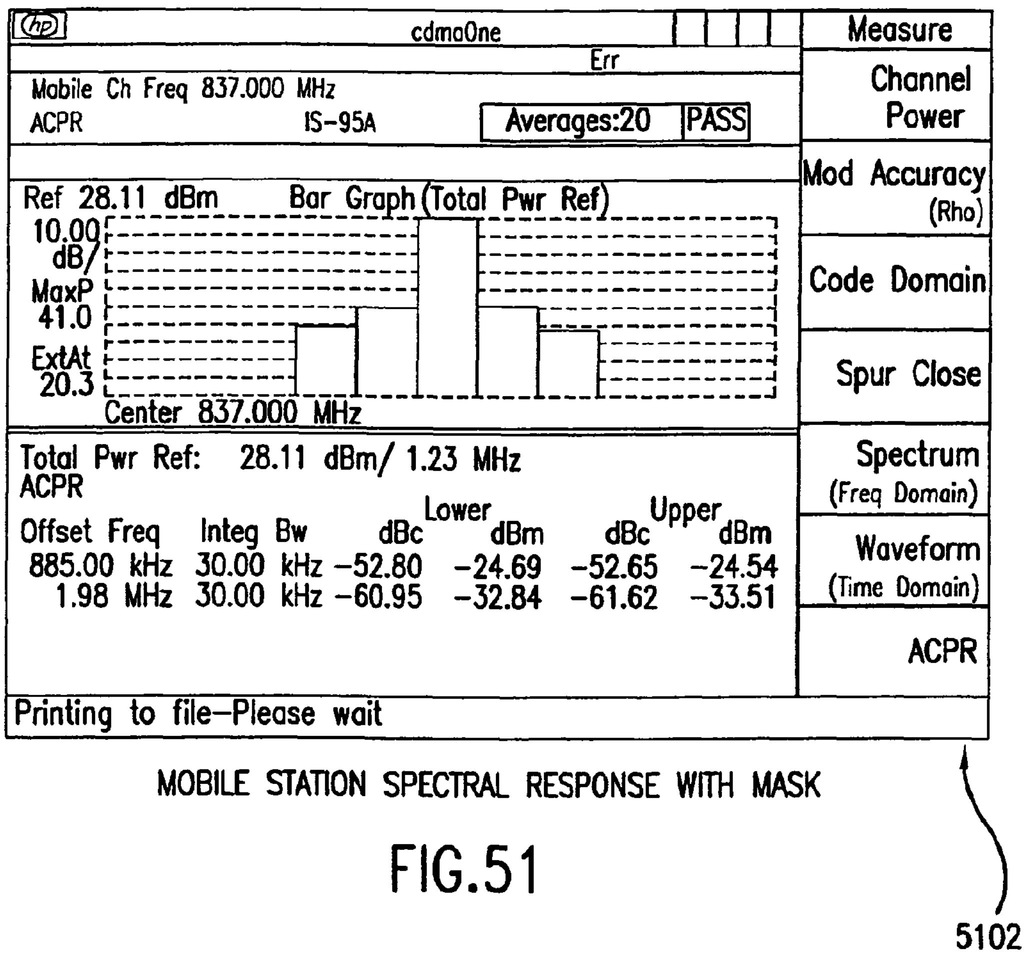

FIG. 51 illustrates a histogram 5102 that corresponds to the mobile station spectrum plot in FIG. 50. The histogram 5102 illustrates the distribution of the spectral energy in the signal 3905 for a mobile station waveform.

Figure 52A:
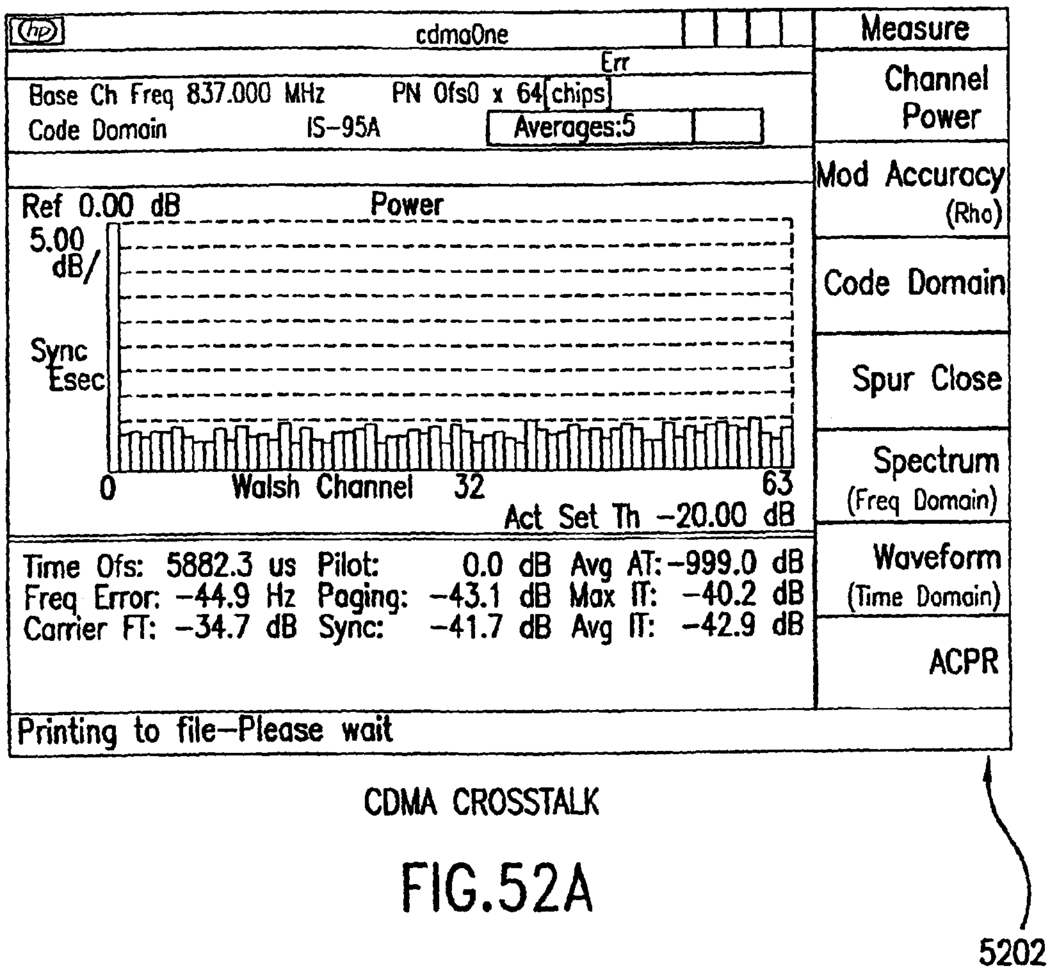

FIG. 52A illustrates a histogram 5202 for crosstalk vs. CDMA channel with a base station input waveform. More specifically, the HP E4406A was utilized as a receiver to analyze the orthogonality of codes superimposed on the base station modulated spectrum. The HP E4406A demodulated the signal provided by the modulator/transmitter and determined the crosstalk to non-active CDMA channels. The pilot channel is in slot '0' and is the active code for this test. All non-active codes are suppressed in the demodulation process by greater than 40 dB. The IS-95 requirement is 27 dB of suppression so that there is over 13 dB of margin. This implies that the modulator 2910 has excellent phase and amplitude linearity.

In additions to the measurements described above, measurements were also conducted to obtain the timing and phase delays associated with a base station transmit signal composed of pilot and active channels. Delta measurements were extracted with the pilot signal as a reference. The delay and phase are −5.7 ns (absolute) and 7.5 milli radians, worst case. The standard requires less than 50 ns (absolute) and 50 milli radians, which the modulator 2910 exceeded with a large margin.

Figure 52B:
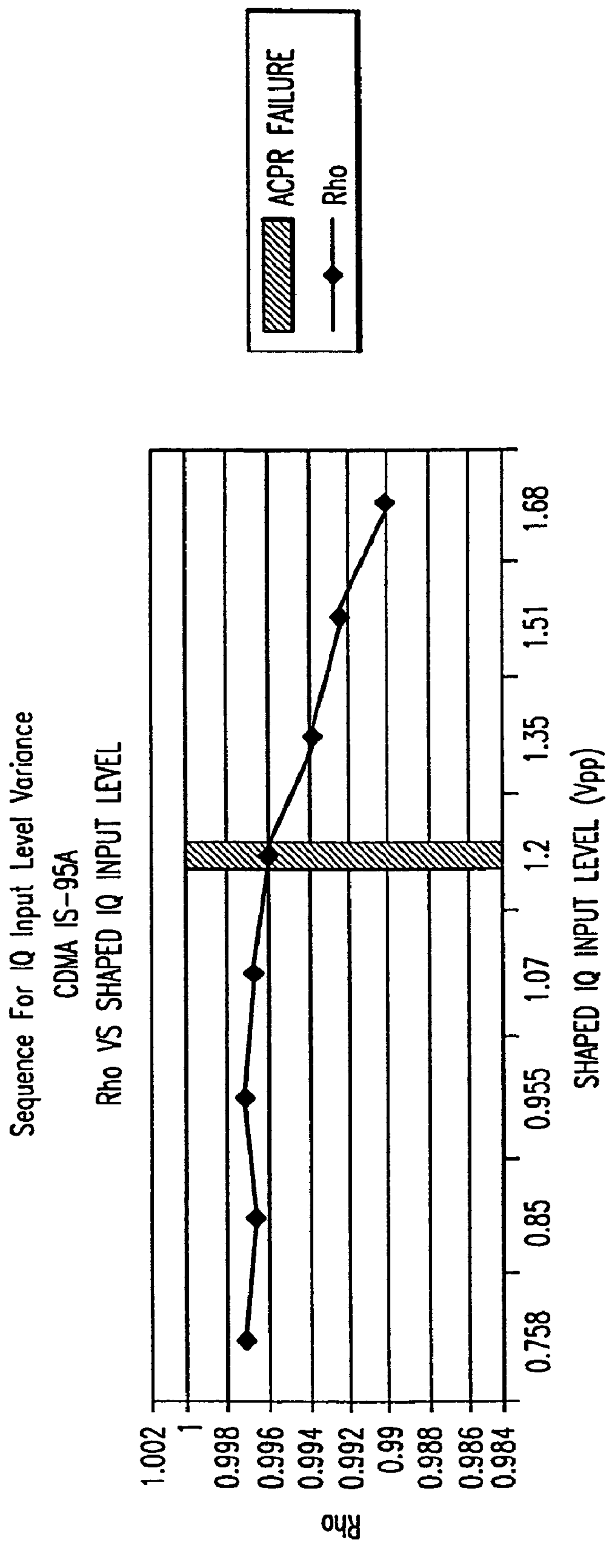

The performance sensitivity of modulator 2910 was also measured over multiple parameter variations. More specifically, the performance sensitivity was measured vs. IQ input signal level variation and LO signal level variation, for both base station and mobile station modulation schemes. (LO signal level is the signal level of the sub-harmonic clock 2645 in FIG. 39.) FIGS. 52B-O depict performance sensitivity of the modulator 2910 using the base station modulation scheme, and FIGS. 52P-Z depict performance sensitivity using the mobile station modulation scheme. These plots reveal that the modulator 2910 is expected to enable good production yields since there is a large acceptable operating performance range for I/Q and LO peak to peak voltage inputs. The plots are described further as follows.

FIG. 52B illustrates Rho vs. shaped IQ input signal level using base station modulation.

Figure 52C:
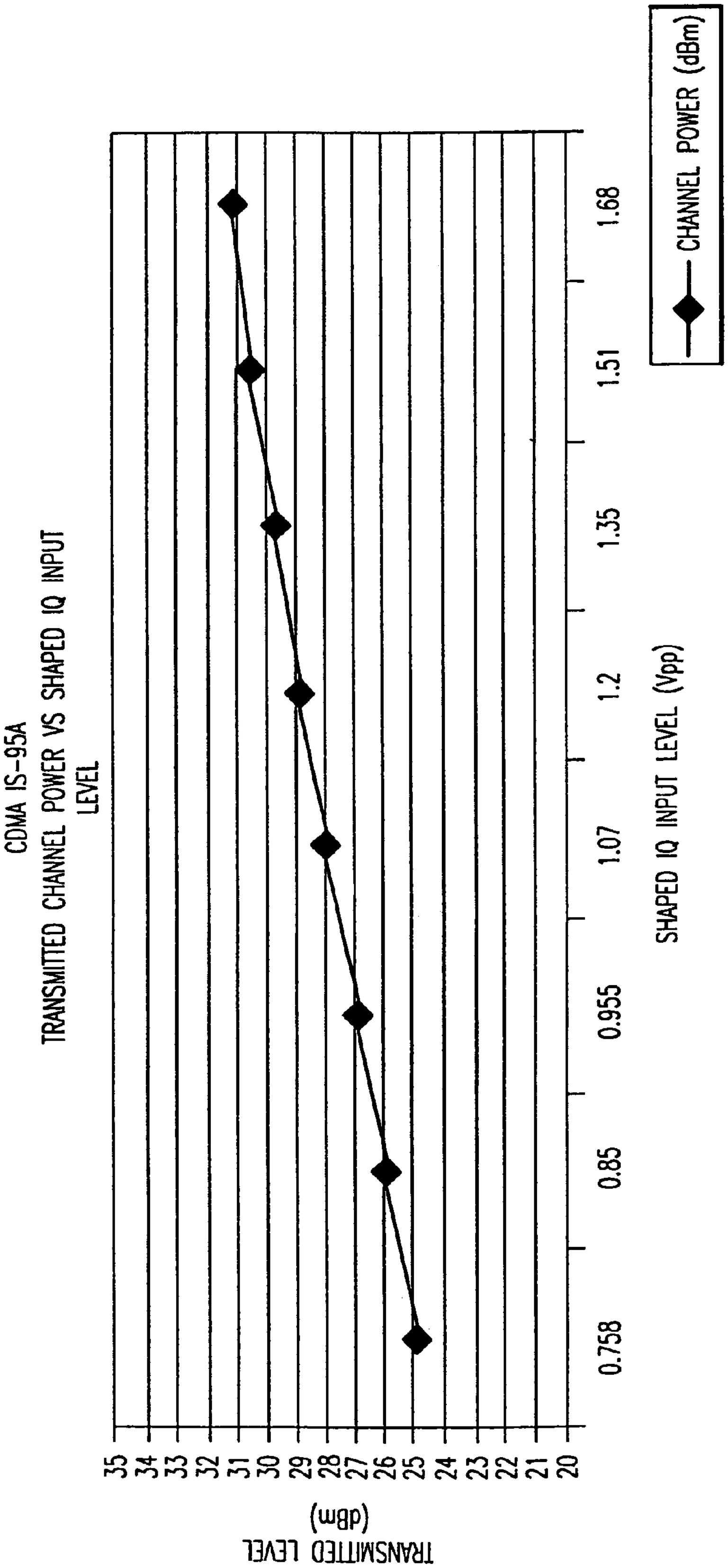

FIG. 52C illustrates transmitted channel power vs. shaped IQ input signal level using base station modulation.

Figure 52D:
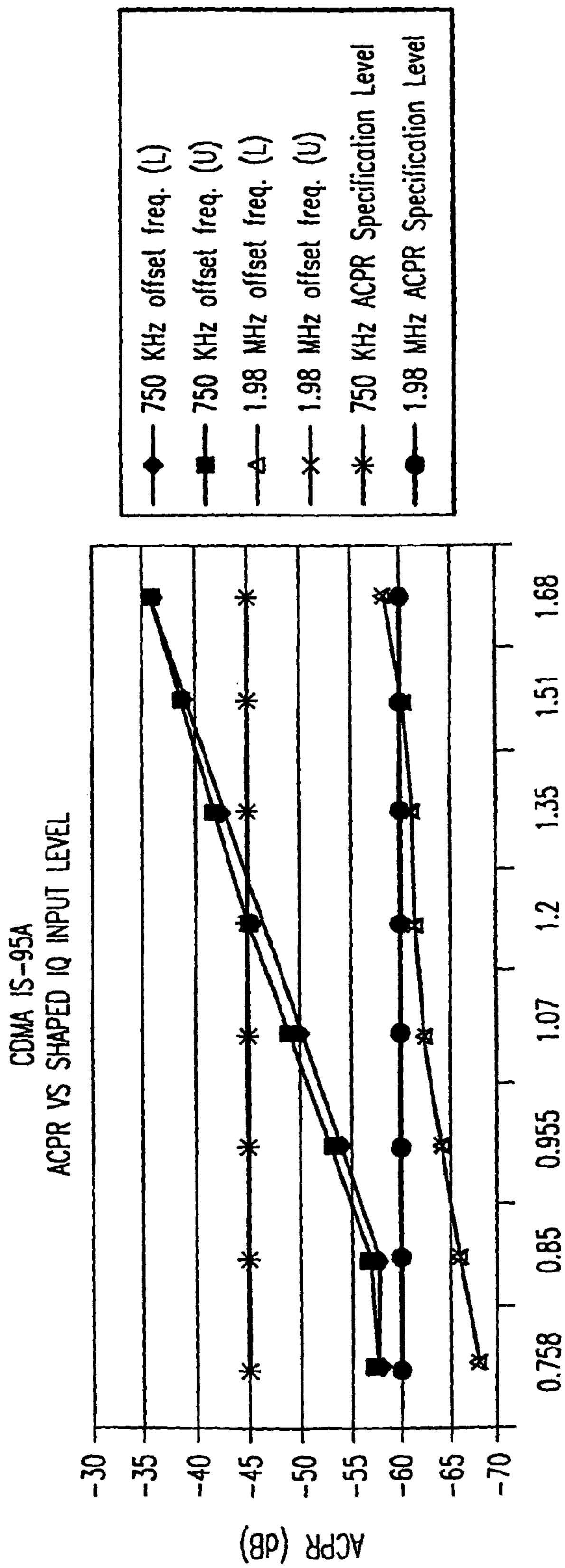

FIG. 52D illustrates ACPR vs. shaped IQ Input signal level using base station modulation.

Figure 52E:
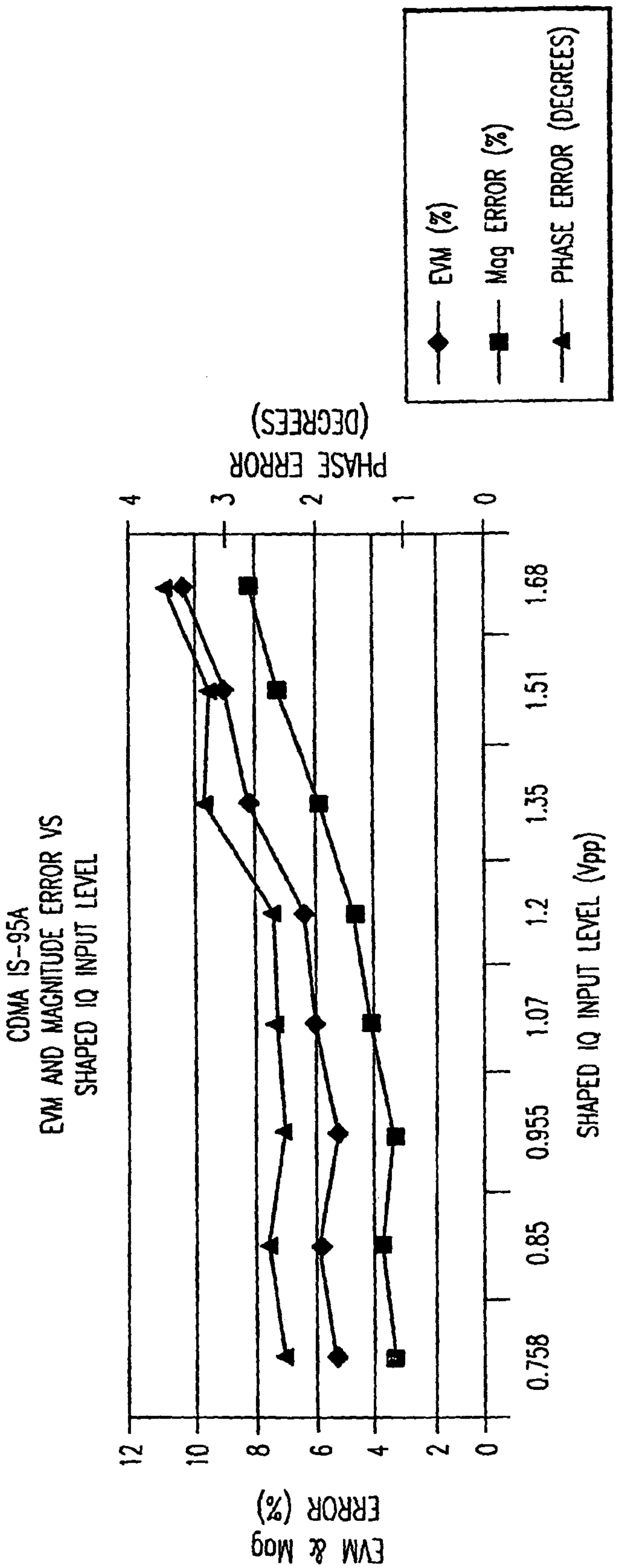

FIG. 52E illustrates EVM and Magnitude error vs shaped IQ input level using base station modulation.

Figure 52F:
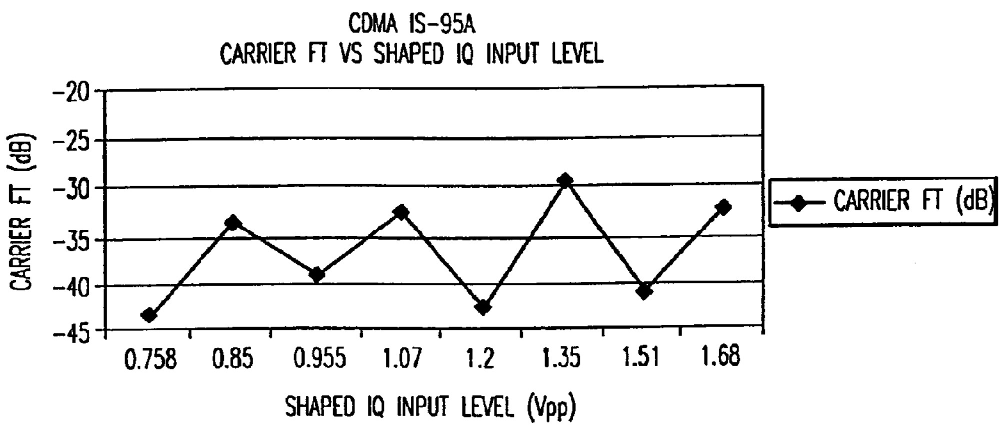

FIG. 52F illustrates carrier feed thru vs. shaped IQ input signal level using base station modulation.

Figure 52G:
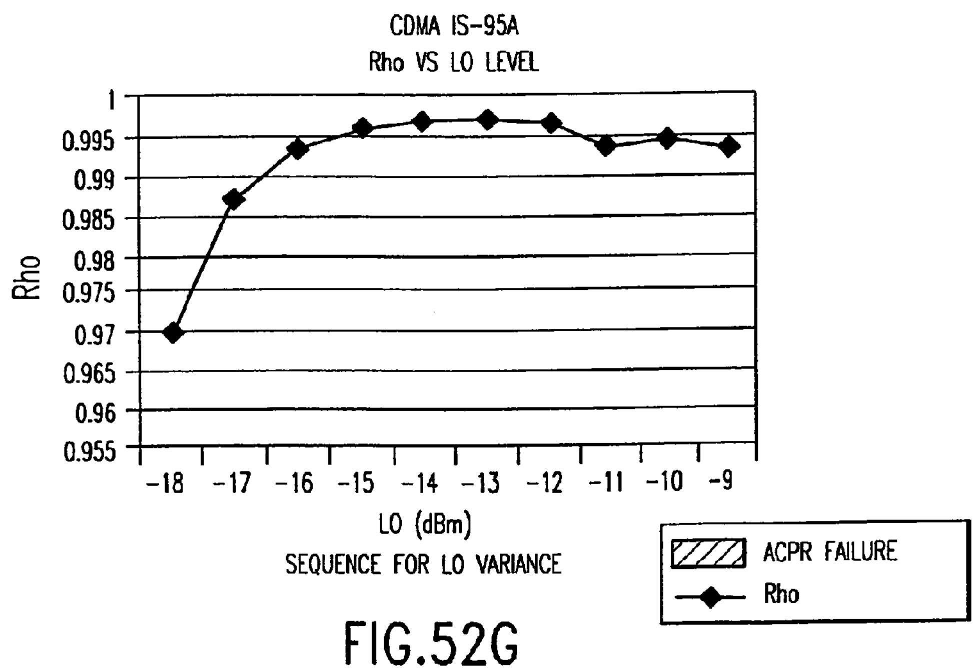

FIG. 52G illustrates Rho vs. LO signal level using base station modulation.

Figure 52H:
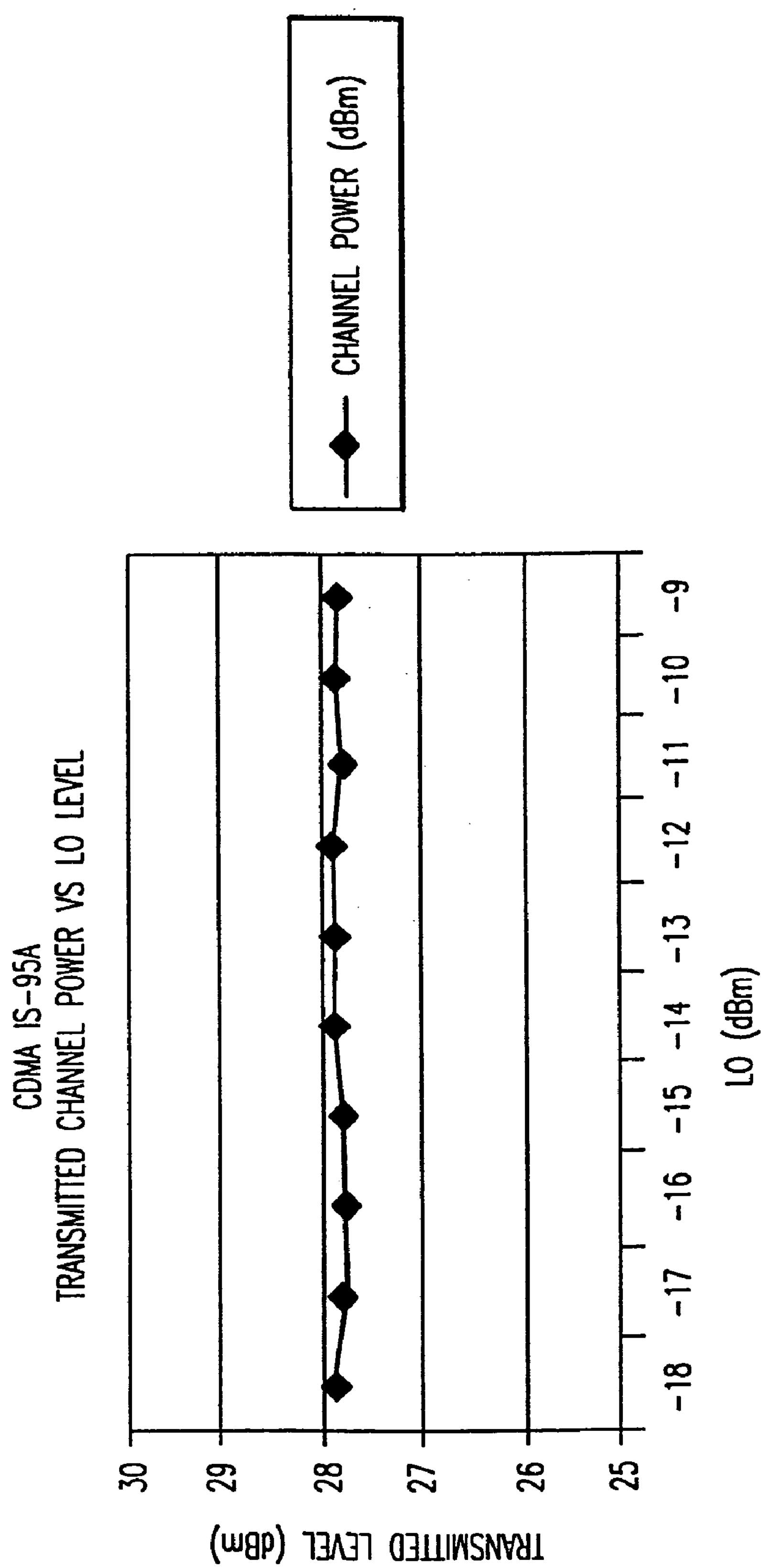

FIG. 52H illustrates transmitted channel power vs. LO signal level using base station modulation.

Figure 52I:
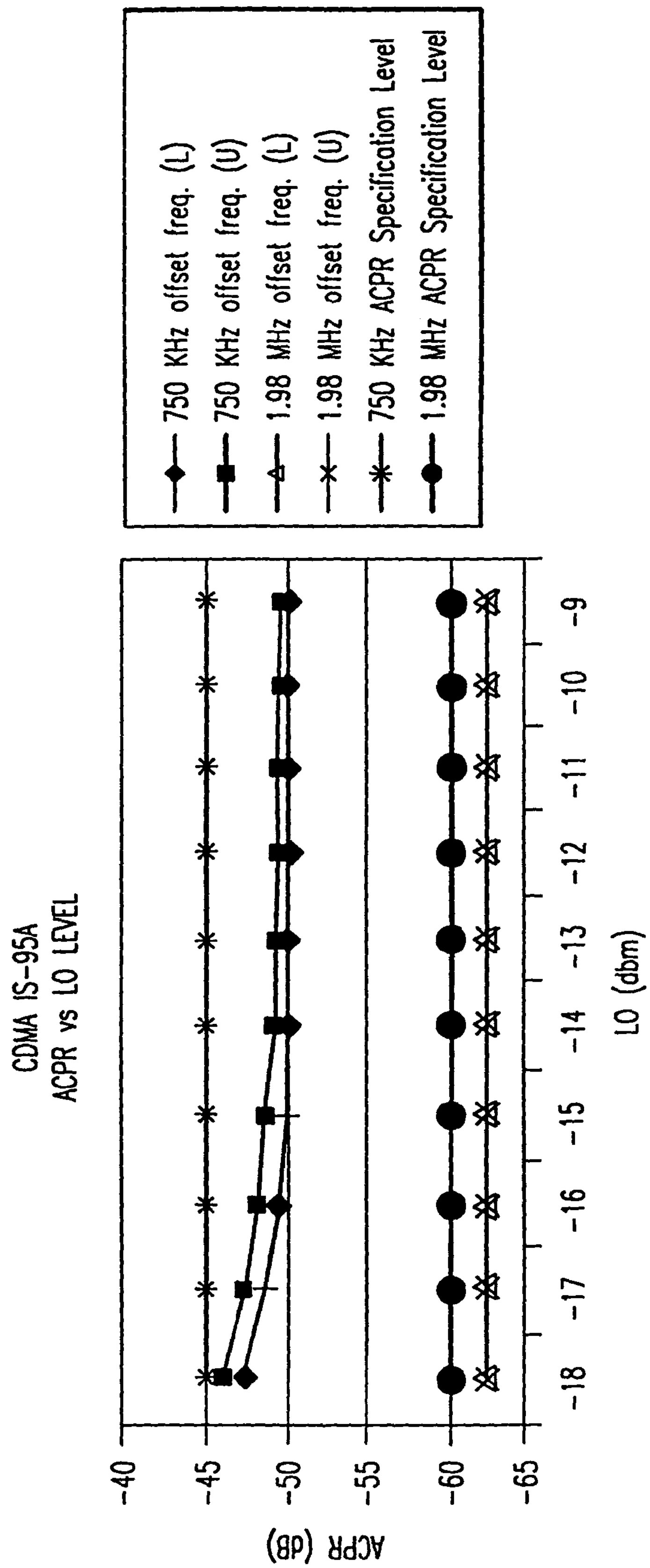

FIG. 52I illustrates ACPR vs. LO signal level using base station modulation.

Figure 52J:
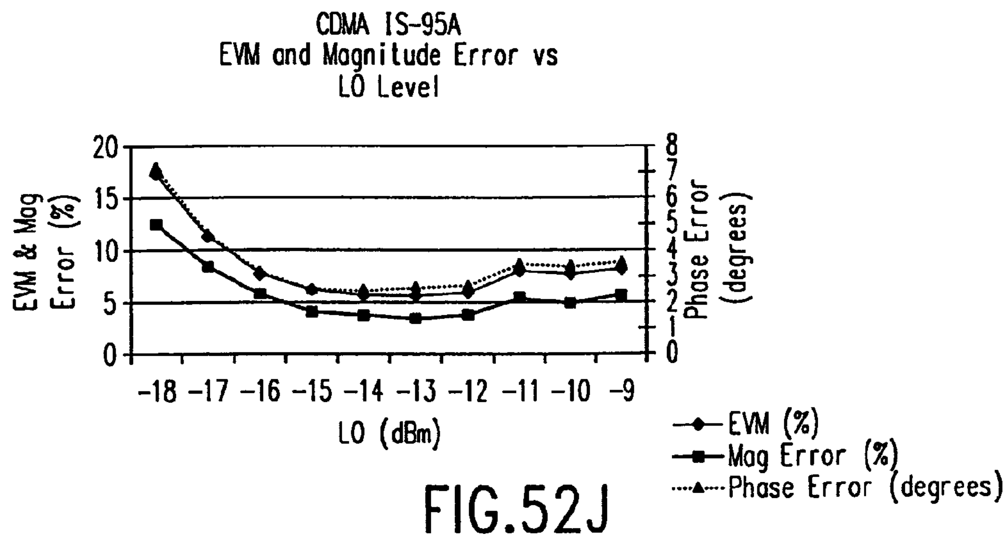

FIG. 52J illustrates EVM and magnitude error vs LO signal level using base station modulation.

Figure 52K:
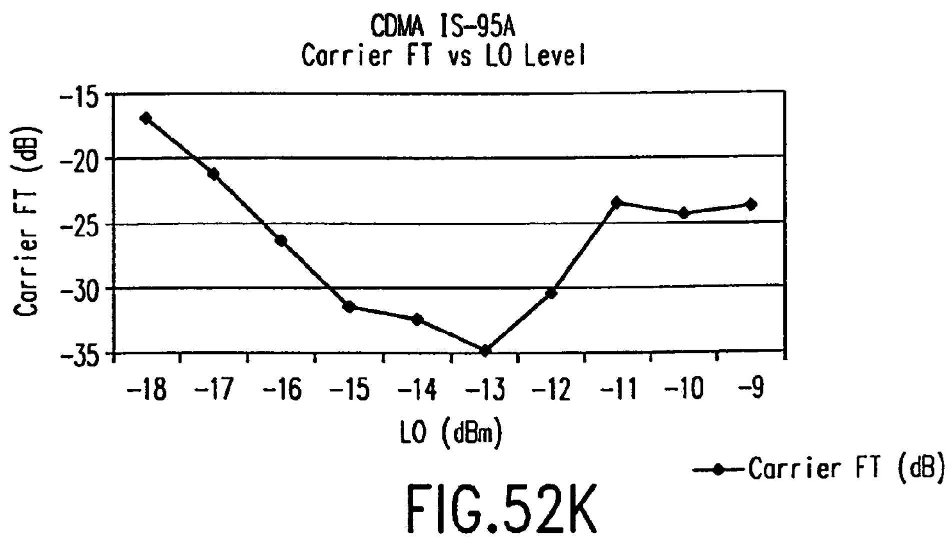

FIG. 52K illustrates carrier feed thru vs. LO signal level using base station modulation.

Figure 52L:
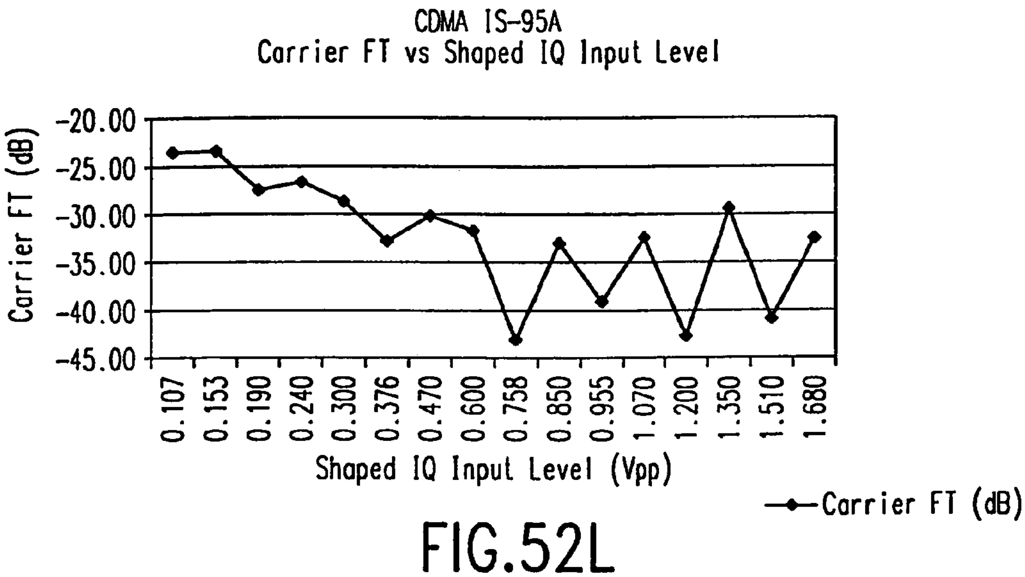

FIG. 52L illustrates carrier feed thru vs IQ input level over a wide range using base station modulation.

Figure 52M:
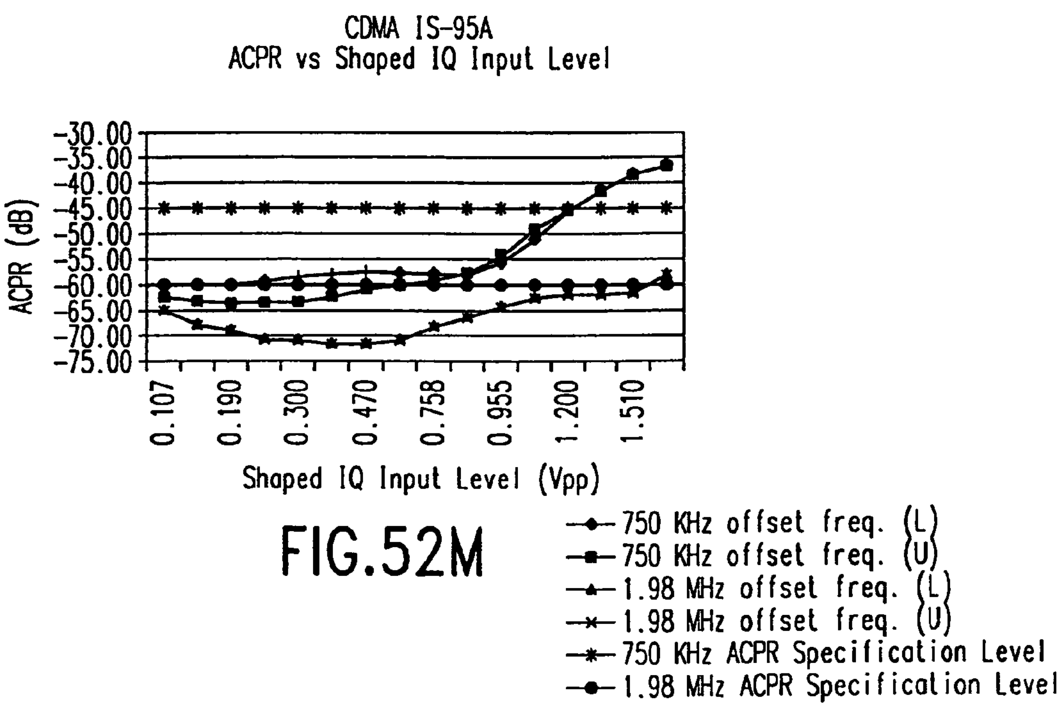

FIG. 52M illustrates ACPR vs. shaped IQ input signal level using base station modulation.

Figure 52N:
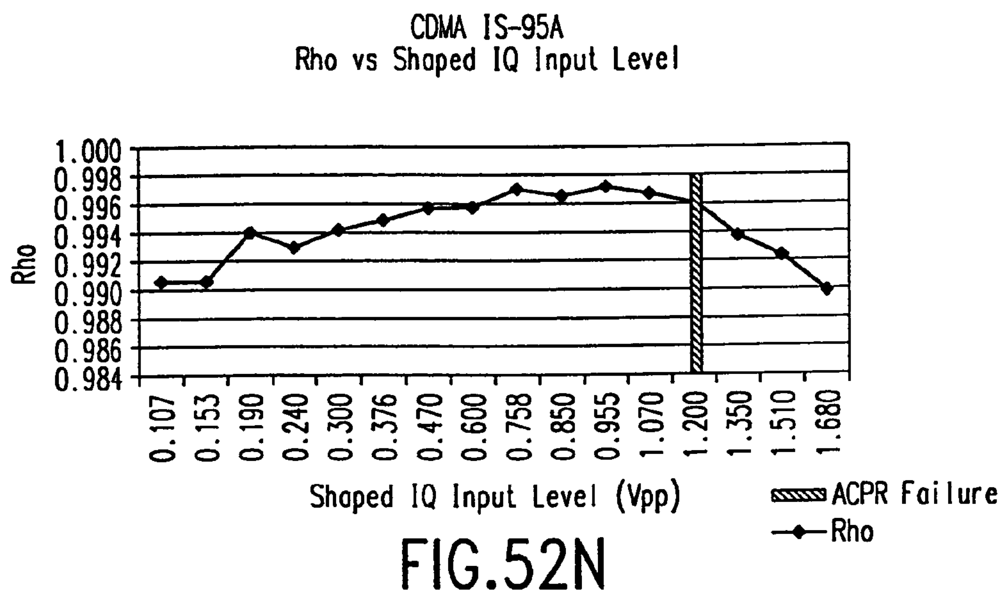
Figure 52O:
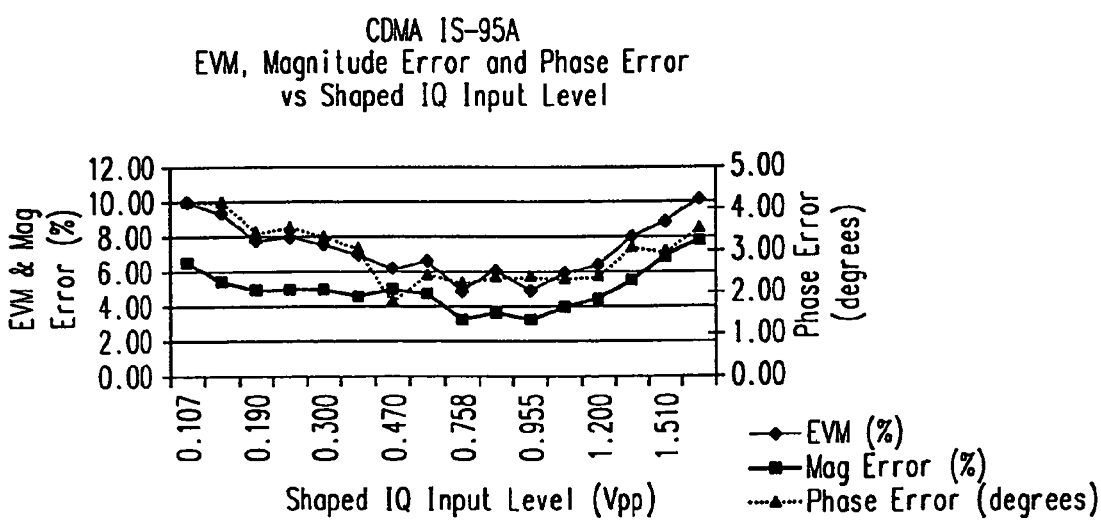

FIG. 52N illustrates Rho vs. shaped IQ input signal level using base station modulation.

FIG. 52O illustrates EVM, magnitude error, and phase error vs. shaped IQ input signal level using base station modulation.

Figure 52P:
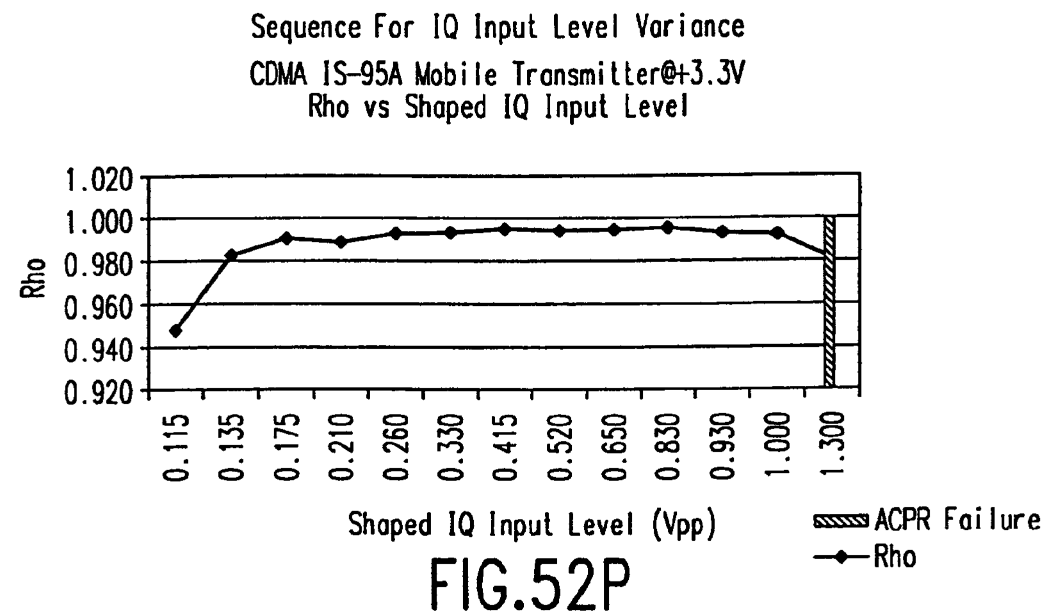

FIG. 52P illustrates Rho vs. shaped IQ input signal level using mobile station modulation.

Figure 52Q:
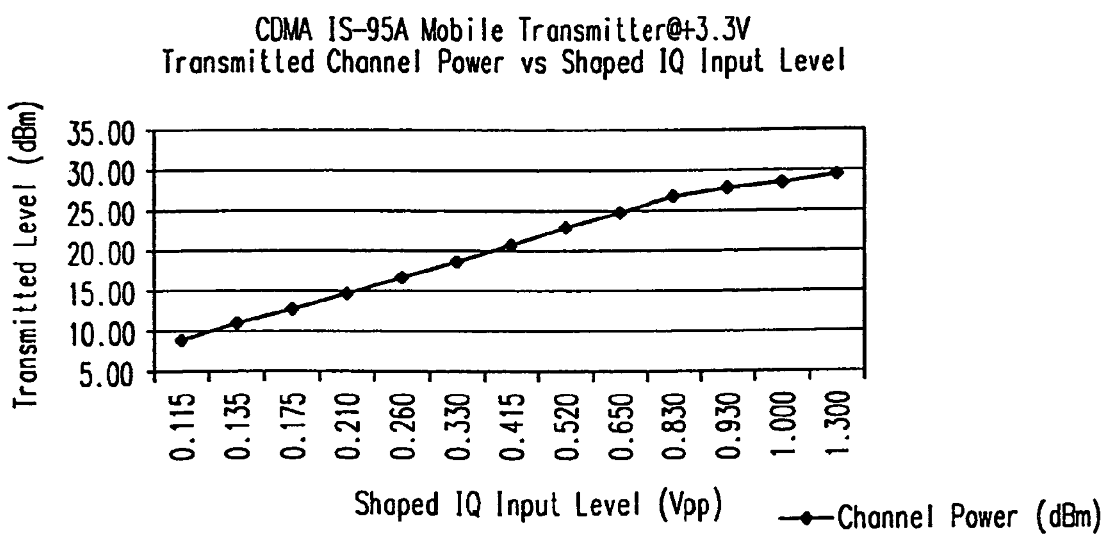

FIG. 52Q illustrates transmitted channel power vs. shaped IQ input signal level using mobile station modulation.

Figure 52R:
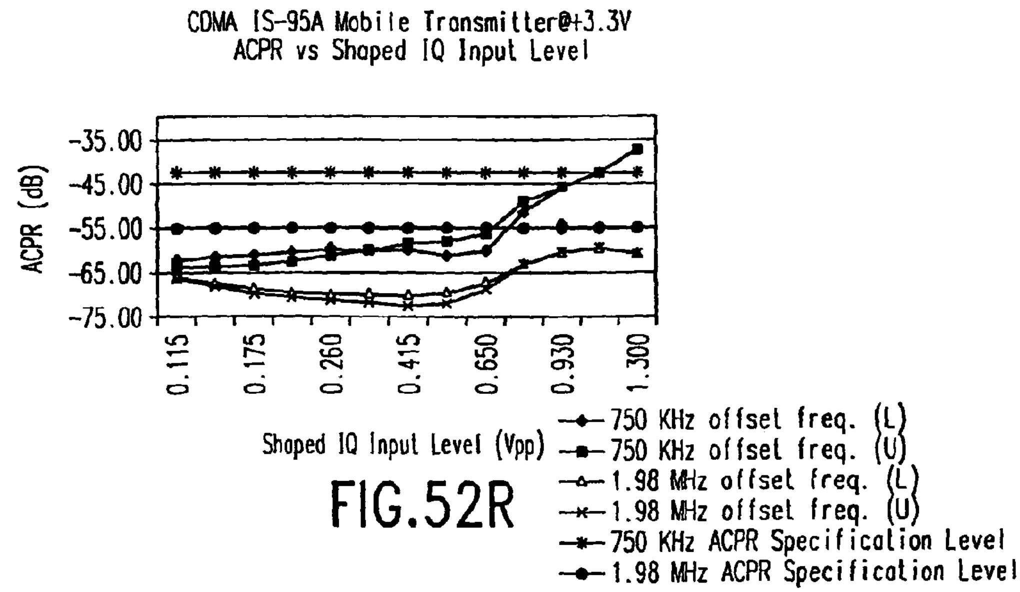

FIG. 52R illustrates ACPR vs. shaped IQ Input signal level using mobile station modulation.

Figure 52S:
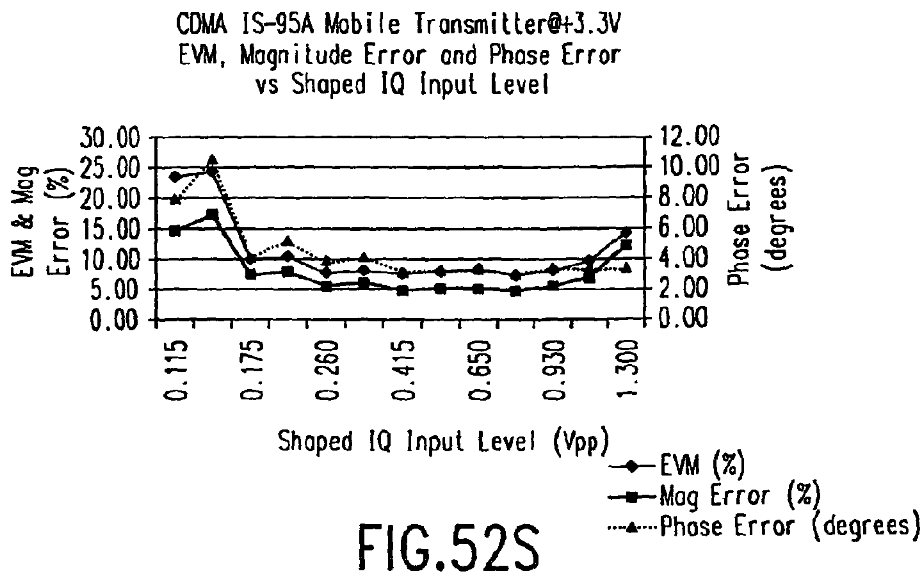

FIG. 52S illustrates EVM, magnitude error, and phase error vs. shaped IQ input level using mobile station modulation.

Figure 52T:
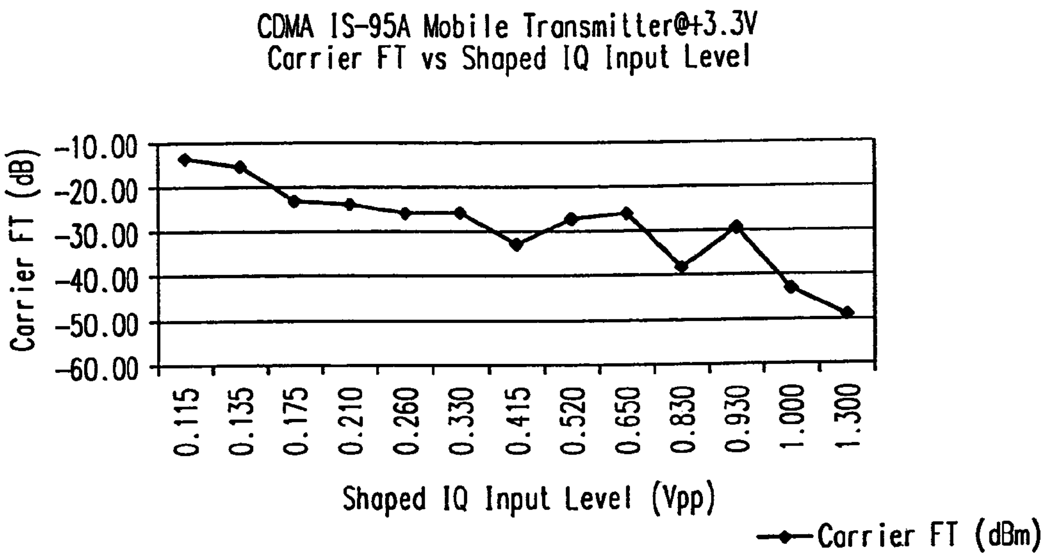

FIG. 52T illustrates carrier feed thru vs. shaped I Q input signal level using mobile station modulation.

Figure 52U:
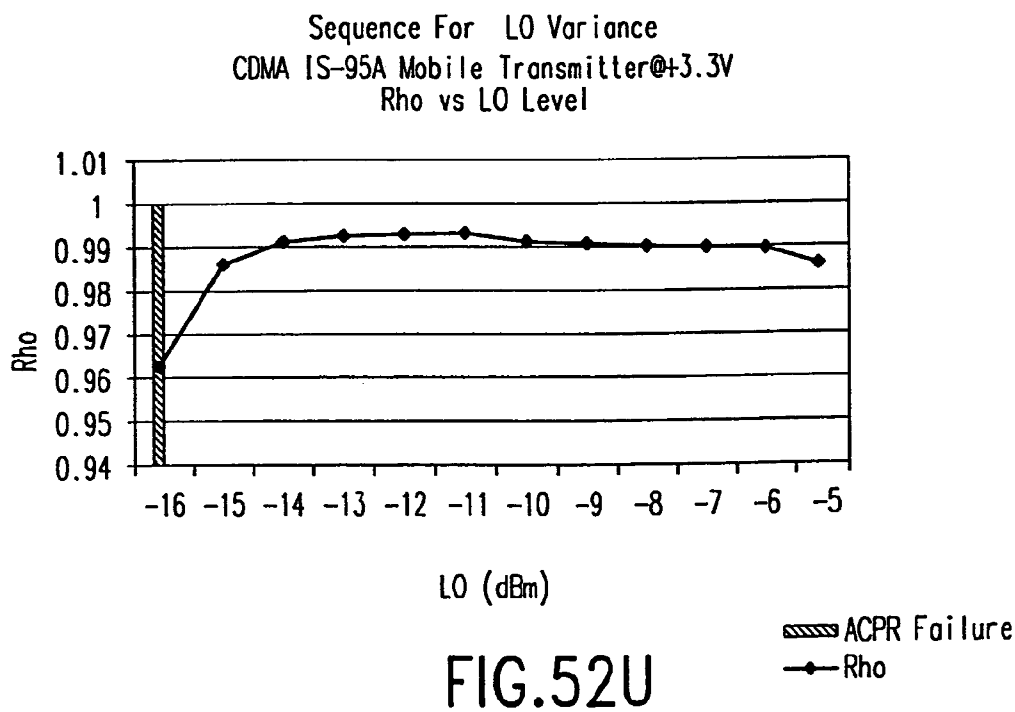

FIG. 52U illustrates Rho vs. LO signal level using mobile station modulation.

Figure 52V:
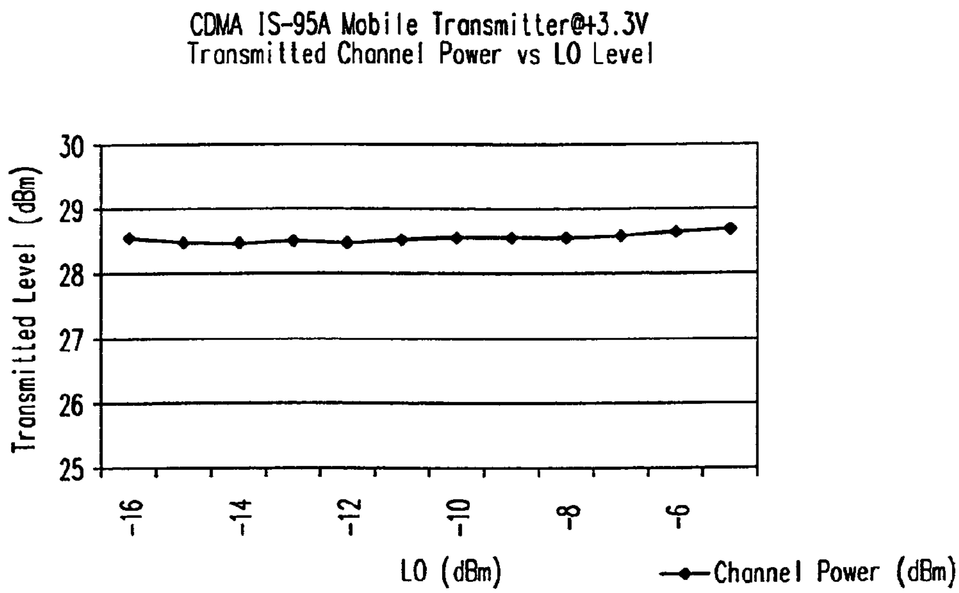

FIG. 52V illustrates transmitted channel power vs. LO signal level using mobile station modulation.

Figure 52W:
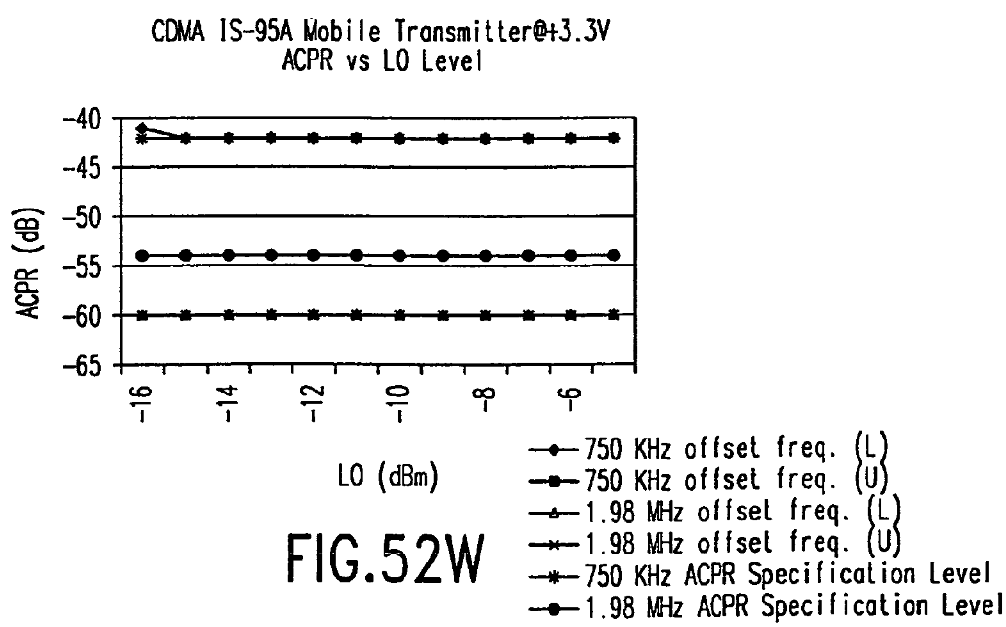

FIG. 52W illustrates ACPR vs. LO signal level using mobile station modulation.

Figure 52X:
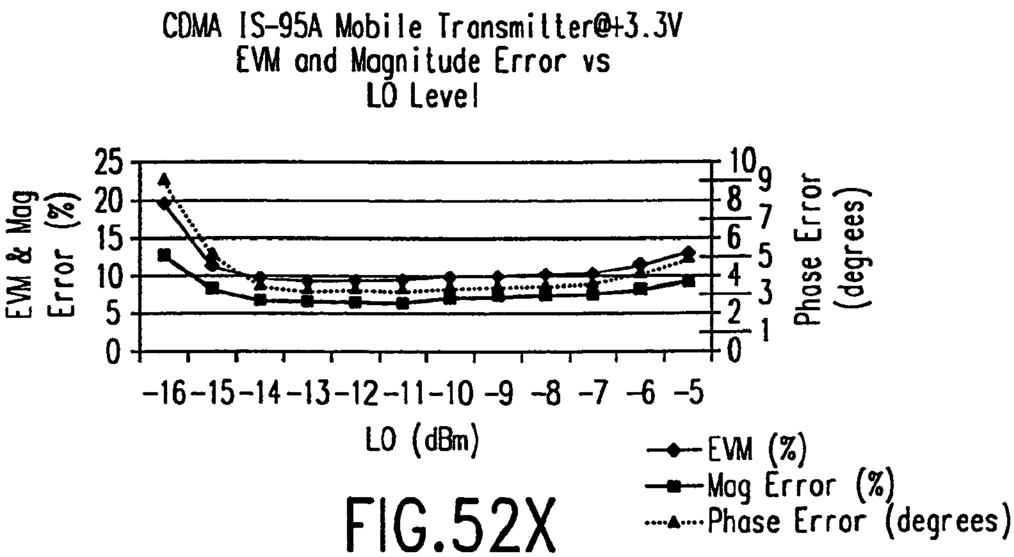

FIG. 52X illustrates EVM and magnitude error vs. LO signal level using mobile station modulation.

Figure 52Y:
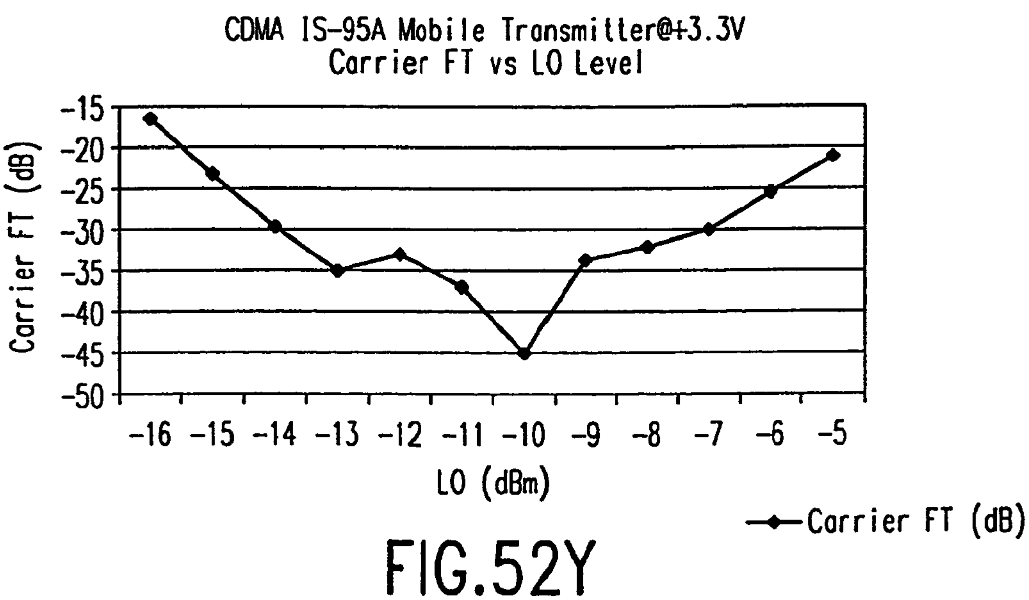

FIG. 52Y illustrates carrier feed thru vs. LO signal level using mobile station modulation.

FIG. 52Z illustrates an approximate power budget for a CDMA modulator based on the modulator 2910.

FIGS. 52B-Z illustrate that the UFT-based complex modulator 2910 comfortably exceeds the IS-95 transmitter performance requirements for both mobile and base station modulations, even with signal level variations. Testing indicates that Rho as well as carrier feed through and ACPR are not overly sensitive to variations in I/Q levels and LO levels. Estimated power consumption for the modulator 2910 is lower than equivalent two-state superheterodyne architecture. This means that a practical UFT based CDMA transmitter can be implemented in bulk CMOS and efficiently produced in volume.

The UFT architecture achieves the highest linearity per milliwatt of power consumed of any radio technology of which the inventors are aware. This efficiency comes without a performance penalty, and due to the inherent linearity of the UFT technology, several important performance parameters may actually be improved when compared to traditional transmitter techniques.

Since the UFT technology can be implemented in standard CMOS, new system partitioning options are available that have not existed before. As an example, since the entire UFT-based modulator can be implemented in CMOS, it is plausible that the modulator and other transmitter functions can be integrated with the digital baseband processor leaving only a few external components such as the final bandpass filter and the power amplifier. In addition to the UFT delivering the required linearity and dynamic range performance, the technology also has a high level of immunity to digital noise that would be found on the same substrate when integrated with other digital circuitry. This is a significant step towards enabling a complete wireless system-on-chip solution.

It is noted that the test setup, procedures, and results discussed above and shown in the figures were provided for illustrative purposes only, and do not limit the invention to any particular embodiment, implementation or application.

8.0 Integrated Up-Conversion And Spreading Of A Baseband Signal

Previous sections focused on up-converting a spread spectrum signal directly from baseband-to-RF, without preforming any IF processing. In these embodiments, the baseband signal was already a spread spectrum signal prior to up-conversion. The following discussion focuses on embodiments that perform the spreading function and the frequency translation function in a simultaneously and in an integrated manner. One type of spreading code is Code Division Multiple Access (or CDMA), although the invention is not limited to this. The present invention can be implemented in CDMA, and other spread spectrum systems as will be understood by those skilled in the arts based on the teachings herein.

8.1 Integrated Up-Conversion and Spreading Using an Amplitude Shaper

Figure 53A:
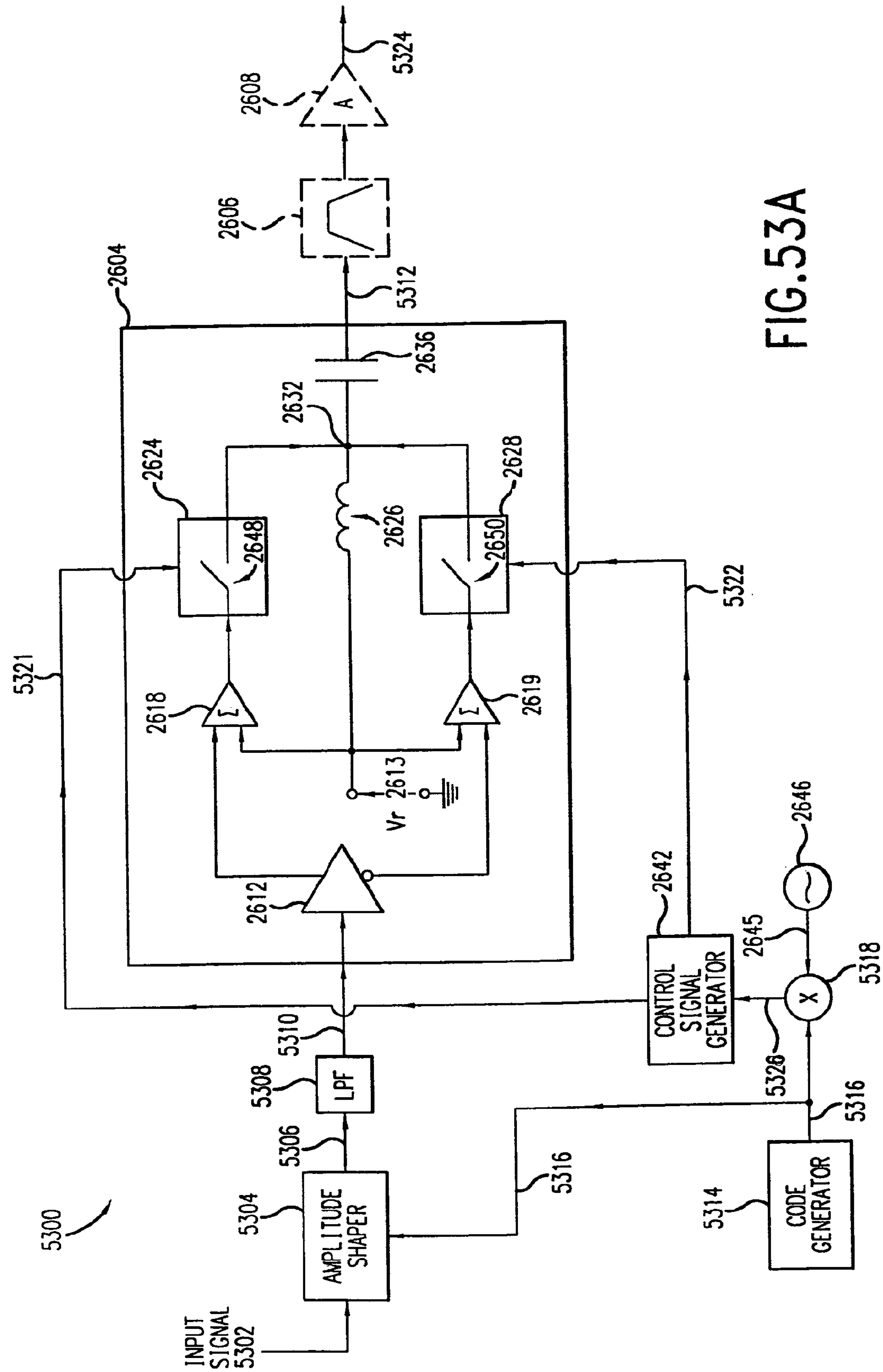
FIGS. 53A-C illustrate a transmitter 5300 and associated signal diagrams according to embodiments of the present invention.
Figure 67:
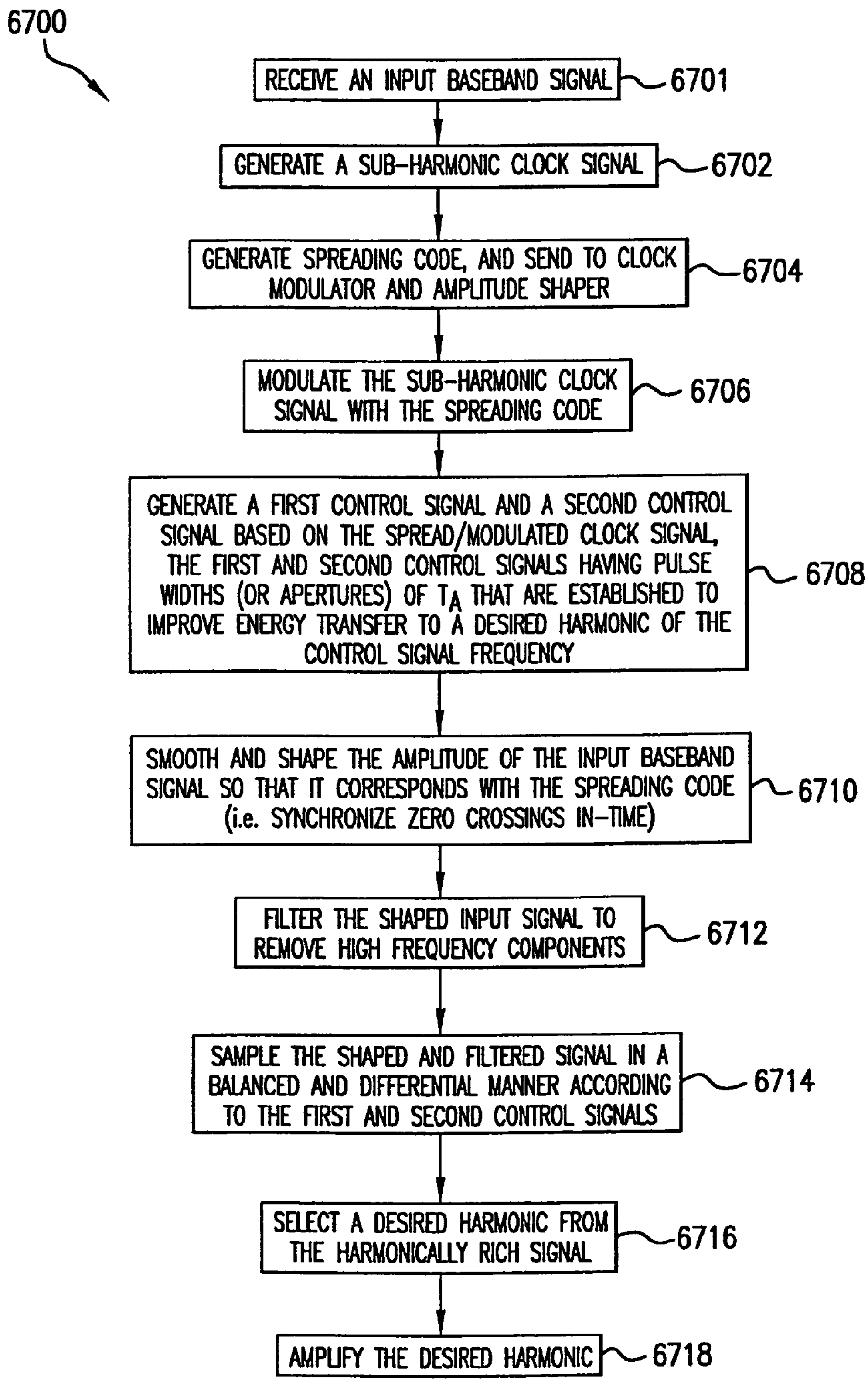
FIG. 67 illustrates a flowchart 6700 that is associated with the spread spectrum transmitter 5300 in FIG. 53A according to an embodiment of the invention.

FIG. 53A illustrates a spread spectrum transmitter 5300 that is based on the UFT-based modulator 2604 that was discussed in FIG. 26A. Spread spectrum transmitter 5300 performs simultaneous up-conversion and spreading of an input baseband signal 5302 to generate an output signal 5324. As will shown, the spreading is accomplished by placing the spreading code on the control signals that operate the UFT modules in the modulator 2604 so that the spreading and up-conversion are accomplished in an integrated manner. In order to limit sidelobe spectral growth in the output signal 5324, the amplitude of the input baseband signal 5302 is shaped so as to correspond with the spreading code. The operation of spread spectrum transmitter 5300 is described in detail as follows with reference to flowchart 6700 that is shown in FIG. 67. The order of the steps in flowchart 6700 are not limiting and may be re-arranged as will be understood by those skilled in the arts. (This is generally true of all flowcharts discussed herein).

In step 6701, the spread spectrum transmitter 5300 receives the input baseband signal 5302.

In step 6702, the oscillator 2646 generates the clock signal 2645. As described earlier, the clock signal 2645 is in embodiments a sub-harmonic of the output signal 5324. Furthermore, in embodiments of the invention, the clock signal 2645 is a periodic square wave or sinusoidal clock signal.

In step 6704, a spreading code generator 5314 generates a spreading code 5316. In embodiments of the invention, the spreading code 5316 is a PN code, or any other type of spreading code that is useful for generating spread spectrum signals.

In step 6706, the multiplier 5318 modulates the clock signal 2645 with the spreading code 5316 to generate spread clock signal 5320. As such, the spread clock signal 5320 carries the spreading code 5316.

In step 6708, the control signal generator 2642 receives the spread clock signal 5320, and generates control signals 5321 and 5322 that operate the UFT modules in the modulator 2604. The control signals 5321 and 5322 are similar to clock signals 2623 and 2627 that were discussed in FIG. 26. In other words, the clock signals 5321 and 5322 include a plurality of pulses having a pulse width $T_A$ that is established to improve energy transfer to a desired harmonic in the resulting harmonically rich signal. Additionally, the control signals 5321 and 5322 are phase shifted with respect to each other by approximately 180 degrees (although the invention is not limited to this example), as were the control signals 2623 and 2627. However, the control signals 5321 and 5322 are modulated with (and carry) the spreading code 5316 because they were generated from spread clock signal 5320.

In step 6710, the amplitude shaper 5304 receives the input baseband signal 5302 and shapes the amplitude so that it corresponds with the spreading code 5316 that is generated by the code generator 5314, resulting in a shaped input signal 5306. This is achieved by feeding the spreading code 5316 back to the amplitude shaper 5304 and smoothing the amplitude of the input baseband signal 5302, accordingly.

Figure 53B:
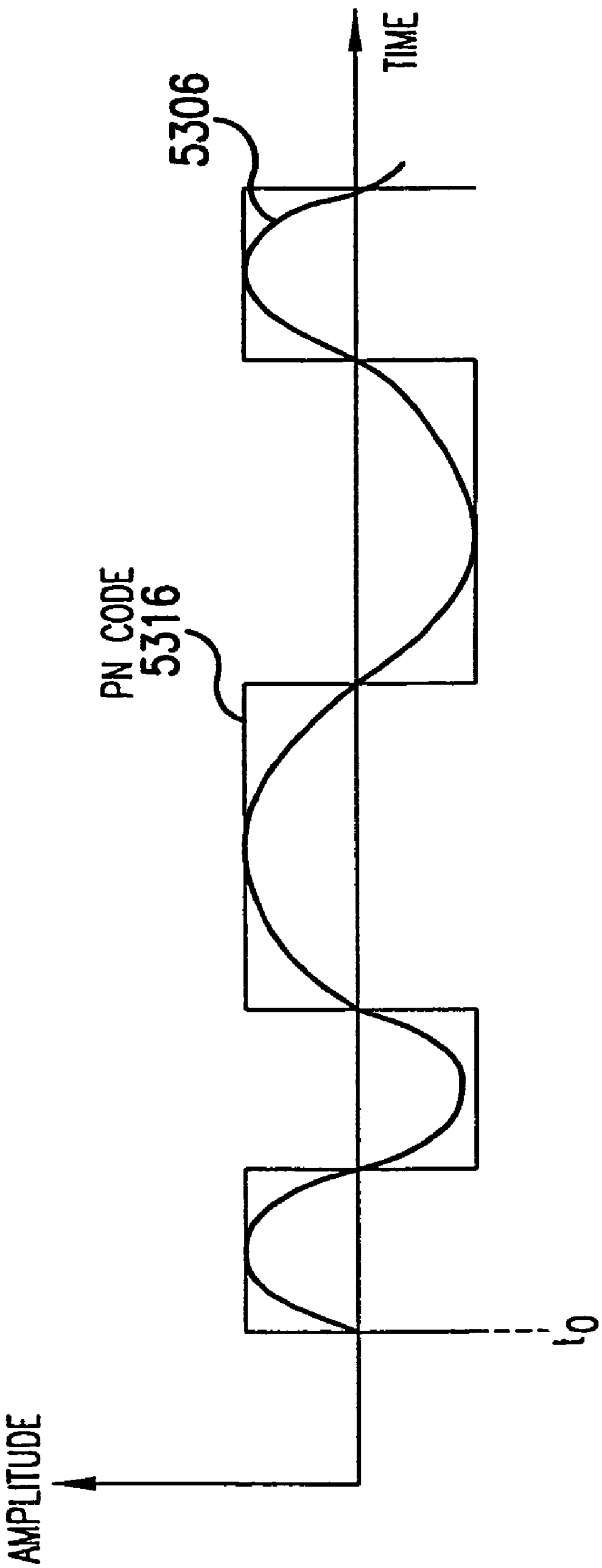

FIG. 53B illustrates the resulting shaped input signal 5306 and the corresponding spreading code 5316. The amplitude of the input signal 5302 is shaped such that it is smooth and so that it has zero crossings that are in time synchronization with the spreading code 5316. By smoothing input signal amplitude, high frequency components are removed from the input signal prior to sampling, which results lower sidelobe energy in the harmonic images produced during sampling. Implementation of amplitude shaper 5304 will be apparent to persons skilled in the art base on the functional teachings combined herein.

In step 6712, the low pass filter 5308 filters the shaped input signal 5306 to remove any unwanted high frequency components, resulting in a filtered signal 5310.

Figure 53C:
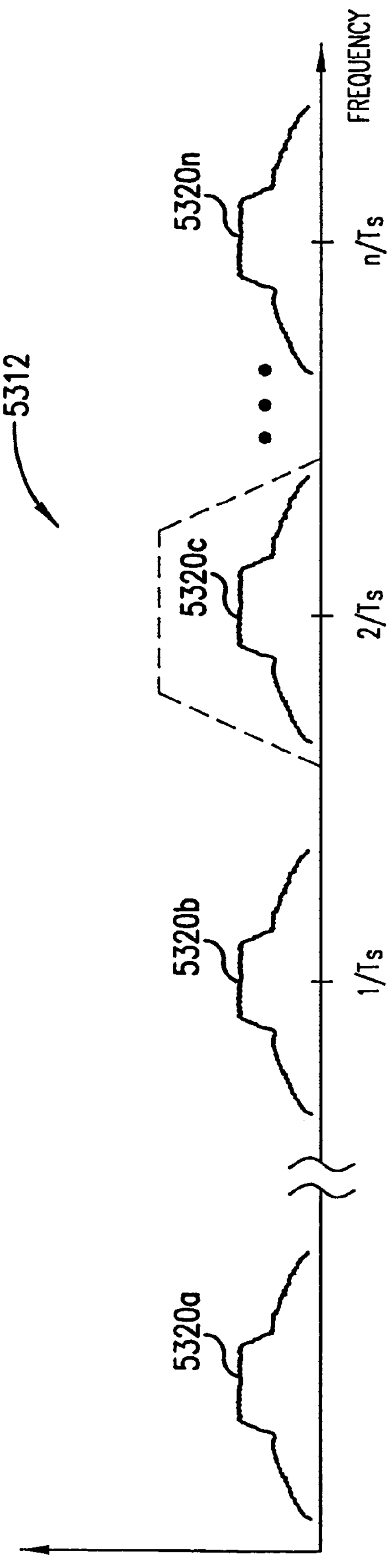

In step 6714, the modulator 2604 samples the signal 5310 in a balanced and differential manner according to the control signals 5320 and 5322, to generate a harmonically rich signal 5312. As discussed in reference to FIG. 26, the control signals 5320 and 5322 trigger the controlled switches in the modulator 2604, resulting in multiple harmonic images of the baseband signal 5302 in the harmonically rich signal 5312. Since the control signals carry the spreading code 5316, the modulator 2604 up-converts and spreads the filtered signal 5310 in an integrated manner during the sampling process. As such, the harmonic images in the harmonically rich signal 5312 are spread spectrum signals. FIG. 53C illustrates the harmonically rich signal 5312 that includes multiple harmonic images 5320*a-n* that repeat at harmonics of the sampling frequency $1/T_S$. Each image 5320*a-n* is a spread spectrum signal that contains the necessary amplitude and frequency information to reconstruct the input baseband signal 5302.

In step 6716, the optional filter 2606 selects a desired harmonic (or harmonics) from the harmonically rich signal 5312. This is presented by the passband 5322 selecting the spread harmonic 5320*c* in FIG. 53C.

In step 6718, the optional amplifier 2608 amplifies the desired harmonic (or harmonics) for transmission.

As mentioned above, an advantage of the spread spectrum transmitter 5300 is that the spreading and up-conversion is accomplished in a simultaneous and integrated manner. This is a result of modulating the control signals that operate the UFT modules in the balanced modulator 2604 with the spreading code prior to sampling of the baseband signal. Furthermore, by shaping the amplitude of the baseband signal prior to sampling, the sidelobe energy in the spread spectrum harmonics is minimized. As discussed above, minimal sidelobe energy is desirable in order to meet the sidelobe standards of the CDMA IS-95 standard (see FIGS. 43A and 43B).

Figure 68A:
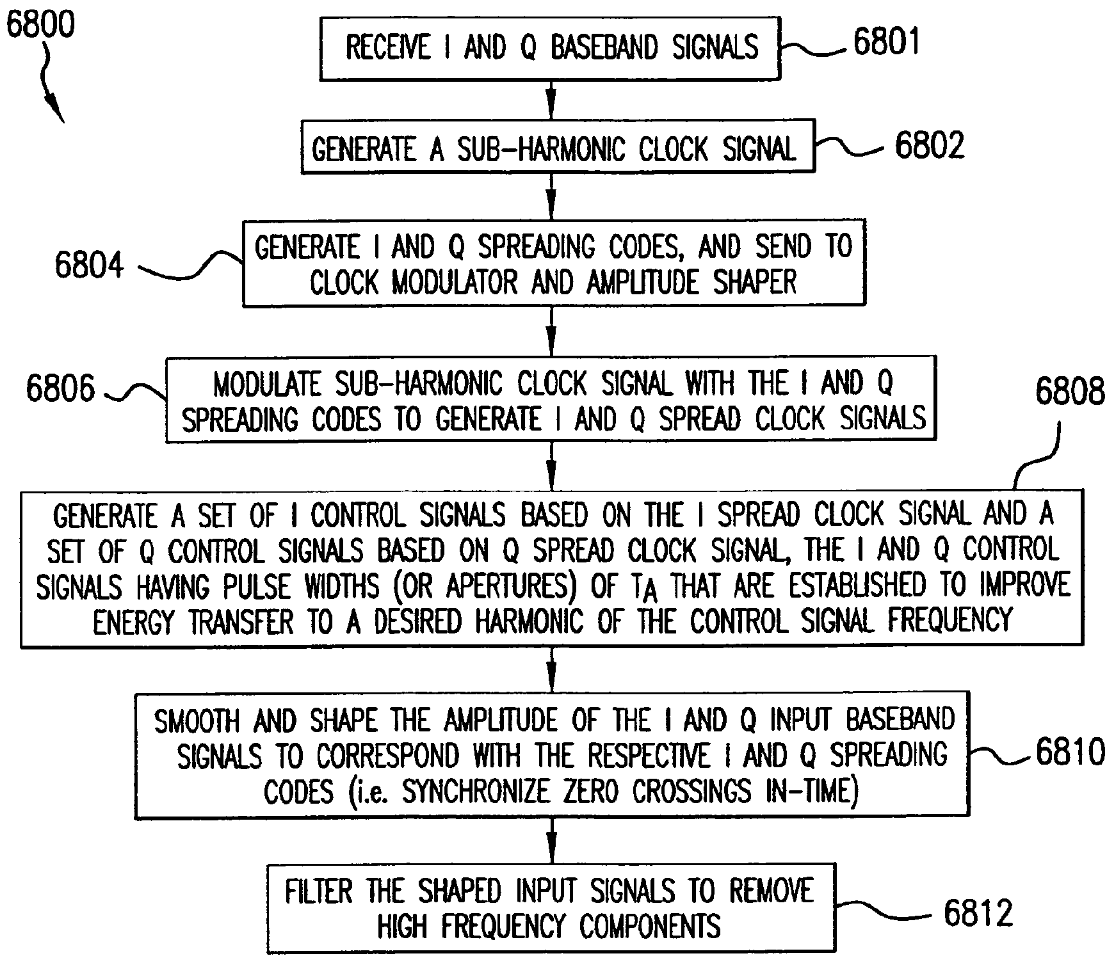
FIG. 68A and FIG. 68B illustrate a flowchart 6800 that is associated with an IQ spread spectrum modulator 6100 in FIG. 61 according to an embodiment of the invention.
Figure 68B:
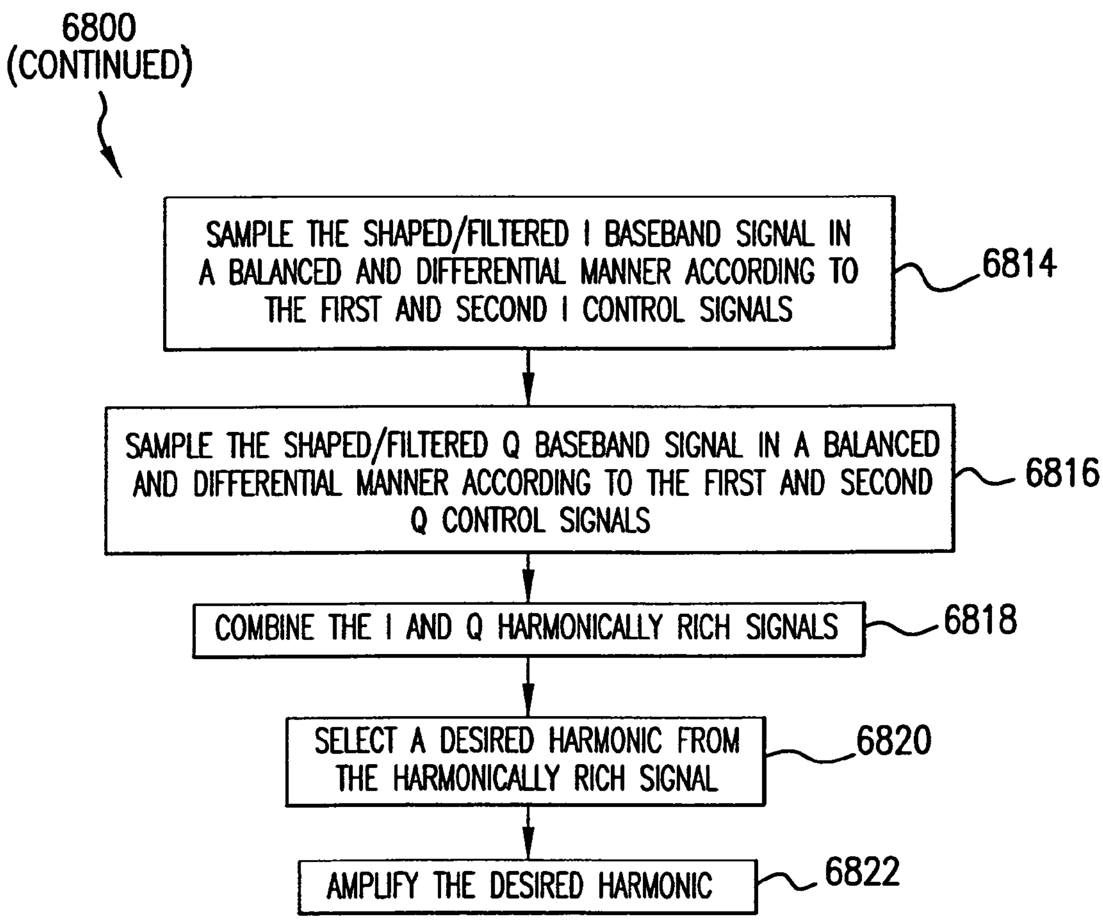

FIG. 61 illustrates an IQ spread spectrum modulator 6100 that is based on the spread spectrum transmitter 5300. Spread spectrum modulator 6100 performs simultaneous up-conversion and spreading of an I baseband signal 6102 and a Q baseband signal 6118 to generate an output signal 6116 that carries both the I and Q baseband information. The operation of the modulator 6100 is described in detail with reference to the flowchart 6800 that is shown in FIGS. 68A and 68B. The steps in flowchart 6800 are not limiting and may be re-arranged as will be understood by those skilled in the arts.

In step 6801, the IQ modulator 6100 receives the I data signal 6102 and the Q data signal 6118.

In step 6802, the oscillator 2646 generates the clock signal 2645. As described earlier, the clock signal 2645 is in embodiments a sub-harmonic of the output signal 6116. Furthermore, in embodiments of the invention, the clock signal 2645 is a periodic square wave or sinusoidal clock signal.

In step 6804, an I spreading code generator 6140 generates an I spreading code 6144 for the I channel. Likewise, a Q spreading code generator 6138 generates a Q spreading code 6142 for the Q channel. In embodiments of the invention, the spreading codes are PN codes, or any other type of spreading code that is useful for generating spread spectrum signals. In embodiments of the invention, the I spreading code and Q spreading code can be the same spreading code. Alternatively, the I and Q spreading codes can be different to improve isolation between the I and Q channels, as will be understood by those skilled in the arts.

In step 6806, the multiplier 5318*a* modulates the clock signal 2645 with the I spreading code 6144 to generate a spread clock signal 6136. Likewise, the multiplier 5318*b* modulates the clock signal 2645 with the Q spreading code 6142 to generate a spread clock signal 6134.

In step 6808, the control signal generator 2642*a* receives the I clock signal 6136 and generates control signals 6130 and 6132 that operate the UFT modules in the modulator 2604*a*. The controls signals 6130 and 6132 are similar to clock signals 2623 and 2627 that were discussed in FIG. 26. The difference being that signals 6130 and 6132 are modulated with (and carry) the I spreading code 6144. Likewise, the control signal generator 2642*b* receives the Q clock signal 6134 and generates control signals 6126 and 6128 that operate the UFT modules in the modulator 2604*b*. In step 6810, the amplitude shaper 5304*a* receives the I data signal 6102 and the shapes the amplitude so that it corresponds with the spreading code 6144, resulting in I shaped data signal 6104. This is achieved by feeding the spreading code 6144 back to the amplitude shaper 5304*a*. The amplitude shaper then shapes the amplitude of the input baseband signal 6102 to correspond to the spreading code 6144, as described for spread spectrum transmitter 5300. More specifically, the amplitude of the input signal 6102 is shaped such that it is smooth and so that it has zero crossings that are in time synchronization with the I spreading code 6144. Likewise, the amplitude shaper 5304*b* receives the Q data signal 6118 and shapes amplitude of the Q data signal 6118 so that it corresponds with the Q spreading code 6142, resulting in Q shaped data signal 6120.

In step 6812, the low pass filter 5308*a* filters the I shaped data signal 6104 to remove any unwanted high frequency components, resulting in a I filtered signal 6106. Likewise, the low pass filter 5308*b* filters the Q shaped data signal 6120, resulting in Q filtered signal 6122.

In step 6814, the modulator 2604*a* samples the I filtered signal 6106 in a balanced and differential manner according to the control signals 6130 and 6132, to generate a harmonically rich signal 6108. As discussed in reference to FIG. 26, the control signals 6130 and 6132 trigger the controlled switches in the modulator 2604*a*, resulting in multiple harmonic images in the harmonically rich signal 6108, where each image contains the I baseband information. Since the control signals 6130 and 6132 also carry the I spreading code 6144, the modulator 2604*a* up-converts and spreads the filtered signal 6106 in an integrated manner during the sampling process. As such, the harmonic images in the harmonically rich signal 6108 are spread spectrum signals.

In step 6816, the modulator 2604*b* samples the Q filtered signal 6122 in a balanced and differential manner according to the control signals 6126 and 6128, to generate a harmonically rich signal 6124. The control signals 6126 and 6128 trigger the controlled switches in the modulator 2604*b*, resulting in multiple harmonic images in the harmonically rich signal 6124, where each image contains the Q baseband information. As with modulator 2604*a*, the control signals 6126 and 6128 carry the Q spreading code 6142 so that the modulator 2604*b* up-converts and spreads the filtered signal 6122 in an integrated manner during the sampling process. In other words, the harmonic images in the harmonically rich signal 6124 are also spread spectrum signals.

In step 6818, a 90 signal combiner 6146 combines the I harmonically rich signal 6108 and the Q harmonically rich signal 6124, to generate the IQ harmonically rich signal 6148. The IQ harmonically rich signal 6148 contains multiple harmonic images, where each images contains the spread I data and the spread Q data. The 90 degree combiner phase shifts the Q signal 6124 relative to the I signal 6108 so that no increase in spectrum width is needed for the IQ signal 6148, when compared the I signal or the Q signal.

In step 6820, the optional bandpass filter 2606 select the harmonic (or harmonics) of interest from the harmonically rich signal 6148, to generate signal 6114.

In step 6222, the optional amplifier 2608 amplifies the desired harmonic 6114 for transmission.

Figure 54A:
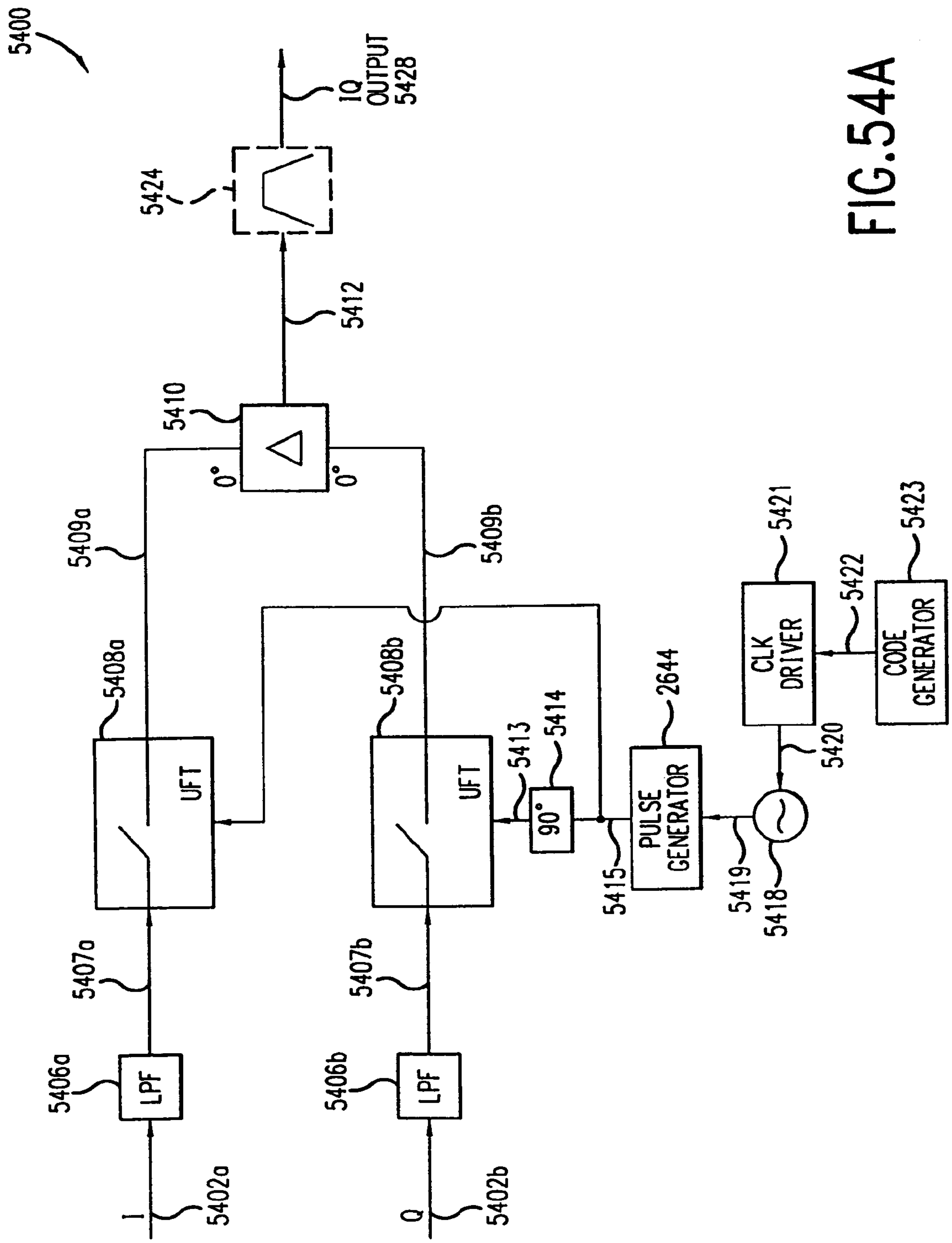
FIGS. 54A-B illustrate a transmitter 5400 and associated signal diagrams according to embodiments of the present invention.
Figure 69A:
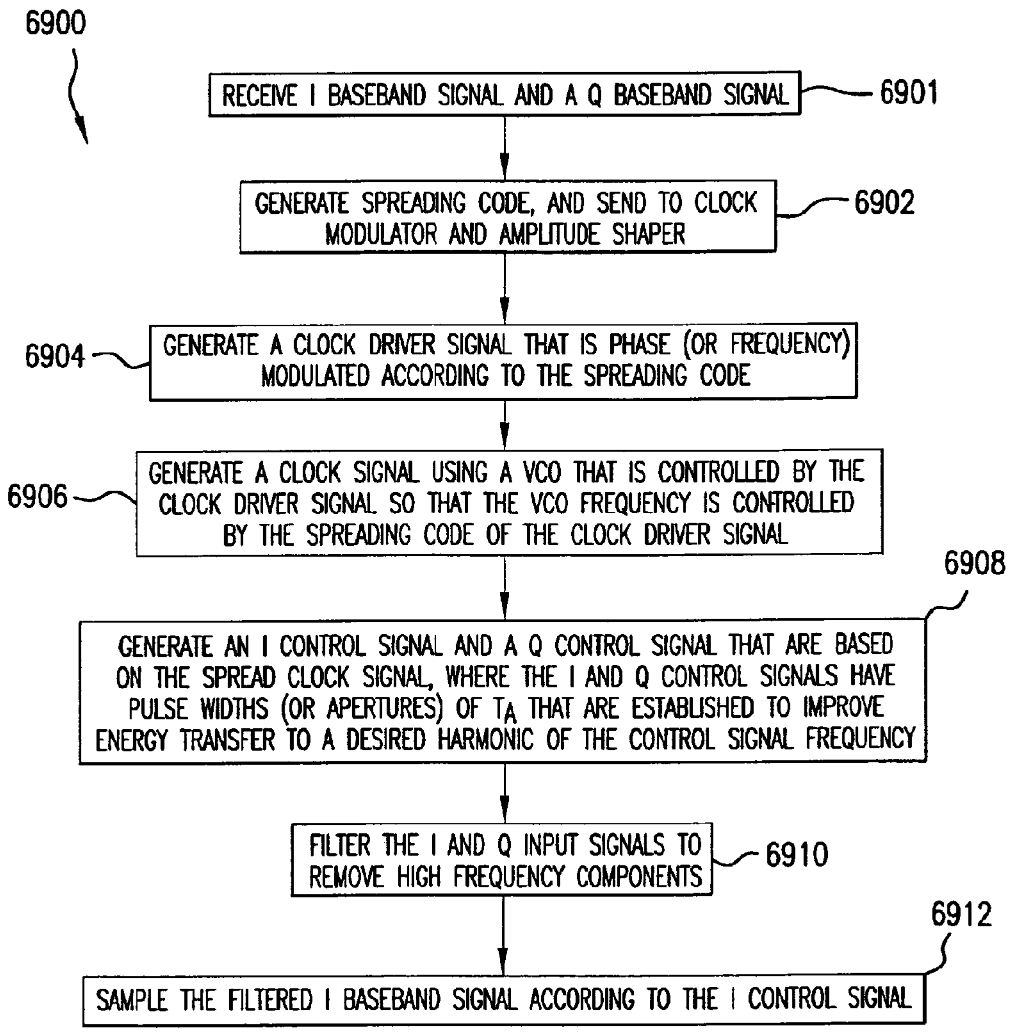
FIG. 69A and FIG. 69B illustrate a flowchart 6900 that is associated with an IQ spread spectrum transmitter 5300 in FIG. 54A according to an embodiment of the invention.
Figure 69B:
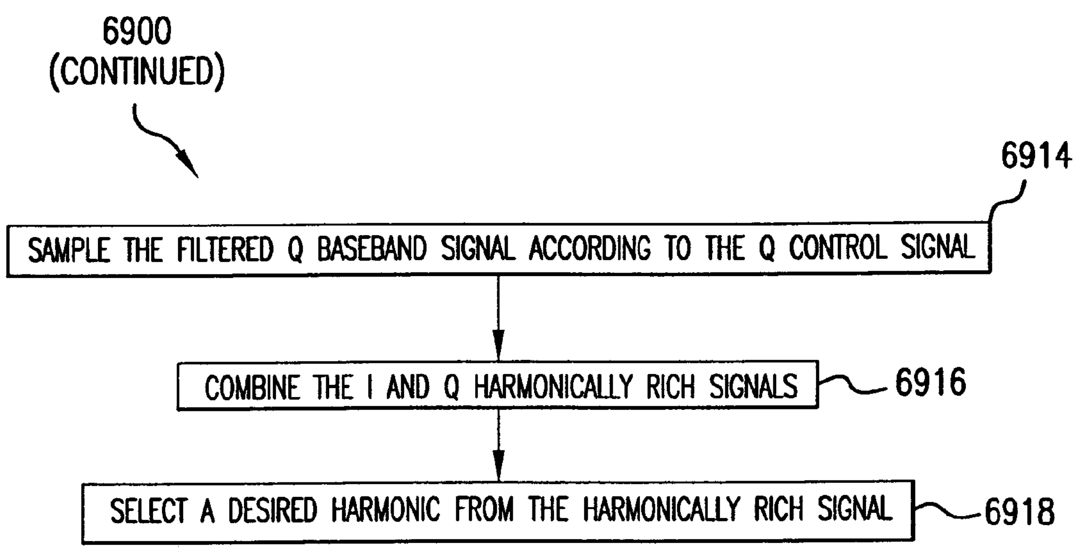

8.2 Integrated Up-Conversion and Spreading Using a Smoothing Varying Clock Signal FIG. 54A illustrates a spread spectrum transmitter 5400 that is a second embodiment of balanced UFT modules that perform up-conversion and spreading simultaneously. More specifically, the spread spectrum transmitter 5400 does simultaneous up-conversion and spreading of an I data signal 5402*a* and a Q data signal 5402*b* to generate an IQ output signal 5428. Similar to modulator 6100, transmitter 5400 modulates the clock signal that controls the UFT modules with the spreading codes to spread the input I and Q signals during up-conversion. However, the transmitter 5400 modulates the clock signal by smoothly varying the instantaneous frequency or phase of a voltage controlled oscillator (VCO) with the spreading code. The transmitter 5400 is described in detail as follows with reference to a flowchart 6900 that is shown in FIGS. 69A and 69B.

In step 6901, the transmitter 5400 receives the I baseband signal 5402*a* and the Q baseband signal 5402*b*.

In step 6902, a code generator 5423 generates a spreading code 5422. In embodiments of the invention, the spreading code 5422 is a PN code or any other type off useful code for spread spectrum systems. Additionally, in embodiments of the invention, there are separate spreading codes for the I and Q channels.

Figure 54B:
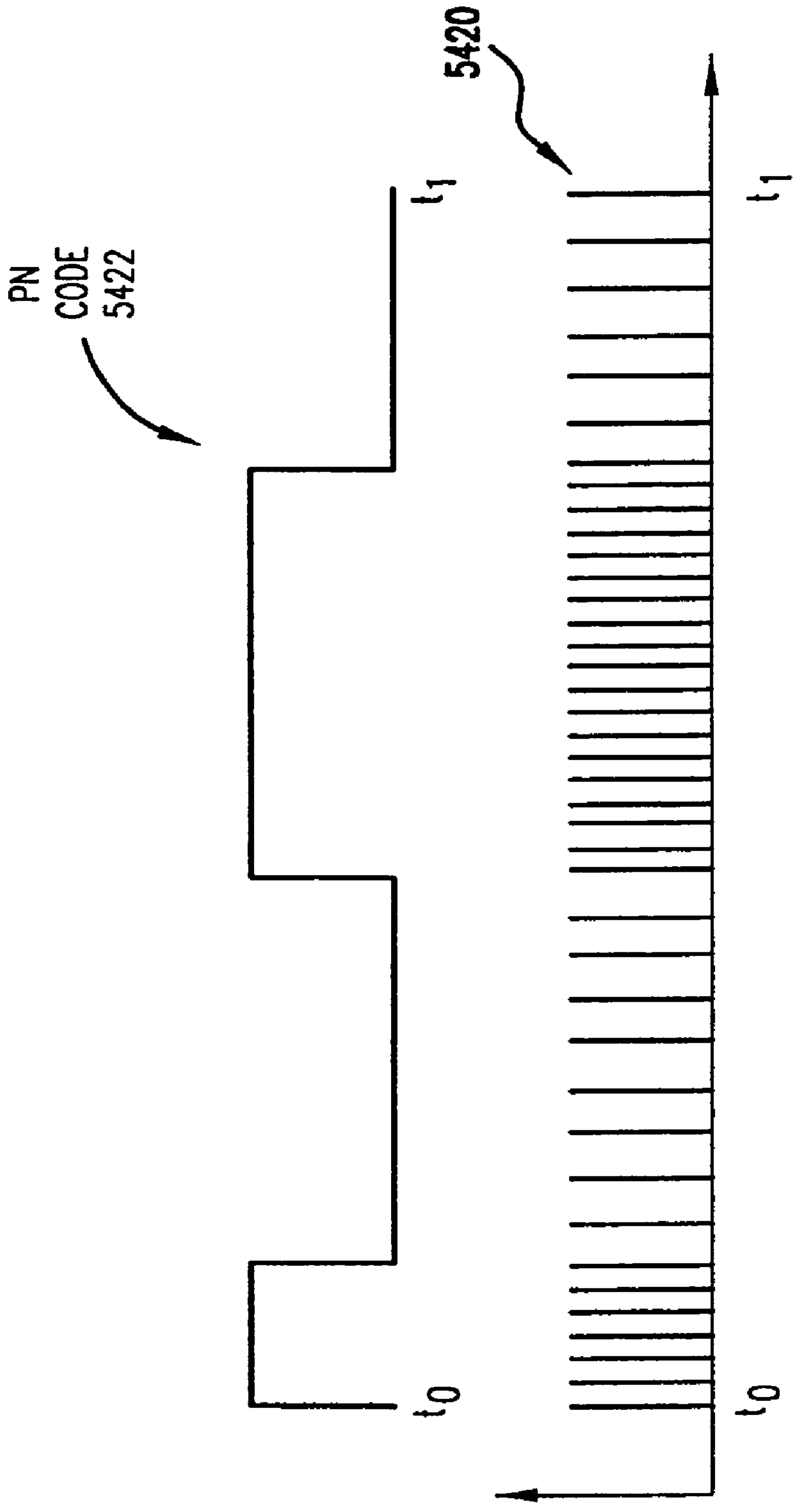

In step 6904, a clock driver circuit 5421 generates a clock driver signal 5420 that is phase modulated according to a spreading code 5422. FIG. 54B illustrates the clock driver signal 5420 as series of pulses, where the instantaneous frequency (or phase) of the pulses is determined by the spreading code 5422, as shown. In embodiments of the invention, the phase of the pulses in the clock driver 5420 is varied smoothly in correlation with the spreading code 5422.

In step 6906, a voltage controlled oscillator 5418 generates a clock signal 5419 that has a frequency that varies according to a clock driver signal 5420. As mentioned above, the phase of the pulses in the clock driver 5420 is varied smoothly in correlation with the spreading code 5422 in embodiments of the invention. Since the clock driver 5420 controls the oscillator 5418, the frequency of the clock signal 5419 varies smoothly as a function of the PN code 5422. By smoothly varying the frequency of the clock signal 5419, the sidelobe growth in the spread spectrum images is minimized during the sampling process.

In step 6908, the pulse generator 2644 generates a control signal 5415 based on the clock signal 5419 that is similar to either one the controls signals 2623 or 2627 (in FIGS. 27A and 27B). The control signal 5415 carries the spreading code 5422 via the clock signal 5419. In embodiments of the invention, the pulse width ($T_A$) of the control signal 5415 is established to enhance or optimize energy transfer to specific harmonics in the harmonically rich signal 5428 at the output. For the Q channel, a phase shifter 5414 shifts the phase of the control signal 5415 by 90 degrees to implement the desired quadrature phase shift between the I and Q channels, resulting in a control signal 5413.

In step 6910, a low pass filter (LPF) 5406*a* filters the I data signal 5402*a* to remove any unwanted high frequency components, resulting in an I signal 5407*a*. Likewise, a LPF 5406*b* filters the Q data signal 5402*b* to remove any unwanted high frequency components, to generate the Q signal 5407*b*.

In step 6912, a UFT module 5408*a* samples the I data signal 5407*a* according to the control signal 5415 to generate a harmonically rich signal 5409*a*. The harmonically rich signal 5409*a* contains multiple spread spectrum harmonic images that repeat at harmonics of the sampling frequency. Similar to transmitter 5300, the harmonic images in signal 5409*a* carry the I baseband information, and are spread spectrum due to the spreading code on the control signal 5415.

In step 6914, a UFT module 5408*b* samples the Q data signal 5407*b* according to the control signal 5413 to generate harmonically rich signal 5409*b*. The harmonically rich signal 5409*b* contains multiple spread spectrum harmonic images that repeat at harmonics of the sampling frequency. The harmonic images in signal 5409*a* carry the Q baseband information, and are spread spectrum due to the spreading code on the control signal 5413.

In step 6916, a signal combiner 5410 combines the harmonically rich signal 5409*a* with the harmonically rich signal 5409*b* to generate an IQ harmonically rich signal 5412. The harmonically rich signal 5412 carries multiple harmonic images, where each image carries the spread I data and the spread Q data.

In step 6918, the optional bandpass filter 5424 selects a harmonic (or harmonics) of interest for transmission, to generate the IQ output signal 5428.

Figure 54C:
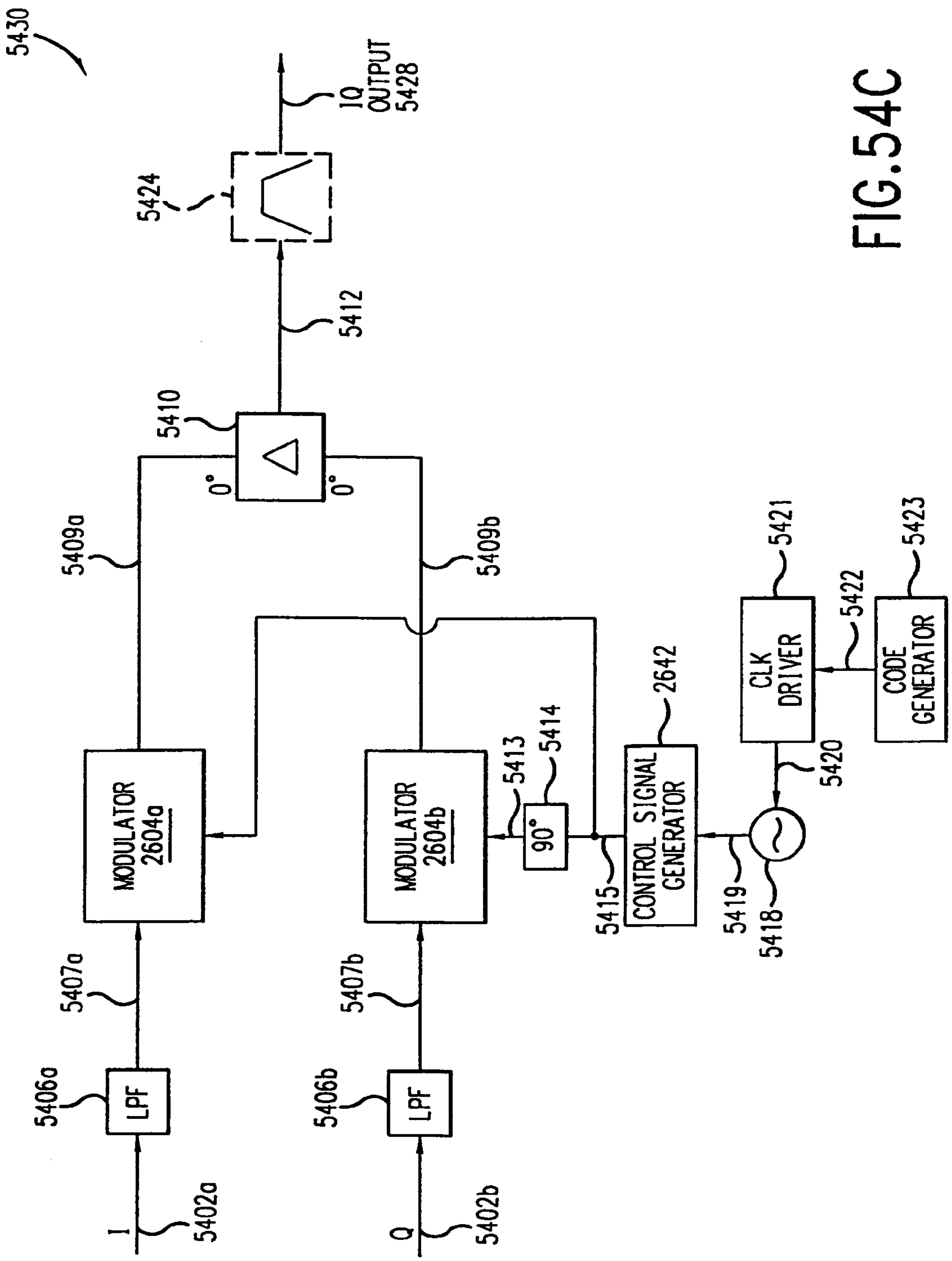
FIG. 54C illustrates a transmitter 5430 according to embodiments of the invention.

FIG. 54C illustrates a transmitter 5430 that is similar to the transmitter 5400 except that the UFT modules are replaced by balanced UFT modulators 2604 that were described in FIG. 26. Also, the pulse generator is replaced by the control signal generator 2642 to generate the necessary control signals to operate the UFT modules in the balanced modulators. By replacing the UFT modules with balanced UFT modulators, sidelobe suppression can be improved.

9.0 Shunt Receiver Embodiments Utilizing UFT Modules

In this section, example receiver embodiments are presented that utilize UFT modules in a differential and shunt configuration. More specifically, embodiments, according to the present invention, are provided for reducing or eliminating DC offset and/or reducing or eliminating circuit re-radiation in receivers, including I/Q modulation receivers and other modulation scheme receivers. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

9.1 Example I/Q Modulation Receiver Embodiments

FIG. 70A illustrates an exemplary I/Q modulation receiver 7000, according to an embodiment of the present invention. I/Q modulation receiver 7000 has additional advantages of reducing or eliminating unwanted DC offsets and circuit re-radiation.

I/Q modulation receiver 7000 comprises a first UFD module 7002, a first optional filter 7004, a second UFD module 7006, a second optional filter 7008, a third UFD module 7010, a third optional filter 7012, a fourth UFD module 7014, a fourth filter 7016, an optional LNA 7018, a first differential amplifier 7020, a second differential amplifier 7022, and an antenna 7072.

I/Q modulation receiver 7000 receives, down-converts, and demodulates a I/Q modulated RF input signal 7082 to an I baseband output signal 7084, and a Q baseband output signal 7086. I/Q modulated RF input signal 7082 comprises a first information signal and a second information signal that are I/Q modulated onto an RF carrier signal. I baseband output signal 7084 comprises the first baseband information signal. Q baseband output signal 7086 comprises the second baseband information signal.

Antenna 7072 receives I/Q modulated RF input signal 7082. I/Q modulated RF input signal 7082 is output by antenna 7072 and received by optional LNA 7018. When present, LNA 7018 amplifies 11Q modulated RF input signal 7082, and outputs amplified I/Q signal 7088.

First UFD module 7002 receives amplified I/Q signal 7088. First UFD module 7002 down-converts the I-phase signal portion of amplified input I/Q signal 7088 according to an I control signal 7090. First UFD module 7002 outputs an I output signal 7098.

In an embodiment, first UFD module 7002 comprises a first storage module 7024, a first UFT module 7026, and a first voltage reference 7028. In an embodiment, a switch contained within first UFT module 7026 opens and closes as a function of I control signal 7090. As a result of the opening and closing of this switch, which respectively couples and de-couples first storage module 7024 to and from first voltage reference 7028, a down-converted signal, referred to as I output signal 7098, results. First voltage reference 7028 may be any reference voltage, and is preferably ground. I output signal 7098 is stored by first storage module 7024.

In an embodiment, first storage module 7024 comprises a first capacitor 7074. In addition to storing I output signal 7098, first capacitor 7074 reduces or prevents a DC offset voltage resulting from charge injection from appearing on I output signal 7098.

I output signal 7098 is received by optional first filter 7004. When present, first filter 7004 is in some embodiments a high pass filter to at least filter I output signal 7098 to remove any carrier signal "bleed through". In a preferred embodiment, when present, first filter 7004 comprises a first resistor 7030, a first filter capacitor 7032, and a first filter voltage reference 7034. Preferably, first resistor 7030 is coupled between I output signal 7098 and a filtered I output signal 7007, and first filter capacitor 7032 is coupled between filtered I output signal 7007 and first filter voltage reference 7034. Alternately, first filter 7004 may comprise any other applicable filter configuration as would be understood by persons skilled in the relevant art(s). First filter 7004 outputs filtered I output signal 7007.

Second UFD module 7006 receives amplified I/Q signal 7088. Second UFD module 7006 down-converts the inverted I-phase signal portion of amplified input I/Q signal 7088 according to an inverted I control signal 7092. Second UFD module 7006 outputs an inverted I output signal 7001.

In an embodiment, second UFD module 7006 comprises a second storage module 7036, a second UFT module 7038, and a second voltage reference 7040. In an embodiment, a switch contained within second UFT module 7038 opens and closes as a function of inverted I control signal 7092. As a result of the opening and closing of this switch, which respectively couples and de-couples second storage module 7036 to and from second voltage reference 7040, a down-converted signal, referred to as inverted I output signal 7001, results. Second voltage reference 7040 may be any reference voltage, and is preferably ground. Inverted I output signal 7001 is stored by second storage module 7036.

In an embodiment, second storage module 7036 comprises a second capacitor 7076. In addition to storing inverted I output signal 7001, second capacitor 7076 reduces or prevents a DC offset voltage resulting from charge injection from appearing on inverted I output signal 7001.

Inverted I output signal 7001 is received by optional second filter 7008. When present, second filter 7008 is a high pass filter to at least filter inverted I output signal 7001 to remove any carrier signal "bleed through". In a preferred embodiment, when present, second filter 7008 comprises a second resistor 7042, a second filter capacitor 7044, and a second filter voltage reference 7046. Preferably, second resistor 7042 is coupled between inverted I output signal 7001 and a filtered inverted I output signal 7009, and second filter capacitor 7044 is coupled between filtered inverted I output signal 7009 and second filter voltage reference 7046. Alternately, second filter 7008 may comprise any other applicable filter configuration as would be understood by persons skilled in the relevant art(s). Second filter 7008 outputs filtered inverted I output signal 7009.

First differential amplifier 7020 receives filtered I output signal 7007 at its non-inverting input and receives filtered inverted I output signal 7009 at its inverting input. First differential amplifier 7020 subtracts filtered inverted I output signal 7009 from filtered I output signal 7007, amplifies the result, and outputs I baseband output signal 7084. Because filtered inverted I output signal 7009 is substantially equal to an inverted version of filtered I output signal 7007, I baseband output signal 7084 is substantially equal to filtered I output signal 7009, with its amplitude doubled. Furthermore, filtered I output signal 7007 and filtered inverted I output signal 7009 may comprise substantially equal noise and DC offset contributions from prior down-conversion circuitry, including first UFD module 7002 and second UFD module 7006, respectively. When first differential amplifier 7020 subtracts filtered inverted I output signal 7009 from filtered I output signal 7007, these noise and DC offset contributions substantially cancel each other.

Third UFD module 7010 receives amplified I/Q signal 7088. Third UFD module 7010 down-converts the Q-phase signal portion of amplified input I/Q signal 7088 according to an Q control signal 7094. Third UFD module 7010 outputs an Q output signal 7003.

In an embodiment, third UFD module 7010 comprises a third storage module 7048, a third UFT module 7050, and a third voltage reference 7052. In an embodiment, a switch contained within third UFT module 7050 opens and closes as a function of Q control signal 7094. As a result of the opening and closing of this switch, which respectively couples and de-couples third storage module 7048 to and from third voltage reference 7052, a down-converted signal, referred to as Q output signal 7003, results. Third voltage reference 7052 may be any reference voltage, and is preferably ground. Q output signal 7003 is stored by third storage module 7048.

In an embodiment, third storage module 7048 comprises a third capacitor 7078. In addition to storing Q output signal 7003, third capacitor 7078 reduces or prevents a DC offset voltage resulting from charge injection from appearing on Q output signal 7003.

Q output signal 7003 is received by optional third filter 7012. When present, in an embodiment, third filter 7012 is a high pass filter to at least filter Q output signal 7003 to remove any carrier signal "bleed through". In an embodiment, when present, third filter 7012 comprises a third resistor 7054, a third filter capacitor 7056, and a third filter voltage reference 7058. Preferably, third resistor 7054 is coupled between Q output signal 7003 and a filtered Q output signal 7011, and third filter capacitor 7056 is coupled between filtered Q output signal 7011 and third filter voltage reference 7058. Alternately, third filter 7012 may comprise any other applicable filter configuration as would be understood by persons skilled in the relevant art(s). Third filter 7012 outputs filtered Q output signal 7011.

Fourth UFD module 7014 receives amplified I/Q signal 7088. Fourth UFD module 7014 down-converts the inverted Q-phase signal portion of amplified input I/Q signal 7088 according to an inverted Q control signal 7096. Fourth UFD module 7014 outputs an inverted Q output signal 7005.

In an embodiment, fourth UFD module 7014 comprises a fourth storage module 7060, a fourth UFT module 7062, and a fourth voltage reference 7064. In an embodiment, a switch contained within fourth UFT module 7062 opens and closes as a function of inverted Q control signal 7096. As a result of the opening and closing of this switch, which respectively couples and de-couples fourth storage module 7060 to and from fourth voltage reference 7064, a down-converted signal, referred to as inverted Q output signal 7005, results. Fourth voltage reference 7064 may be any reference voltage, and is preferably ground. Inverted Q output signal 7005 is stored by fourth storage module 7060.

In an embodiment, fourth storage module 7060 comprises a fourth capacitor 7080. In addition to storing inverted Q output signal 7005, fourth capacitor 7080 reduces or prevents a DC offset voltage resulting from charge injection from appearing on inverted Q output signal 7005.

Inverted Q output signal 7005 is received by optional fourth filter 7016. When present, fourth filter 7016 is a high pass filter to at least filter inverted Q output signal 7005 to remove any carrier signal "bleed through". In a preferred embodiment, when present, fourth filter 7016 comprises a fourth resistor 7066, a fourth filter capacitor 7068, and a fourth filter voltage reference 7070. Preferably, fourth resistor 7066 is coupled between inverted Q output signal 7005 and a filtered inverted Q output signal 7013, and fourth filter capacitor 7068 is coupled between filtered inverted Q output signal 7013 and fourth filter voltage reference 7070. Alternately, fourth filter 7016 may comprise any other applicable filter configuration as would be understood by persons skilled in the relevant art(s). Fourth filter 7016 outputs filtered inverted Q output signal 7013.

Second differential amplifier 7022 receives filtered Q output signal 7011 at its non-inverting input and receives filtered inverted Q output signal 7013 at its inverting input. Second differential amplifier 7022 subtracts filtered inverted Q output signal 7013 from filtered Q output signal 7011, amplifies the result, and outputs Q baseband output signal 7086. Because filtered inverted Q output signal 7013 is substantially equal to an inverted version of filtered Q output signal 7011, Q baseband output signal 7086 is substantially equal to filtered Q output signal 7013, with its amplitude doubled. Furthermore, filtered Q output signal 7011 and filtered inverted Q output signal 7013 may comprise substantially equal noise and DC offset contributions of the same polarity from prior down-conversion circuitry, including third UFD module 7010 and fourth UFD module 7014, respectively. When second differential amplifier 7022 subtracts filtered inverted Q output signal 7013 from filtered Q output signal 7011, these noise and DC offset contributions substantially cancel each other.

Additional embodiments relating to addressing DC offset and re-radiation concerns, applicable to the present invention, are described in co-pending patent application No., "DC Offset, Re-radiation, and I/Q Solutions Using Universal Frequency Translation Technology," Ser. No. 11/059,536, which is herein incorporated by reference in its entirety.

9.1.1 Example I/Q Modulation Control Signal Generator Embodiments

Figure 70B:
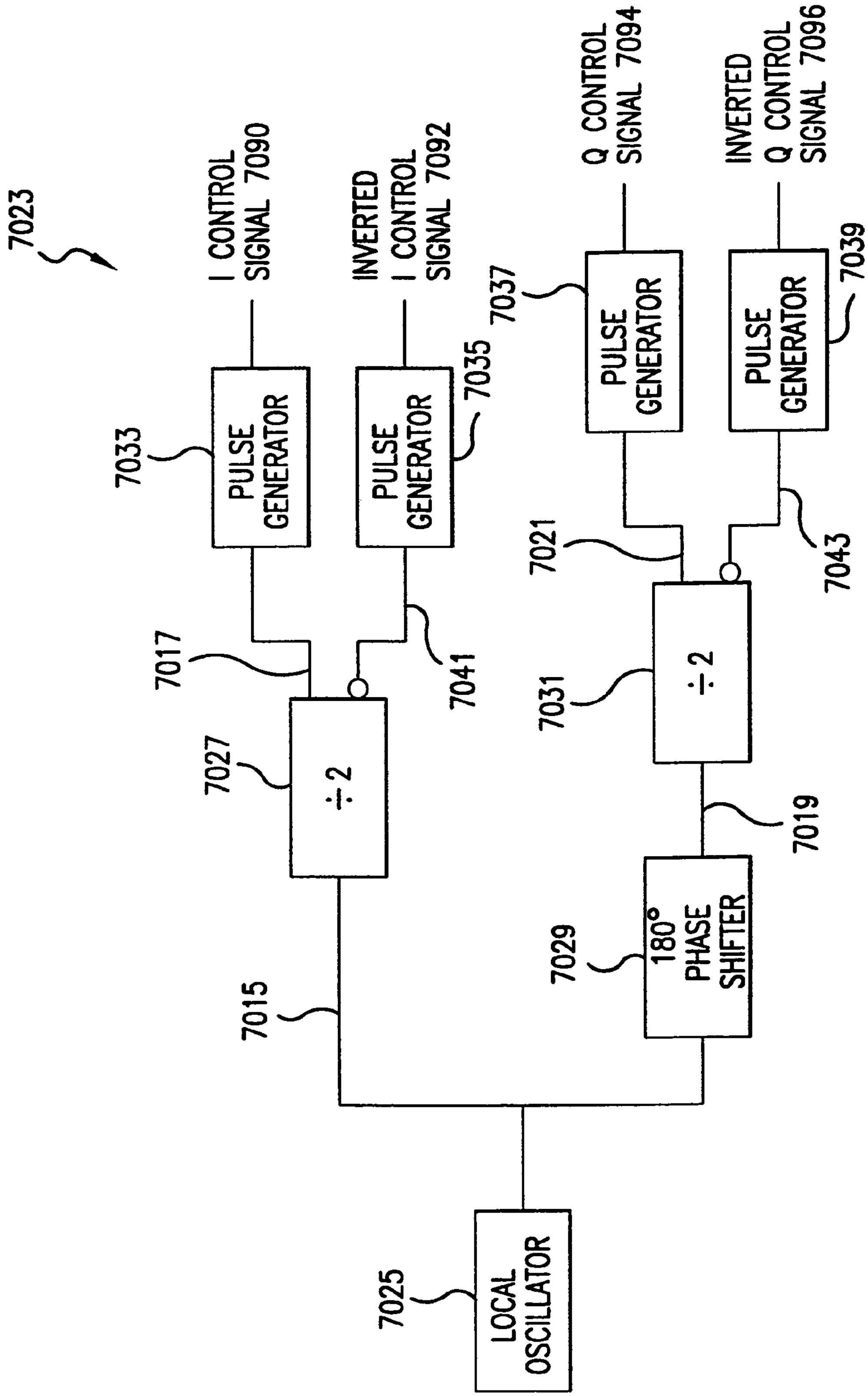
FIG. 70B illustrates control signal generator embodiments for receiver 7000 according to embodiments of the invention.

FIG. 70B illustrates an exemplary block diagram for I/Q modulation control signal generator 7023, according to an embodiment of the present invention. I/Q modulation control signal generator 7023 generates I control signal 7090, inverted I control signal 7092, Q control signal 7094, and inverted Q control signal 7096 used by I/Q modulation receiver 7000 of FIG. 70A. I control signal 7090 and inverted I control signal 7092 operate to down-convert the I-phase portion of an input I/Q modulated RF signal. Q control signal 7094 and inverted Q control signal 7096 act to down-convert the Q-phase portion of the input I/Q modulated RF signal. Furthermore, I/Q modulation control signal generator 7023 has the advantage of generating control signals in a manner such that resulting collective circuit re-radiation is radiated at one or more frequencies outside of the frequency range of interest. For instance, potential circuit re-radiation is radiated at a frequency substantially greater than that of the input RF carrier signal frequency.

I/Q modulation control signal generator 7023 comprises a local oscillator 7025, a first divide-by-two module 7027, a 180 degree phase shifter 7029, a second divide-by-two module 7031, a first pulse generator 7033, a second pulse generator 7035, a third pulse generator 7037, and a fourth pulse generator 7039.

Figure 70C:
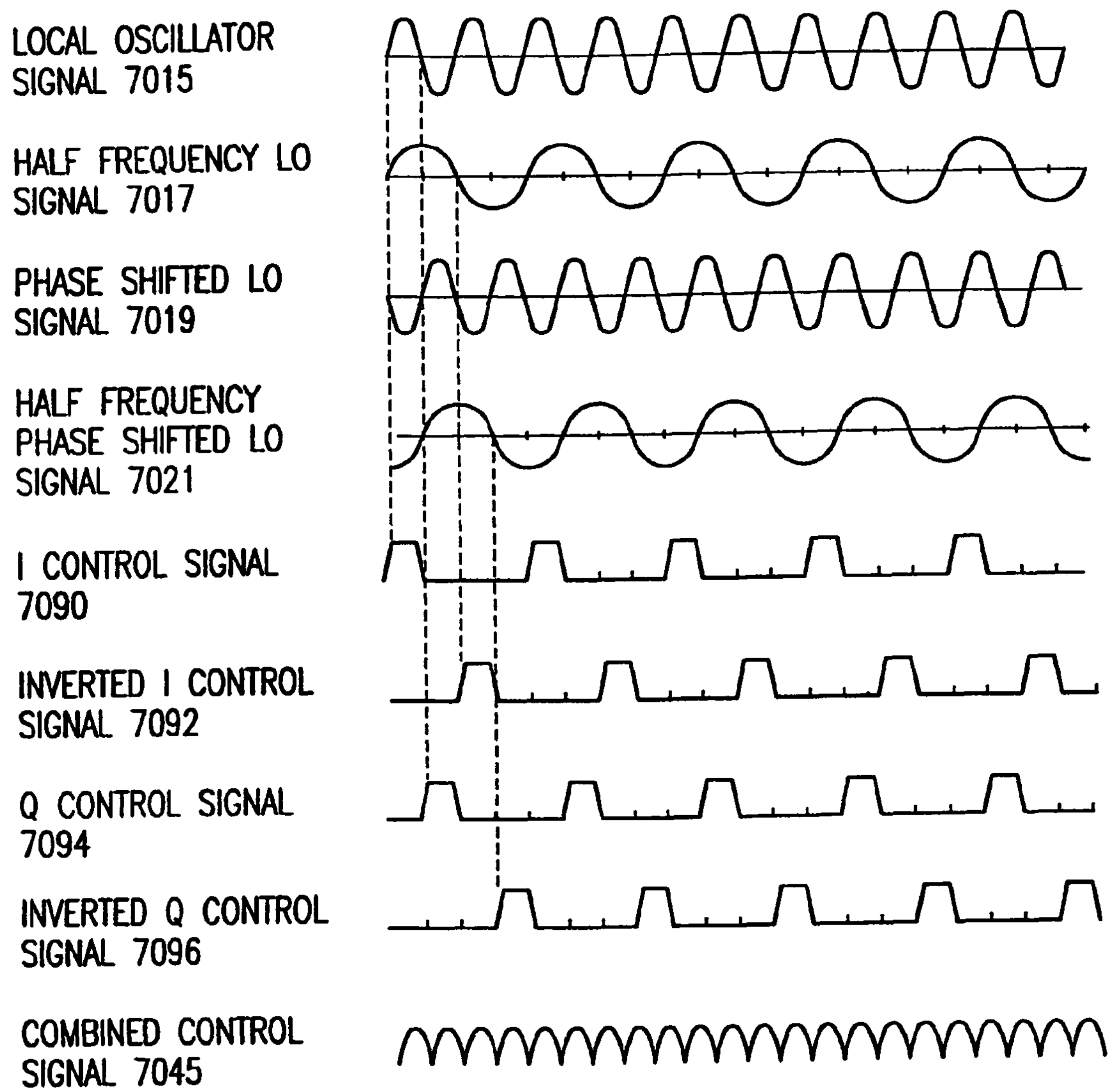
FIGS. 70C-D illustrate various control signal waveforms according to embodiments of the invention.

Local oscillator 7025 outputs an oscillating signal 7015. FIG. 70C shows an exemplary oscillating signal 7015.

First divide-by-two module 7027 receives oscillating signal 7015, divides oscillating signal 7015 by two, and outputs a half frequency LO signal 7017 and a half frequency inverted LO signal 7041. FIG. 70C shows an exemplary half frequency LO signal 7017. Half frequency inverted LO signal 7041 is an inverted version of half frequency LO signal 7017. First divide-by-two module 7027 may be implemented in circuit logic, hardware, software, or any combination thereof, as would be known by persons skilled in the relevant art(s).

180 degree phase shifter 7029 receives oscillating signal 7015, shifts the phase of oscillating signal 7015 by 180 degrees, and outputs phase shifted LO signal 7019. 180 degree phase shifter 7029 may be implemented in circuit logic, hardware, software, or any combination thereof, as would be known by persons skilled in the relevant art(s). In alternative embodiments, other amounts of phase shift may be used.

Second divide-by two module 7031 receives phase shifted LO signal 7019, divides phase shifted LO signal 7019 by two, and outputs a half frequency phase shifted LO signal 7021 and a half frequency inverted phase shifted LO signal 7043. FIG. 70C shows an exemplary half frequency phase shifted LO signal 7021. Half frequency inverted phase shifted LO signal 7043 is an inverted version of half frequency phase shifted LO signal 7021. Second divide-by-two module 7031 may be implemented in circuit logic, hardware, software, or any combination thereof, as would be known by persons skilled in the relevant art(s).

First pulse generator 7033 receives half frequency LO signal 7017, generates an output pulse whenever a rising edge is received on half frequency LO signal 7017, and outputs I control signal 7090. FIG. 70C shows an exemplary I control signal 7090.

Second pulse generator 7035 receives half frequency inverted LO signal 7041, generates an output pulse whenever a rising edge is received on half frequency inverted LO signal 7041, and outputs inverted I control signal 7092. FIG. 70C shows an exemplary inverted I control signal 7092.

Third pulse generator 7037 receives half frequency phase shifted LO signal 7021, generates an output pulse whenever a rising edge is received on half frequency phase shifted LO signal 7021, and outputs Q control signal 7094. FIG. 70C shows an exemplary Q control signal 7094.

Fourth pulse generator 7039 receives half frequency inverted phase shifted LO signal 7043, generates an output pulse whenever a rising edge is received on half frequency inverted phase shifted LO signal 7043, and outputs inverted Q control signal 7096. FIG. 70C shows an exemplary inverted Q control signal 7096.

In an embodiment, control signals 7090, 7021, 7041 and 7043 include pulses having a width equal to one-half of a period of I/Q modulated RF input signal 7082. The invention, however, is not limited to these pulse widths, and control signals 7090, 7021, 7041, and 7043 may comprise pulse widths of any fraction of, or multiple and fraction of, a period of I/Q modulated RF input signal 7082.

First, second, third, and fourth pulse generators 7033, 7035, 7037, and 7039 may be implemented in circuit logic, hardware, software, or any combination thereof, as would be known by persons skilled in the relevant art(s).

As shown in FIG. 70C, in an embodiment, control signals 7090, 7021, 7041, and 7043 comprise pulses that are non-overlapping in other embodiments the pulses may overlap. Furthermore, in this example, pulses appear on these signals in the following order: I control signal 7090, Q control signal 7094, inverted I control signal 7092, and inverted Q control signal 7096. Potential circuit re-radiation from I/Q modulation receiver 7000 may comprise frequency components from a combination of these control signals.

Figure 70D:
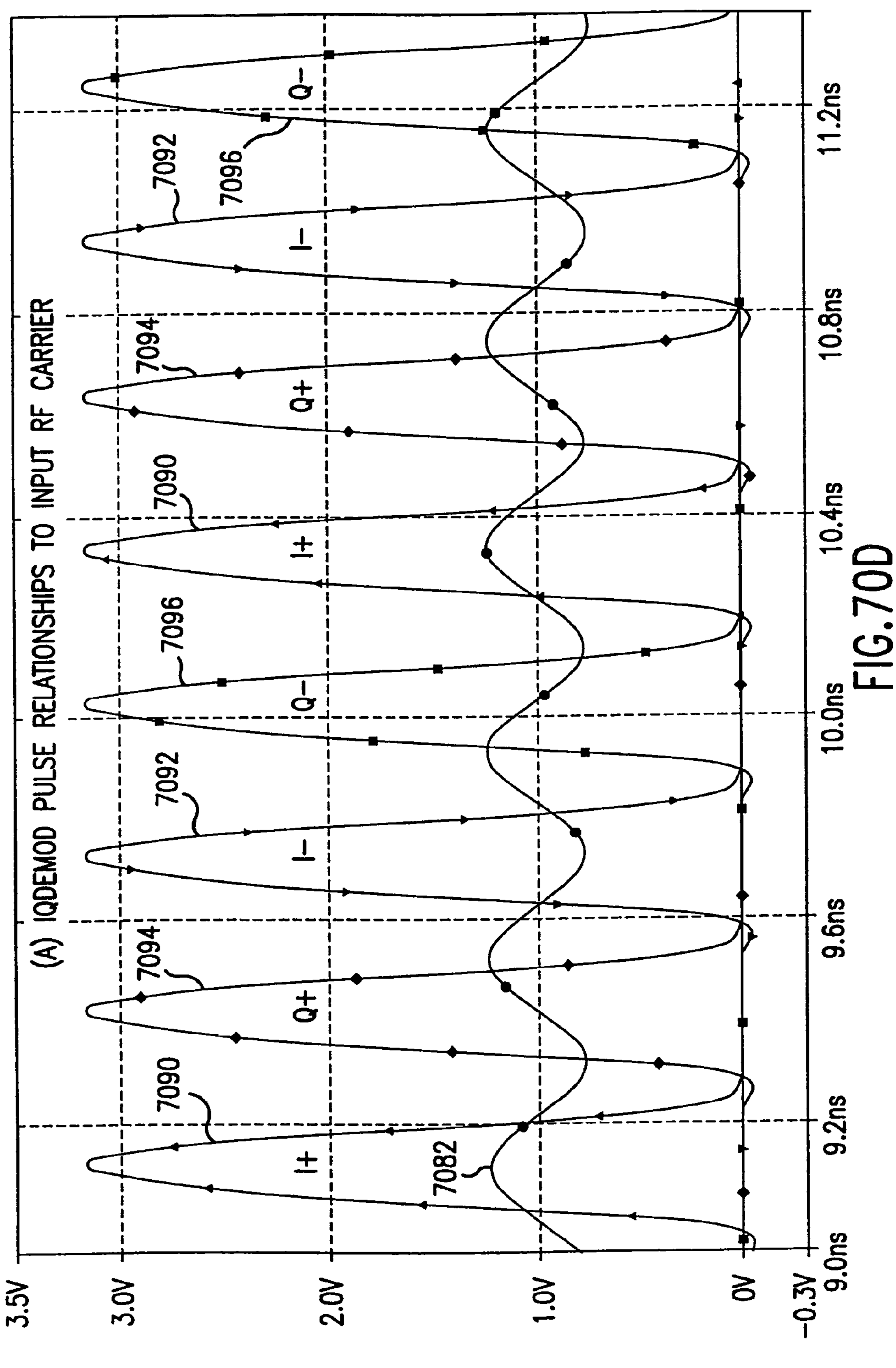

For example, FIG. 70D shows an overlay of pulses from I control signal 7090, Q control signal 7094, inverted I control signal 7092, and inverted Q control signal 7096. When pulses from these control signals leak through first, second, third, and/or fourth UFD modules 7002, 7006, 7010, and 7014 to antenna 7072 (shown in FIG. 70A), they may be radiated from I/Q modulation receiver 7000, with a combined waveform that appears to have a primary frequency equal to four times the frequency of any single one of control signals 7090, 7021, 7041, and 7043. FIG. 70 shows an example combined control signal 7045.

FIG. 70D also shows an example I/Q modulation RF input signal 7082 overlaid upon control signals 7090, 7094, 7092, and 7096. As shown in FIG. 70D, pulses on I control signal 7090 overlay and act to down-convert a positive I-phase portion of I/Q modulation RE input signal 7082. Pulses on inverted I control signal 7092 overlay and act to down-convert a negative I-phase portion of I/Q modulation RF input signal 7082. Pulses on Q control signal 7094 overlay and act to down-convert a rising Q-phase portion of I/Q modulation RF input signal 7082. Pulses on inverted Q control signal 7096 overlay and act to down-convert a falling Q-phase portion of I/Q modulation RF input signal 7082.

As FIG. 70D further shows in this example, the frequency ratio between the combination of control signals 7090, 7021, 7041, and 7043 and I/Q modulation RF input signal 7082 is approximately 4:3. Because the frequency of the potentially re-radiated signal, i.e., combined control signal 7045, is substantially different from that of the signal being down-converted, i.e., I/Q modulation RF input signal 7082, it does not interfere with signal down-conversion as it is out of the frequency band of interest, and hence may be filtered out. In this manner, I/Q modulation receiver 7000 reduces problems due to circuit re-radiation. As will be understood by persons skilled in the relevant art(s) from the teachings herein, frequency ratios other than 4:3 may be implemented to achieve similar reduction of problems of circuit re-radiation.

It should be understood that the above control signal generator circuit example is provided for illustrative purposes only. The invention is not limited to these embodiments. Alternative embodiments (including equivalents, extensions, variations, deviations, etc., of the embodiments described herein) for I/Q modulation control signal generator 7023 will be apparent to persons skilled in the relevant art(s) from the teachings herein, and are within the scope of the present invention.

Additional embodiments relating to addressing DC offset and re-radiation concerns, applicable to the present invention, are described in co-pending patent application titled "DC Offset, Re-radiation, and I/Q Solutions Using Universal Frequency Translation Technology," which is herein incorporated by reference in its entirety.

9.1.2 Detailed Example I/Q Modulation Receiver Embodiment with Exemplary Waveforms FIG. 70E illustrates a more detailed example circuit implementation of I/Q modulation receiver 7000, according to an embodiment of the present invention. FIGS. 70E-P show example waveforms related to an example implementation of I/Q modulation receiver 7000 of FIG. 70E.

Figure 70F:
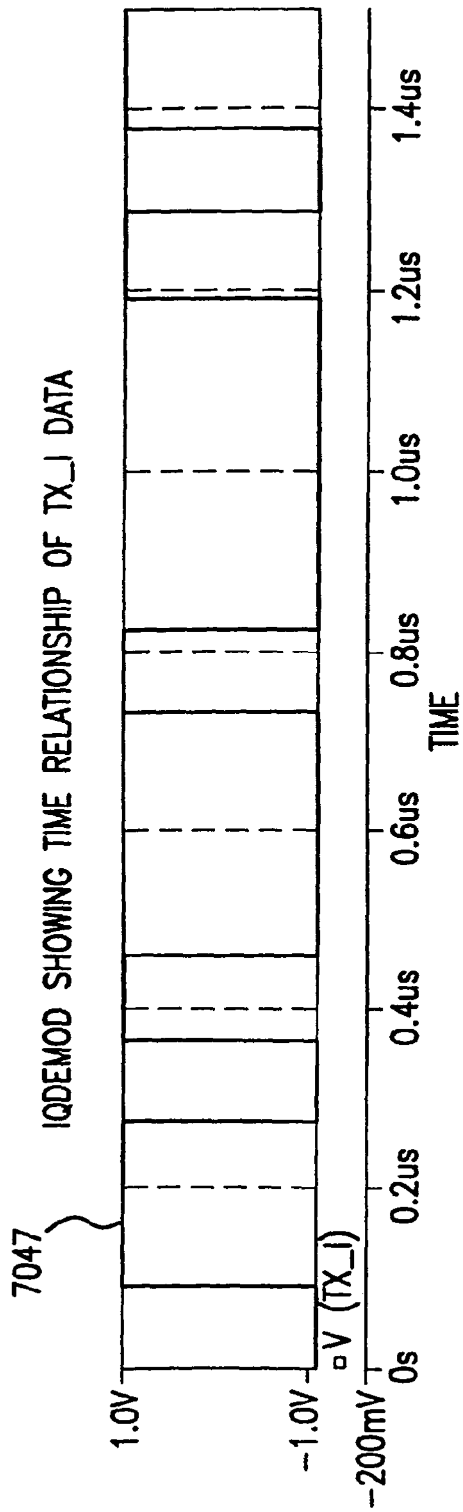
Figure 70G:
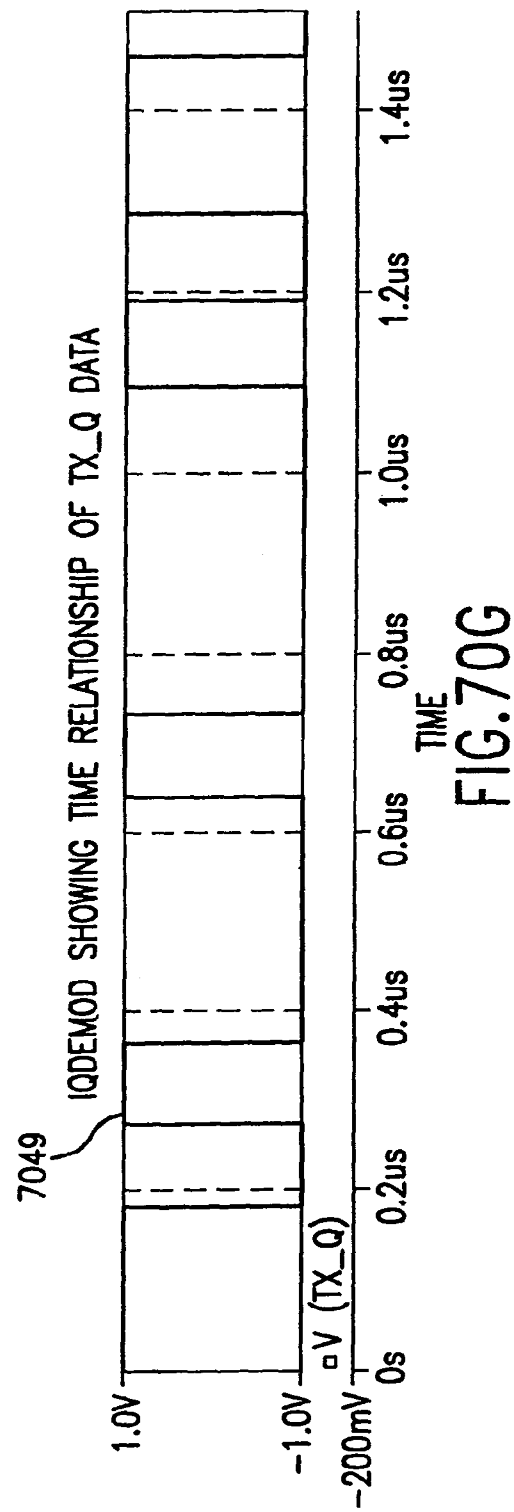

FIGS. 70F and 70G show first and second input data signals 7047 and 7049 to be I/Q modulated with a RF carrier signal frequency as the I-phase and Q-phase information signals, respectively.

Figure 70H:
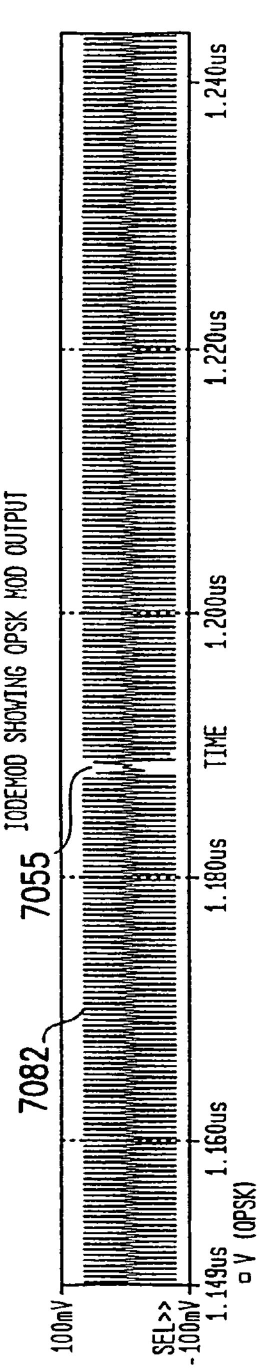
Figure 70I:
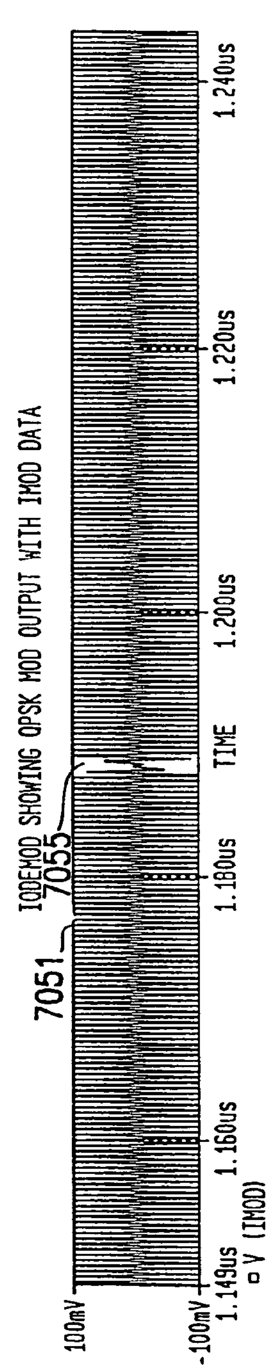
Figure 70J:
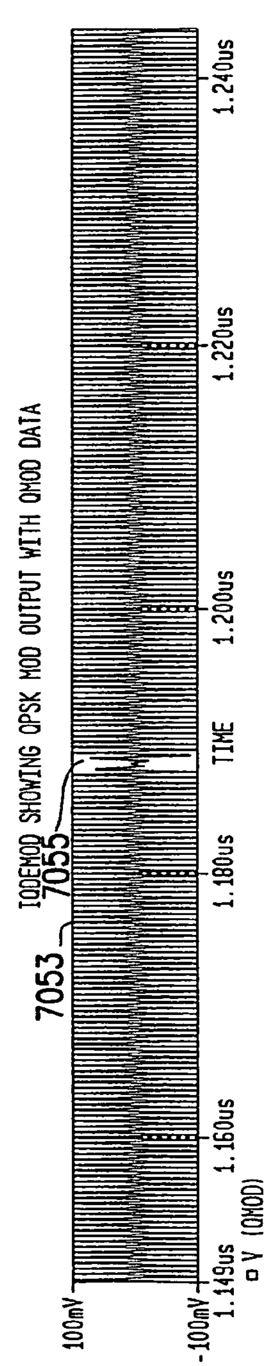

FIGS. 70I and 70J show the signals of FIGS. 70F and 70G after modulation with a RF carrier signal frequency, respectively, as I-modulated signal 7051 and Q-modulated signal 7053.

FIG. 70H shows an I/Q modulation RF input signal 7082 formed from I-modulated signal 7051 and Q-modulated signal 7053 of FIGS. 70I and 70J, respectively.

Figure 70K:
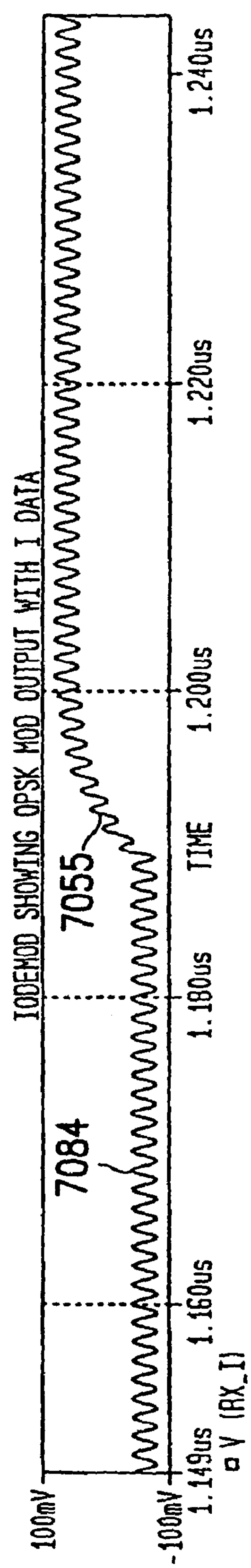
Figure 70L:
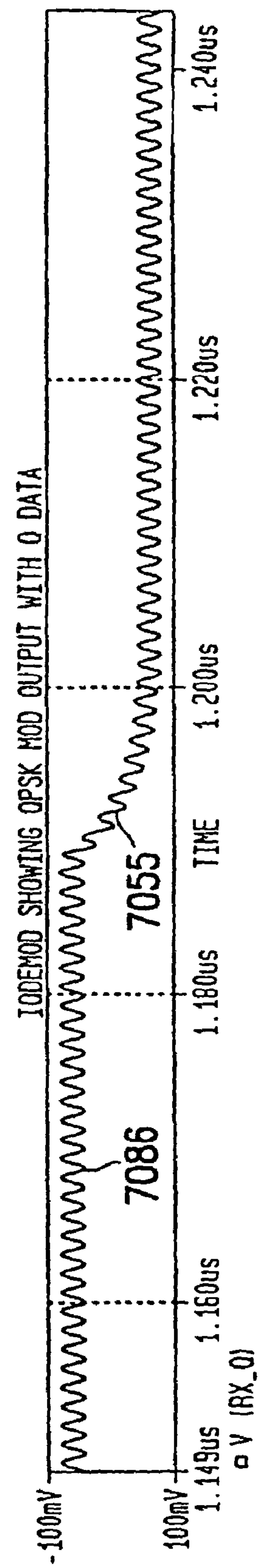
Figure 70M:
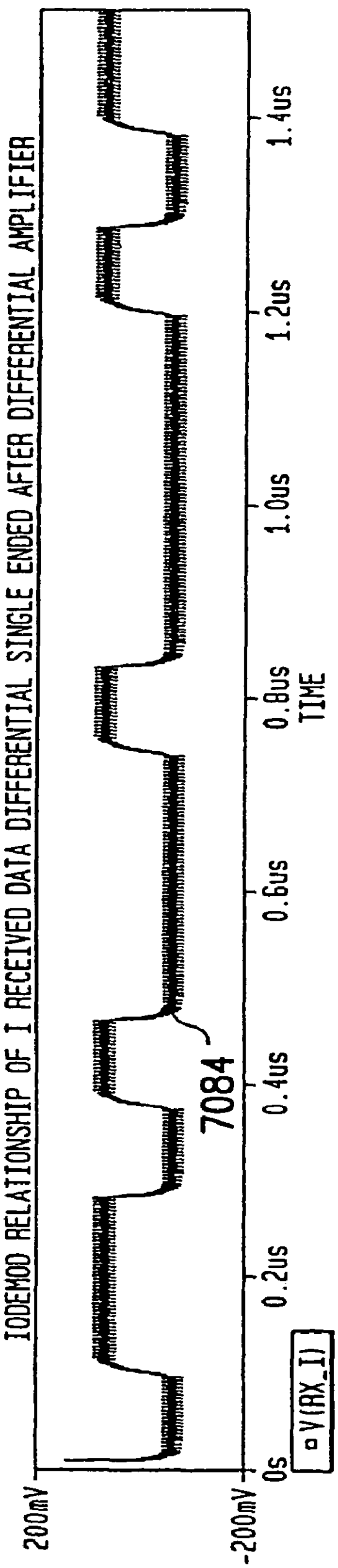
Figure 70N:
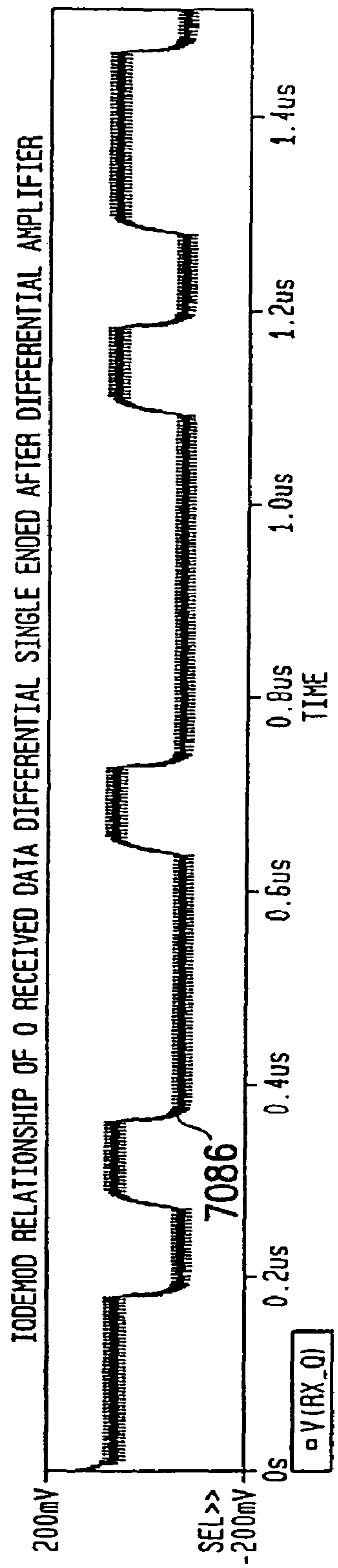
Figure 70O:
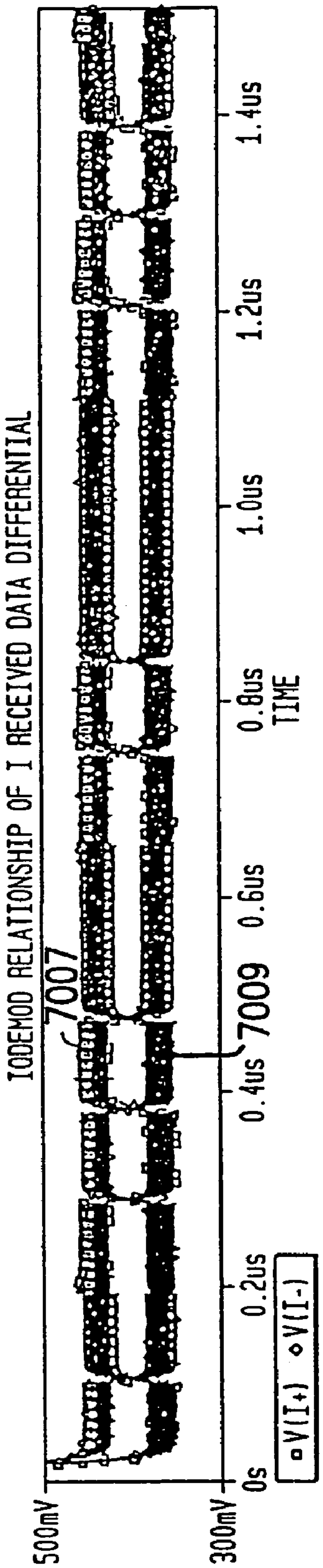

FIG. 70O shows an overlaid view of filtered I output signal 7007 and filtered inverted I output signal 7009.

Figure 70P:
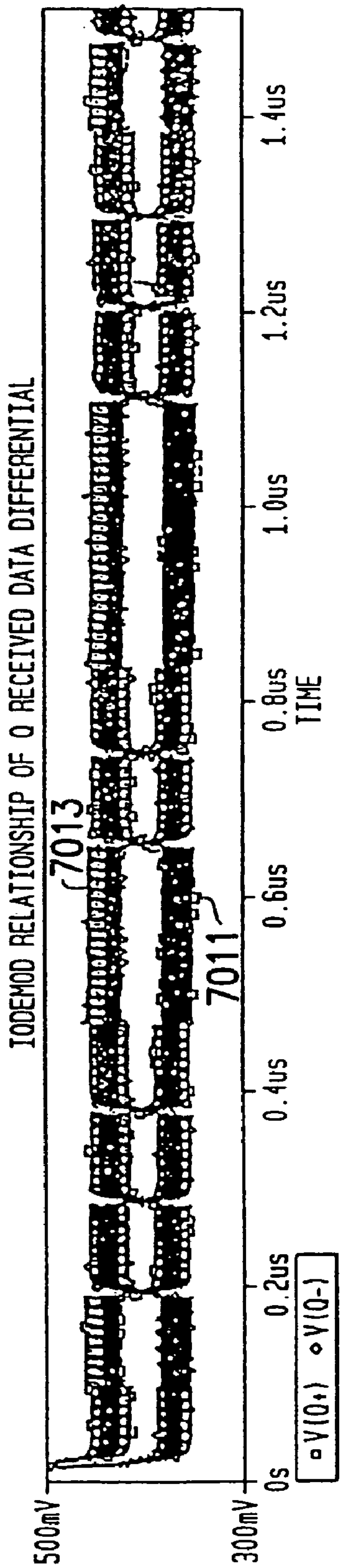

FIG. 70P shows an overlaid view of filtered Q output signal 7011 and filtered inverted Q output signal 7013.

FIGS. 70K and 70L show I baseband output signal 7084 and Q baseband output signal 7086, respectfully. A data transition 7055 is indicated in both I baseband output signal 7084 and Q baseband output signal 7086. The corresponding data transition 7055 is indicated in I-modulated signal 7051 of FIG. 70I, Q-modulated signal 7053 of FIG. 70J, and I/Q modulation RF input signal 7082 of FIG. 70H.

FIGS. 70M and 70N show I baseband output signal 7084 and Q baseband output signal 7086 over a wider time interval.

9.2 Example Single Channel Receiver Embodiment

Figure 70Q:
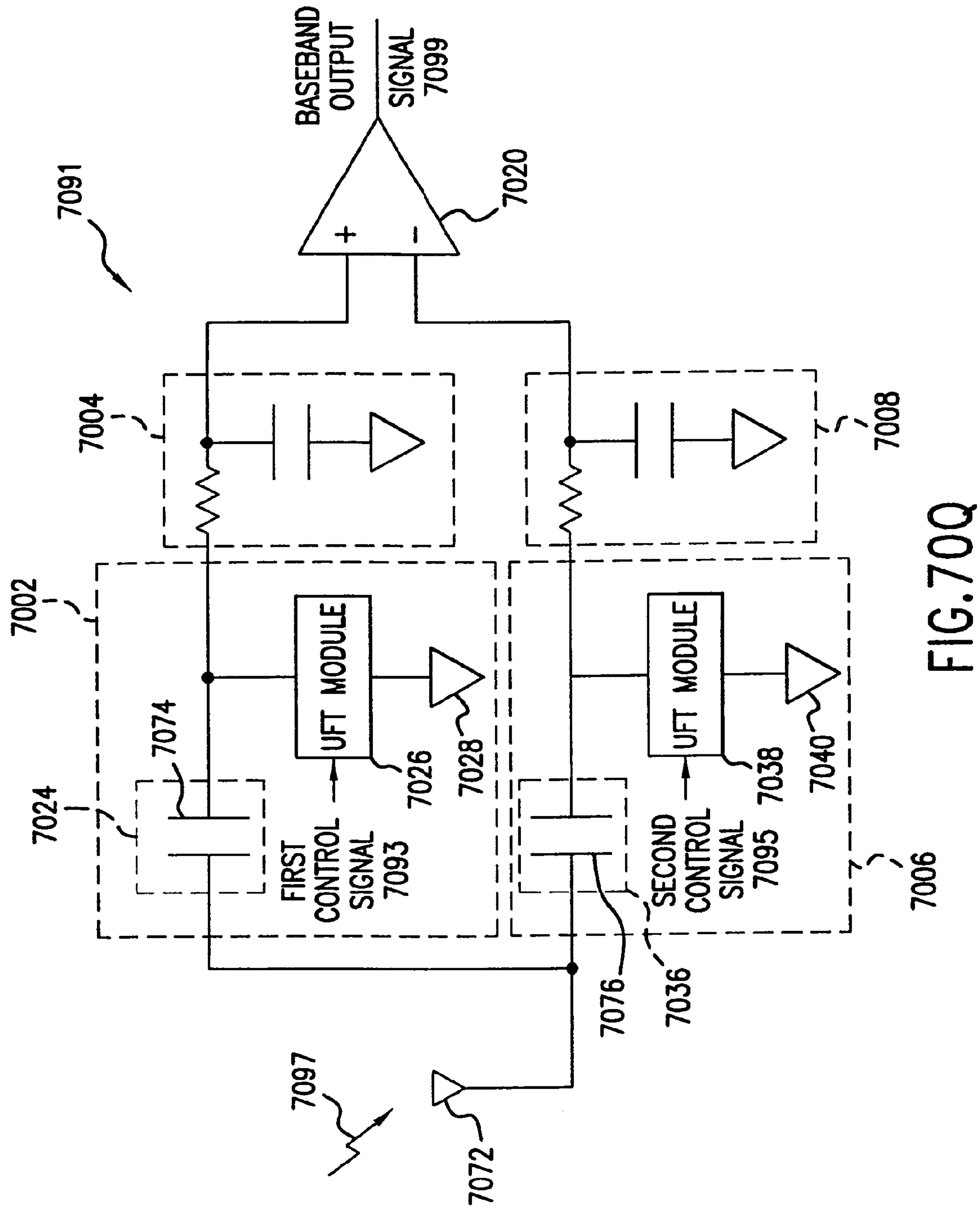
FIGS. 70Q-R illustrate single channel receiver embodiments according to embodiments of the invention.

FIG. 70Q illustrates an example single channel receiver 7091, corresponding to either the I or Q channel of I/Q modulation receiver 7000, according to an embodiment of the present invention. Single channel receiver 7091 can down-convert an input RF signal 7097 modulated according to AM, PM, FM, and other modulation schemes. Refer to section 7.4.1 above for further description on the operation of single channel receiver 7091.

9.3 Alternative Example I/Q Modulation Receiver Embodiment

Figure 70R:
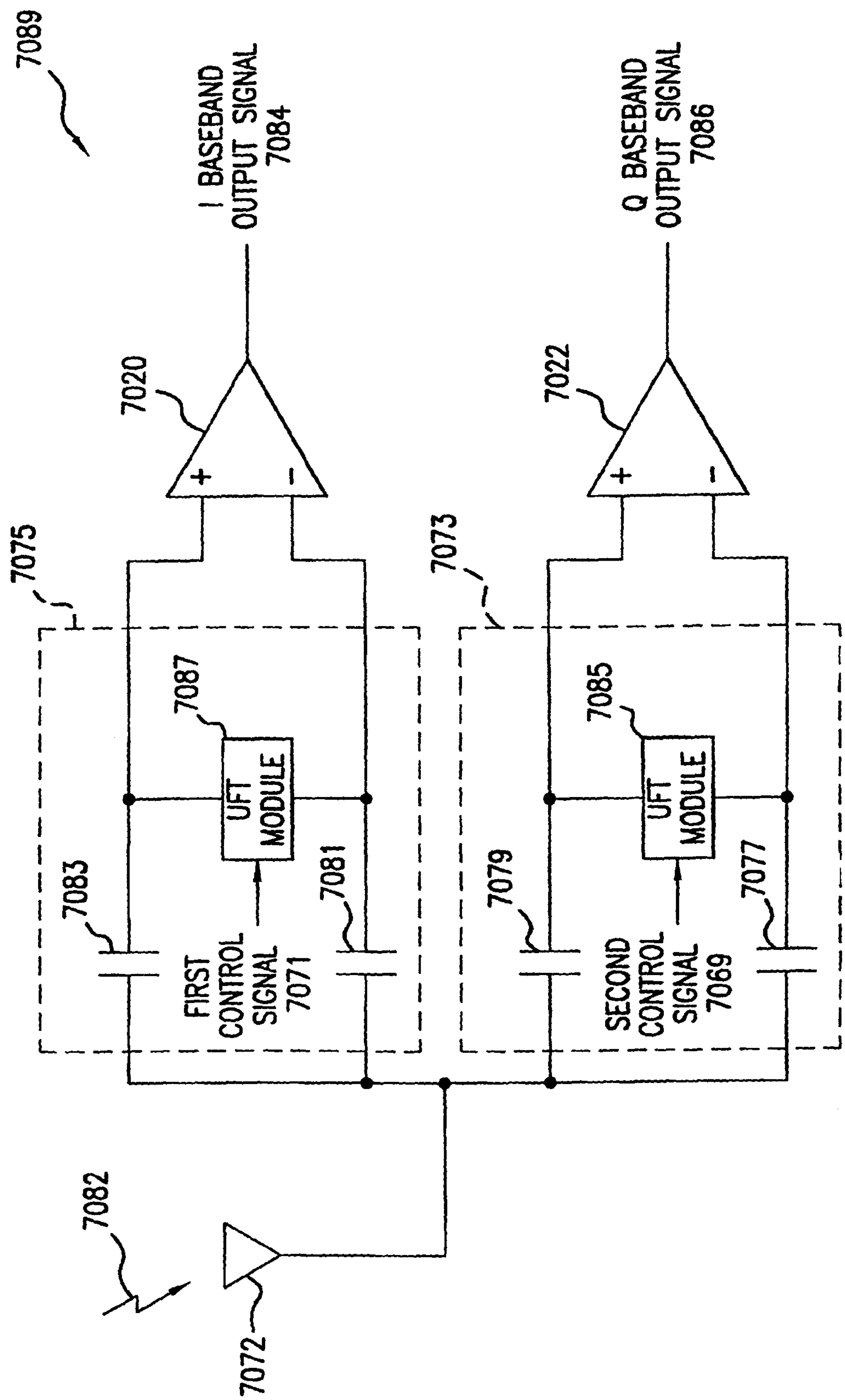

FIG. 70R illustrates an exemplary I/Q modulation receiver 7089, according to an embodiment of the present invention. I/Q modulation receiver 7089 receives, down-converts, and demodulates an I/Q modulated RF input signal 7082 to an I baseband output signal 7084, and a Q baseband output signal 7086. I/Q modulation receiver 7089 has additional advantages of reducing or eliminating unwanted DC offsets and circuit re-radiation, in a similar fashion to that of I/Q modulation receiver 7000 described above.

10. Shunt Transceiver Embodiments using UFT Modules

In this section, example transceiver embodiments are presented that utilize UFT modules in a shunt configuration for balanced up-conversion and balanced down-conversion.

More specifically, a signal channel transceiver embodiment is presented that incorporates the balanced transmitter 5600 (FIG. 56A) and the receiver 7091 (FIG. 70Q). Additionally, an IQ transceiver embodiment is presented that incorporate balanced IQ transmitter 5700 (FIG. 57) and IQ receiver 7000 (FIG. 70A).

These transceiver embodiments incorporate the advantages described above for the balanced transmitter 5600 and the balanced receiver 7091. More specifically, during up-conversion, an input baseband signal is up-converted in a balanced and differential fashion, so as to minimize carrier insertion and unwanted spectral growth. Additionally, during down-conversion, an input RF input signal is down-converted so that DC offset and re-radiation is reduced or eliminated. Additionally, since both transmitter and receiver utilize UFT modules for frequency translation, integration and cost saving can be realized.

These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Figure 71:
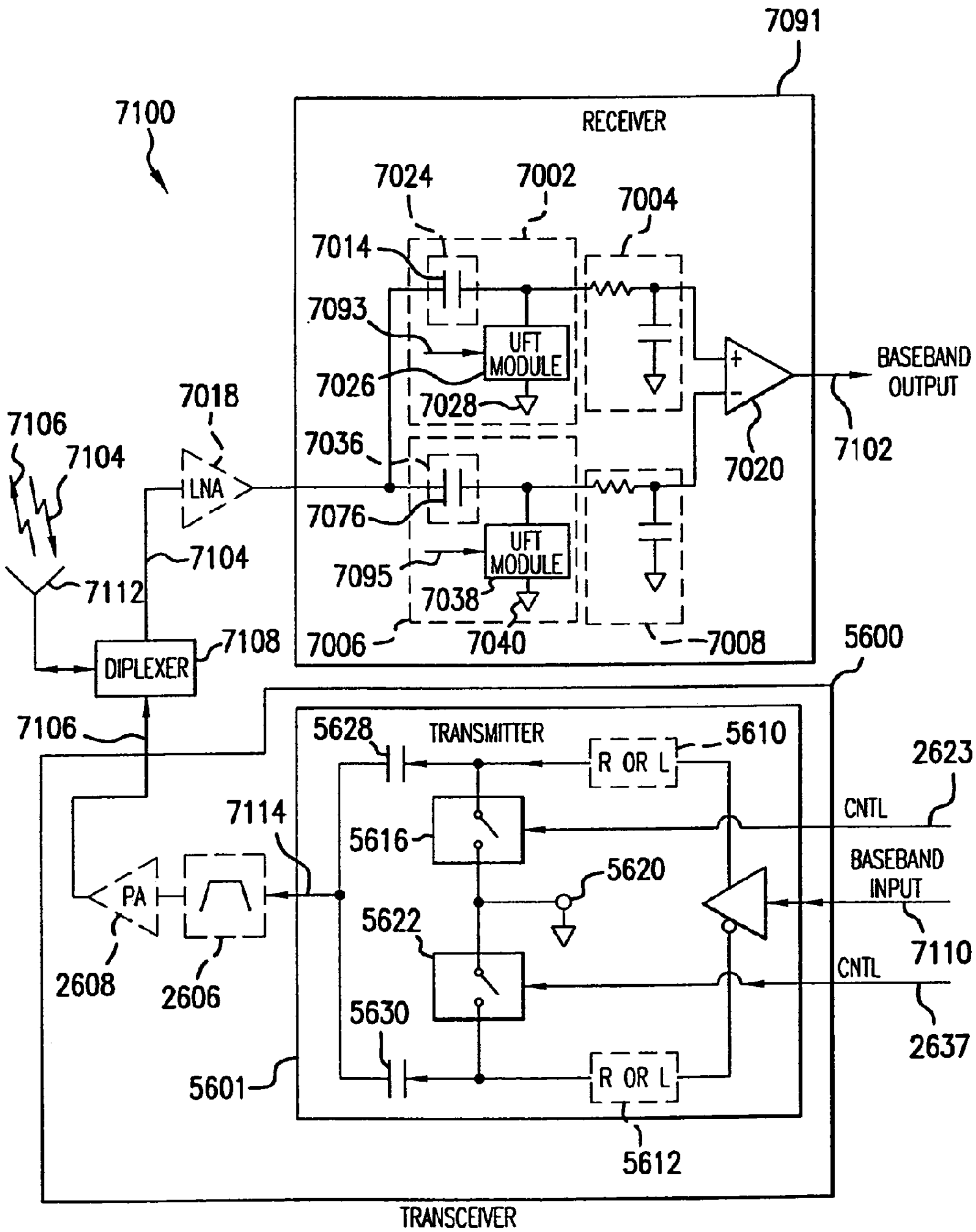
FIG. 71 illustrates a transceiver 7100 according to embodiments of the present invention.

FIG. 71 illustrates a transceiver 7100 according to embodiments of the present invention. Transceiver 7100 includes the single channel receiver 7091, the balanced transmitter 5600, a diplexer 7108, and an antenna 7112. Transceiver 7100 up-converts a baseband input signal 7110 using the balanced transmitter 5600 resulting in an output RF signal 7106 that is radiated by the antenna 7112. Additionally, the transceiver 7100 also down-converts a received RF input signal 7104 using the receiver 7091 to output baseband signal 7102. The diplexer 7108 separates the transmit signal 7106 from the receive signal 7104 so that the same antenna 7112 can be used for both transmit and receive operations. The operation of transmitter 5600 is described above in section 7.1.3, to which the reader is referred for greater detail.

During up-conversion, the transmitter 5600 shunts the input baseband signal 7110 to ground in a differential and balanced fashion according to the control signals 2623 and 2627, resulting in the harmonically rich signal 7114. The harmonically rich signal 7114 includes multiple harmonic images that repeat at harmonics of the sampling frequency of the control signals, where each harmonic image contains the necessary amplitude, frequency, and phase information to reconstruct the baseband signal 7110. The optional filter 2606 can be included to select a desired harmonic from the harmonically rich signal 7114. The optional amplifier 2608 can be included to amplify the desired harmonic resulting in the output RF signal 7106, which is transmitted by antenna 7112 after the diplexer 7108. A detailed description of the transmitter 5600 is included in section 7.1.3, to which the reader is referred for further details.

During down-conversion, the receiver 7091 alternately shunts the received RF signal 7104 to ground according to control signals 7093 and 7095, resulting in the down-converted output signal 7102. A detailed description of receiver 7091 is included in sections 9.1 and 9.2, to which the reader is referred for further details.

Figure 72:
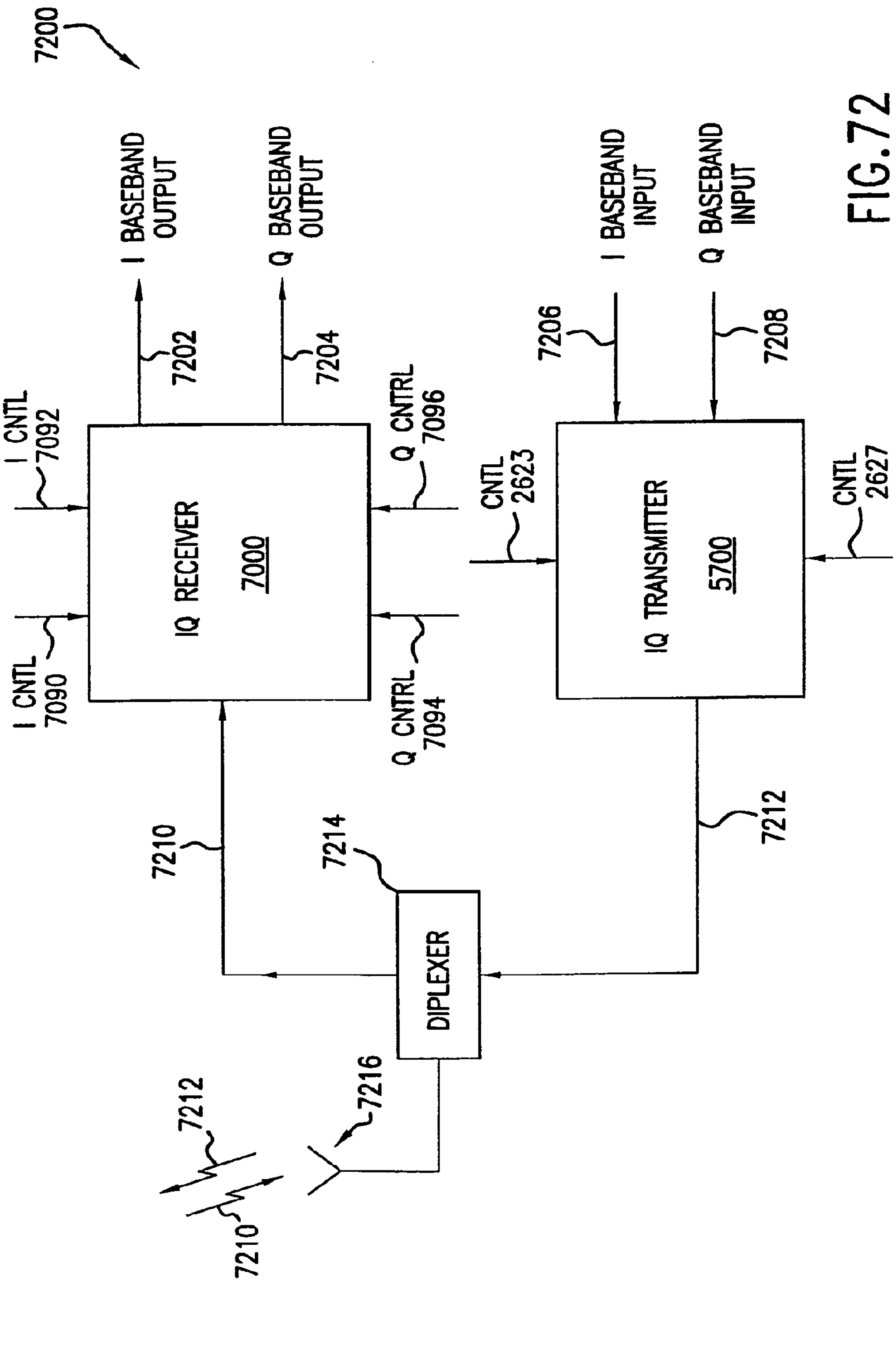
FIG. 72 illustrates a transceiver 7200 according to embodiments of the present invention.

FIG. 72 illustrates IQ transceiver 7200 according to embodiments of the present invention. IQ transceiver 7200 includes the IQ receiver 7000, the IQ transmitter 5700, a diplexer 7214, and an antenna 7216. Transceiver 7200 up-converts an I baseband signal 7206 and a Q baseband signal 7208 using the IQ transmitter 5700 (FIG. 57) to generate an IQ RF output signal 7212. A detailed description of the IQ transmitter 5700 is included in section 7.2.2, to which the reader is referred for further details. Additionally, the transceiver 7200 also down-converts a received RF signal 7210 using the IQ Receiver 7000, resulting in I baseband output signal 7202 and a Q baseband output signal 7204. A detailed description of the IQ receiver 7000 is included in section 9.1, to which the reader is referred for further details.

11. Conclusion

Example implementations of the methods, systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments.

What is claimed is:

1. A method for up-converting a baseband signal, to a higher frequency signal comprising the steps for:

(1) receiving the baseband signal;

(2) using first and second control signals, each having a single fundamental frequency, the first and second control signals being phase shifted from one another, and each control signal having variable pulse widths, to differentially sample the baseband signal to generate both I and Q harmonically rich signals each containing a plurality of harmonic images, the I and Q harmonically rich signals each being a function of information of the baseband signal;

(3) controlling the amplitude of each harmonically rich signal by adjusting the variable pulse widths of the first and second control signals;

(4) combining corresponding portions of harmonic images for the harmonically rich signals and then filtering the combined result for a selected harmonic frequency to obtain an up-converted signal;

(5) selecting a desired harmonic from said harmonic images; and (6) transmitting said desired harmonic over a communications medium.

2. The method of claim 1, further comprising the step of: minimizing DC offset voltages during step (2), and thereby minimizing carrier insertion in said harmonic images.

3. The method of claim 1, wherein the controlling step further comprises maintaining a reference voltage between said differential samples.

4. The method of claim 1, wherein step (2) comprises the steps of: (a) converting said baseband signal into a differential baseband signal having a first differential baseband component and a second differential baseband component; (b) sampling said first differential baseband component according to said first control signal to generate the first harmonically rich signal, and sampling said second differential baseband component according to said second control signal to generate the second harmonically rich signal, wherein said second control signal is phase shifted relative to said first control signal as measured by a master clock signal; and (c) combining said first harmonically rich signal and said second harmonically rich signal to generate said harmonic images.

5. The method of claim 4, further comprising the step of: (d) adding a reference voltage to said first differential baseband component and said second differential baseband component prior to step (b), and thereby minimizing any DC offset voltages during sampling of said first differential baseband component and said second differential baseband component.

6. The method of claim 4, wherein said step (b) of sampling comprises the steps of: (i) generating said first control signal comprising a first plurality of pulses and said second control signal comprising a second plurality of pulses; and (ii) operating a first switch according to said first control signal to periodically sample said first differential baseband component, and operating a second switch according to said second control signal to periodically sample said second differential baseband signal.

7. The method of claim 6, wherein said step (i) comprises the step of controlling pulse widths of said first control signal and said second control signal by a specified amount to control a time interval that said first switch and said second switch is closed in step (ii), and thereby controlling energy transfer to said desired harmonic image.

8. The method of claim 7, wherein said step of controlling pulse widths comprises the step of controlling pulse widths for said first and second control signals to a non-zero fraction of a period of a desired harmonic of interest.

9. The method of claim 7, wherein said step of controlling pulse widths comprises the step of controlling pulse widths for said first and second control signals to approximately one-half of a period of a desired harmonic of interest.

10. The method of claim 7, wherein said step of controlling pulse widths comprises the step of controlling pulse widths for said first and second control signals to approximately one-fourth of a period of a desired harmonic of interest.

11. The method of claim 7, wherein said step of controlling pulse widths comprises the step of controlling pulse widths for said first and second control signals to approximately one-tenth to one-fourth of a period of a desired harmonic of interest.

12. The method of claim 1, wherein said first control signal and said second control signal have a period of $T_s$ so that said harmonic images repeat at $1/T_s$ in frequency, and wherein said second control signal is phase-shifted relative to said first control signal by approximately 180 degrees.

13. The method of claim 1, wherein said first control signal and said second control signal have a period of $T_s$ so that said harmonic images repeat at $1/T_s$ in frequency, and wherein said second control signal is phase-shifted relative to said first control signal by approximately 90 degrees.

14. The method of claim 1, wherein said pulse widths of said first control signal and said second control signal are a non-zero fraction of a period of a desired harmonic of interest.

15. The method of claim 1, wherein said pulse widths of said first control signal and said second control signal are approximately one-half of a period of a desired harmonic of interest.

16. The method of claim 1, wherein said pulse widths of said first control signal and said second control signal are approximately one-half of a period of a desired harmonic of interest.

17. The method of claim 1, wherein said plurality of harmonic images have an amplitude that is proportional to the following equation: Amp n=[4 sin (n .pi. $T_A$ $T_s$) sin (n .pi. 2) n .pi.] where: $T_s$=period of said first and second control signals $T_A$=pulse width of said first and second control signals n=harmonic number of said harmonic image whose amplitude is determined.

18. The method of claim 1, wherein said harmonic images have an amplitude that is based on $n*(T_A/T_s)$, where $T_s$ is a period of said first and second control signals, $T_A$ is a pulse width of pulses in said first and second control signals, and n is a harmonic number of said harmonic image.

19. The method of claim 1, wherein control signals having substantially shorter pulse widths shift an increased amount of energy into higher frequency harmonics.

20. The method of claim 1, wherein control signals having relatively longer pulse widths shift an increased amount of energy into lower frequency harmonics.

21. The method of claim 1, wherein the information of the baseband signal includes amplitude, or phase or frequency or any combination thereof.

22. A differential frequency up-conversion module for up-converting a baseband signal to a higher frequency signal, comprising:

an input terminal for receiving at least one baseband signal;

first and second switching devices for receiving, respectively, first and second control signals having a single fundamental frequency, the first and second control signals being phase shifted from one another, and each control signal having variable pulse widths to differentially sample the baseband signal in order to generate I and Q harmonically rich signals, each containing a plurality of harmonic images, the I and Q harmonically rich signals each being representative of the baseband signal, and having an amplitude adjusted based on the pulse widths of the first and second control signals;

a combiner that combines corresponding portions of particular ones of the harmonic images for the harmonically rich signals; and a filter that filters results of the combiner for a selected harmonic frequency to obtain an up-converted signal.

23. The differential frequency up-conversion module as claimed in claim 22, wherein the combiner provides a direct connection between the first and second switching devices.

24. The differential frequency up-conversion module as claimed in claim 22, wherein the combiner is a wire.

* * * * *